(12) United States Patent
Mizutani et al.

(10) Patent No.: US 9,559,311 B2
(45) Date of Patent: Jan. 31, 2017

(54) ANTHRACENE DERIVATIVE, ORGANIC-ELECTROLUMINESCENCE-DEVICE MATERIAL, ORGANIC ELECTROLUMINESCENCE DEVICE, AND ELECTRONIC EQUIPMENT

(71) Applicant: IDEMITSU KOSAN CO., LTD., Tokyo (JP)

(72) Inventors: Sayaka Mizutani, Sodegaura (JP); Takayasu Sado, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 371 days.

(21) Appl. No.: 14/109,958

(22) Filed: Dec. 18, 2013

(65) Prior Publication Data

US 2014/0239273 A1  Aug. 28, 2014

(30) Foreign Application Priority Data

Feb. 22, 2013  (JP) .................................. 2013-033887

(51) Int. Cl.
  *B32B 9/00* (2006.01)
  *H01L 51/00* (2006.01)
  *H01L 51/50* (2006.01)

(52) U.S. Cl.
  CPC ....... *H01L 51/0058* (2013.01); *H01L 51/0052* (2013.01); *H01L 51/0067* (2013.01); *H01L 51/5012* (2013.01)

(58) Field of Classification Search
  USPC ........................................................ 428/690
  See application file for complete search history.

(56) References Cited

U.S. PATENT DOCUMENTS

2006/0019116 A1  1/2006  Conley et al.
2006/0041126 A1  2/2006  Schafer et al.
(Continued)

FOREIGN PATENT DOCUMENTS

CN  101087759  12/2007
CN  101560136  10/2009
(Continued)

OTHER PUBLICATIONS

International Search Report for corresponding International Application No. PCT/JP2013/082934, Feb. 4, 2014.
(Continued)

*Primary Examiner* — Austin Murata
(74) *Attorney, Agent, or Firm* — Oblon, McClelland, Maier & Neustadt, L.L.P.

(57) ABSTRACT

An anthracene derivative is represented by a formula (1) below, (1)

$$\text{structure with } (Ar^1)_s, L^1, (R^{11})_n, (Ar^2)_t, L^2, L^3, (Ar^3)_u, (R^{12})_m$$

(Continued)

in which at least one of $Ar^1$, $Ar^2$, $Ar^3$, $L^1$, $L^2$ and $L^3$ is a group derived from a skeleton represented by a formula (10) below,

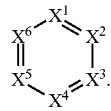

(10)

16 Claims, 1 Drawing Sheet

(56) References Cited

U.S. PATENT DOCUMENTS

| | | |
|---|---|---|
| 2006/0110622 A1 | 5/2006 | Uchida et al. |
| 2006/0154105 A1 | 7/2006 | Yamamoto et al. |
| 2007/0200490 A1 | 8/2007 | Kawamura et al. |
| 2007/0205412 A1 | 9/2007 | Bae et al. |
| 2007/0252516 A1 | 11/2007 | Kondakova et al. |
| 2007/0252521 A1 | 11/2007 | Kondakov et al. |
| 2007/0252522 A1 | 11/2007 | Kondakov et al. |
| 2008/0032123 A1 | 2/2008 | Spindler et al. |
| 2008/0111473 A1* | 5/2008 | Kawamura ......... C07D 213/04 313/504 |
| 2008/0152950 A1 | 6/2008 | Je et al. |
| 2008/0176099 A1 | 7/2008 | Hatwar et al. |
| 2008/0199726 A1 | 8/2008 | Schafer et al. |
| 2009/0233125 A1 | 9/2009 | Choi et al. |
| 2009/0256473 A1 | 10/2009 | Kim et al. |
| 2010/0001262 A1 | 1/2010 | Kim et al. |
| 2010/0039026 A1 | 2/2010 | Yang et al. |
| 2010/0084647 A1 | 4/2010 | Kondakova et al. |
| 2010/0240892 A1 | 9/2010 | Schafer et al. |
| 2011/0065924 A1 | 3/2011 | Kim et al. |
| 2011/0079774 A1 | 4/2011 | Kang et al. |
| 2011/0084259 A1 | 4/2011 | Lee et al. |
| 2011/0108826 A1 | 5/2011 | Jang et al. |
| 2011/0147716 A1 | 6/2011 | Kondakova et al. |
| 2011/0215308 A1 | 9/2011 | Im et al. |
| 2011/0240983 A1 | 10/2011 | Sekiguchi et al. |
| 2011/0295017 A1 | 12/2011 | Ebisawa et al. |
| 2011/0315963 A1 | 12/2011 | Yoshinaga et al. |
| 2012/0181518 A1 | 7/2012 | Ogiwara et al. |
| 2012/0181922 A1 | 7/2012 | Kawamura et al. |
| 2012/0238105 A1 | 9/2012 | Anemian et al. |
| 2013/0079517 A1 | 3/2013 | Schafer et al. |
| 2013/0105787 A1 | 5/2013 | Tanaka et al. |
| 2013/0112949 A1 | 5/2013 | Sim et al. |
| 2013/0207082 A1* | 8/2013 | Cho ................... H01L 51/5016 257/40 |
| 2013/0228753 A1 | 9/2013 | Moon et al. |
| 2013/0306955 A1 | 11/2013 | Mizutani et al. |
| 2014/0103306 A1 | 4/2014 | Moon et al. |
| 2014/0110692 A1 | 4/2014 | Kato et al. |
| 2014/0166351 A1 | 6/2014 | Lee et al. |
| 2014/0191206 A1 | 7/2014 | Cho |
| 2014/0209874 A1 | 7/2014 | Chun et al. |
| 2014/0217378 A1 | 8/2014 | Nishimura et al. |
| 2014/0306207 A1 | 10/2014 | Nishimura et al. |
| 2014/0330013 A1 | 11/2014 | Aihara et al. |

FOREIGN PATENT DOCUMENTS

| | | |
|---|---|---|
| CN | 101560182 | 10/2009 |
| CN | 102214795 | 10/2011 |
| CN | 102675031 | 9/2012 |
| CN | 103187531 | 7/2013 |
| EP | 2105979 | 9/2009 |
| JP | 2004-2297 | 1/2004 |
| JP | 2005-120296 | 5/2005 |
| JP | 2006-176448 | 7/2006 |
| JP | 2009-249378 | 10/2009 |
| JP | 2009-256352 | 11/2009 |
| JP | 2010-251585 | 11/2010 |
| JP | 2011-173972 | 9/2011 |
| JP | 2011-222997 | 11/2011 |
| JP | 2011-243597 | 12/2011 |
| JP | 2012-82136 | 4/2012 |
| JP | 2012-204793 | 10/2012 |
| JP | 2012-204794 | 10/2012 |
| JP | 2013-93541 | 5/2013 |
| JP | 2013-232521 | 11/2013 |
| JP | 2013-251480 | 11/2013 |
| JP | 2013-258379 | 12/2013 |
| JP | 2014-125449 | 7/2014 |
| KR | 10-2007-0088978 | 8/2007 |
| KR | 10-2009-0052774 | 5/2009 |
| KR | 10-2009-0086015 | 8/2009 |
| KR | 10-2010-0066424 | 6/2010 |
| KR | 10-2010-0094413 | 8/2010 |
| KR | 10-2013-0098227 | 4/2013 |
| WO | WO2006/117052 A1 | 11/2006 |
| WO | WO 2010/005268 | 1/2010 |
| WO | WO 2010/114263 | 10/2010 |
| WO | WO2012/141249 | 10/2012 |
| WO | WO2012/176675 | 12/2012 |
| WO | WO2013/145666 | 10/2013 |
| WO | WO2013/146117 | 10/2013 |
| WO | WO2013/180241 | 12/2013 |
| WO | WO2013/180503 | 12/2013 |
| WO | WO2014/046495 | 3/2014 |
| WO | WO2014/122937 | 8/2014 |

OTHER PUBLICATIONS

Office Action issued Jul. 27, 2016, in Chinese Patent Application No. 201380073422.5 filed Dec. 9, 2013 (with English translation).

* cited by examiner

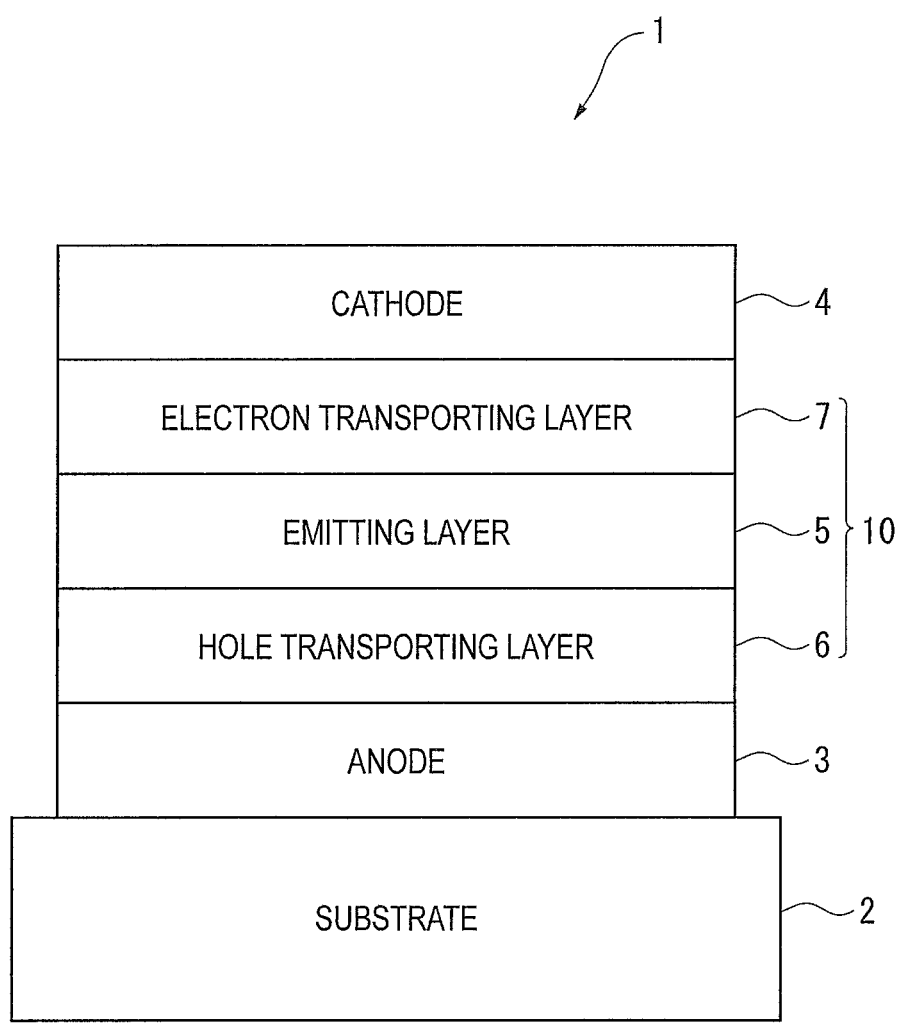

ANTHRACENE DERIVATIVE, ORGANIC-ELECTROLUMINESCENCE-DEVICE MATERIAL, ORGANIC ELECTROLUMINESCENCE DEVICE, AND ELECTRONIC EQUIPMENT

CROSS-REFERENCE TO RELATED APPLICATION(S)

The application is based upon and claims the benefit of priority from the prior Japanese Patent Application No. 2013-033887, filed on Feb. 22, 2013; the entire contents of which are incorporated herein by reference.

FIELD

Embodiments described herein relate generally to an anthracene derivative, an organic-electroluminescence-device material, an organic electroluminescence device, and electronic equipment.

BACKGROUND

An organic electroluminescence device (hereinafter, occasionally abbreviated as an organic EL device) using an organic substance is a promising component of a solid-emitting-type full-color display device of a low cost and a large area. Accordingly, various developments of the organic EL device have been made.

The organic EL device generally includes a pair of opposing electrodes and an emitting layer interposed between the pair of opposing electrodes. When an electrical field is applied to the opposing electrodes of the organic EL device, electrons are injected from a cathode and holes are injected from an anode. When the injected electrons and holes are recombined in the emitting layer, excitons are formed. Energy generated when the excitons are returned from an excited state to a ground state is irradiated as light. The organic EL device emits light in accordance with such a principle.

A typical organic EL device exhibits a higher drive voltage than an inorganic light-emitting diode. Moreover, since properties of the organic EL device are considerably deteriorated, the organic EL device is not in practical use. Although the organic EL device has been gradually improved in recent years, further lower drive voltage and higher efficiency have been demanded.

Patent Literature 1 (JP-A-2006-176448) discloses an organic EL device including a compound having an anthracene skeleton in at least one of an electron injecting layer and an electron transporting layer. Patent Literature 2 (US Patent Application Publication No. 2006/0019116), Patent Literature 3 (US Patent Application Publication No. 2007/0205412), Patent Literature 4 (Korean Publication Patent No. 10-2009-052774), Patent Literature 5 (Korean Publication Patent No. 10-2010-066424), Patent Literature 6 (Korean Publication Patent No. 10-2009-086015), Patent Literature 7 (International Publication No. WO2010/005268), Patent Literature 8 (International Publication No. WO2010/114263), Patent Literature 9 (US Patent Application Publication No. 2011/0084259), Patent Literature 10 (JP-A-2011-173972), Patent Literature 11 (US Patent Application Publication No. 2011/0215308), Patent Literature 12 (JP-A-2011-243597), Patent Literature 13 (US Patent Application Publication No. 2011/0295017) and Patent Literature 14 (US Patent Application Publication No. 2011/0315963) each disclose an organic EL device including an electron injecting layer and an electron transporting layer.

Although having an improved lifetime as compared with that of a typical organic EL device, the organic EL devices of Patent Literatures 1 to 14 are required to exhibit a further lower drive voltage for practical use.

BRIEF SUMMARY OF THE INVENTION

An anthracene derivative according to an aspect of the invention is represented by a formula (1) below.

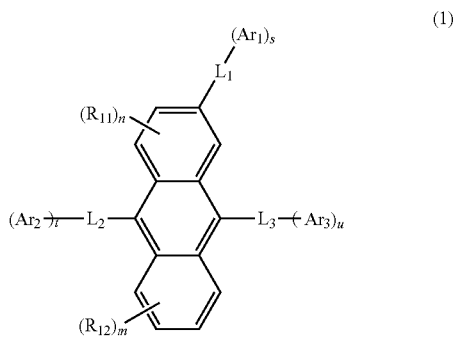

In the formula (1), s, t and u are each independently an integer of 1 to 5. n is 3. m is 4.

At least one of $(Ar^1)s-L^1-$, $(Ar^2)t-L^2-$ and $(Ar^3)u-L^3-$ includes a group derived from a skeleton represented by a formula (10) below.

$Ar^1$, $Ar^2$ or $Ar^3$ does not include a monovalent cyclic structure derived from a formula (X-100) or (X-101) below. $L^1$, $L^2$ or $L^3$ does not include an (s+1)-valent group, (t+1)-valent group or (u+1)-valent group derived from the formula (X-100) or (X-101).

$R^{11}$ and $R^{12}$ are selected from the group consisting of a hydrogen atom, halogen atom, cyano group, nitro group, hydroxyl group, carboxyl group, sulfonyl group, mercapto group, substituted or unsubstituted boryl group, substituted or unsubstituted phosphino group, substituted or unsubstituted acyl group, substituted or unsubstituted amino group, substituted or unsubstituted silyl group, substituted or unsubstituted alkyl group having 1 to 30 carbon atoms, substituted or unsubstituted alkenyl group having 2 to 30 carbon atoms, substituted or unsubstituted alkynyl group having 2 to 30 carbon atoms, substituted or unsubstituted aralkyl group having 6 to 30 carbon atoms, substituted or unsubstituted alkoxy group having 1 to 30 carbon atoms, substituted or unsubstituted aryloxy group having 6 to 40 ring carbon atoms, substituted or unsubstituted heteroaryloxy group having 5 to 40 ring carbon atoms, substituted or unsubstituted alkylthio group having 1 to 30 carbon atoms, substituted or unsubstituted arylthio group having 6 to 40 ring carbon atoms, substituted or unsubstituted heteroarylthio group having 5 to 40 ring carbon atoms, substituted or unsubstituted alkoxycarbonyl group having 2 to 30 carbon atoms, substituted or unsubstituted aryloxycarbonyl group having 6 to 40 ring carbon atoms, and substituted or unsubstituted heteroaryloxycarbonyl group having 5 to 40 ring carbon atoms. However, $R^{12}$ is neither a methyl group nor a tertiary butyl group.

$R^{11}$ and $R^{12}$ are respectively bonded to any carbon atoms of the anthracene ring. A plurality of $R^{11}$ are mutually the same or different. A plurality of $R^{12}$ are mutually the same or different.

Ar¹, Ar² and Ar³ represent a substituted or unsubstituted aromatic hydrocarbon group having 6 to 40 ring carbon atoms or a substituted or unsubstituted heterocyclic group having 5 to 40 ring atoms. A plurality of Ar¹ are mutually the same or different when s is 2 or more. A plurality of Ar² are mutually the same or different when t is 2 or more. A plurality of Ar³ are mutually the same or different when u is 2 or more.

However, when Ar³ has a substituent, the substituent is not a trimethylsilyl group.

L¹, L² and L³ each independently represent a single bond or a linking group. The linking group is a substituted or unsubstituted polyvalent aromatic hydrocarbon group having 6 to 40 ring carbon atoms, a substituted or unsubstituted polyvalent heterocyclic group having 5 to 40 ring atoms, or a polyvalent multiple linking group provided by bonding two to three groups selected from the above aromatic hydrocarbon group and the above heterocyclic group. In the multiple linking group, the aromatic hydrocarbon group and the heterocyclic group forming the multiple linking group are mutually the same or different and may be bonded to each other to form a ring. L¹, L² and L³ each independently may be bonded to the anthracene ring, R¹¹ or R¹² to form a ring, or may not be bonded thereto. Ar¹ and L¹, Ar² and L², and Ar³ and L³ each may form a ring, or may not form a ring. When t and u are 1, L² and L³ are a single bond, and Ar² and Ar³ are a phenyl group, L is an aromatic hydrocarbon group.

When (Ar¹)s-L¹- includes a group derived from the skeleton represented by the following formula (10), (Ar¹)s-L¹- does not include a group selected from groups represented by the following formulae (X-111), (X-112) and (X-114) to (X-117).

When (Ar¹)s-L¹- includes a group derived from the skeleton represented by the following formula (10), (Ar¹)s-L- is not a group represented by the following formula (X-113).

When (Ar¹)s-L¹- includes a group derived from the skeleton represented by the following formula (10) and (Ar²)t-L²- and (Ar³)u-L³- are the same group selected from groups represented by the following formulae (X-121) to (X-128), (Ar¹)s-L¹- is not a group selected from groups represented by the following formulae (X-131) to (X-135).

When (Ar¹)s-L- includes a group derived from the skeleton represented by the following formula (10) and (Ar²)t-L²- and (Ar³)u-L³- are the same group selected from groups represented by the following formulae (X-121) and (X-125) to (X-128), (Ar¹)s-L¹- is not a group represented by the following formula (X-136).

When (Ar¹)s-L¹- includes a group derived from the skeleton represented by the following formula (10) and (Ar²)t-L²- and (Ar³)u-L³- are the same group selected from the group of the following formula (X-125) or the group of the following formula (X-126), (Ar¹)s-L¹- is not a group of the following formula (X-137).

When (Ar¹)s-L¹- includes a group derived from the skeleton represented by the following formula (10), s is 1, L¹ is a single bond, and Ar¹ is a substituted or unsubstituted phenyl group, a substituent to be bonded to a ring carbon atom of the phenyl group is not deuterium.

When at least one of (Ar²)t-L²- and (Ar³)u-L³- includes a group derived from the skeleton represented by the following formula (10), (Ar²)t-L²- or (Ar³)u-L³- does not include a monovalent group derived from the following formula (X-141) or (X-144), a (t+11)-valent group derived from the following formula (X-141) or (X-144), and (u+1)-valent group derived from the following formula (X-141) or (X-144). (Ar³)u-L³- is not a group of the following formula (X-142).

When (Ar³)u-L³- is a group of the following formula (X-143), (Ar²)t-L²- does not include a group derived from the skeleton represented by the following formula (10).

When t and u are 1, L² and L³ are a single bond, and Ar² and Ar³ are a substituted or unsubstituted phenyl group, a substituent to be bonded to a ring carbon atom of the phenyl group is not deuterium.

The anthracene derivative of the formula (1) does not include compounds represented by the following formulae (X-1) to (X-8).

When the formula (1) is represented by the following formula (101), in which Ar² and Ar³ are phenyl groups and Ar¹⁰² is a hydrogen atom, Ar¹⁰¹ is not a group represented by the following formula (X-145) or (X-146).

When the formula (1) is represented by the formula (101), in which Ar² and Ar³ are phenyl groups and Ar¹⁰¹ is a hydrogen atom, Ar¹⁰² is not a group represented by the following formula (X-147).

When the formula (1) is represented by the following formula (101), in which Ar² and Ar³ are the same group selected from a phenyl group or the group represented by the formula (X-125), Ar¹⁰¹ or Ar¹⁰² is not a group represented by any one of the following formulae (X-148) to (X-150).

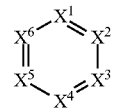

(10)

In the formula (10), X¹ to X⁶ each independently represent a nitrogen atom or CR¹⁰. However, one to four of X¹ to X⁶ are a nitrogen atom. Adjacent ones of CR¹⁰ may be bonded to each other to form a ring, or may not be bonded. However, when adjacent ones of CR¹⁰ are bonded to each other to form a ring, a five-membered ring is not formed.

R¹⁰ is selected from the group consisting of a hydrogen atom, halogen atom, cyano group, nitro group, hydroxyl group, carboxyl group, sulfonyl group, mercapto group, substituted or unsubstituted boryl group, substituted or unsubstituted phosphino group, substituted or unsubstituted acyl group, substituted or unsubstituted amino group, substituted or unsubstituted silyl group, substituted or unsubstituted alkyl group having 1 to 30 carbon atoms, substituted or unsubstituted alkenyl group having 2 to 30 carbon atoms, substituted or unsubstituted alkynyl group having 2 to 30 carbon atoms, substituted or unsubstituted aralkyl group having 6 to 30 carbon atoms, substituted or unsubstituted alkoxy group having 1 to 30 carbon atoms, substituted or unsubstituted aryloxy group having 6 to 40 ring carbon atoms, substituted or unsubstituted heteroaryloxy group having 5 to 40 ring carbon atoms, substituted or unsubstituted alkylthio group having 1 to 30 carbon atoms, substituted or unsubstituted arylthio group having 6 to 40 ring carbon atoms, substituted or unsubstituted heteroarylthio group having 5 to 40 ring carbon atoms, substituted or unsubstituted alkoxycarbonyl group having 2 to 30 carbon atoms, substituted or unsubstituted aryloxycarbonyl group having 6 to 40 ring carbon atoms, substituted or unsubstituted heteroaryloxycarbonyl group having 5 to 40 ring carbon atoms, substituted or unsubstituted aromatic hydrocarbon group having 6 to 40 ring carbon atoms, and substituted or unsubstituted heterocyclic group having 5 to 40 ring atoms.

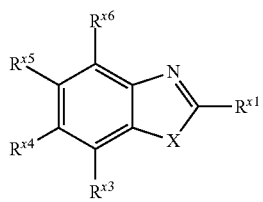
(X-100)

In the (X-100), X represents one of an oxygen atom, a sulfur atom and NR$^{x2}$. R$^{x1}$ to R$^{x6}$ represent the same as R$^{11}$ of the formula (1) or are selected from a substituted or unsubstituted aromatic hydrocarbon group having 6 to 40 ring carbon atoms or a substituted or unsubstituted heterocyclic group having 5 to 40 ring atoms.

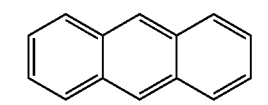
(X-101)

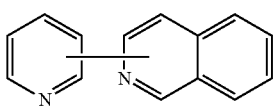
(X-111)

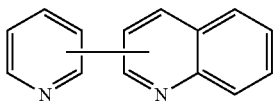
(X-112)

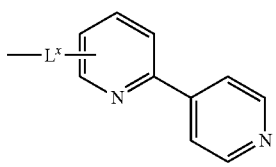
(X-113)

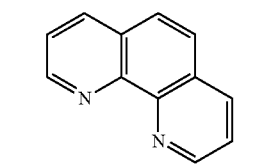
(X-114)

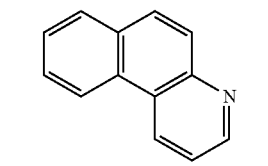
(X-115)

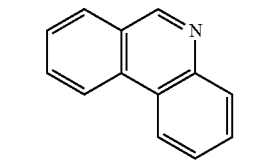
(X-116)

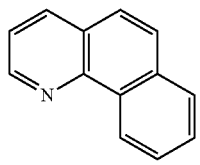
(X-117)

In the formula (X-113), L$^x$ is a substituted or unsubstituted aromatic hydrocarbon group having 6 to 40 ring carbon atoms.

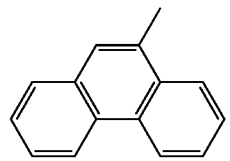
(X-121)

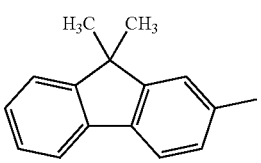
(X-122)

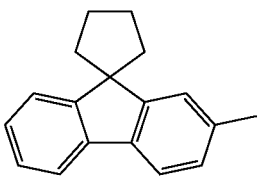
(X-123)

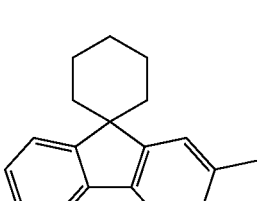
(X-124)

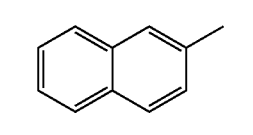
(X-125)

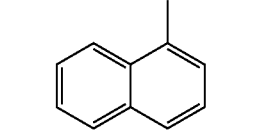
(X-126)

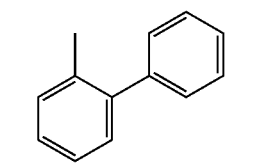
(X-127)

-continued
(X-128)
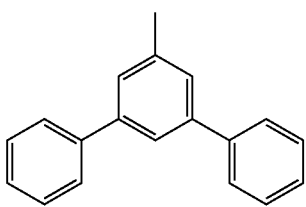
(X-131)
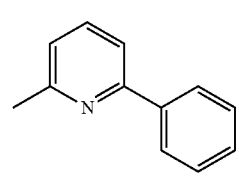
(X-132)
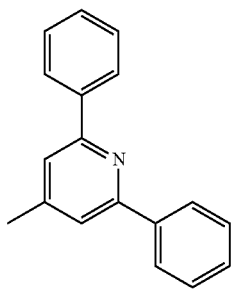
(X-133)
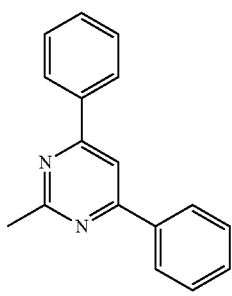
(X-134)
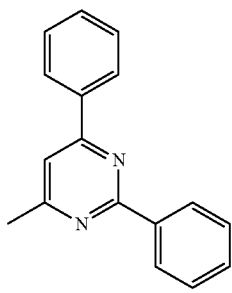
(X-135)
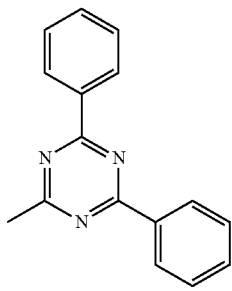
-continued
(X-136)
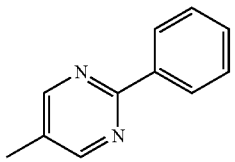
(X-137)
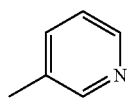
(X-141)
(X-142)
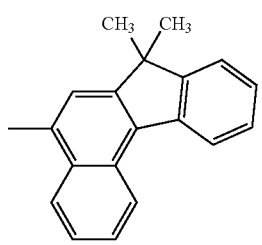
(X-143)
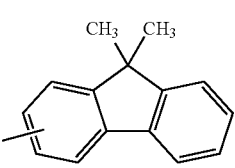
(X-144)
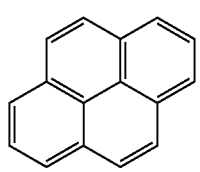
(X-1)
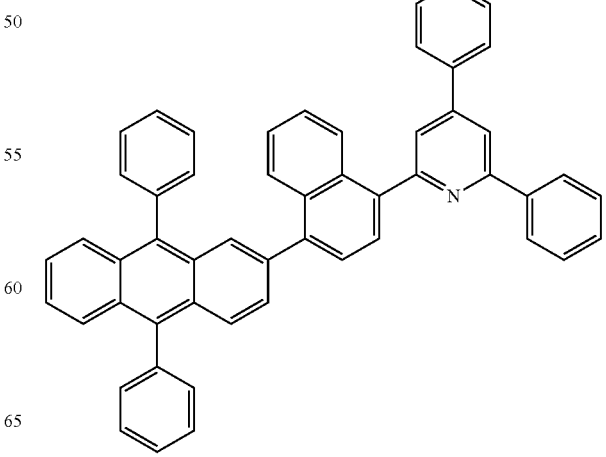

(X-2) 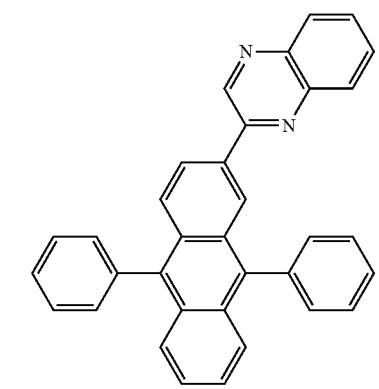
(X-3) 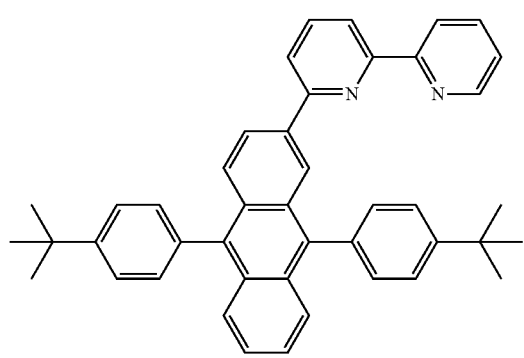
(X-4) 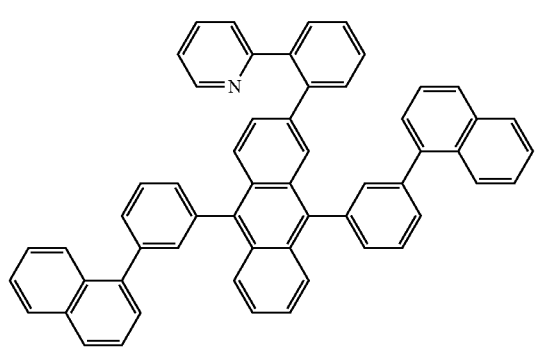
(X-5) 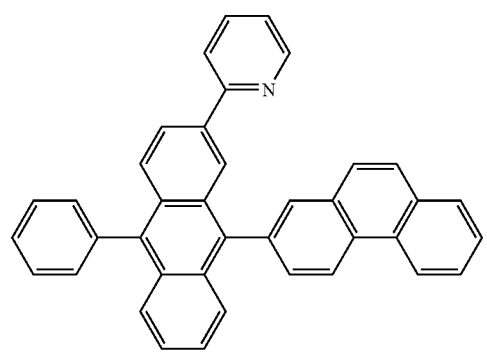
(X-6) 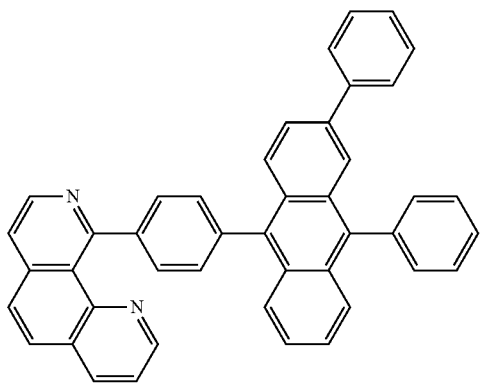
(X-7) 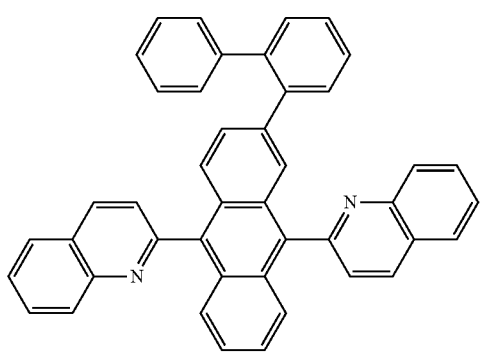
(X-8) 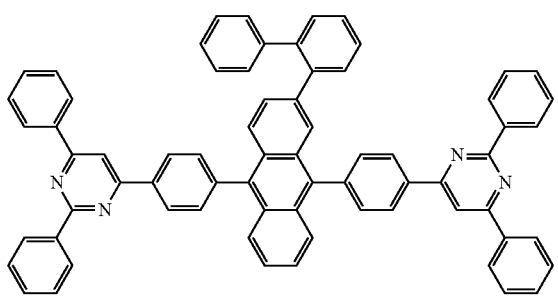
(101) 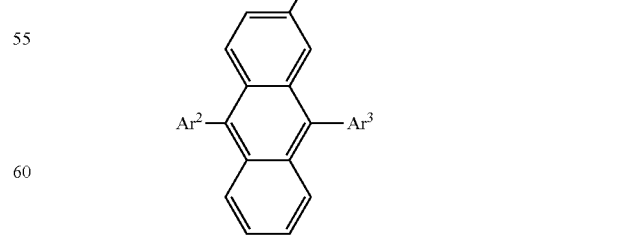
In the formula (101), $Ar^2$ and $Ar^3$ represent the same as $Ar^2$ and $Ar^3$ in the formula (1). $Ar^{101}$ and $Ar^{102}$ represent the same as $R^{10}$ of the formula (10).

(X-145)

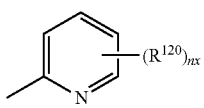

(X-146)

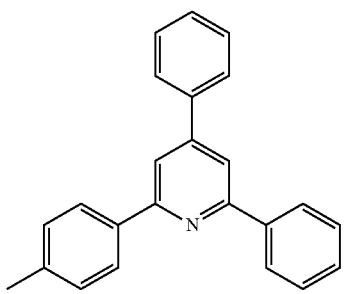

(X-147)

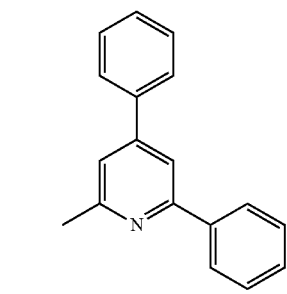

(X-148)

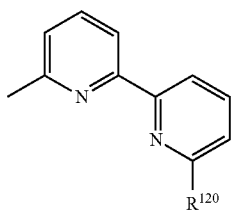

(X-149)

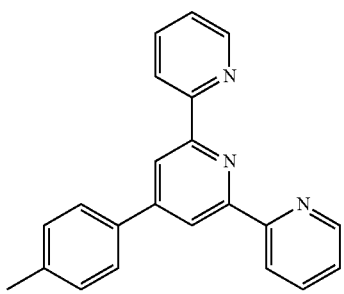

(X-150)

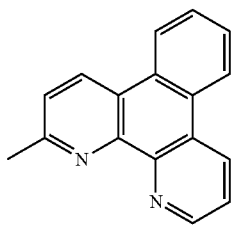

In the formulae (X-145) and (X-148), $R^{120}$ represents a hydrogen atom or a phenyl group. nx is 4. A plurality of $R^{120}$ are mutually the same or different.

An organic-electroluminescence-device material according to another aspect of the invention preferably includes the anthracene derivative.

The organic electroluminescence device according to still another aspect of the invention includes an anode, a cathode opposed to the anode, and one or more layers of an organic layer interposed between the anode and the cathode, in which the organic layer includes the anthracene derivative.

Electronic equipment according to a further aspect of the invention preferably includes the organic electroluminescence device.

BRIEF DESCRIPTION OF THE DRAWINGS

FIG. 1 schematically shows an exemplary arrangement of an organic EL device according to an exemplary embodiment of the invention.

DETAILED DESCRIPTION OF THE INVENTION

Anthracene Derivative

An anthracene derivative according to an exemplary embodiment of the invention is represented by a formula (1) below.

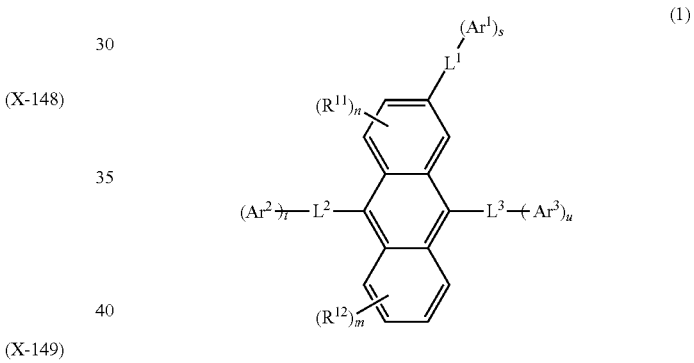

In the formula (1), s, t and u are each independently an integer of 1 to 5. n is 3. m is 4.

At least one of $(Ar^1)s-L^1-$, $(Ar^2)t-L^2-$ and $(Ar^3)u-L^3-$ includes a group derived from a skeleton represented by a formula (10) below.

$Ar^1$, $Ar^2$ or $Ar^3$ does not include a monovalent cyclic structure derived from a formula (X-100) or (X-101) below.

$L^1$, $L^2$ or $L^3$ does not include an (s+1)-valent group, (t+1)-valent group or (u+1)-valent group derived from the formula (X-100) or (X-101).

$R^{11}$ and $R^{12}$ are selected from the group consisting of a hydrogen atom, halogen atom, cyano group, nitro group, hydroxyl group, carboxyl group, sulfonyl group, mercapto group, substituted or unsubstituted boryl group, substituted or unsubstituted phosphino group, substituted or unsubstituted acyl group, substituted or unsubstituted amino group, substituted or unsubstituted silyl group, substituted or unsubstituted alkyl group having 1 to 30 carbon atoms, substituted or unsubstituted alkenyl group having 2 to 30 carbon atoms, substituted or unsubstituted alkynyl group having 2 to 30 carbon atoms, substituted or unsubstituted aralkyl group having 6 to 30 carbon atoms, substituted or unsubstituted alkoxy group having 1 to 30 carbon atoms, substituted or unsubstituted aryloxy group having 6 to 40 ring carbon atoms, substituted or unsubstituted heteroaryloxy group having 5 to 40 ring carbon atoms, substituted or unsubstituted alkylthio group having 1 to 30 carbon atoms, substituted or unsubstituted arylthio group having 6 to 40 ring carbon atoms, substituted or unsubstituted heteroarylthio group having 5 to 40 ring carbon atoms, substituted or unsubstituted alkoxycarbonyl group having 2 to 30 carbon atoms, substituted or unsubstituted aryloxycarbonyl group having 6 to 40 ring carbon atoms, and substituted or unsubstituted heteroaryloxycarbonyl group having 5 to 40 ring carbon atoms. However, $R^{12}$ is neither a methyl group nor a tertiary butyl group.

$R^{11}$ and $R^{12}$ are respectively bonded to any carbon atoms of the anthracene ring. A plurality of $R^{11}$ are mutually the same or different. A plurality of $R^{12}$ are mutually the same or different.

$Ar^1$, $Ar^2$ and $Ar^3$ represent a substituted or unsubstituted aromatic hydrocarbon group having 6 to 40 ring carbon atoms or a substituted or unsubstituted heterocyclic group having 5 to 40 ring atoms. A plurality of $Ar^1$ are mutually the same or different when s is 2 or more. A plurality of $Ar^2$ are mutually the same or different when t is 2 or more. A plurality of $Ar^3$ are mutually the same or different when u is 2 or more.

However, when $Ar^3$ has a substituent, the substituent is not a trimethylsilyl group.

$L^1$, $L^2$ and $L^3$ each independently represent a single bond or a linking group. The linking group is a substituted or unsubstituted polyvalent aromatic hydrocarbon group having 6 to 40 ring carbon atoms, a substituted or unsubstituted polyvalent heterocyclic group having 5 to 40 ring atoms, or a polyvalent multiple linking group provided by bonding two to three groups selected from the above aromatic hydrocarbon group and the above heterocyclic group. In the multiple linking group, the aromatic hydrocarbon group and the heterocyclic group forming the multiple linking group are mutually the same or different and may be bonded to each other to form a ring. $L^1$, $L^2$ and $L^3$ each independently may be bonded to the anthracene ring, $R^{11}$ or $R^{12}$ to form a ring, or may not be bonded thereto. $Ar^1$ and $L^1$, $Ar^2$ and $L^2$, and $Ar^3$ and $L^3$ each may form a ring, or may not form a ring. When t and u are 1, $L^2$ and $L^3$ are a single bond, and $Ar^2$ and $Ar^3$ are a phenyl group, L is an aromatic hydrocarbon group.

When $(Ar^1)s-L^1-$ includes a group derived from the skeleton represented by the following formula (10), $(Ar^1)s-L^1-$ does not include a group selected from groups represented by the following formulae (X-111), (X-112) and (X-114) to (X-117).

When $(Ar^1)s-L-$ includes a group derived from the skeleton represented by the following formula (10), $(Ar^1)s-L^1-$ is not a group of the following formula (X-113).

When $(Ar^1)s-L^1-$ includes a group derived from the skeleton represented by the following formula (10) and $(Ar^2)t-L^2-$ and $(Ar^3)u-L^3-$ are the same group selected from groups represented by the following formulae (X-121) to (X-128), $(Ar^1)s-L-$ is not a group selected from groups represented by the following formulae (X-131) to (X-135).

When $(Ar^1)s-L^1-$ includes a group derived from the skeleton represented by the following formula (10) and $(Ar^2)t-L^2-$ and $(Ar^3)u-L^3-$ are the same group selected from groups represented by the following formulae (X-121) and (X-125) to (X-128), $(Ar^1)s-L^1-$ is not a group of the following formula (X-136).

When $(Ar^1)s-L^1-$ includes a group derived from the skeleton represented by the following formula (10), and $(Ar^2)t-L^2-$ and $(Ar^3)u-L^3-$ each are a group selected from the group of the following formula (X-125) or the group of the following formula (X-126), $(Ar^1)s-L^1-$ is not a group of the following formula (X-137).

When $(Ar^1)s-L^1-$ includes the group derived from the skeleton represented by the following formula (10), s is 1, $L^1$ is a single bond, and $Ar^1$ is a substituted or unsubstituted phenyl group, a substituent to be bonded to a ring carbon atom of the phenyl group is not deuterium.

When at least one of $(Ar^2)t-L^2-$ and $(Ar^3)u-L^3-$ includes the group derived from the skeleton represented by the following formula (10), $(Ar^2)t-L^2-$ or $(Ar^3)u-L^3-$ does not include a monovalent group derived from the following formula (X-141) or (X-144), a (t+1)-valent group derived from the formula (X-141) or (X-144), and (u+1)-valent group derived from the formula (X-141) or (X-144).

$(Ar^3)u-L^3-$ is not a group of the following formula (X-142).

When $(Ar^3)u-L^3-$ is a group of the following formula (X-143), $(Ar^2)t-L^2-$ does not include a group derived from the following formula (10).

When t and u are 1, $L^2$ and $L^3$ are a single bond, and $Ar^2$ and $Ar^3$ are a substituted or unsubstituted phenyl group, a substituent to be bonded to a ring carbon atom of the phenyl group is not deuterium.

The anthracene derivative of the formula (1) does not include compounds represented by the following formulae (X-1) to (X-7).

When the formula (1) is represented by the following formula (101), in which $Ar^2$ and $Ar^3$ are phenyl groups and $Ar^{102}$ is a hydrogen atom, $Ar^{101}$ is not a group represented by the following formula (X-145) or (X-146).

When the formula (1) is represented by the formula (101), in which $Ar^2$ and $Ar^3$ are phenyl groups and $Ar^{101}$ is a hydrogen atom, $Ar^{102}$ is not a group represented by the following formula (X-147).

When the formula (1) is represented by the following formula (101), in which $Ar^2$ and $Ar^3$ are the same group selected from a phenyl group or the group represented by the formula (X-125), $Ar^{101}$ or $Ar^{102}$ is not a group represented by any one of the following formulae (X-148) to (X-150).

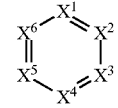

(10)

In the formula (10), $X^1$ to $X^6$ each independently represent a nitrogen atom or $CR^{10}$. However, one to four of $X^1$ to $X^6$ are a nitrogen atom. Adjacent ones of $CR^{10}$ may be bonded to each other to form a ring, or may not be bonded. However, when adjacent ones of $CR^{10}$ are bonded to each other to form a ring, a five-membered ring is not formed.

$R^{10}$ is selected from the group consisting of a hydrogen atom, halogen atom, cyano group, nitro group, hydroxyl group, carboxyl group, sulfonyl group, mercapto group, substituted or unsubstituted boryl group, substituted or unsubstituted phosphino group, substituted or unsubstituted acyl group, substituted or unsubstituted amino group, substituted or unsubstituted silyl group, substituted or unsubstituted alkyl group having 1 to 30 carbon atoms, substituted or unsubstituted alkenyl group having 2 to 30 carbon atoms, substituted or unsubstituted alkynyl group having 2 to 30 carbon atoms, substituted or unsubstituted aralkyl group having 6 to 30 carbon atoms, substituted or unsubstituted alkoxy group having 1 to 30 carbon atoms, substituted or unsubstituted aryloxy group having 6 to 40 ring carbon atoms, substituted or unsubstituted heteroaryloxy group having 5 to 40 ring carbon atoms, substituted or unsubstituted alkylthio group having 1 to 30 carbon atoms, substituted or unsubstituted arylthio group having 6 to 40 ring carbon atoms, substituted or unsubstituted heteroarylthio group having 5 to 40 ring carbon atoms, substituted or unsubstituted alkoxycarbonyl group having 2 to 30 carbon atoms, substituted or unsubstituted aryloxycarbonyl group having 6 to 40 ring carbon atoms, substituted or unsubstituted heteroaryloxycarbonyl group having 5 to 40 ring carbon atoms, substituted or unsubstituted aromatic hydrocarbon group having 6 to 40 ring carbon atoms, and substituted or unsubstituted heterocyclic group having 5 to 40 ring atoms.

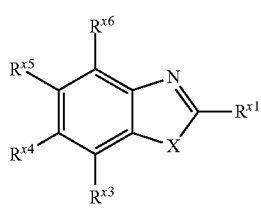

(X-100)

In the (X-100), X represents one of an oxygen atom, a sulfur atom and $NR^{x2}$. $R^{x1}$ to $R^{x6}$ represent the same as $R^{11}$ of the formula (1) or are selected from a substituted or unsubstituted aromatic hydrocarbon group having 6 to 40 ring carbon atoms or a substituted or unsubstituted heterocyclic group having 5 to 40 ring atoms.

(X-101)

(X-111)

(X-112)

(X-113)

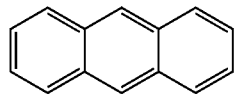

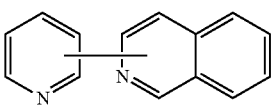

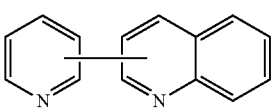

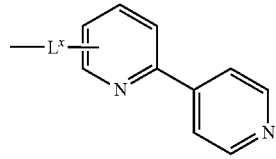

(X-114)

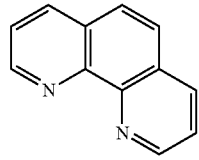

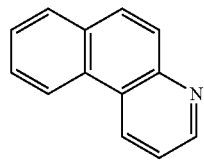

(X-115)

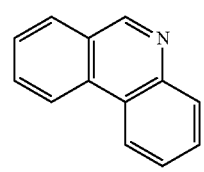

(X-116)

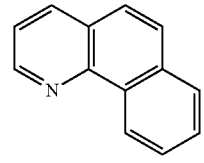

(X-117)

In the formula (X-113), $L^x$ is a substituted or unsubstituted aromatic hydrocarbon group having 6 to 40 ring carbon atoms.

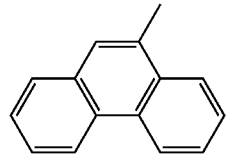

(X-121)

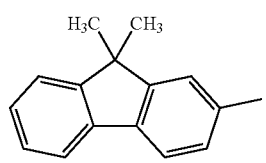

(X-122)

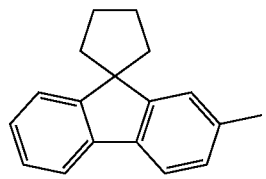

(X-123)

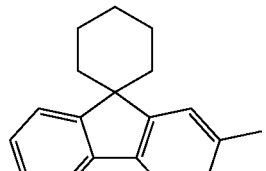

(X-124)

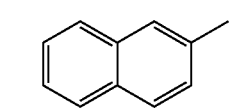

(X-125)

(X-126) 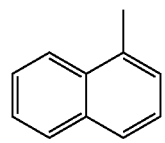
(X-127) 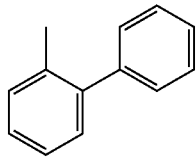
(X-128) 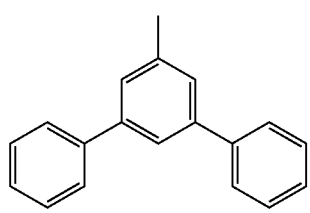
(X-131) 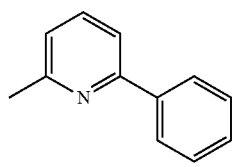
(X-132) 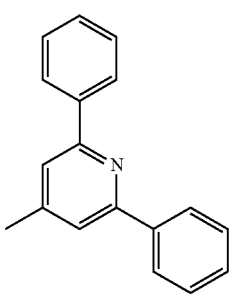
(X-133) 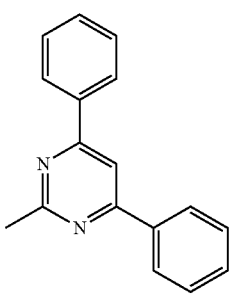
(X-134) 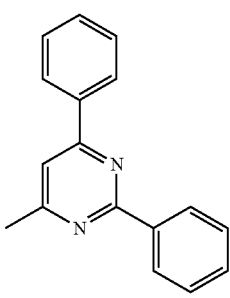
(X-135) 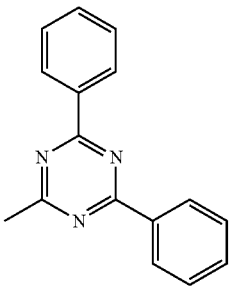
(X-136) 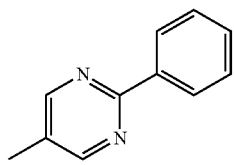
(X-137) 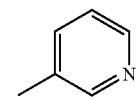
(X-141) 
(X-142) 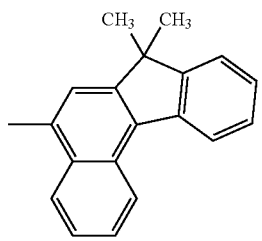
(X-143) 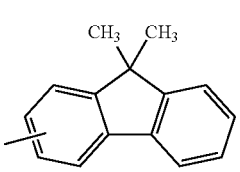
(X-144) 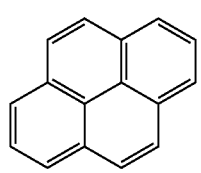

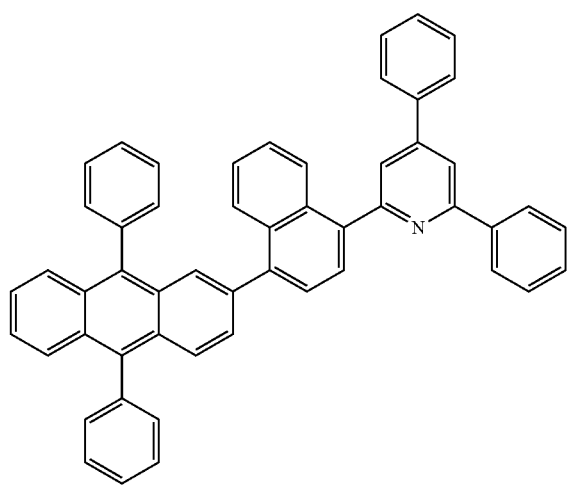

(101)

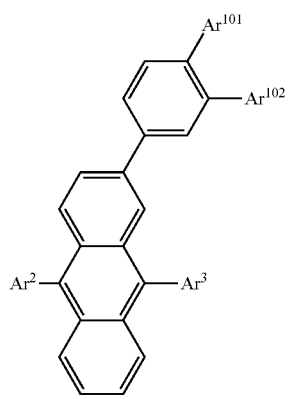

In the formula (101), $Ar^2$ and $Ar^3$ represent the same as $Ar^2$ and $Ar^3$ in the formula (1). $Ar^{101}$ and $Ar^{102}$ represent the same as $R^{10}$ of the formula (10).

(X-145)

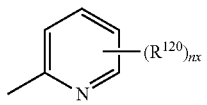

(X-146)

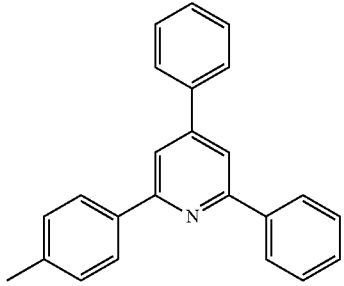

(X-147)

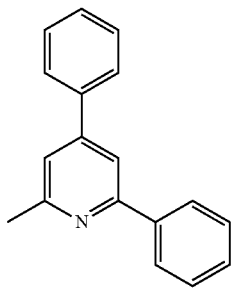

(X-148)

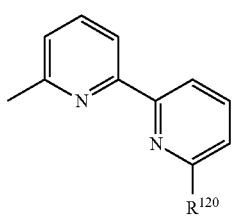

(X-149)

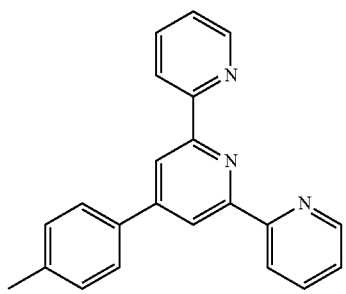

(X-150)

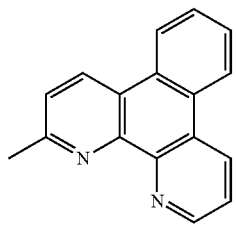

In the formulae (X-145) and (X-148), $R^{120}$ represents a hydrogen atom or a phenyl group. nx is 4. A plurality of $R^{120}$ are mutually the same or different.

In the formula (1), when $L^1$, $L^2$ and $L^3$ are each independently bonded to the anthracene ring to form a ring, the formula (1) is represented by the following formulae (100-1) to (100-6).

(100-1)

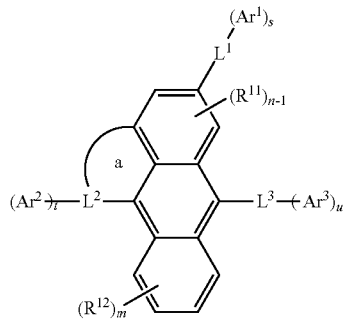

(100-2)

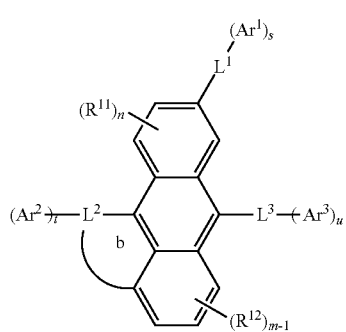

-continued

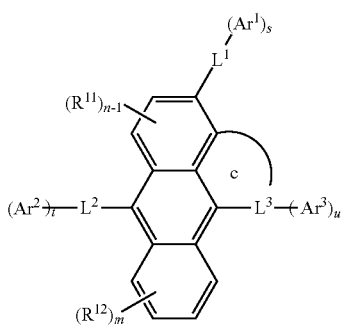
(100-3)

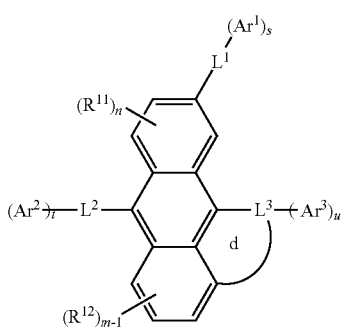
(100-4)

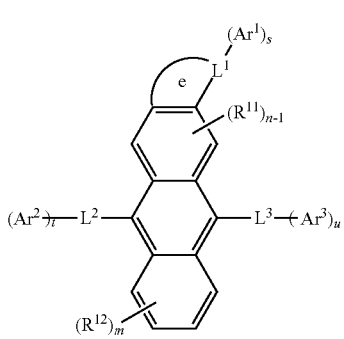
(100-5)

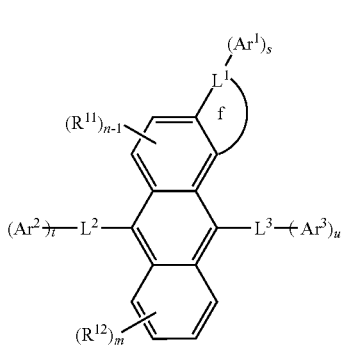
(100-6)

In the formulae (100-1) to (100-6), $A^1$, $A^2$, $Ar^3$, $L^1$, $L^2$, $L^3$, $R^{11}$, $R^{12}$, s, t, n and m represent the same as those of the formula (1). a to f each represent a ring formed by any one of $L^1$, $L^2$ and $L^3$ and the anthracene ring. When $L^1$, $L^2$ and $L^3$ each have a substituent, the rings a to f may be formed by bonding the substituents of $L^1$, $L^2$ and $L^3$ to the carbon atoms of the anthracene ring.

In the formulae (100-1) and (100-2), when $L^2$ is exemplarily a group represented by the following formula (L), the formulae (100-1) and (100-2) are exemplarily represented by the following formulae (100-11) to (100-14).

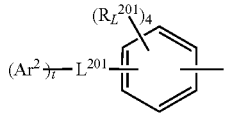
(L)

In the formula (L), $Ar^2$ and t represent the same as those of the formula (1).

$L^{201}$ represents a single bond or a linking group. The linking group is a substituted or unsubstituted polyvalent aromatic hydrocarbon group having 6 to 40 ring carbon atoms, a substituted or unsubstituted polyvalent heterocyclic group having 5 to 40 ring atoms, or a polyvalent multiple linking group provided by bonding two groups selected from the above aromatic hydrocarbon group and the above heterocyclic group.

$R_L^{201}$ is each independently selected from the group consisting of a hydrogen atom, halogen atom, cyano group, nitro group, hydroxyl group, carboxyl group, sulfonyl group, mercapto group, substituted or unsubstituted boryl group, substituted or unsubstituted phosphino group, substituted or unsubstituted acyl group, substituted or unsubstituted amino group, substituted or unsubstituted silyl group, substituted or unsubstituted alkyl group having 1 to 30 carbon atoms, substituted or unsubstituted alkenyl group having 2 to 30 carbon atoms, substituted or unsubstituted alkynyl group having 2 to 30 carbon atoms, substituted or unsubstituted aralkyl group having 6 to 30 carbon atoms, substituted or unsubstituted alkoxy group having 1 to 30 carbon atoms, substituted or unsubstituted aryloxy group having 6 to 40 ring carbon atoms, substituted or unsubstituted heteroaryloxy group having 5 to 40 ring carbon atoms, substituted or unsubstituted alkylthio group having 1 to 30 carbon atoms, substituted or unsubstituted arylthio group having 6 to 40 ring carbon atoms, substituted or unsubstituted heteroarylthio group having 5 to 40 ring carbon atoms, substituted or unsubstituted alkoxycarbonyl group having 2 to 30 carbon atoms, substituted or unsubstituted aryloxycarbonyl group having 6 to 40 ring carbon atoms, substituted or unsubstituted heteroaryloxycarbonyl group having 5 to 40 ring carbon atoms, substituted or unsubstituted aromatic hydrocarbon group having 6 to 40 ring carbon atoms, and substituted or unsubstituted heterocyclic group having 5 to 40 ring atoms.

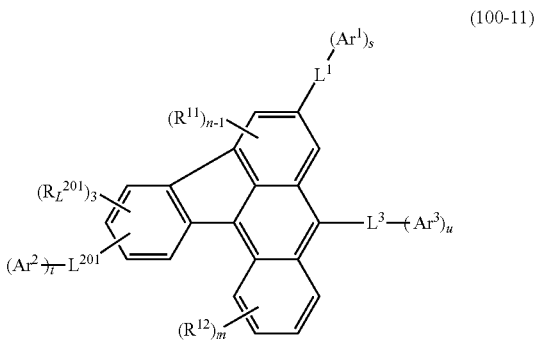
(100-11)

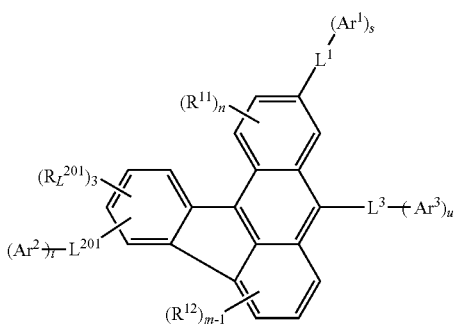
(100-12)

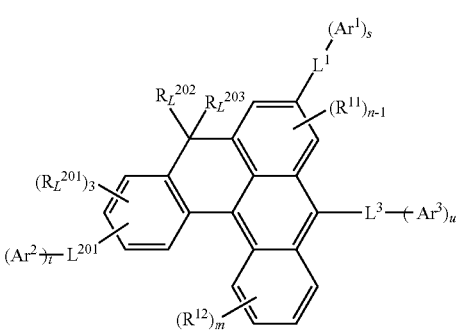
(100-13)

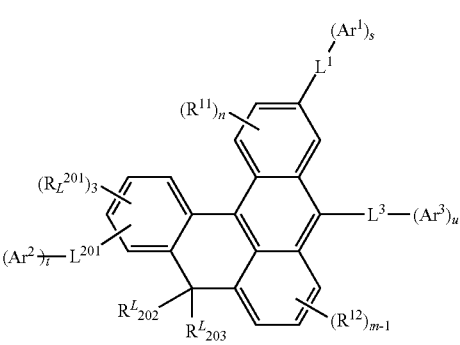
(100-14)

In the formulae (100-11) to (100-14), $A^1$, $A^2$, $Ar^3$, $L^1$, $L^3$, $R^{11}$, $R^{12}$, s, t, n and m represent the same as those of the formula (1). $L^{201}$ and $R_L{}^{201}$ represent the same as those of the formula (L).

$R_L{}^{202}$ and $R_L{}^{203}$ represent the same as $R_L{}^{201}$ of the formula (L).

The formula (1) is represented by the following formula (2).

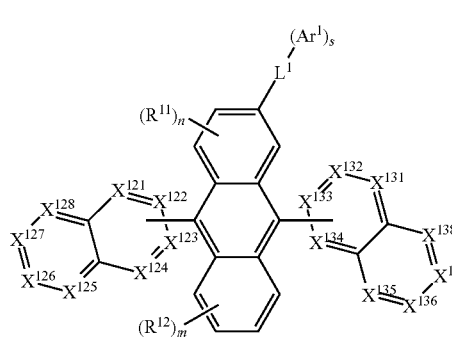
(2)

In the formula (2), n, m, $L^1$, $R^{11}$ and $R^{12}$ represent the same as n, m, $L^1$, $R^{11}$ and $R^{12}$ of the formula (1).

$Ar^1$ is a group represented by the following formula (201) or (202).

$X^{121}$ to $X^{138}$ are each independently a carbon atom that is single-bonded to the anthracene ring, or $CR^{110}$. $R^{110}$ represents the same as $R^{10}$ of the formula (10). In the formula (2), the anthracene ring is directly bonded at a position 9 to $X^{121}$ or $X^{122}$ while being directly bonded at a position 10 to $X^{131}$ or $X^{132}$.

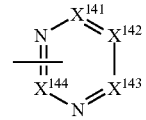
(201)

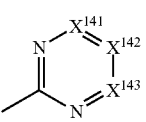
(202)

In the formula (201) and (202), $X^{141}$ to $X^{144}$ and $X^{151}$ to $X^{160}$ are each independently $CR^{111}$. $R^{111}$ represents the same as $R^{10}$ of the formula (10). One of $X^{141}$ to $X^{144}$ is a carbon atom bonded to $L^1$ of the formula (2). One of $X^{151}$ to $X^{155}$ is a carbon atom bonded to L of the formula (2). One of $X^{151}$ to $X^{155}$ and one of $X^{151}$ to $X^{160}$ are carbon atoms bonded to each other.

Further, in the formula (1), $(Ar^1)s$-$L^1$- is preferably represented by the following formula (201A) or (202A). In the formula (2), $(Ar^1)s$-$L^1$- is more preferably represented by the following formula (201A) or (202A).

(201A)

(202A)

In the formulae (201A) and (202A), $X^{141}$ to $X^{143}$, $X^{151}$, $X^{153}$, $X^{154}$, and $X^{157}$ to $X^{160}$ are each independently $CR^1$. $R^{111}$ represents the same as $R^{10}$ of the formula (10).

The formula (1) is also preferably represented by the following formula (3).

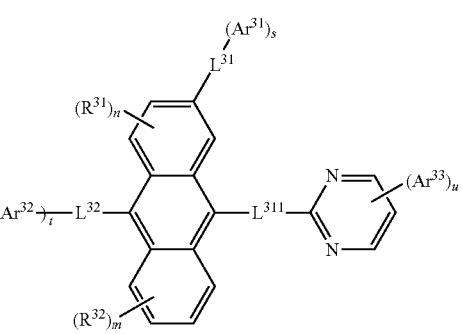
(3)

In the formula (3), s, t and u represent the same as s, t and u of the formula (1). $L^{31}$, $L^{32}$ and $L^{311}$ each independently represent the same as $L^1$, $L^2$ and $L^3$ of the formula (1). $Ar^{31}$ and $Ar^{32}$ represent the same as $Ar^1$ and $Ar^2$ of the formula (1). $Ar^{33}$ represents the same as $R^{10}$ of the formula (10). $Ar^{33}$ is bonded to any one of carbon atoms of a pyrimidine ring.

In the formula (1), it is preferable that s, t and u are each independently 1 or 2. Also in the formula (2), s is preferably 1 or 2. It is preferable also in the formula (3) that s, t and u are each independently 1 or 2.

The formula (1) is preferably represented by any one selected from the group of the following formulae (1-A) to (1-O).

(1-A)
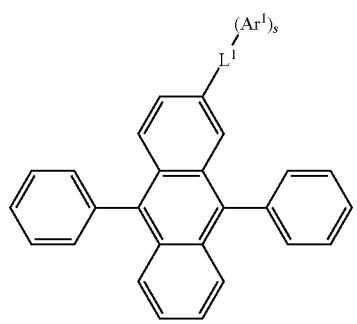

(1-B)
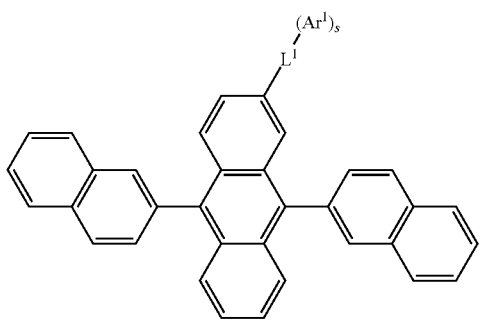

(1-C)
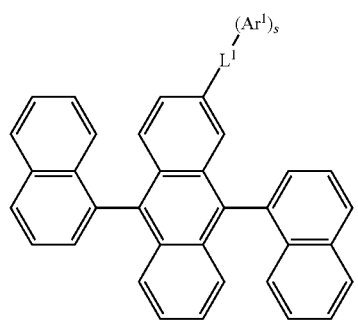

(1-D)
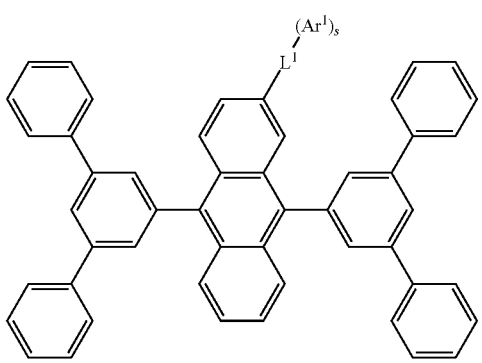

-continued (1-E)
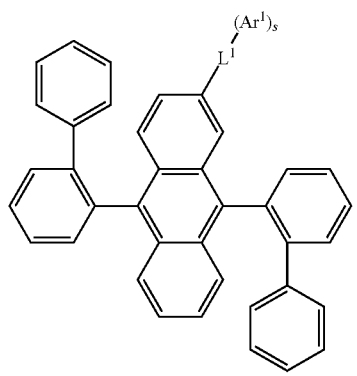

(1-F)
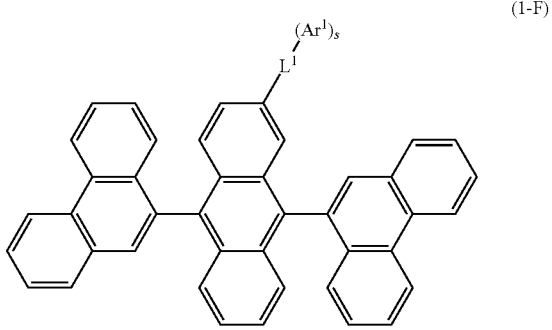

(1-G)
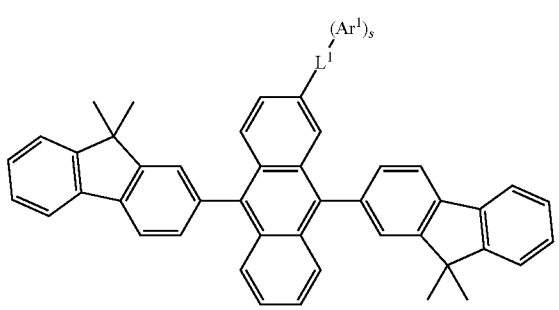

(1-H)
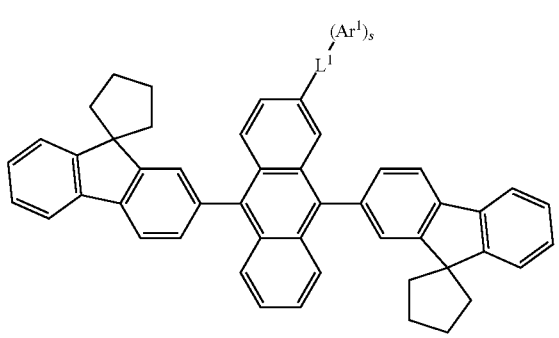

-continued (1-I)
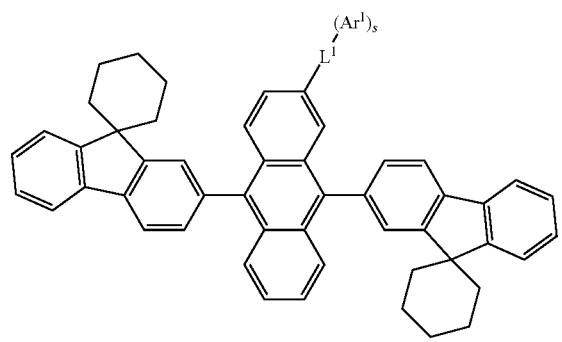

(1-J)
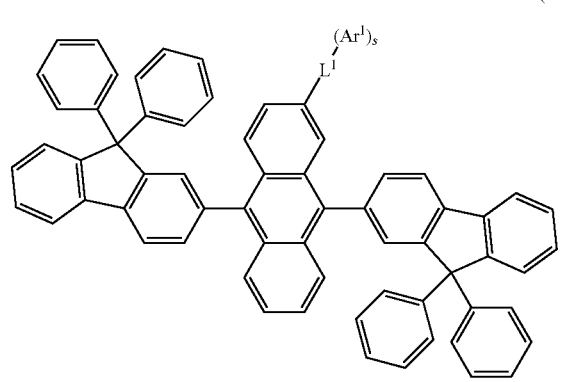

(1-K)
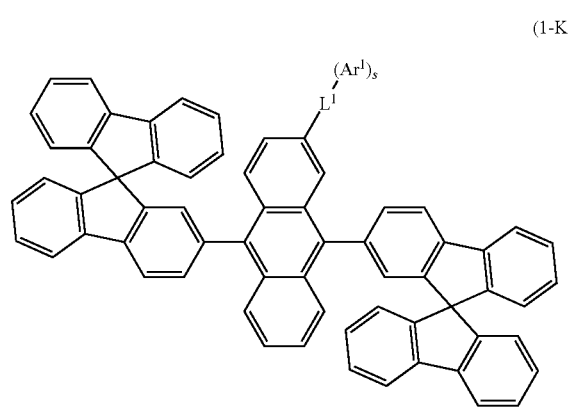

(1-L)
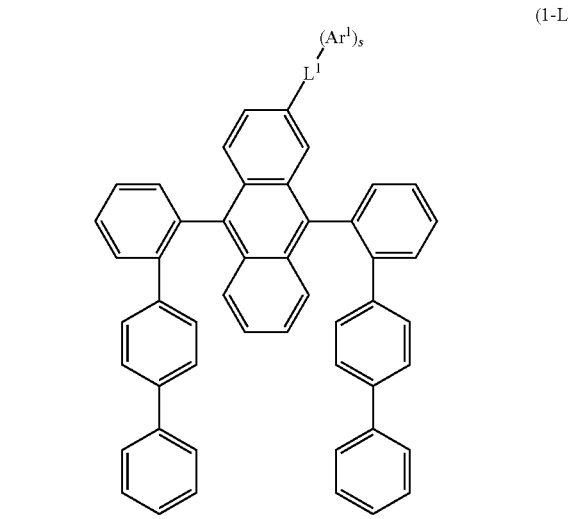

-continued (1-M)
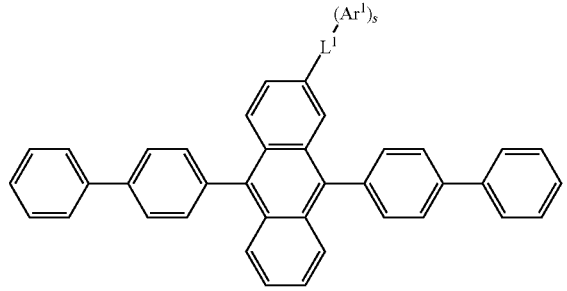

(1-N)

(1-O)

In the formulae (1-A) to (1-O), $Ar^1$, L and s represent the same as those of the formula (1).

The formula (1) is preferably represented by the formula (1-A) or (1-B) among the formulae (1-A) to (1-O), more preferably by the formula (1-B).

In the formula (1), $(Ar^1)s$-L- preferably includes a group represented by the following formula (10-A) or (10-B).

(10-A)
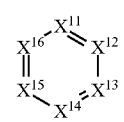

(10-B)
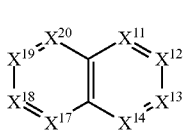

In the formulae (10-A) and (10-B), $X^{11}$ to $X^{20}$ each independently represent a nitrogen atom, $CR^{100}$ or a carbon atom bonded to an adjacent group. However, one to four of $X^{11}$ to $X^{16}$ are a nitrogen atom in the formula (10-A). In the formula (10-B), one to four of $X^{11}$ to $X^{14}$ and $X^{17}$ to $X^{20}$ are a nitrogen atom. $R^{100}$ represents the same as $R^{10}$ of the formula (10). However, adjacent ones of $CR^{100}$ are not mutually bonded to form a ring.

A group derived from the skeleton represented by the formula (10-A) or (10-B) means a monovalent or polyvalent group obtained by removing one or more hydrogen atoms from the skeleton represented by the formula (10-A) or (10-B). The obtained group is a monovalent group when one of $Ar^1$, $Ar^2$ and $Ar^3$ is represented by the formula (10-A) or (10-B) and is a divalent or polyvalent group when one of $L^1$, $L^2$ and $L^3$ is represented by the formula (10-A) or (10-B). When one of $L^1$, $L^2$ and $L^3$ is represented by the formula (10-A) or (10-B), the group derived from the skeleton represented by the formula (10-A) or (10-B) is preferably a divalent or trivalent group, more preferably a divalent group.

When $R^{10}$ is a substituted or unsubstituted aromatic hydrocarbon group in the formula (10), $R^{10}$ is preferably an aromatic hydrocarbon group having 6 to 33 ring carbon atoms, more preferably an aromatic hydrocarbon group having 6 to 25 ring carbon atoms, particularly preferably an aromatic hydrocarbon group having 6 to 20 ring carbon atoms. The aromatic hydrocarbon group having 6 to 20 ring carbon atoms is exemplified by an aromatic hydrocarbon group having 6 to 20 ring carbon atoms among a later-described aromatic hydrocarbon group having 6 to 40 ring carbon atoms.

The group derived from the skeleton represented by the formula (10) is preferably a group derived from a skeleton represented by a formula (10-A1) below. More preferably, in the formula (1), $(Ar^1)s-L^1$- includes the group derived from the skeleton represented by the formula (10-A1).

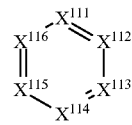
(10-A1)

In the formula (10-A1), $X^{111}$ to $X^{116}$ each are a nitrogen atom, $CR^{101}$, or a carbon atom to be bonded to an adjacent group. However, one to three of $X^{111}$ to $X^{116}$ are a nitrogen atom.

$R^{101}$ represents the same as $R^{10}$ of the formula (10). However, adjacent ones of $CR^{101}$ are not mutually bonded to form a ring.

The group derived from the skeleton represented by the formula (10-A1) means a monovalent or polyvalent group provided by removing one or more hydrogen atoms from the skeleton represented by the formula (10-A1).

The group derived from the skeleton represented by the formula (10) is preferably a group derived from one of groups represented by formulae (10-A11) to (10-A13) below. In the formula (1), $(Ar^1)s$-L- preferably includes a group derived from one of groups represented by the formulae (10-A11) to (10-A13).

(10-A11)

(10-A12)

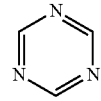
(10-A13)

The group derived from one of the skeletons represented by the formulae (10-A11) to (10-A13) means a monovalent or polyvalent group provided by removing one or more hydrogen atoms from the one of the skeletons represented by the formulae (10-A11) to (10-A13).

In the formula (1), $(Ar^1)s-L^1$- is more preferably represented by formulae (21) to (25) below.

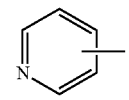
(21)

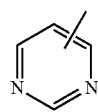
(22)

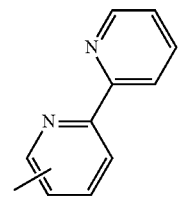
(23)

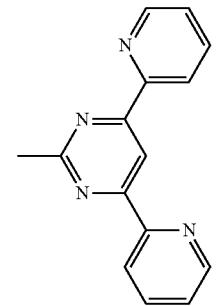
(24)

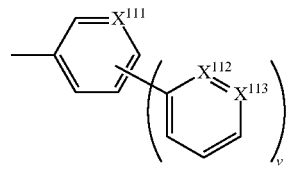
(25)

In each of the formulae (21) to (23), any one of carbon atoms forming a six-membered ring is directly bonded to a position 2 of the anthracene ring of the formula (1).

In the formula (24), an atomic bond is bonded to the position 2 of the anthracene ring of the formula (1).

In the formula (25), $X^{111}$ to $X^{113}$ represent a nitrogen atom or $CR^{211}$.

However, at least one of $X^{111}$ to $X^{113}$ is a nitrogen atom.

$R^{211}$ represents the same as $R^{10}$ of the formula (10).

v is 1 or 2.

In the formula (25), a six-membered ring having $X^{112}$ and $X^{113}$ is directly bonded to any one of carbon atoms of a six-membered ring having $X^{111}$. Further, a six-membered ring having $X^{111}$ is directly bonded to the position 2 of the anthracene ring of the formula (1).

More preferably, the formula (1) is represented by any one selected from the group of the formulae (1-A) to (1-O). $(Ar^1)_s$-$L^1$- in the formulae (1-A) to (1-O) is represented by the formula (21) to (25). Among the formulae (1-A) to (1-O), the formula (1) is preferably represented by the formula (1-A) or (1-B), more preferably by the formula (1-B).

In the formula (1), at least one of $(Ar^2)_t$-$L^2$- and $(Ar^3)_u$-$L^3$- is a substituted or unsubstituted aromatic hydrocarbon group having 6 to 33 ring carbon atoms or a substituted or unsubstituted heterocyclic group having 5 to 33 ring atoms. When the at least one of $(Ar^2)_t$-$L^2$- and $(Ar^3)_u$-$L^3$- is the heterocyclic group, the heterocyclic group preferably does not include a group derived from a skeleton represented by a formula (X-40) below.

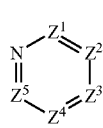
(X-40)

In the formula (X-40), $Z^1$ to $Z^5$ represent $CR^{140}$ in which $R^{140}$ represents the same as $R^{10}$ of the formula (10). However, $R^{140}$ is not mutually bonded to form a ring. One of $Z^1$ to $Z^5$ is a carbon atom bonded to the anthracene ring.

In the formula (1), $(Ar^2)_t$-$L^2$- and $(Ar^3)_u$-$L^3$- preferably have the same structure.

The formula (1) is preferably represented by the following formula (1-A) or (1-B).

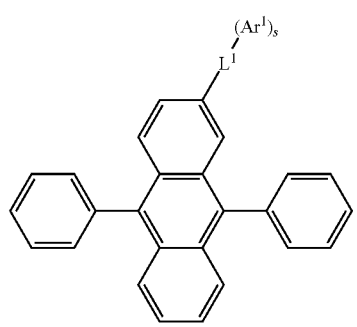
(1-A)

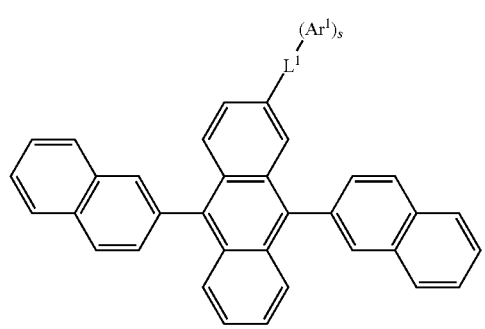
(1-B)

In the formulae (1-A) and (1-B), $Ar^1$, $L^1$ and s represent the same as $Ar^1$, L and s of the formula (1).

In the formula (1), it is preferable that $L^1$, $L^2$ and $L^3$ are each independently represented by any one of formulae (L11) to (L14) below.

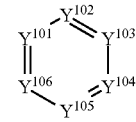
(L11)

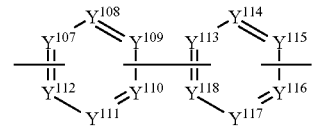
(L12)

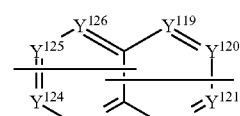
(L13)

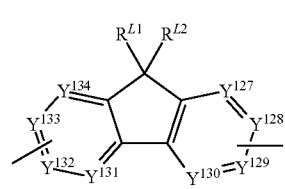
(L14)

In the formulae (L11) to (L14), $Y^{101}$ to $Y^{134}$ are $CR^{150}$. $R^{150}$ represents the same as $R^{11}$ of the formula (1). However, two of $Y^{101}$ to $Y^{106}$, one of $Y^{107}$ to $Y^{112}$, one of $Y^{113}$ to $Y^{118}$, two of $Y^{119}$ to $Y^{126}$, one of $Y^{127}$ to $Y^{130}$, and one of $Y^{131}$ to $Y^{134}$ each are a carbon atom bonded to an adjacent group. $R^{L1}$ and $R^{L2}$ represent the same as $R^{11}$ of the formula (1).

In the formula (1), it is preferable that $L^1$, $L^2$ and $L^3$ are each independently represented by any one of formulae (L-1) to (L-9) below.

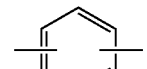
(L-1)

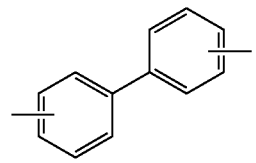
(L-2)

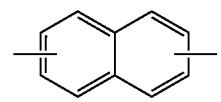
(L-3)

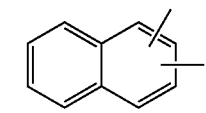
(L-4)

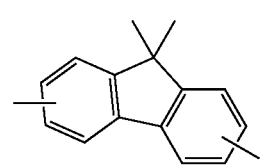
(L-5)

(L-6)
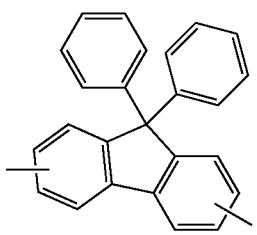

(L-7)
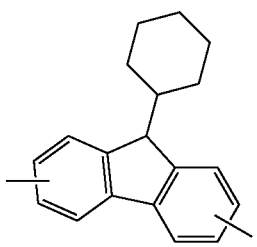

(L-8)
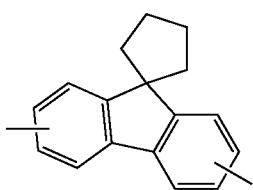

(L-9)
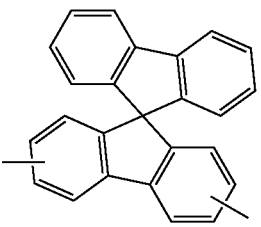

In the formulae (L-1) to (L-9), one of atomic bonds is for bonding a carbon atom of a benzene ring in the formulae (L-1) to (L-9) to the anthracene ring of the formula (1) while the other of the atomic bonds is for bonding a carbon atom of the benzene ring or another benzene ring in the formulae (L-1) to (L-9) to any one of $Ar^1$ to $Ar^3$.

The formulae (L-1) to (L-9) are exemplified by the following formulae.

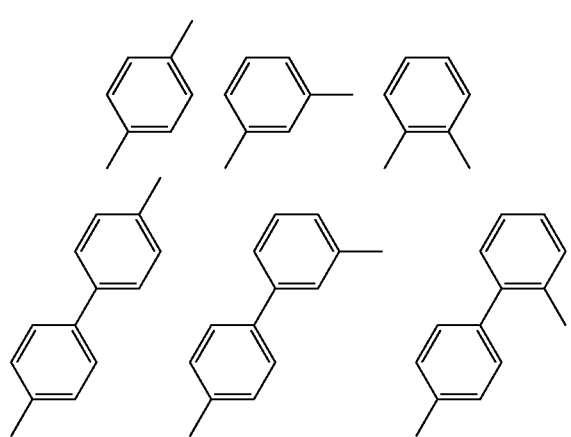

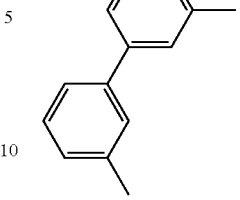 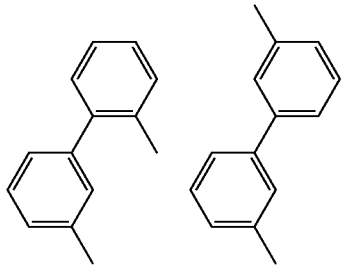

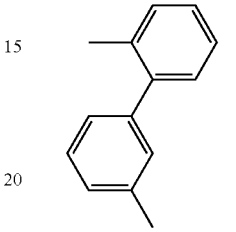 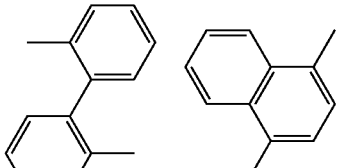

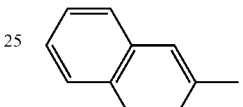 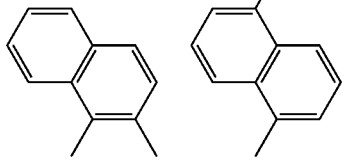

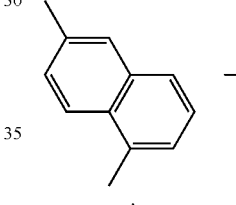 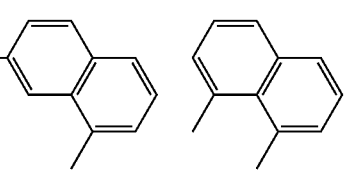

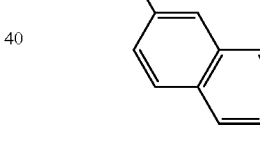 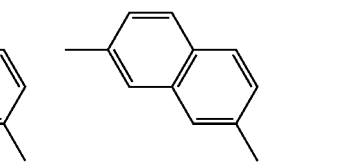

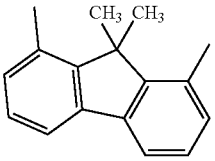 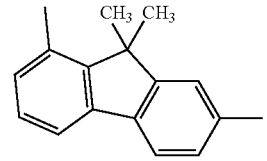

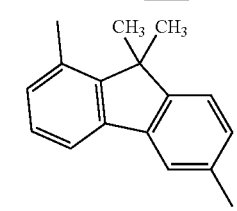 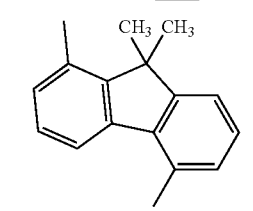

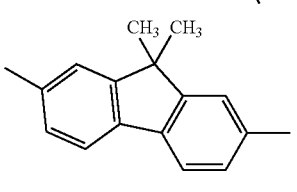 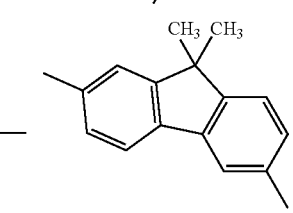

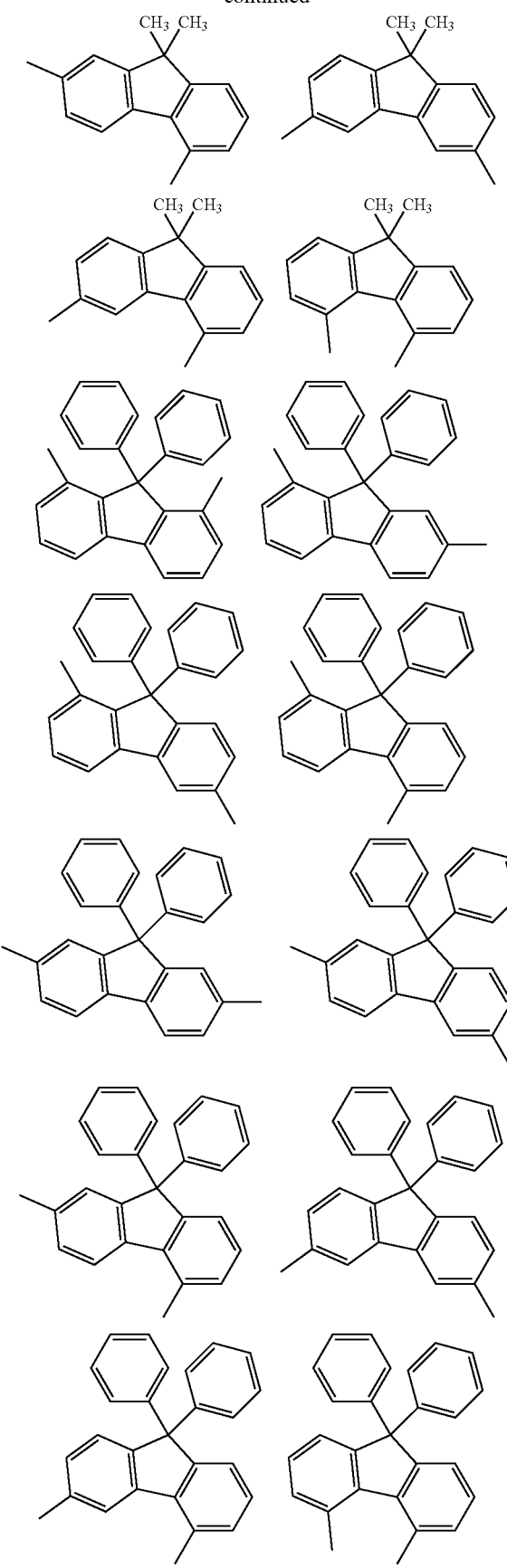
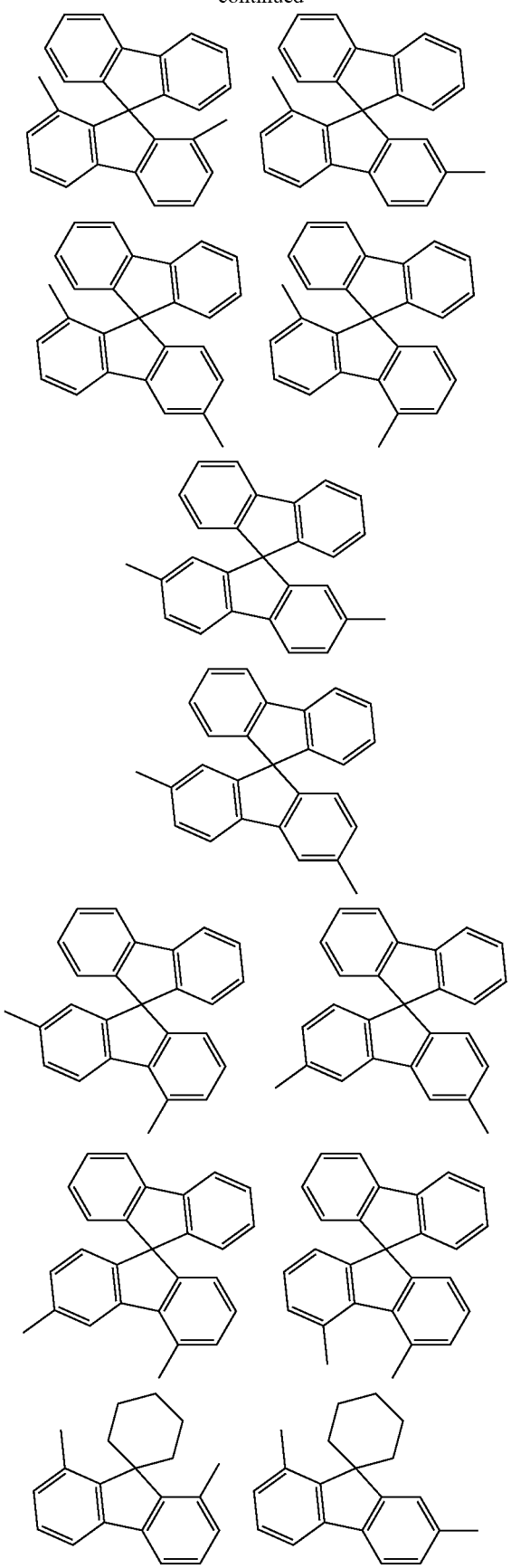

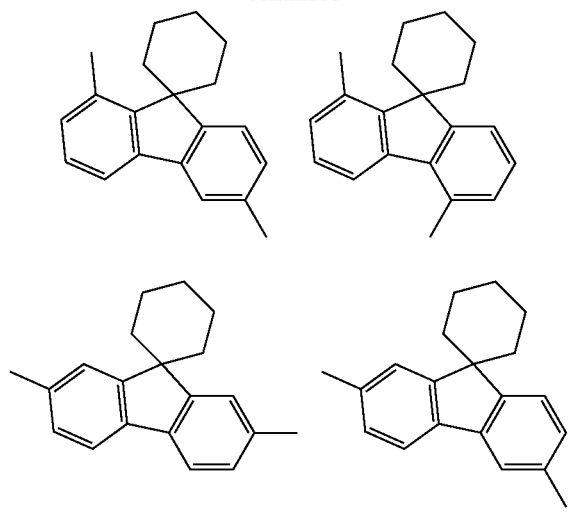
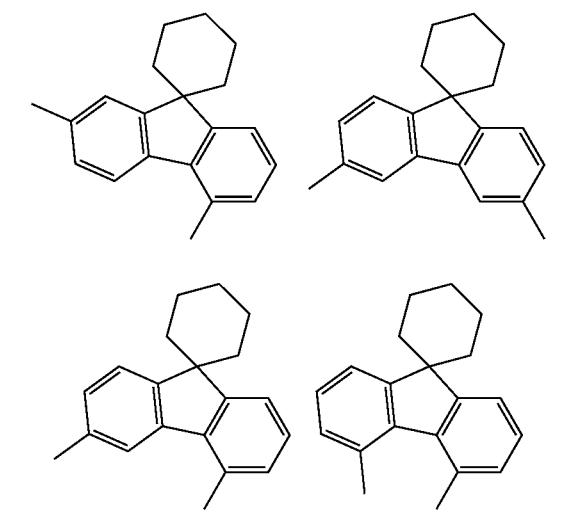
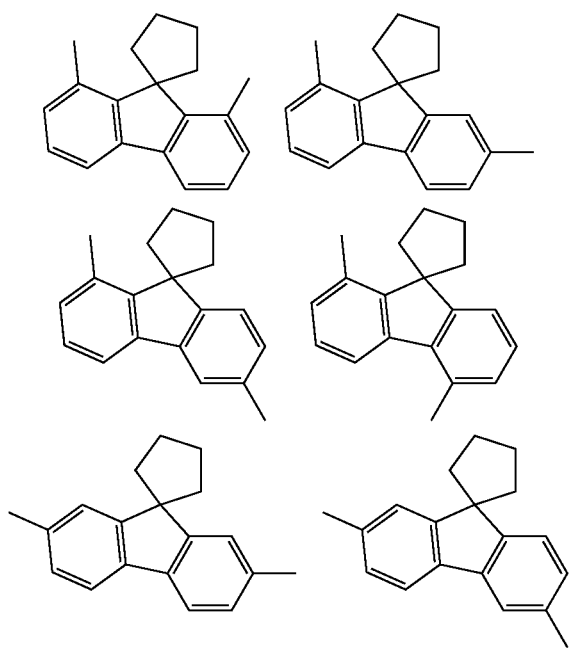

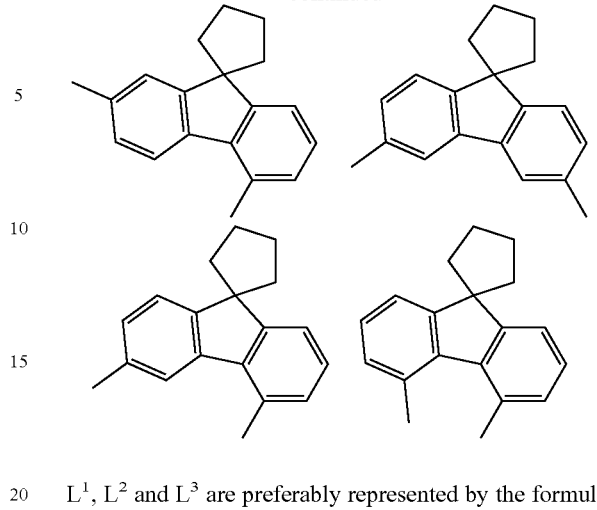

L¹, L² and L³ are preferably represented by the formulae (L-1) to (L-4) among the formulae (L-1) to (L-9), more preferably any one of formulae (L-101) to (L-103) below.

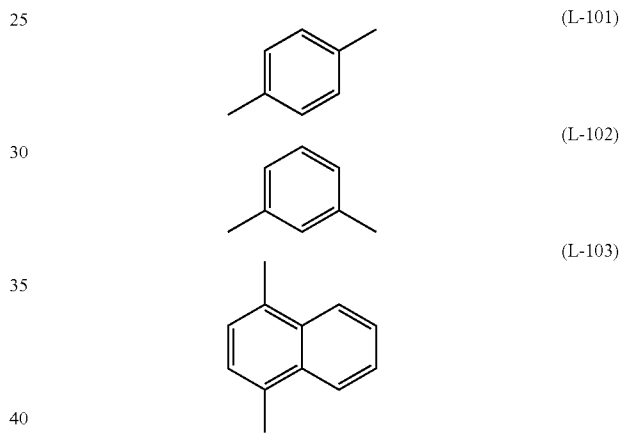

The formula (1) is also preferably represented by the following formula (30).

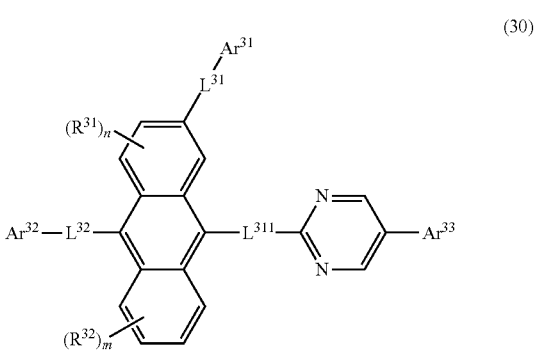

In the formula (30), $L^{31}$, $L^{32}$ and $L^{311}$ each independently represent a single bond and a phenylene group. $Ar^{31}$, $Ar^{32}$ and $Ar^{33}$ each independently represent a hydrogen atom, a phenyl group, a naphthyl group, or the group derived from the skeleton represented by the formula (10).

Further, the formula (30) is preferably represented by a formula (31) below.

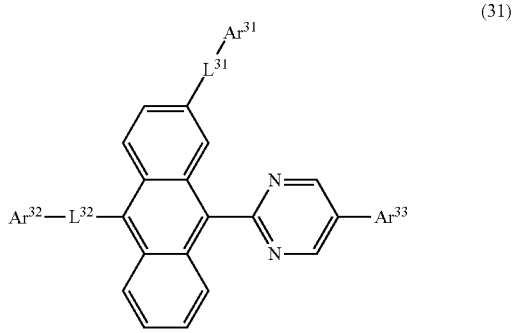

(31)

In the formula (31), $Ar^{31}$, $Ar^{32}$, $Ar^{33}$, $L^{31}$ and $L^{32}$ represent the same as those of the formula (3).

Next, substituents described in each of the formulae (1) to (3), (1-A) to (1-O), (10), (10-A), (10-B), (10-A1), (100-1) to (100-6), (100-11) to (100-14), (101), (201) to (202), (201A), (202A), (25), (30) to (31), (L), (L11) to (L14), (X-40), (X-100), (X-145) and (X-148) (hereinafter, referred to as "the formula (1) and the like") will be described. Examples of the substituents described in the formula (1) and the like include a halogen atom, cyano group, nitro group, hydroxyl group, carboxyl group, sulfonyl group, mercapto group, substituted or unsubstituted boryl group, substituted or unsubstituted phosphino group, substituted or unsubstituted acyl group, substituted or unsubstituted amino group, substituted or unsubstituted silyl group, substituted or unsubstituted alkyl group having 1 to 30 carbon atoms, substituted or unsubstituted alkenyl group having 2 to 30 carbon atoms, substituted or unsubstituted alkynyl group having 2 to 30 carbon atoms, substituted or unsubstituted aralkyl group having 6 to 30 carbon atoms, substituted or unsubstituted alkoxy group having 1 to 30 carbon atoms, substituted or unsubstituted aryloxy group having 6 to 40 ring carbon atoms, substituted or unsubstituted heteroaryloxy group having 5 to 40 ring carbon atoms, substituted or unsubstituted alkylthio group having 1 to 30 carbon atoms, substituted or unsubstituted arylthio group having 6 to 40 ring carbon atoms, substituted or unsubstituted heteroarylthio group having 5 to 40 ring carbon atoms, substituted or unsubstituted alkoxycarbonyl group having 2 to 30 carbon atoms, substituted or unsubstituted aryloxycarbonyl group having 6 to 40 ring carbon atoms, substituted or unsubstituted heteroaryloxycarbonyl group having 5 to 40 ring carbon atoms, substituted or unsubstituted aromatic hydrocarbon group having 6 to 40 ring carbon atoms, and substituted or unsubstituted heterocyclic group having 5 to 40 ring atoms.

Examples of the halogen atom in the formula (1) and the like include fluorine, chlorine, bromine and iodine, among which fluorine is preferable.

Examples of the substituted or unsubstituted boryl group in the formula (1) and the like include a boryl group ($-BH_2$) and $-BR^E R^E$ obtained by substituting H of a boryl group ($-BH_2$) by $R^E$ and $R^E$.

Herein, when $R^E$ is an alkyl group, $-BR^E R^E$ becomes an alkylboryl group, which is preferably a substituted or unsubstituted alkylboryl group. The alkyl group as $R^E$ is preferably an alkyl group having 1 to 30 carbon atoms below.

When $R^E$ is an aryl group, $-BR^E R^E$ becomes an arylboryl group, which is preferably a substituted or unsubstituted arylboryl group. The aryl group as $R^E$ is preferably an aromatic hydrocarbon group having 6 to 40 ring carbon atoms below.

When $R^E$ is a heteroaryl group, $-BR^E R^E$ becomes a heteroarylboryl group, which is preferably a substituted or unsubstituted heteroarylboryl group. The heteroaryl group as $R^E$ is preferably a heterocyclic group having 5 to 40 ring atoms below.

In addition, $-BR^E R^E$ is exemplified by a dihydroxyboryl group ($-B(OH)_2$).

Examples of the substituted or unsubstituted phosphino group in the formula (1) and the like include a phosphino group ($-PH_2$), $-PR^F R^F$ obtained by substituting H of a phosphino group ($-PH_2$) by $R^F$ and $R^F$, and a group represented by $-P(O)R^F R^F$.

Herein, when $R^F$ is an alkyl group, $-PR^F R^F$ becomes an alkylphosphino group, which is preferably a substituted or unsubstituted alkylphosphino group. The alkyl group as $R^F$ is preferably the following alkyl group having 1 to 30 carbon atoms.

When $R^F$ is an aryl group, $-PR^F R^F$ becomes an arylphosphino group, which is preferably a substituted or unsubstituted arylphosphino group. The aryl group as $R^F$ is preferably the following aromatic hydrocarbon group having 6 to 40 ring carbon atoms.

When $R^F$ is a heteroaryl group, $-PR^F R^F$ becomes a heteroarylphosphino group, which is preferably a substituted or unsubstituted heteroarylphosphino group. The heteroaryl group as $R^F$ is preferably the following heterocyclic group having 5 to 40 ring atoms.

The substituted or unsubstituted acyl group in the formula (1) and the like is represented by $-CO-R^D$.

Herein, when $R^D$ is an alkyl group, $-CO-R^D$ becomes an alkylcarbonyl group, among which a substituted or unsubstituted alkylcarbonyl group having 2 to 30 carbon atoms is preferable. The alkyl group as $R^D$ is preferably the following alkyl group having 1 to 30 carbon atoms. Examples of the alkylcarbonyl group include an acetyl group, propionyl group, butynyl group, valeryl group, pivaloyl group, palmitoyl group, stearoyl group and oleoyl group.

When $R^D$ is an aryl group, $-CO-R^D$ becomes an arylcarbonyl group (also referred to as an aroyl group), among which a substituted or unsubstituted arylcarbonyl group is preferable. The aryl group as $R^D$ is preferably the following aromatic hydrocarbon group having 6 to 40 ring carbon atoms. Examples of the arylcarbonyl group include a benzoyl group, toluoyl group, salicyloyl group, cinnamoyl group, naphthoyl group, and phthaloyl group.

When $R^D$ is a heteroaryl group, $-CO-R^D$ becomes a heteroarylcarbonyl group, among which a substituted or unsubstituted heteroarylcarbonyl group having 5 to 40 ring atoms is preferable. The heteroaryl group as $R^D$ is preferably the following heterocyclic group having 5 to 40 ring atoms. Examples of the heteroarylcarbonyl group include a furoyl group, pyrrolylcarbonyl group, pyridylcarbonyl group, and thienylcarbonyl group.

It should be noted that a formyl group ($-CO-H$) including H as $R^D$ is also included in examples of the above acyl group.

Examples of the substituted or unsubstituted amino group in the formula (1) and the like include an amino group ($-NH_2$) and an amino group obtained by substituting H in an amino group ($-NH_2$) by a substituent. Examples of such an amino group include an alkylamino group obtained by substituting an amino group by a substituted or unsubstituted alkyl group having 1 to 30 carbon atoms, an arylamino group obtained by substituting an amino group by a substituted or unsubstituted aryl group having 6 to 40 ring carbon atoms, a heteroarylamino group obtained by substituting an amino group by a substituted or unsubstituted heteroaryl group having 5 to 40 ring atoms, and an acylamino group obtained by substituting an amino group by a substituted or unsubstituted acyl group having 2 to 30 carbon atoms.

The alkyl group having 1 to 30 carbon atoms in the alkylamino group is preferably an alkyl group having 1 to 30 carbon atoms as follows. When the amino group is substituted by two alkyl groups, the two alkyl groups may be the same or different.

The aryl group having 6 to 40 ring carbon atoms in the arylamino group is preferably an aromatic hydrocarbon group having 6 to 40 ring carbon atoms below. The arylamino group is preferably an amino group substituted by a phenyl group. When the amino group is substituted by two aryl groups, the two aryl groups may be the same or different.

The heteroaryl group having 5 to 40 ring atoms in the heteroarylamino group is preferably a heterocyclic group having 5 to 40 ring atoms as follows. When the amino group is substituted by two heteroaryl groups, the two heteroaryl groups may be the same or different.

The acyl group having 2 to 30 carbon atoms in the acylamino group is preferably selected from the above acyl group.

The substituted amino group may be an amino group substituted by two of a hydrogen atom, alkyl group, aryl group, heteroaryl group and acyl group.

For instance, the substituted amino group may be an amino group substituted by an alkyl group and an aryl group. Examples of such an amino group include an alkylarylamino group, alkylheteroarylamino group, arylheteroarylamino group, alkylacylamino group and arylacylamino group.

Examples of the substituted or unsubstituted silyl group in the formula (1) and the like include an unsubstituted silyl group, an alkylsilyl group obtained by substituting an silyl group by a substituted or unsubstituted alkyl group having 1 to 30 carbon atoms, an arylsilyl group obtained by substituting an silyl group by a substituted or unsubstituted aryl group having 6 to 40 ring carbon atoms, and a heteroarylsilyl group obtained by substituting an silyl group by a substituted or unsubstituted heteroaryl group having 5 to 40 ring atoms.

The alkylsilyl group is exemplified by a trialkylsilyl group having the above-described alkyl group having 1 to 30 carbon atoms. Specific examples of the trialkylsilyl group include a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl grou-p, diethylisopropylsilyl group, vinyldimethylsilyl group, propyldimethylsilyl group and triisopropylsilyl group. Three alkyl groups may be the same or different.

The arylsilyl group is exemplified by a triarylsilyl group having three of the following aromatic hydrocarbon group having 6 to 30 ring carbon atoms. Three aryl groups may be the same or different.

The heteroarylsilyl group is exemplified by a triheteroarylsilyl group having three of the following heterocyclic group having 5 to 40 ring atoms. Three heteroaryl groups may be the same or different.

The substituted silyl group may be a silyl group substituted by at least two of an alkyl group, aryl group and heteroaryl group.

For instance, the substituted silyl group may be a silyl group substituted by an alkyl group and an aryl group. Examples of such a silyl group include an alkylarylsilyl group, dialkylarylsilyl group, diarylsilyl group, alkyldiarylsilyl group and triarylsilyl group. A plurality of aryl groups or a plurality of alkyl groups may be the same or different.

The dialkylarylsilyl group is exemplified by a dialkylarylsilyl group having two of the examples of the alkyl group having 1 to 30 carbon atoms and one of the following aromatic hydrocarbon group having 6 to 40 ring carbon atoms. The dialkylarylsilyl group preferably has 8 to 30 carbon atoms. Two alkyl groups may be the same or different.

The alkyldiarylsilyl group is exemplified by an alkyldiarylsilyl group having one of the examples of the alkyl group having 1 to 30 carbon atoms and two of the aryl group having 6 to 40 ring carbon atoms. The dialkylarylsilyl group preferably has 13 to 30 carbon atoms. Two aryl groups may be the same or different.

Examples of the above arylsilyl group are a phenyldimethylsilyl group, a diphenylmethylsilyl group, a diphenyl-t-butylsilyl group and a triphenylsilyl group.

The substituted silyl group may be a silyl group substituted by an alkyl group and a heteroaryl group, a silyl group substituted by an aryl group and a heteroaryl group, and a silyl group substituted by an alkyl group, an aryl group and a heteroaryl group.

The substituted or unsubstituted alkyl group having 1 to 30 carbon atoms in the formula (1) and the like may be linear, branched or cyclic. The substituted alkyl group having 1 to 30 carbon atoms includes a haloalkyl group. The haloalkyl group is exemplified by a haloalkyl group provided by substituting the alkyl group having 1 to 30 carbon atoms by one or more halogen atoms. Examples of the substituted or unsubstituted linear or branched alkyl group are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 1,2-dinitroethyl group, 2,3-dinitro-t-butyl group, 1,2,3-trinitropropyl group, fluoromethyl group, difluoromethyl group, trifluoromethyl group, fluoroethyl group, 2,2,2-trifluoroethyl group, and 1,1,1,3,3,3-hexafluoro-2-propyl group.

The substituted or unsubstituted cyclic alkyl group (cycloalkyl group) is preferably a substituted or unsubstituted cycloalkyl group having 3 to 30 carbon atoms, examples of which include a cyclopropyl group, cyclobutyl group, cyclopentyl group, cyclohexyl group, cyclooctyl group, 4-methylcyclohexyl group, 3,5-tetramethylcyclohexyl group, 1-adamantyl group, 2-adamantyl group, 1-norbornyl group and 2-norbornyl group.

Among the above alkyl group, the alkyl group having 1 to 10 carbon atoms is preferable, the alkyl group having 1 to 8 carbon atoms is more preferable, and the alkyl group having 1 to 6 carbon atoms is particularly preferable. A methyl group, isopropyl group, t-butyl group and cyclohexyl group are particularly preferable.

The substituted or unsubstituted alkenyl group having 2 to 30 carbon atoms in the formula (1) and the like may be linear, branched or cyclic. Examples of the alkenyl group are vinyl group, propenyl group, butenyl group, oleyl group, eicosapentaenyl group, docosahexaenyl group, styryl group, 2,2-diphenylvinyl group, 1,2,2-triphenylvinyl group and 2-phenyl-2-propenyl group, among which a vinyl group is preferable.

Examples of the substituted or unsubstituted alkynyl group having 2 to 30 carbon atoms in the formula (1) and the like include ethynyl, propynyl and 2-phenylethynyl, among which an ethynyl group is preferable.

The aralkyl group having 7 to 40 carbon atoms in the formula (1) and the like is represented by —$R^E$—$R^F$. $R^E$ is exemplified by an alkylene group provided as a divalent group derived from the alkyl group having 1 to 30 carbon atoms. $R^F$ is exemplified by the examples of the following aromatic hydrocarbon group having 6 to 40 ring carbon atoms.

In the aralkyl group, an aryl group moiety has 6 to 40 carbon atoms, preferably 6 to 20 carbon atoms, more preferably 6 to 12 carbon atoms. In the aralkyl group, an alkyl group moiety has 1 to 30 carbon atoms, preferably 1 to 20 carbon atoms, more preferably 1 to 10 carbon atoms, further preferably 1 to 6 carbon atoms. Examples of the aralkyl group are a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrorylmethyl group, 2-(1-pyroryl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

In the formula (1) and the like, the substituted or unsubstituted alkoxy group having 1 to 30 carbon atoms, substituted or unsubstituted aryloxy group having 6 to 40 ring carbon atoms, and substituted or unsubstituted heteroaryloxy group having 5 to 40 ring carbon atoms are represented by —$OR^A$.

Herein, when $R^A$ is an alkyl group, —$OR^A$ becomes an alkoxy group, among which a substituted or unsubstituted alkoxy group having 1 to 30 carbon atoms is preferable. The alkyl group as $R^A$ is preferably the above-described alkyl group having 1 to 30 carbon atoms. Examples of the alkoxy group are a methoxy group, ethoxy group, propoxy group, butoxy group, pentyloxy group and hexyloxy group. Among the alkoxy group, an alkoxy group having 1 to 10 carbon atoms is preferable and an alkoxy group having 1 to 8 carbon atoms is more preferable. An alkoxy group having 1 to 4 carbon atoms is particularly preferable.

The substituted or unsubstituted alkoxy group described herein includes a haloalkoxy group obtained by substituting an alkyl group as $R^A$ by one or more of the above-described halogen atom.

When $R^A$ is an aryl group, —$OR^A$ becomes an aryloxy group, among which a substituted or unsubstituted aryloxy group having 6 to 40 ring carbon atoms is preferable.

The aryl group as $R^A$ is preferably the following aromatic hydrocarbon group having 6 to 40 ring carbon atoms. The aryloxy group is exemplified by a phenoxy group.

The substituted or unsubstituted aryloxy group described herein includes a haloaryloxy group obtained by substituting an aryl group as $R^A$ by one or more of the above-described halogen atom.

When $R^A$ is a heteroaryl group, —$OR^A$ becomes a heteroaryloxy group, among which a substituted or unsubstituted heteroaryloxy group having 5 to 40 ring atoms is preferable. The heteroaryl group as $R^A$ is preferably the following heterocyclic group having 5 to 40 ring atoms.

In the formula (1) and the like, the substituted or unsubstituted alkylthio group having 1 to 30 carbon atoms, substituted or unsubstituted arylthio having 6 to 40 ring carbon atoms, and substituted or unsubstituted heteroarylthio group having 5 to 40 ring carbon atoms are represented by —$SR^C$.

Herein, when $R^C$ is an alkyl group, —$SR^C$ becomes an alkylthio group, among which a substituted or unsubstituted alkylthio group having 1 to 30 carbon atoms is preferable. The alkyl group as $R^C$ is preferably the above-described alkyl group having 1 to 30 carbon atoms.

When $R^C$ is an aryl group, —$SR^C$ becomes an arylthio group, among which a substituted or unsubstituted arylthio group having 6 to 40 ring carbon atoms is preferable.

The aryl group as $R^C$ is preferably the following aromatic hydrocarbon group having 6 to 40 ring carbon atoms.

When $R^C$ is a heteroaryl group, —$SR^C$ becomes a heteroarylthio group, among which a substituted or unsubstituted heteroarylthio group having 5 to 40 ring atoms is preferable. The heteroaryl group as $R^C$ is preferably the following heterocyclic group having 5 to 40 ring atoms.

In the formula (1) and the like, the substituted or unsubstituted heteroarylcarbonyl group having 6 to 40 ring carbon atoms, substituted or unsubstituted alkoxycarbonyl group having 2 to 30 carbon atoms, substituted or unsubstituted aryloxycarbonyl group having 6 to 40 ring carbon atoms, and substituted or unsubstituted heteroaryloxycarbonyl group having 5 to 40 ring carbon atoms are represented by —$COOR^B$.

Herein, when $R^B$ is an alkyl group, —$COOR^B$ becomes an alkoxycarbonyl group, among which a substituted or unsubstituted alkoxycarbonyl group having 2 to 30 carbon atoms is preferable. The alkyl group as $R^B$ is preferably the above-described alkyl group having 1 to 30 carbon atoms.

When $R^B$ is an aryl group, —$COOR^B$ becomes an aryloxycarbonyl group, among which a substituted or unsubstituted aryloxycarbonyl group having 7 to 40 ring carbon atoms is preferable. The aryl group as $R^B$ is preferably the following aromatic hydrocarbon group having 6 to 40 ring carbon atoms.

When $R^B$ is a heteroaryl group, —COOR$^B$ becomes a heteroaryloxycarbonyl group, among which a substituted or unsubstituted heteroaryloxycarbonyl group having 5 to 40 ring atoms is preferable. The heteroaryl group as RB is preferably the following heterocyclic group having 5 to 40 ring atoms.

The aromatic hydrocarbon group having 6 to 40 ring carbon atoms in the formula (1) and the like is exemplified by a non-fused aromatic hydrocarbon group and a fused aromatic hydrocarbon group, examples of which include a phenyl group, naphthyl group, anthryl group, phenanthryl group, biphenyl group, terphenyl group, quaterphenyl group, fluoranthenyl group, pyrenyl group, triphenylenyl group, phenanthrenyl group, fluorenyl group, 9,9-dimethylfluorenyl group, spirofluorenyl group, benzo[c]phenanthrenyl group, benzo[a]triphenylenyl group, naphtho[1,2-c]phenanthrenyl group, naphtho[1,2-a]triphenylenyl group, dibenzo[a,c]triphenylenyl group, benzo[b]fluoranthenyl group and spiroaromatic ring group. Among the above aromatic hydrocarbon group, the aromatic hydrocarbon group having 6 to 30 ring carbon atoms is more preferable, the aromatic hydrocarbon group having 6 to 20 ring carbon atoms is further preferable, and the aromatic hydrocarbon group having 6 to 12 carbon atoms is particularly preferable.

The spiroaromatic ring group is a compound represented by a formula (A) below.

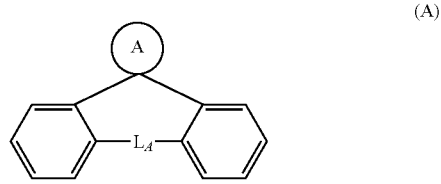

In the formula (A), A represents a cyclic structure. $L_A$ represents a single bond, —O—, —S—, —NR'— or —CR"R'"— (in which R', R" and R'" each independently represent a substituted or unsubstituted alkyl group having 1 to 50 carbon atoms or a substituted or unsubstituted aryl group having 6 to 40 carbon atoms).

Examples of the spiroaromatic ring group represented by the formula (A) include a spiro(cyclohexane-1,9'-fluorene)-2'-yl group, spiro(cyclopentane-1,9'-fluorene)-2'-yl group, spiro(indene-1,9'-fluorene)-2'-yl group, dispiro(bisfluorene-9,10,9',9"-9,9,10,10-tetrahydroanthracene)-2-yl group, dispiro(bisfluorene-9,10,9',9"-9,9,10,10-tetrahydroanthracene)-2'-yl group, and 9,9'-spirobifluorene-2-yl group.

The heterocyclic group having 5 to 40 ring atoms in the formula (1) and the like is exemplified by a non-fused heterocyclic group and a fused heterocyclic group, examples of which include a pyroryl group, pyrazinyl group, pyridinyl group, indolyl group, isoindolyl group, furyl group, benzofuranyl group, isobenzofuranyl group, dibenzofuranyl group, dibenzothiophenyl group, quinolyl group, isoquinolyl group, quinoxalinyl group, carbazolyl group, phenanthrydinyl group, acridinyl group, phenanthrolinyl group, thienyl group, and group formed based on a pyridine ring, pyrazine ring, pyrimidine ring, pyridazine ring, triazine ring, indole ring, quinoline ring, acridine ring, pyrrolidine ring, dioxane ring, piperidine ring, morpholine ring, piperazine ring, carbazole ring, furan ring, thiophene ring, oxazole ring, oxadiazole ring, benzoxazole ring, thiazole ring, thiadiazole ring, benzothiazole ring, triazole ring, imidazole ring, benzimidazole ring, pyrane ring, dibenzofuran ring, benzo[c]dibenzofuran ring and silafluorene ring. Among the above heterocyclic group, the heterocyclic group having 5 to 40 ring atoms is more preferable, the heterocyclic group having 5 to 20 ring atoms is further preferable, and the heterocyclic group having 5 to 12 ring atoms is particularly preferable.

When $L^1$, $L^2$, $L^3$, $L^{201}$ and $L^{311}$ in the formulae (1), (100-1) to (100-6), (100-11) to (100-14), (1-A) to (1-O) and (L) are the linking groups, the polyvalent aromatic hydrocarbon group having 6 to 40 ring carbon atoms is exemplified by a polyvalent group derived from the above aromatic hydrocarbon group having 6 to 40 ring carbon atoms, among which a divalent or trivalent group is preferable and a divalent group is more preferable. Specifically, divalent groups derived from a phenyl group, biphenyl group, naphthyl group, and 9,9-dimethylfluorenyl group are preferable. The divalent groups may have the above substituents.

When $L^1$, $L^2$, $L^3$, $L^{201}$ and $L^{311}$ in the formulae (1), (100-1) to (100-6), (100-11) to (100-14), (1-A) to (1-O) and (L) are the linking groups, the polyvalent heterocyclic group having 5 to 40 ring atoms is exemplified by a polyvalent group derived from the above heterocyclic group having 5 to 40 ring atoms, among which a divalent or trivalent group is preferable and a divalent group is more preferable. Specifically, divalent groups derived from a pyridyl group, pyrimidyl group, dibenzofuranyl group, dibenzothiophenyl group, silafluorenyl group and carbazolyl group are preferable. The divalent groups may have the above substituents.

In the invention, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a hetero ring including a saturated ring, unsaturated ring, or aromatic ring.

In the invention, a "hydrogen atom" means isotopes having different neutron numbers and specifically encompasses protium, deuterium and tritium.

Examples of the substituent meant by "substituted or unsubstituted" are the above-described aryl group, heteroaryl group, alkyl group (linear or branched alkyl group, cycloalkyl group and haloalkyl group), alkoxy group, aryloxy group, aralkyl group, haloalkoxy group, alkylsilyl group, dialkylarylsilyl group, alkyldiarylsilyl group, triarylsilyl group, halogen atom, cyano group, hydroxyl group, nitro group and carboxy group. In addition, the alkenyl group and alkynyl group are also included.

In the above-described substituents, the aryl group, heteroaryl group, alkyl group, halogen atom, alkylsilyl group, arylsilyl group and cyano group are preferable. The preferable ones of the specific examples of each substituent are further preferable.

A substituent meant by "substituted or unsubstituted" for $R^{11}$ and $R^{12}$ is more preferably a substituent having no aryl and heteroaryl among the above-described substituents.

"Unsubstituted" in "substituted or unsubstituted" means that a group is not substituted by the above-described substituents but bonded with a hydrogen atom.

Herein, "a to b carbon atoms" in the description of "substituted or unsubstituted XX group having a to b carbon atoms" represent carbon atoms of an unsubstituted XX group and does not include carbon atoms of a substituted XX group.

In a later-described compound or a partial structure thereof, the same applies to the description of "substituted or unsubstituted."

Specific examples of the compound represented by the formula (1) are shown below, but the compound represented by the formula (1) is not limited thereto.

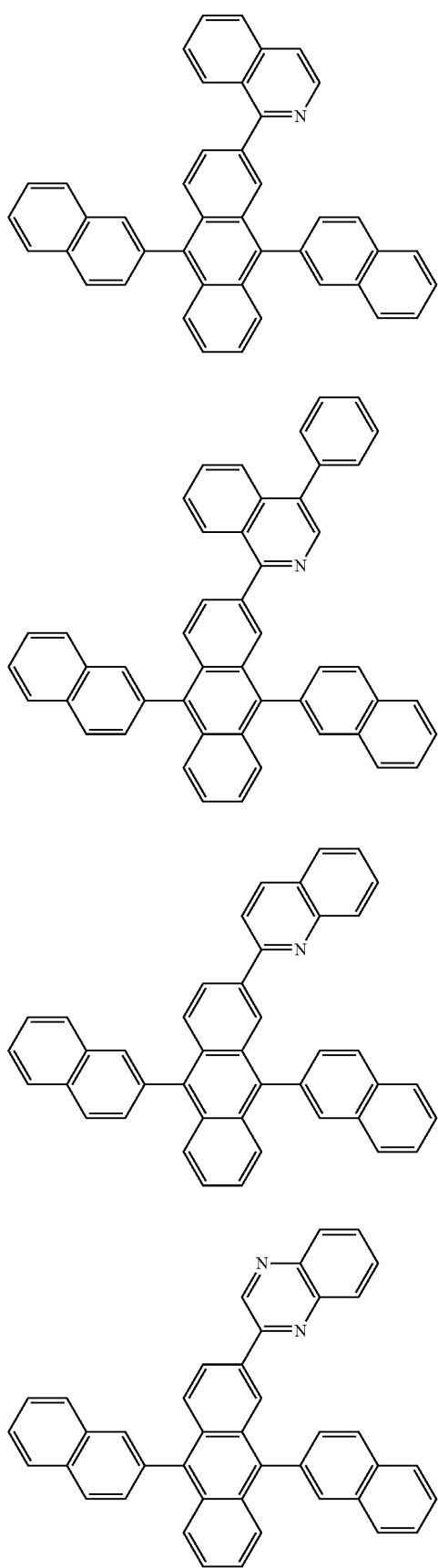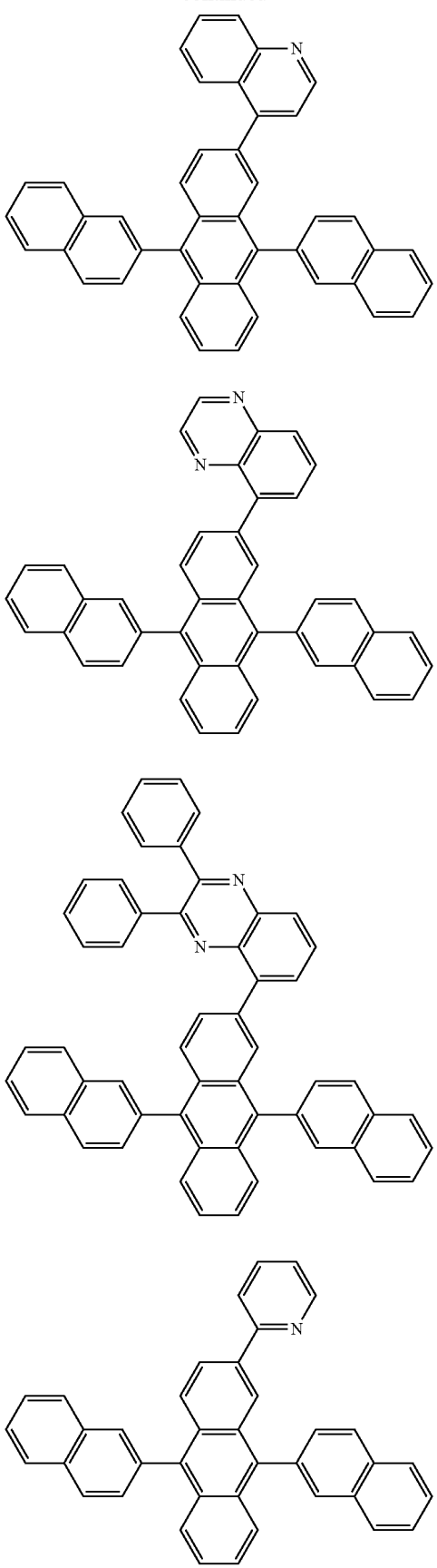
-continued

51
-continued
52
-continued
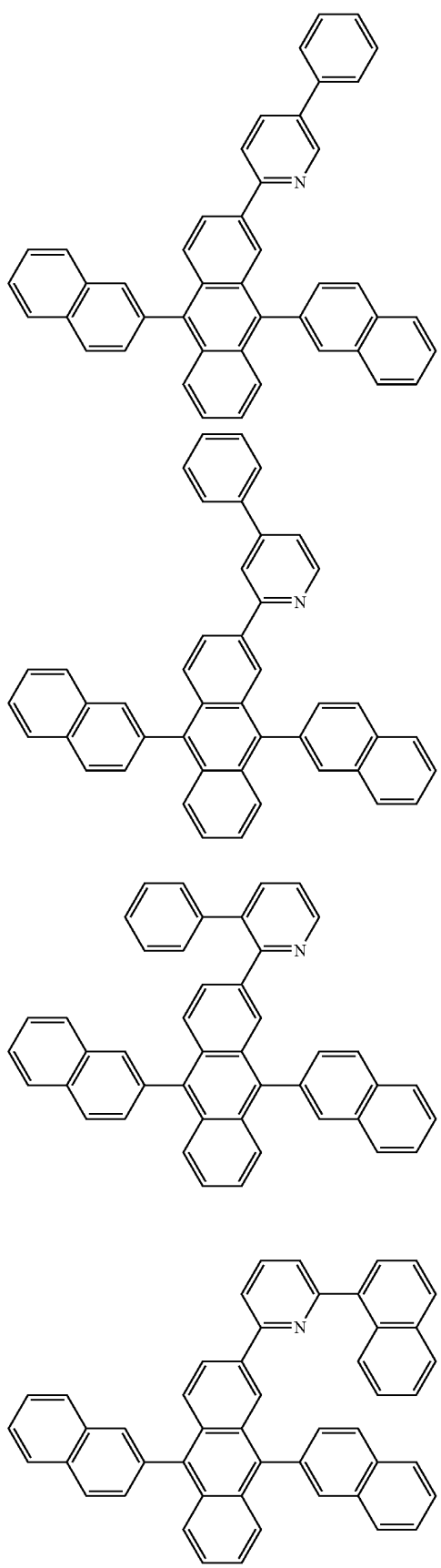
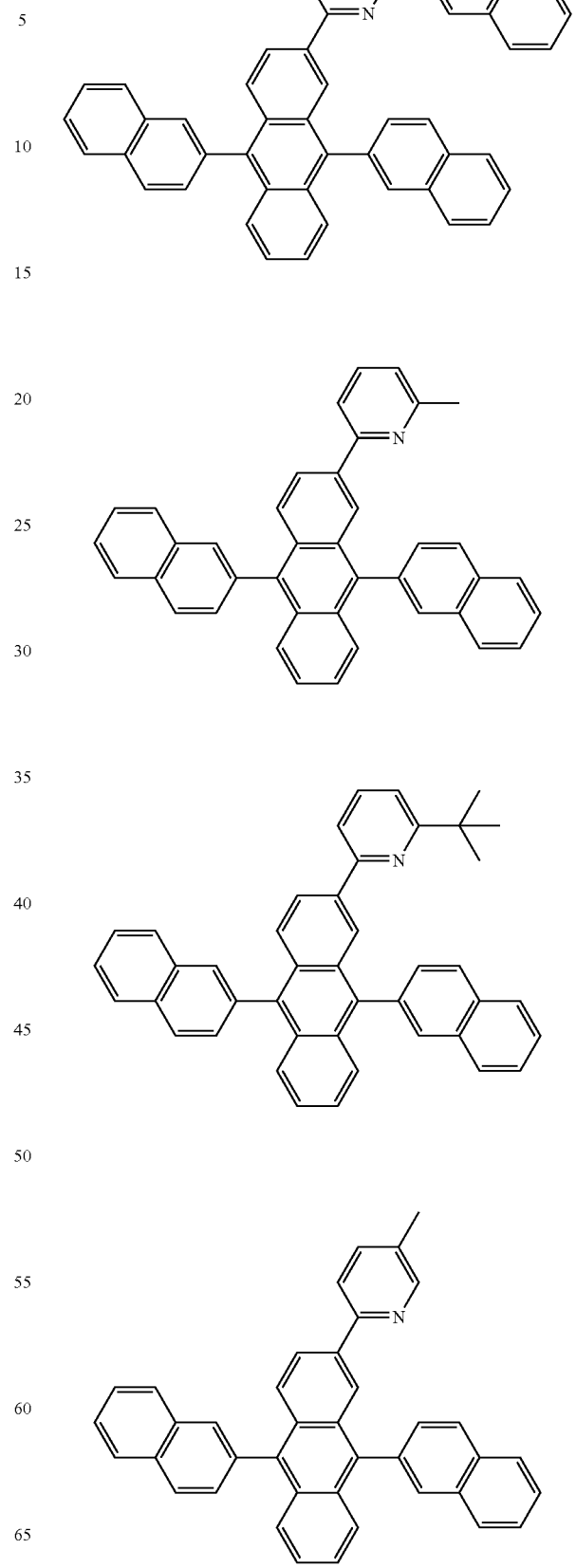

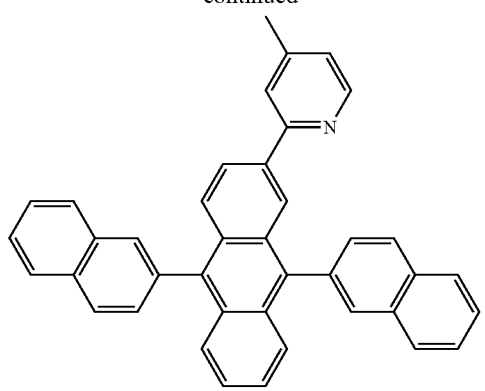
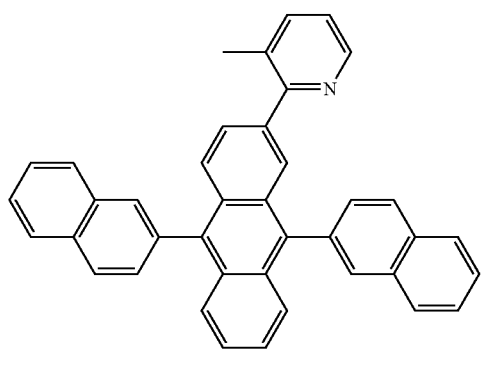
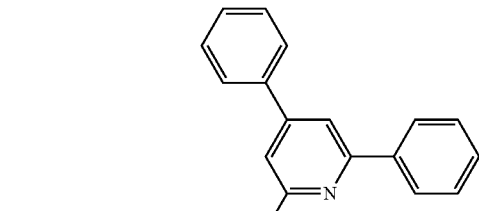
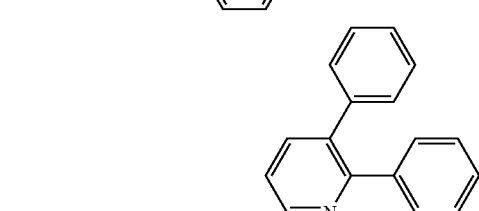
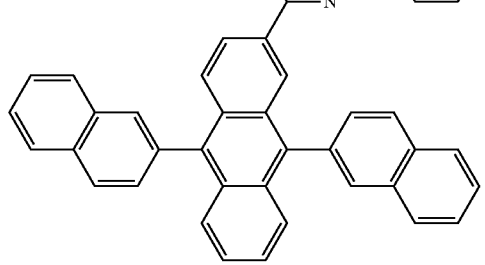
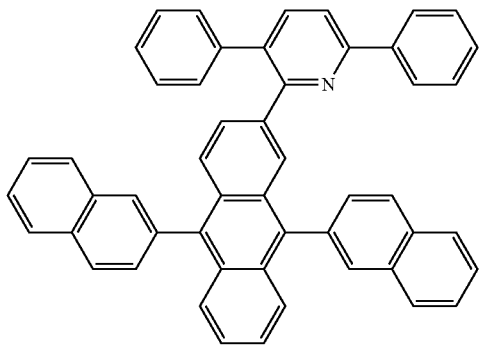
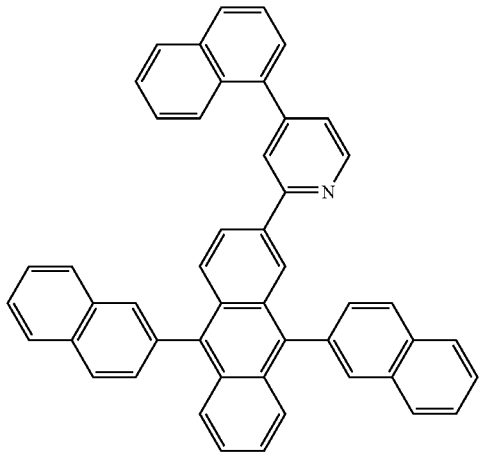
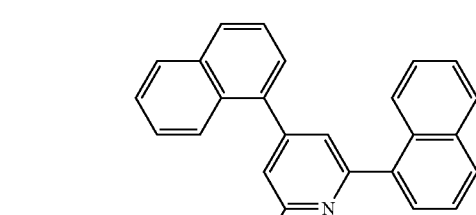
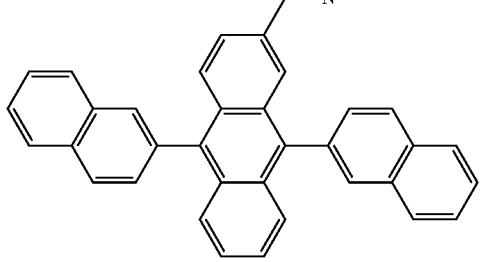

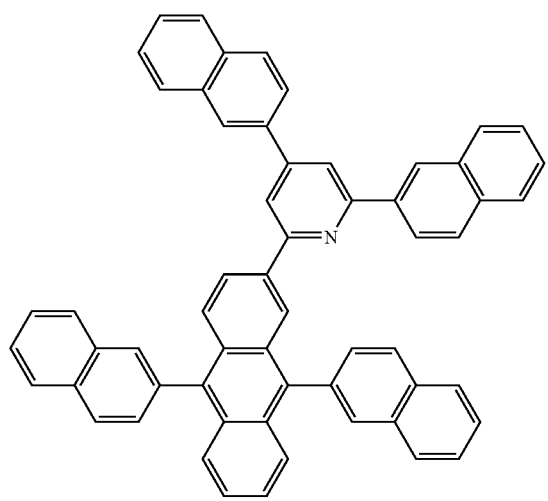
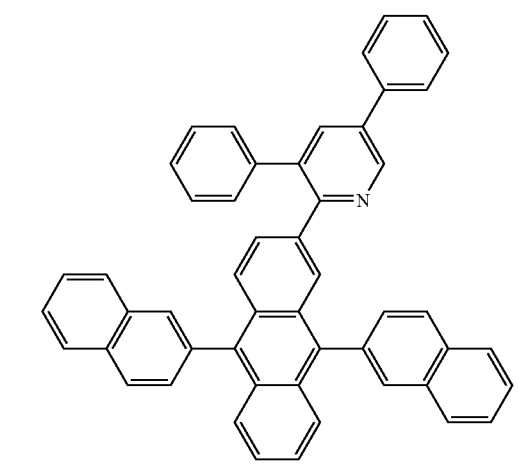
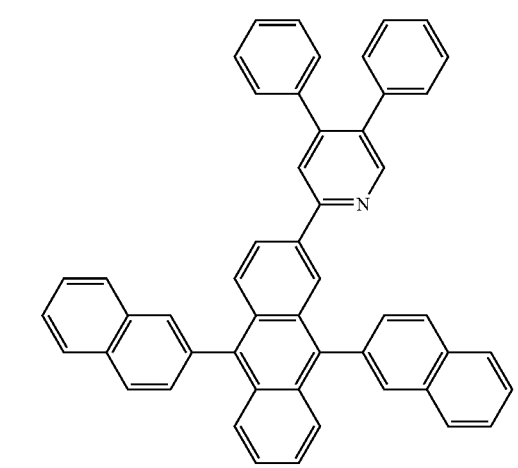
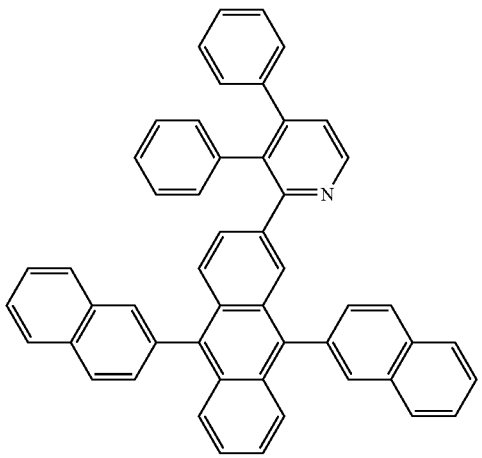
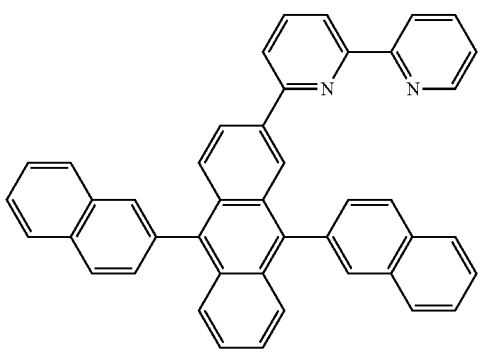
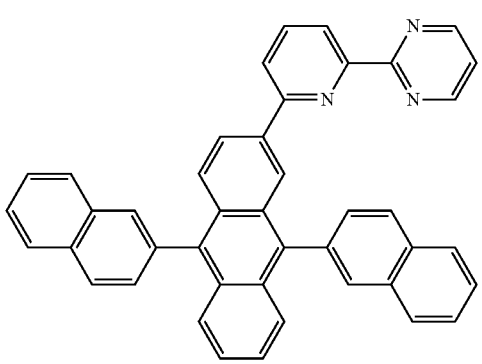
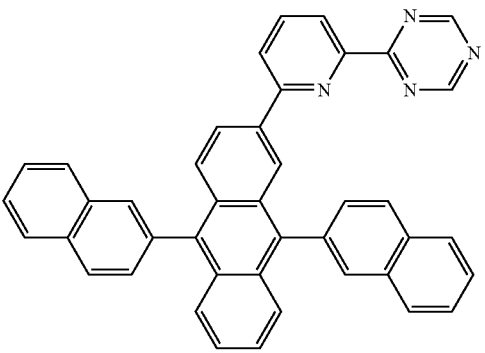

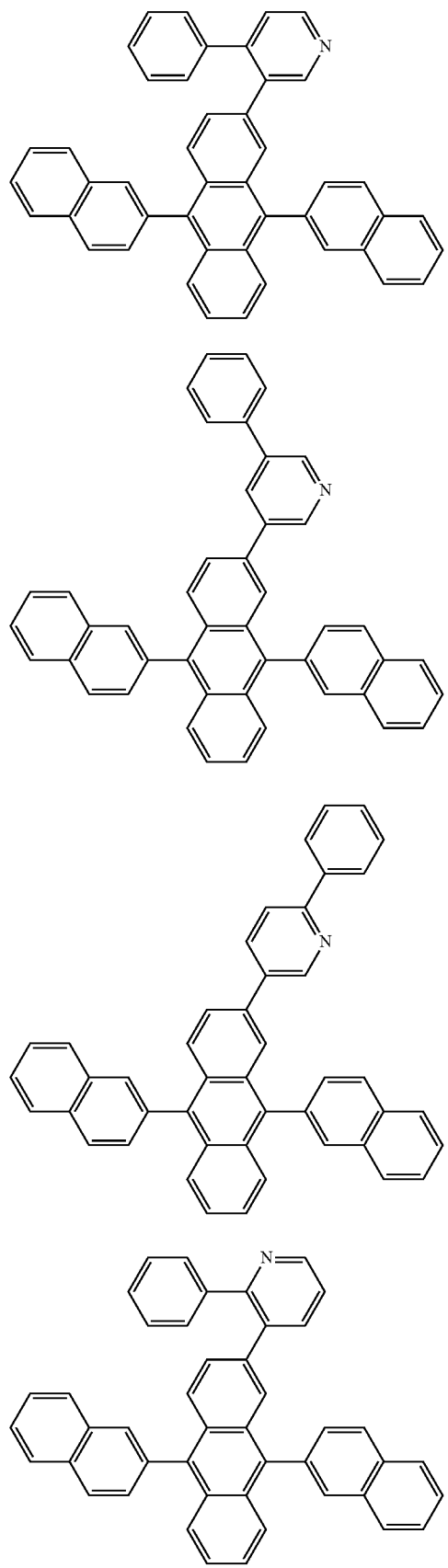
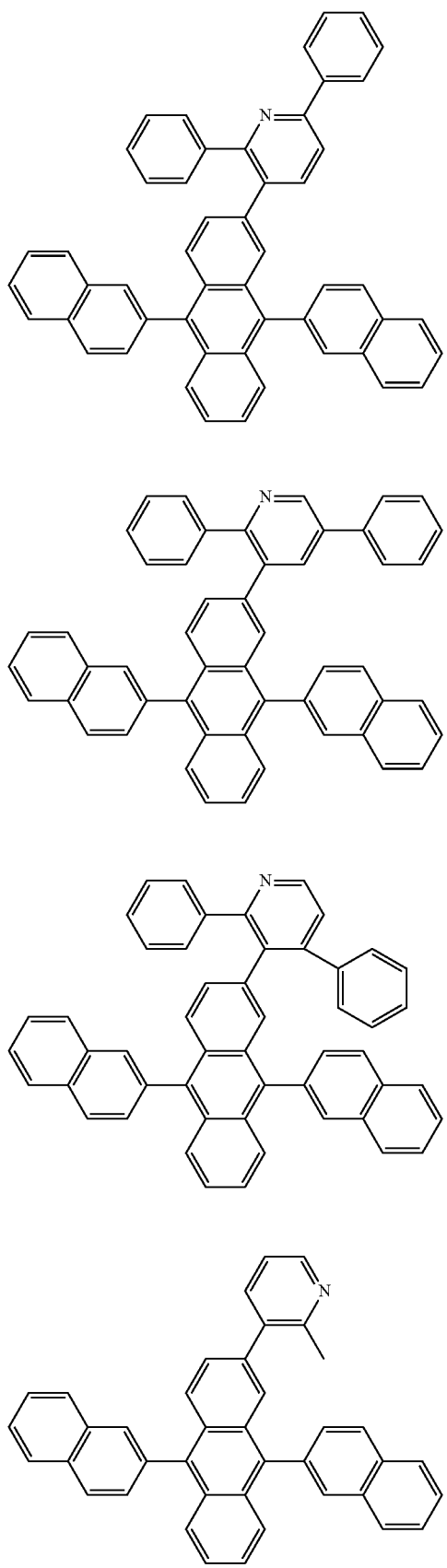

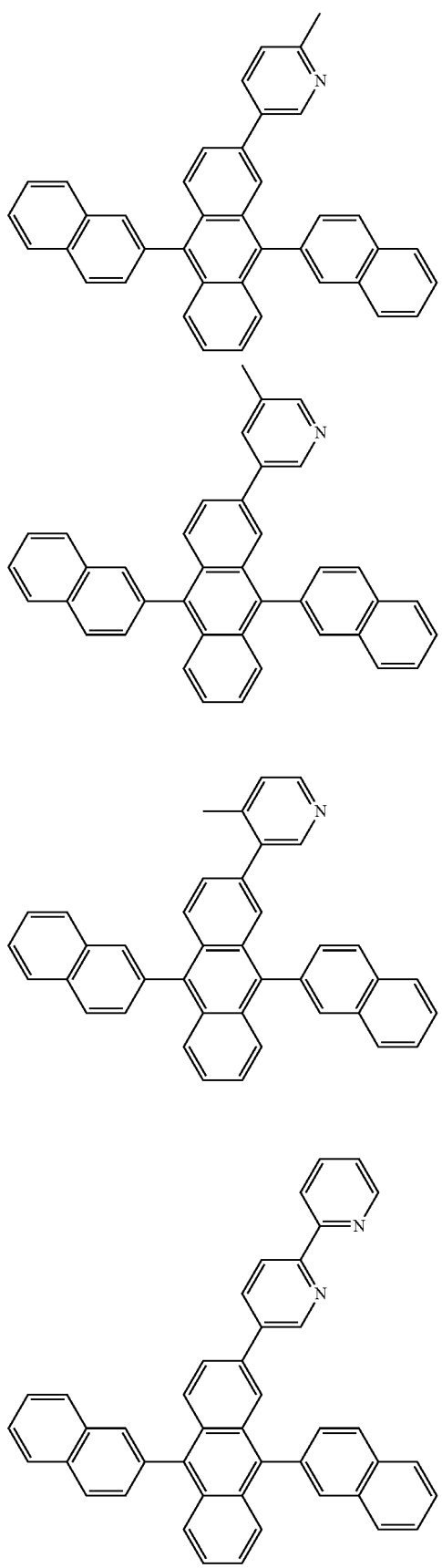
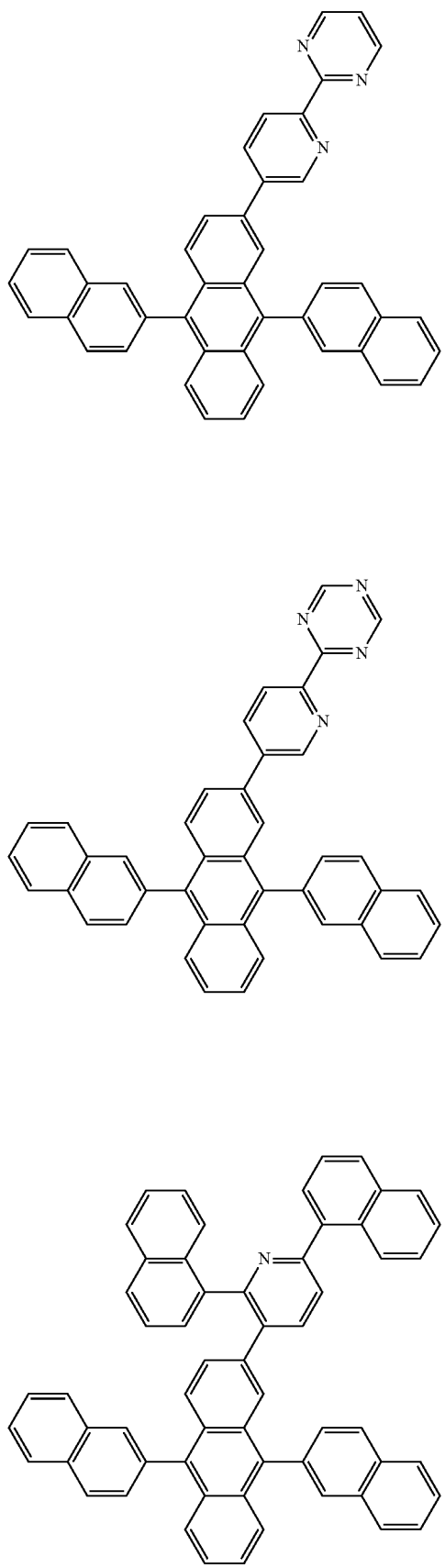

61
-continued
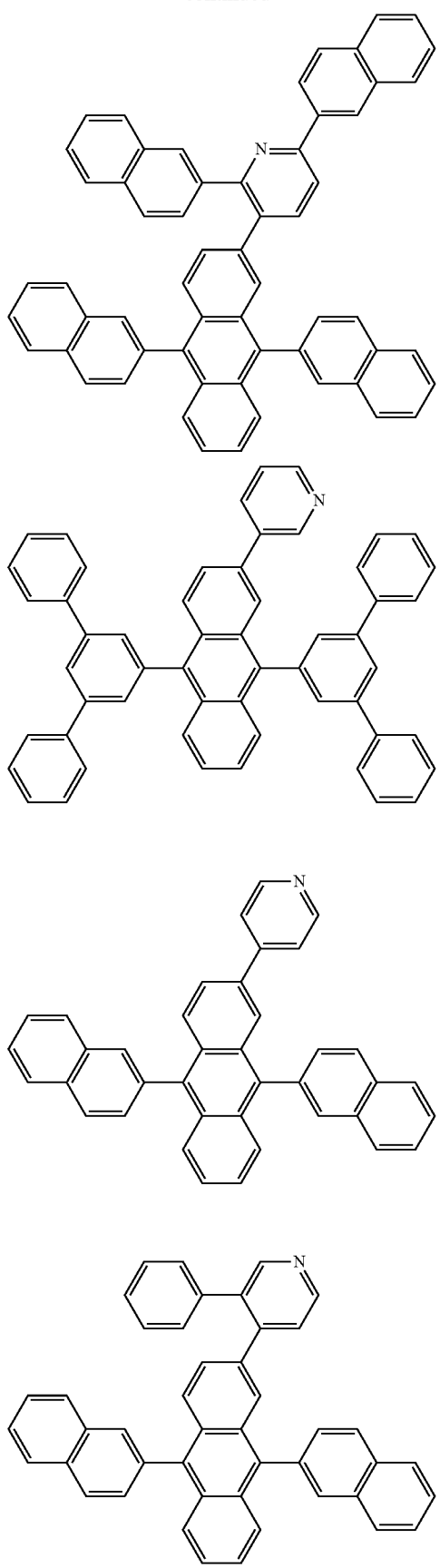
62
-continued
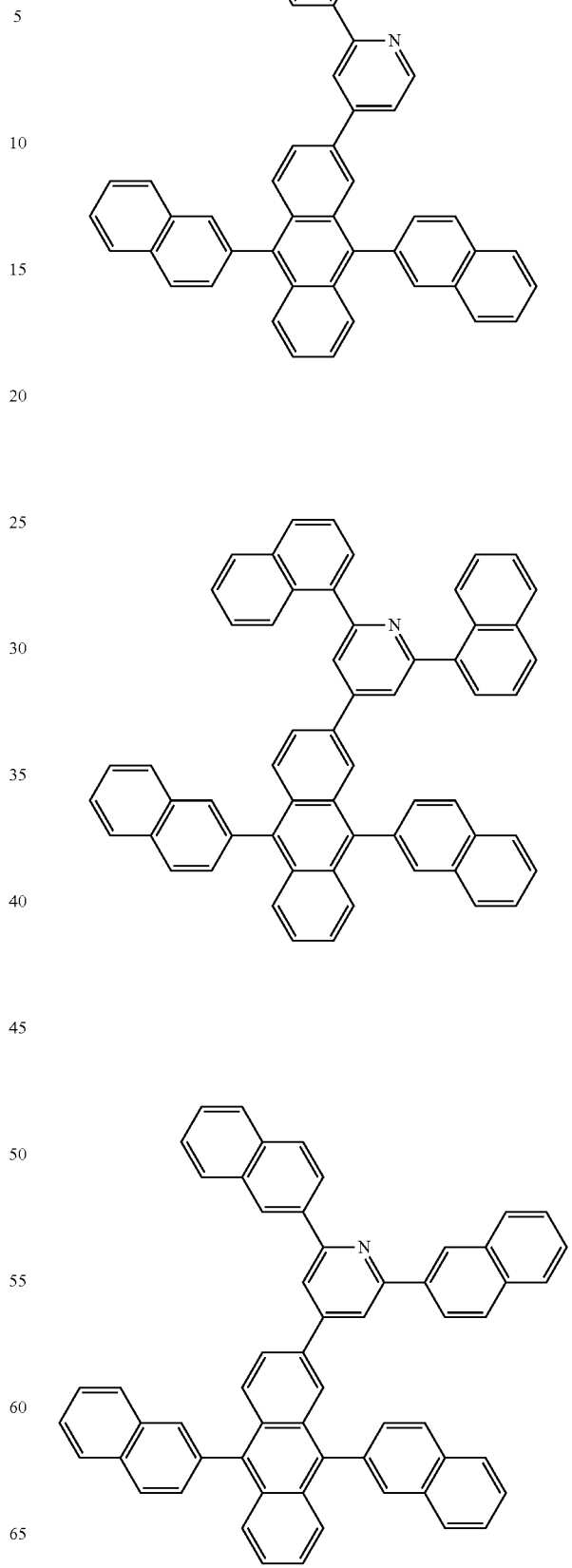

63
-continued
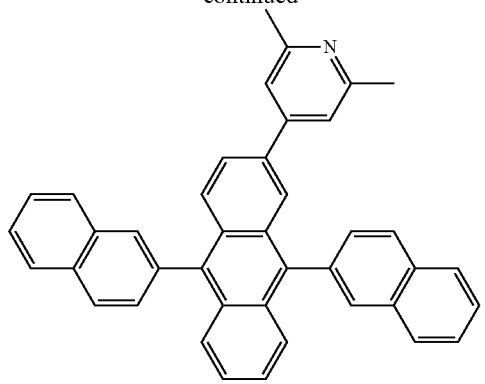
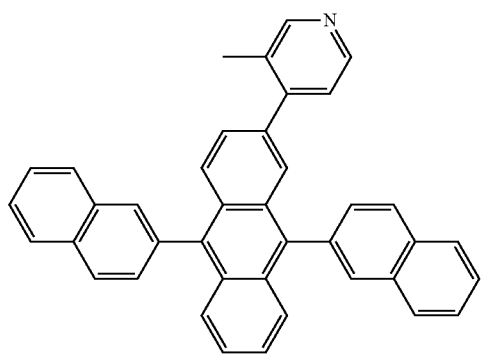
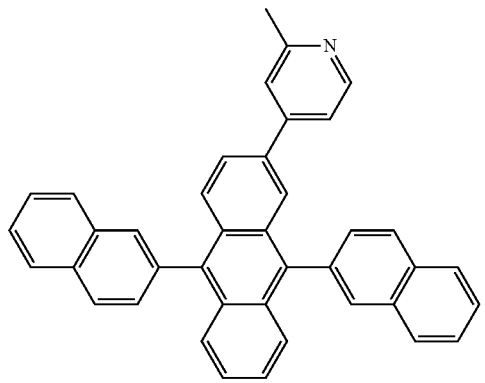
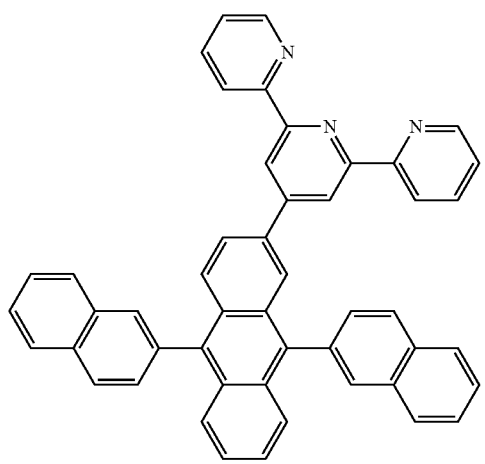
64
-continued
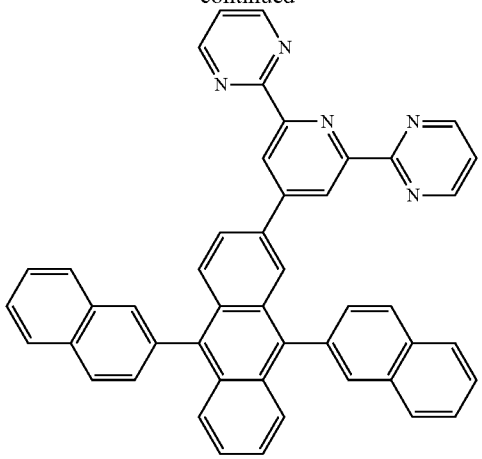
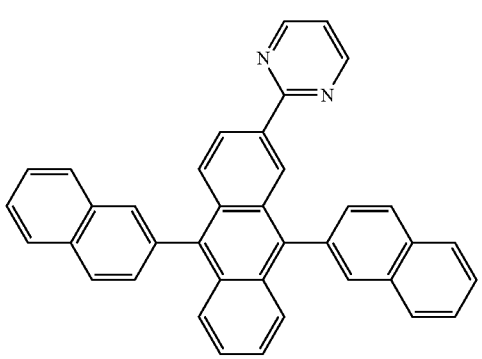
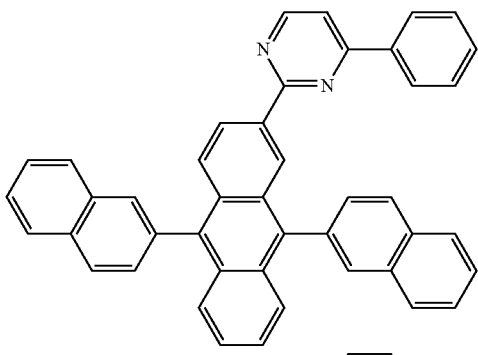
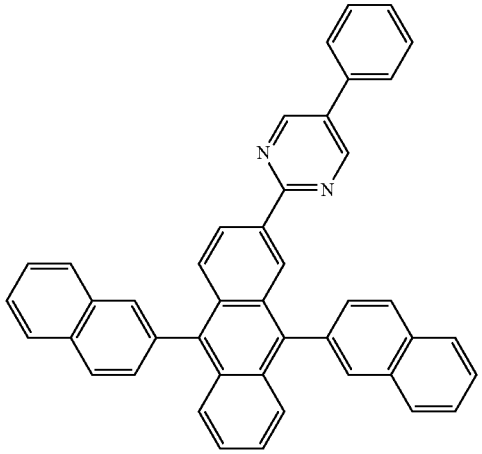

-continued
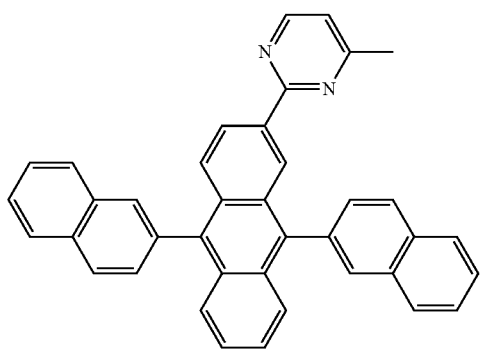
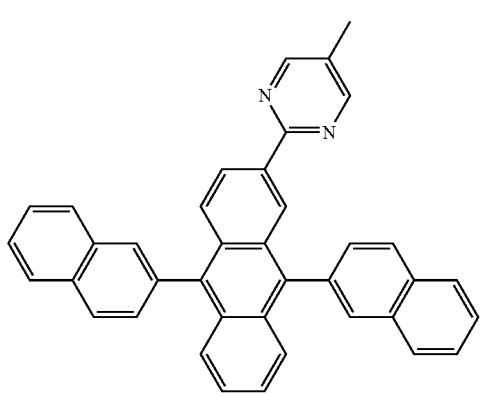
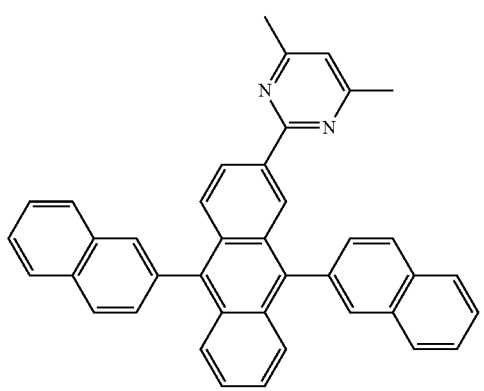
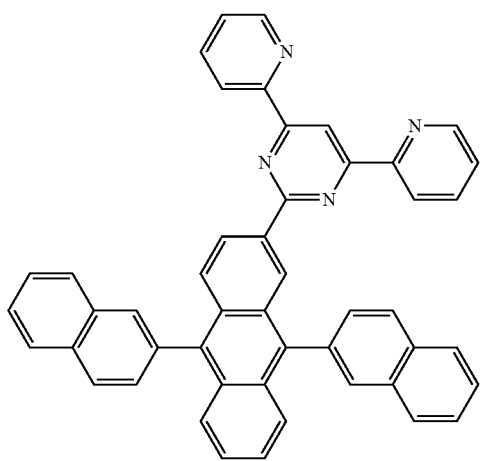
-continued
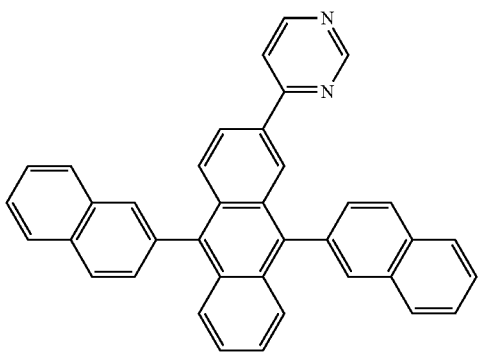
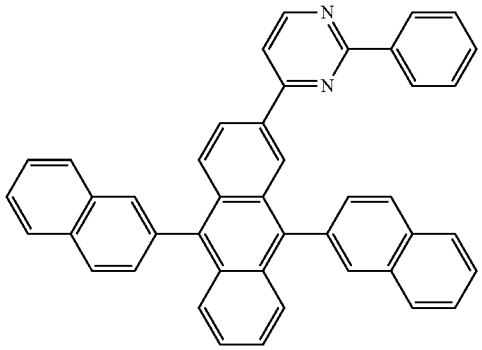
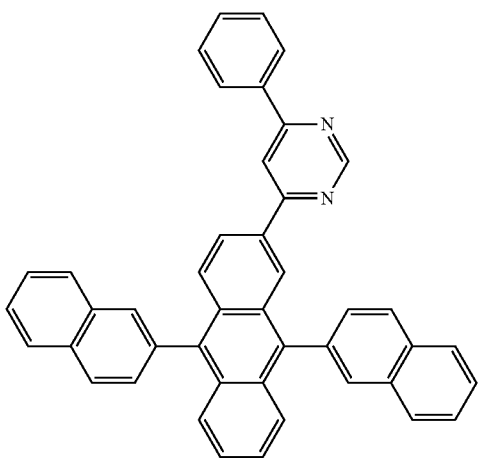

67
-continued
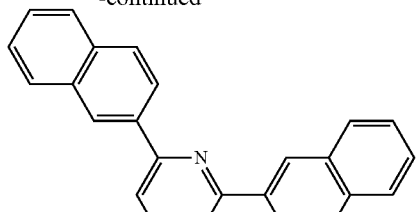
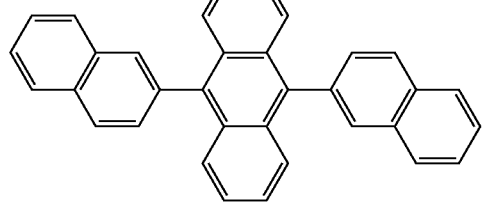
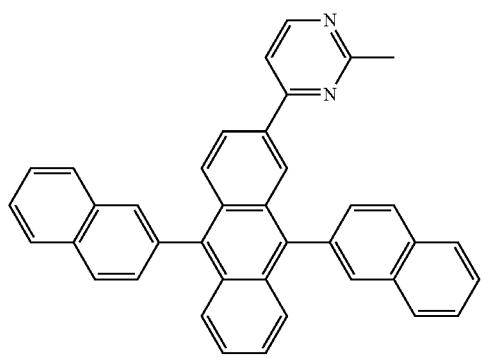
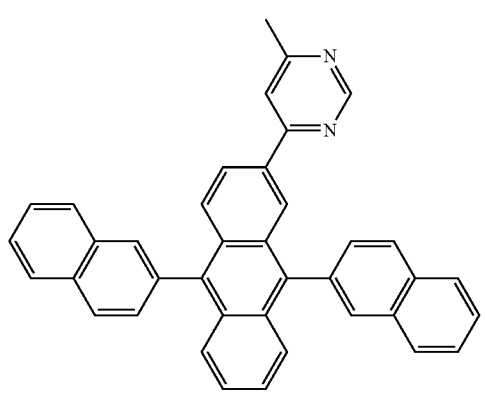
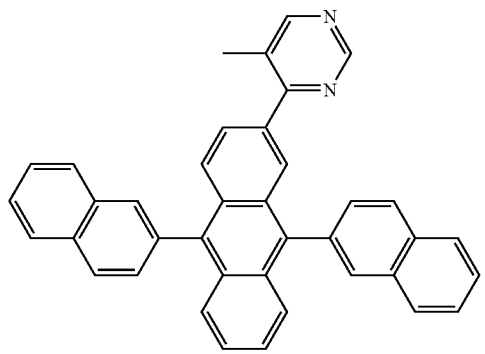
68
-continued
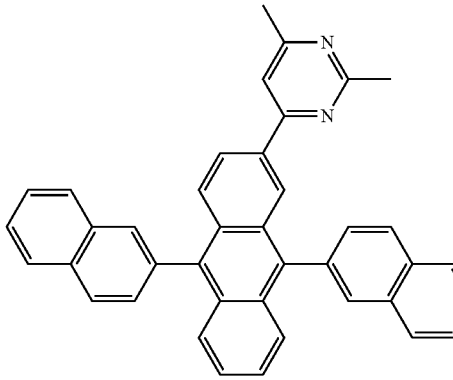
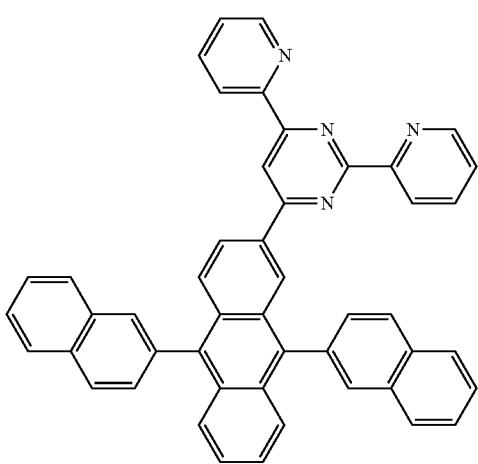
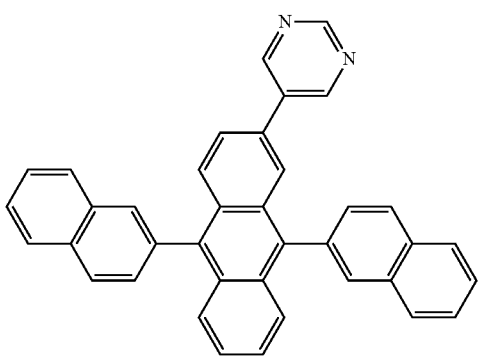
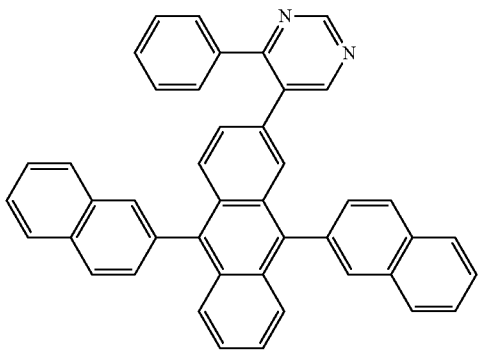

-continued
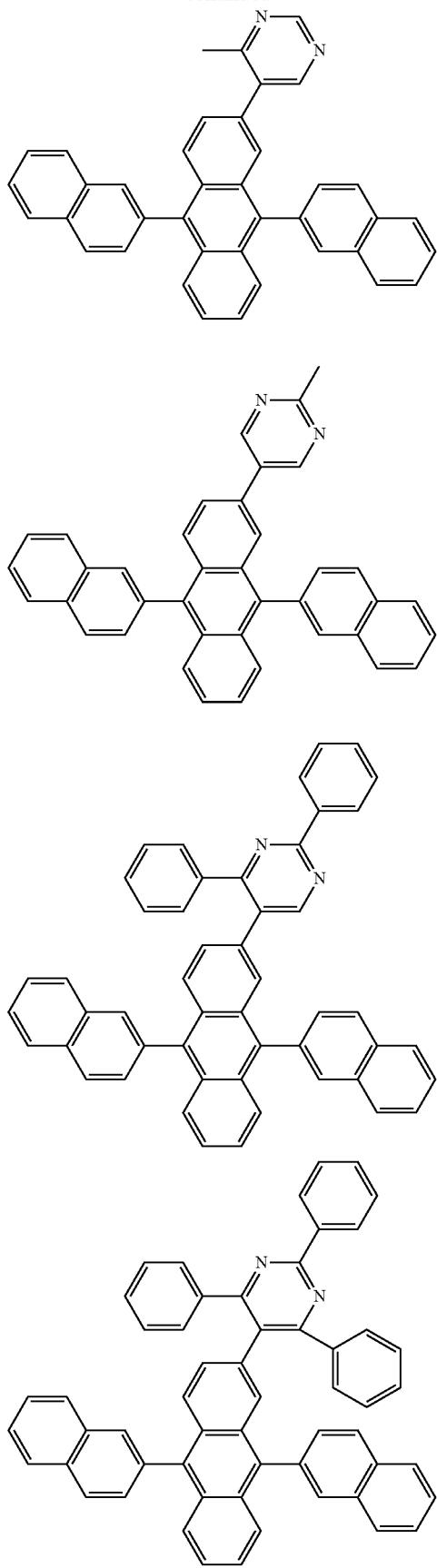
-continued
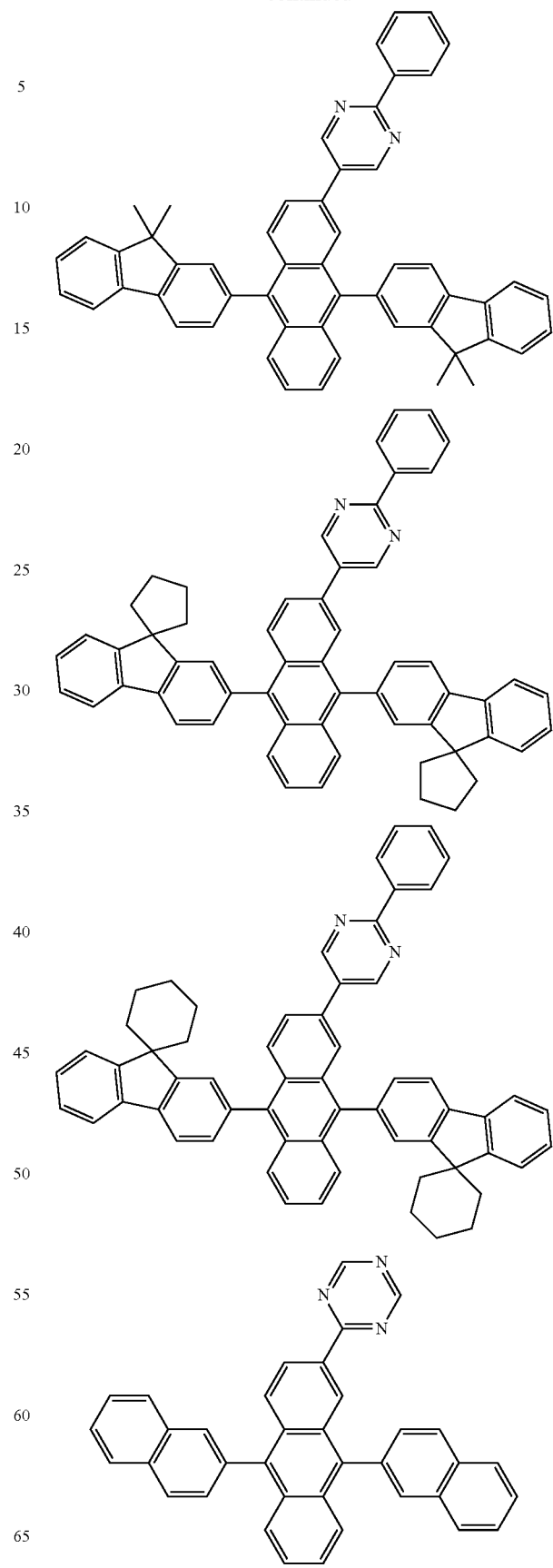

71
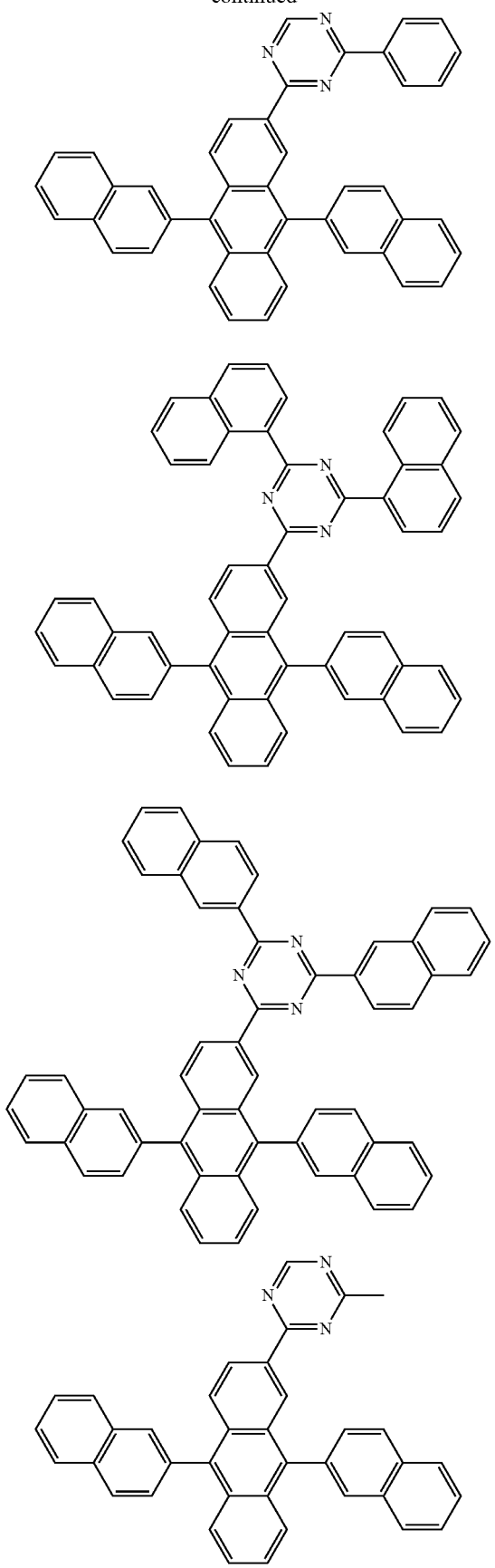
72
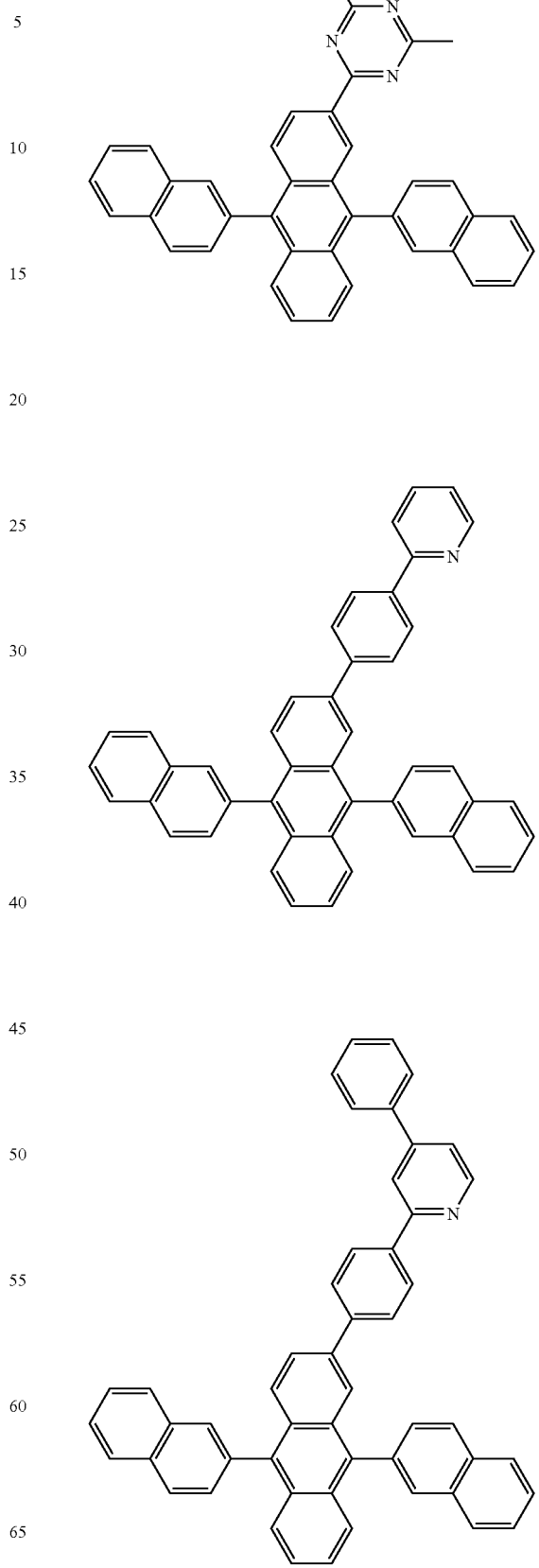

-continued
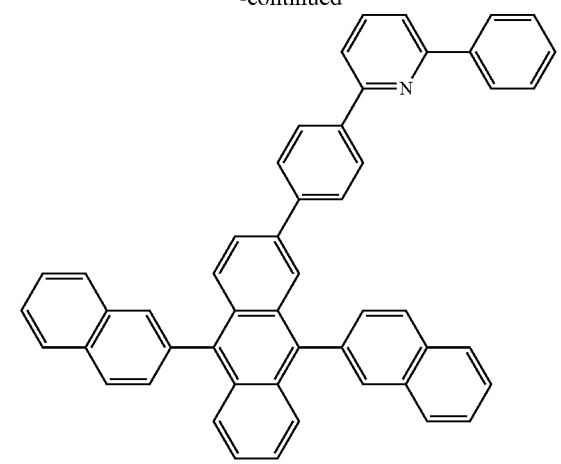
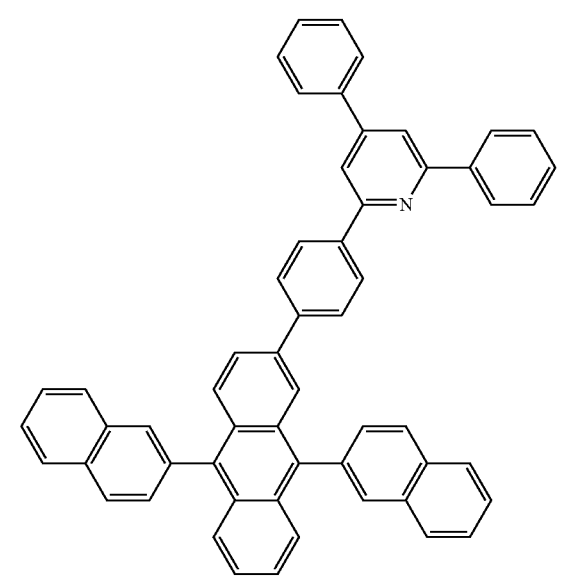
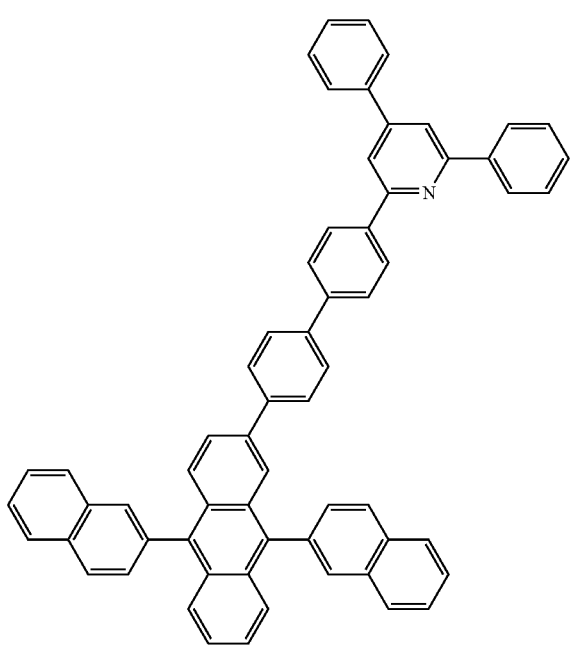
-continued
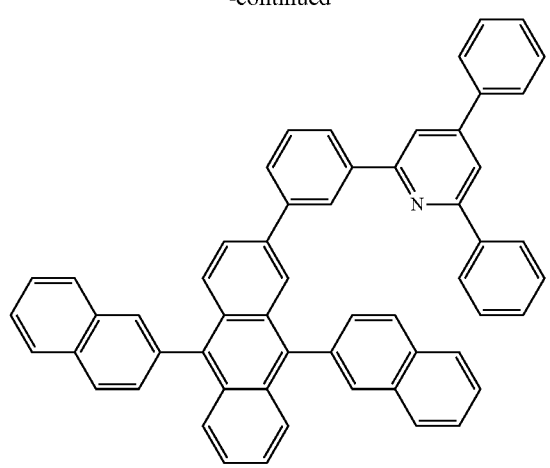
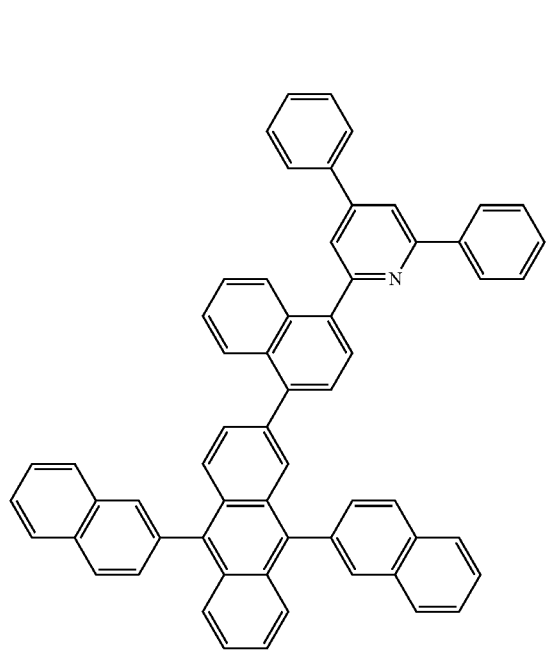
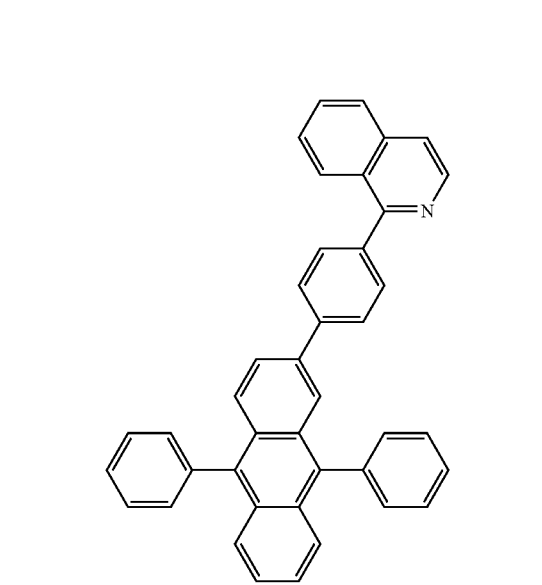

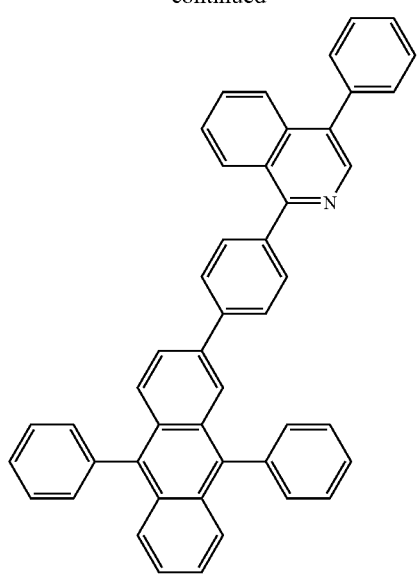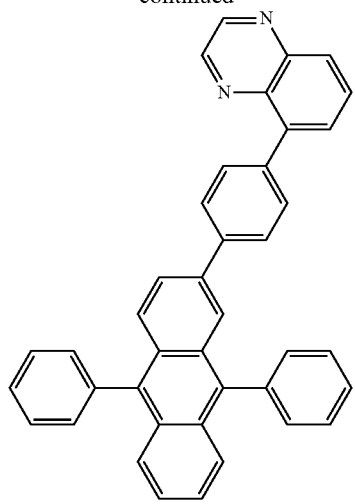

77
-continued
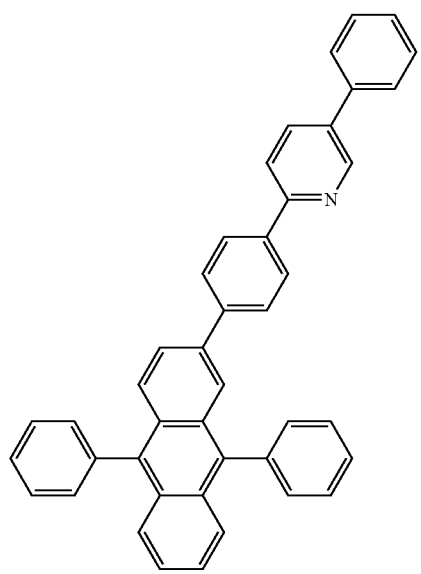
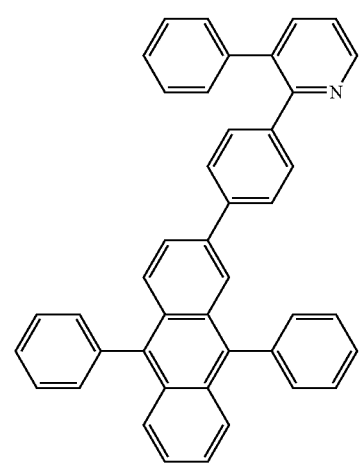
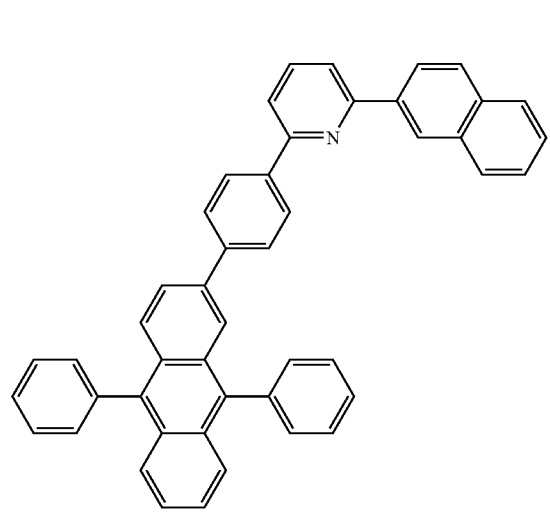
78
-continued
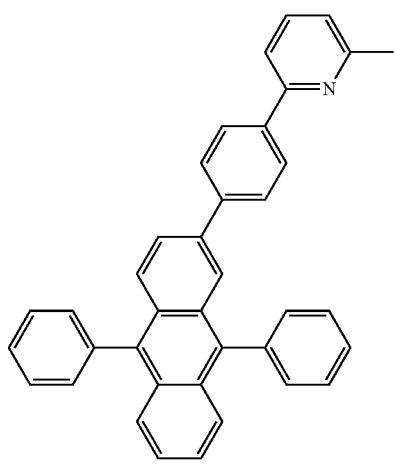
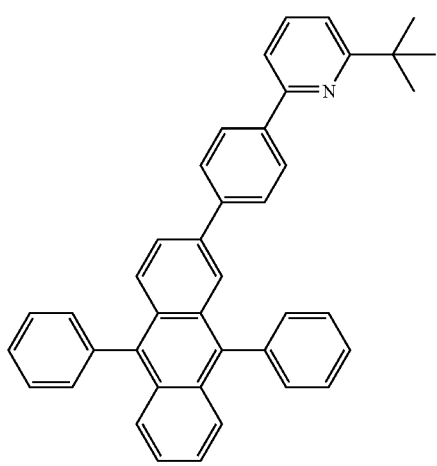
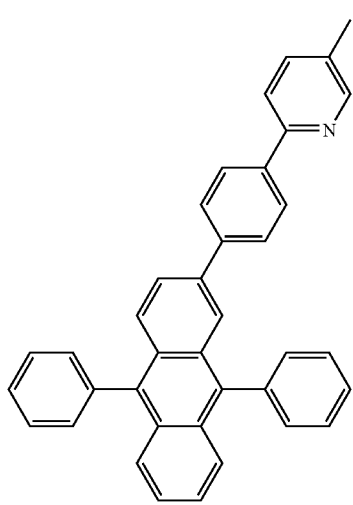

-continued
79
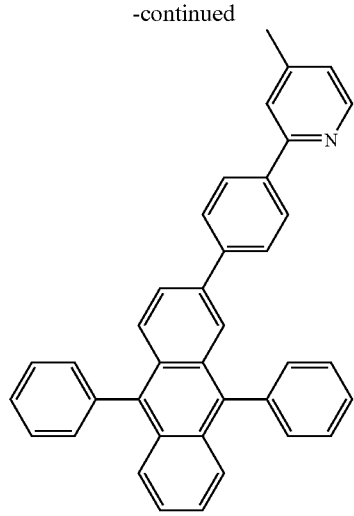
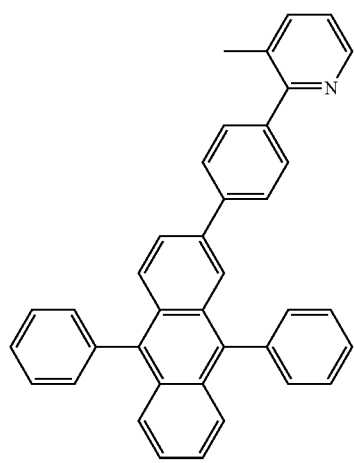
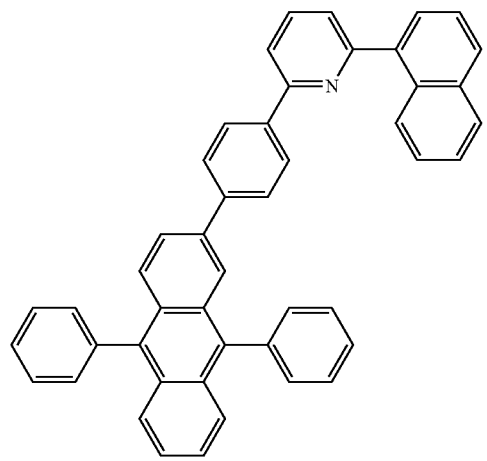
80
-continued
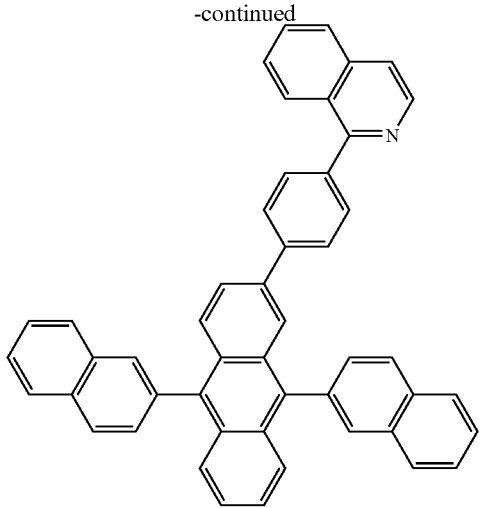
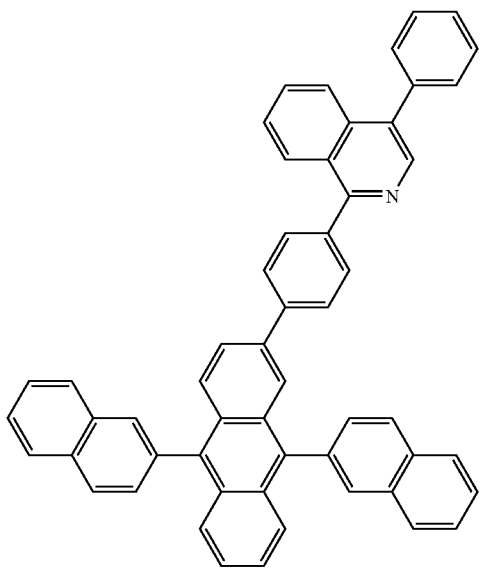
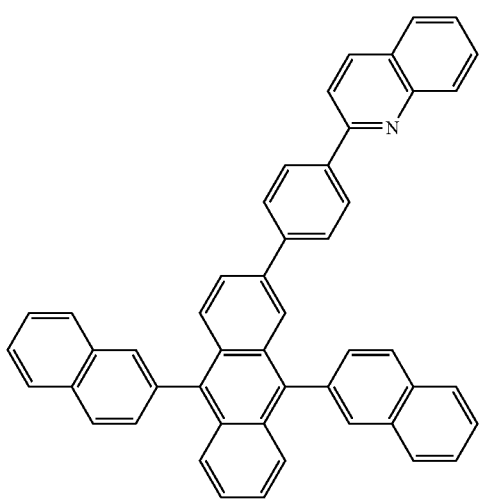

-continued
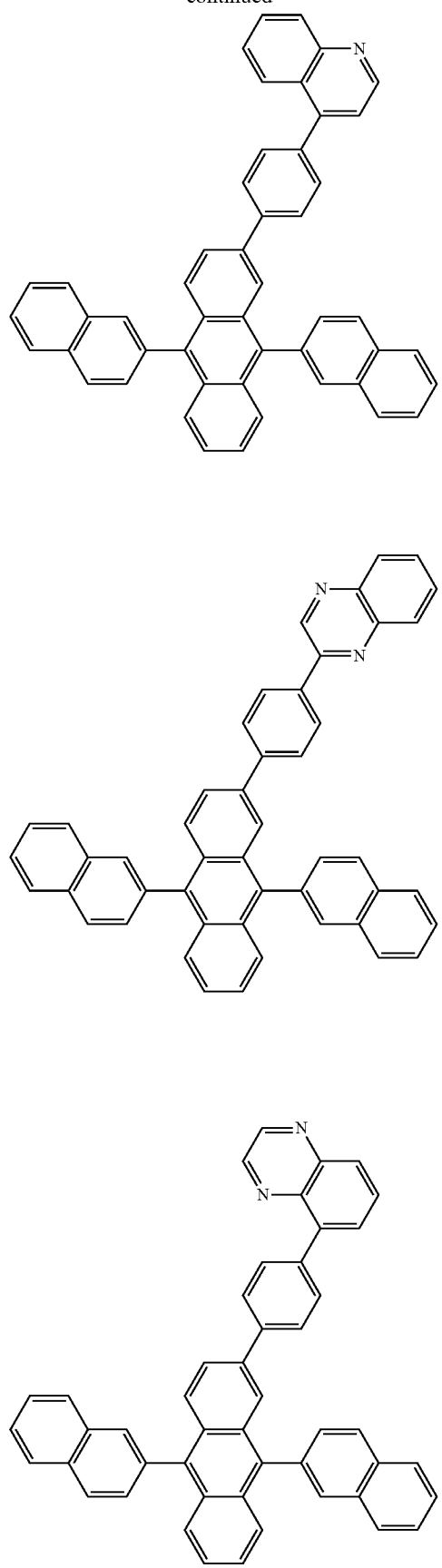
-continued
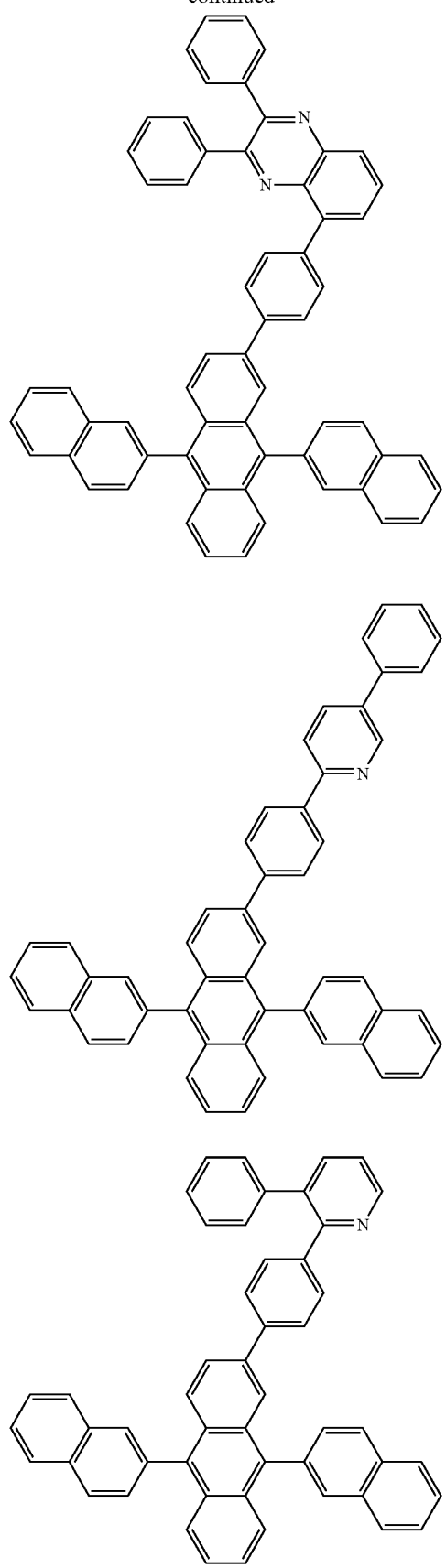

83
-continued
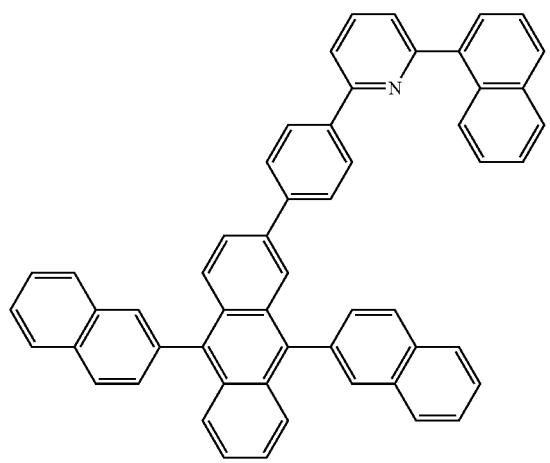
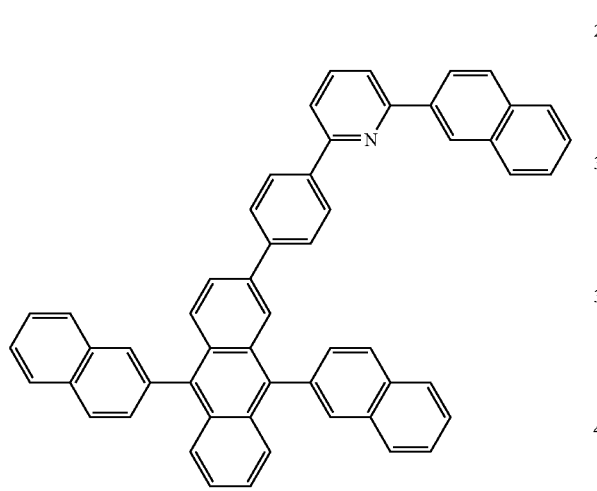
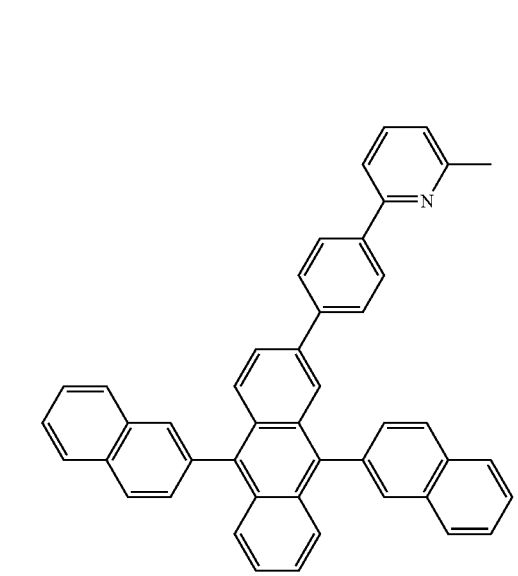
84
-continued
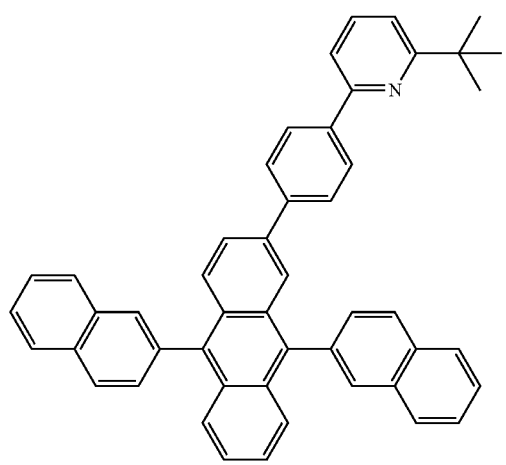
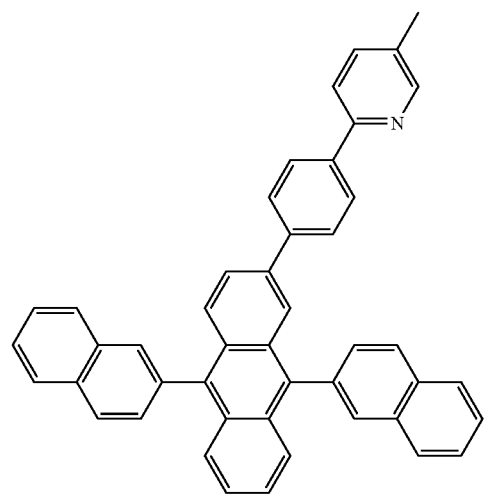
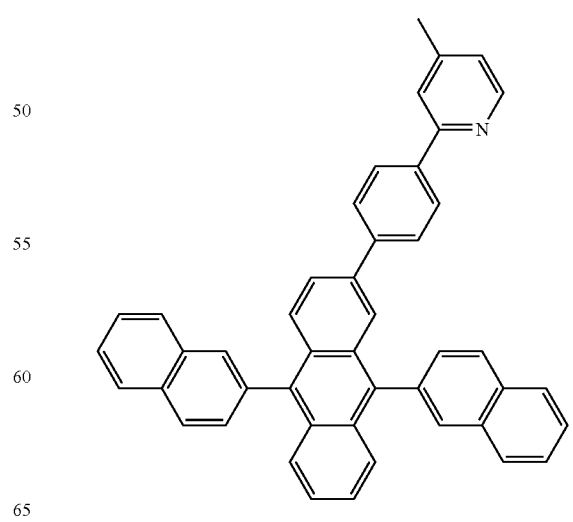

85
-continued
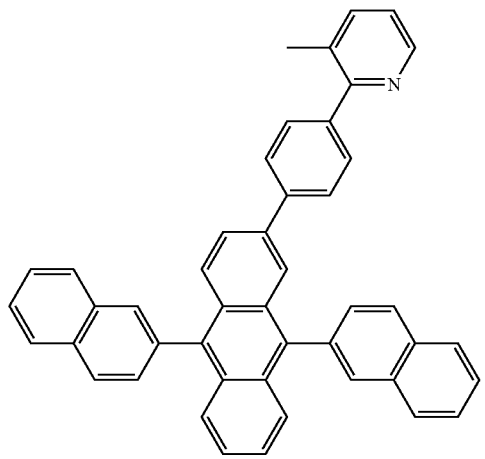
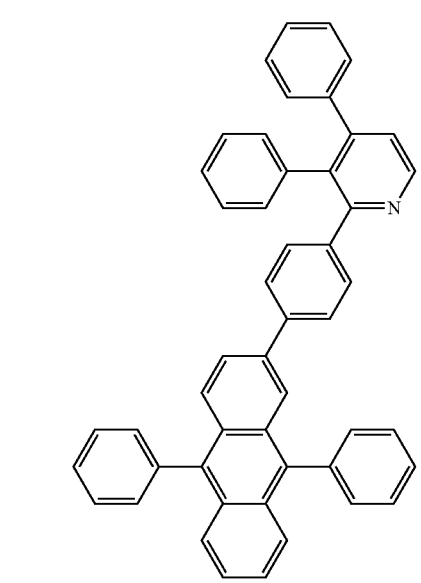
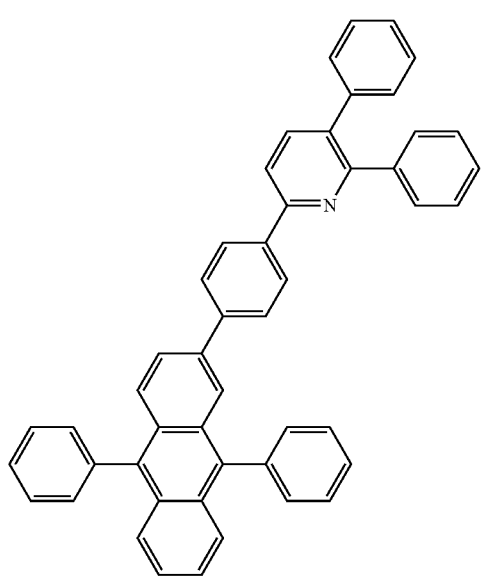
86
-continued
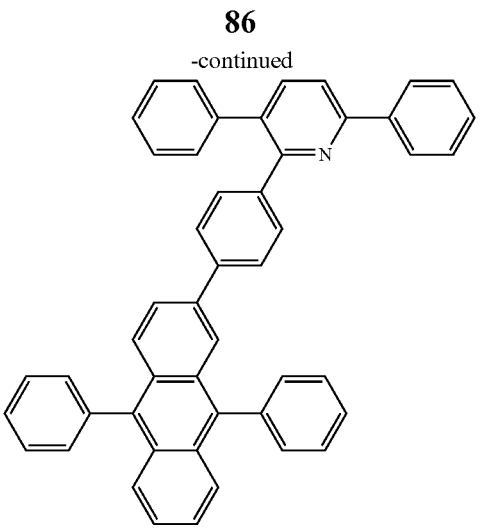
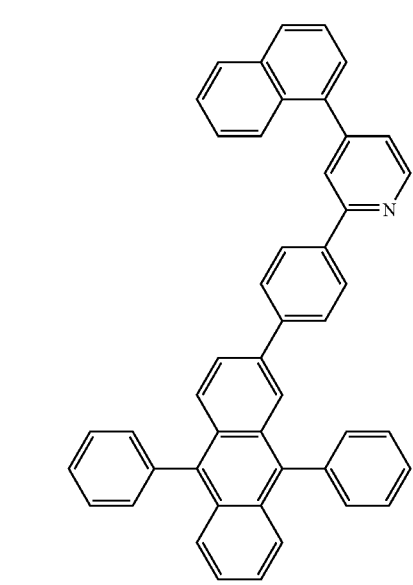
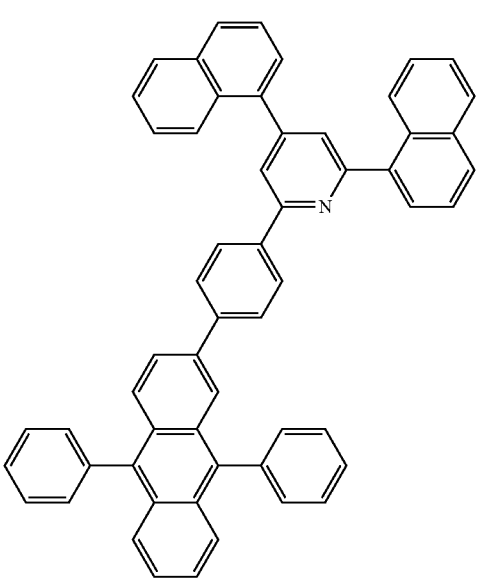

87
-continued
88
-continued
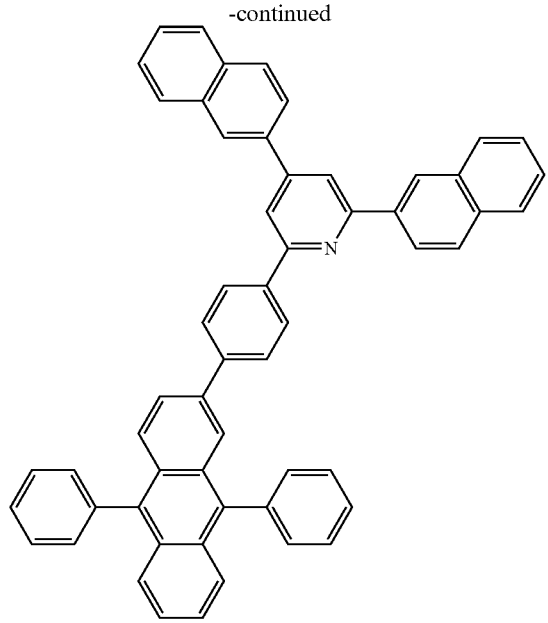
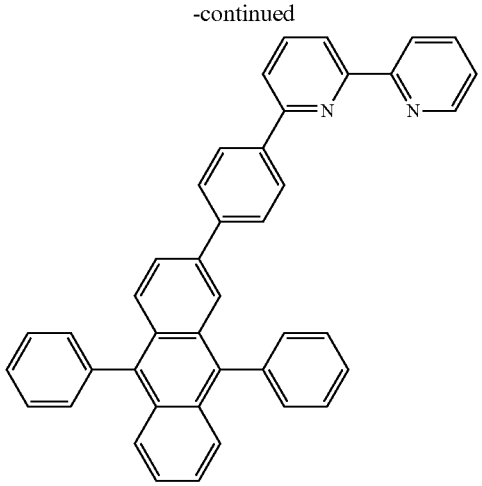

89
-continued
90
-continued
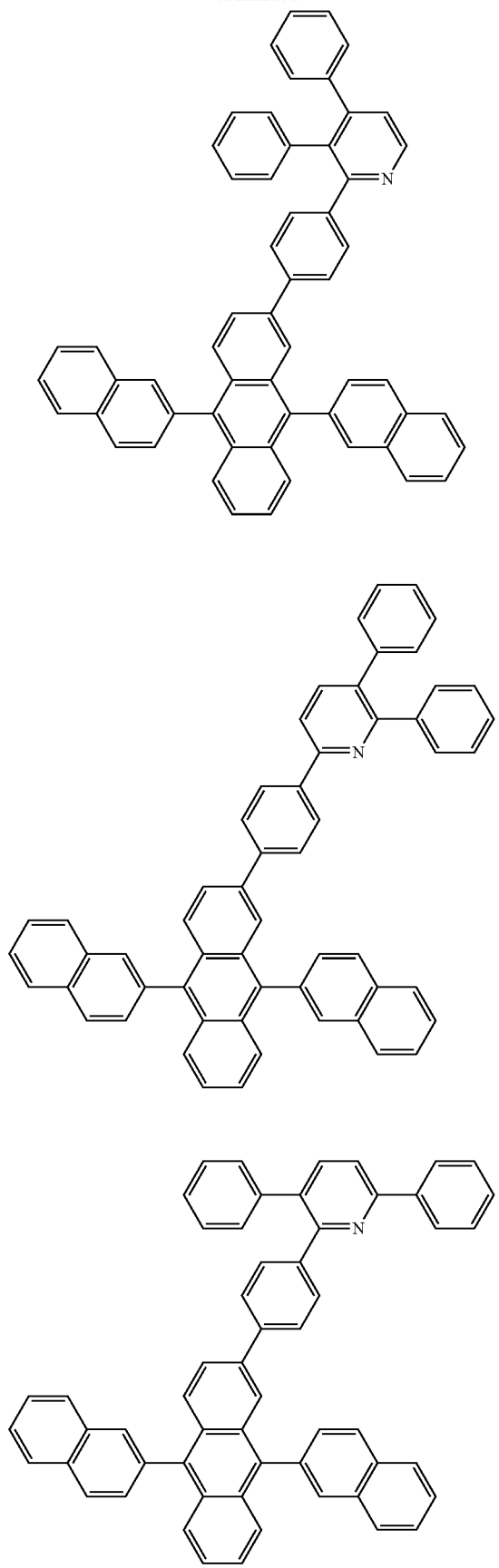
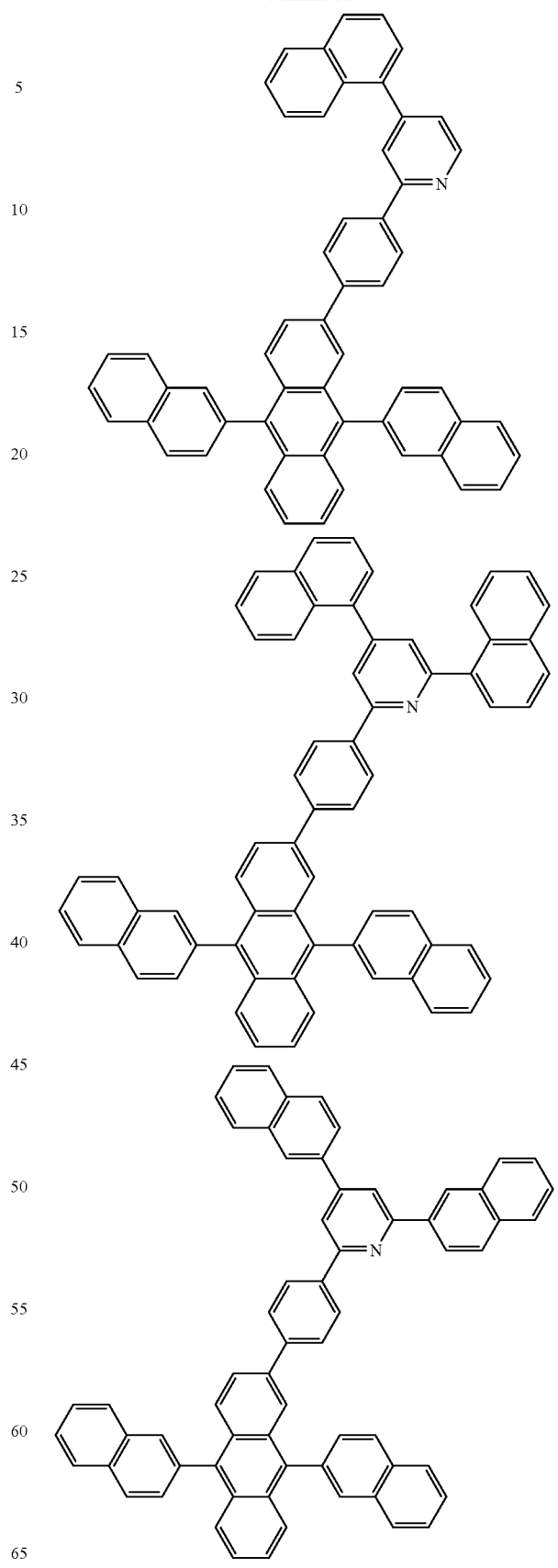

91
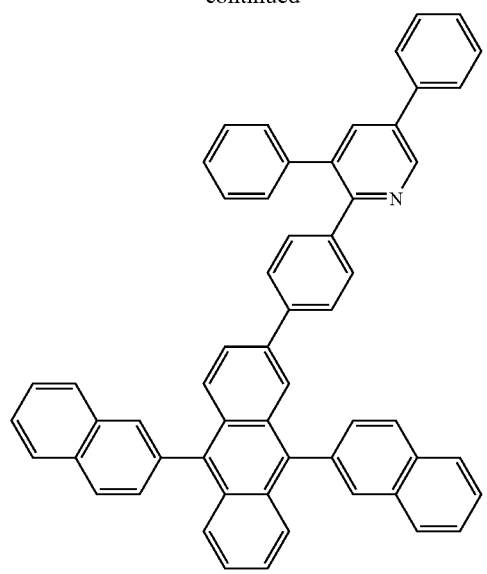
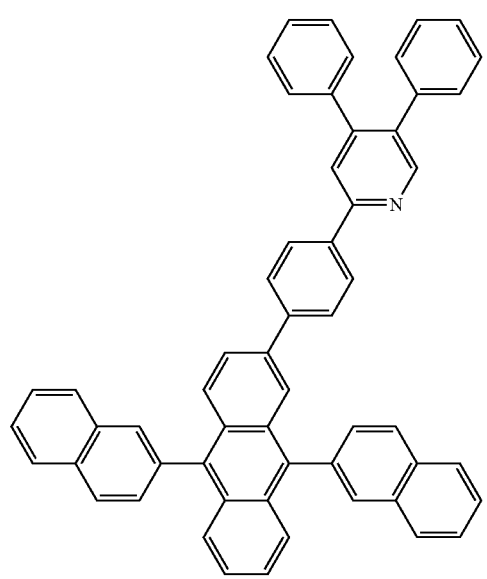
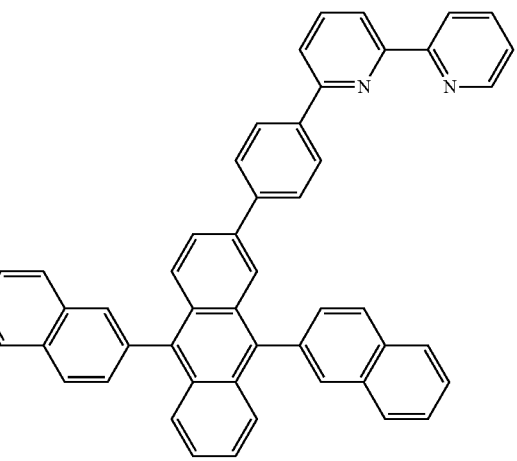
92
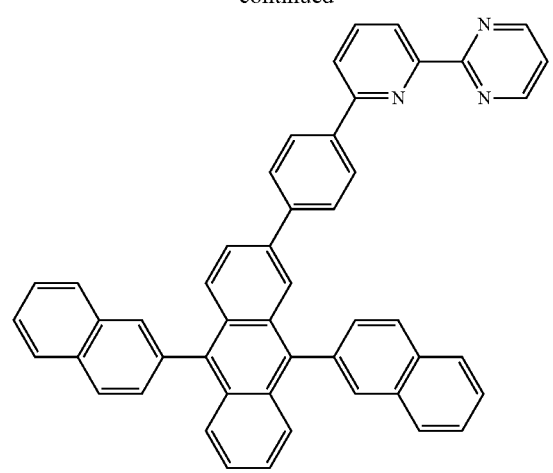
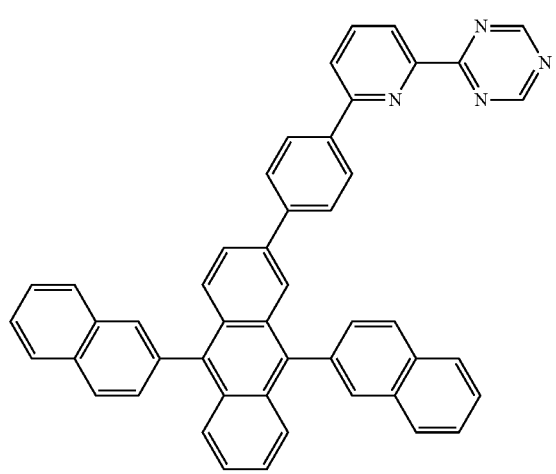
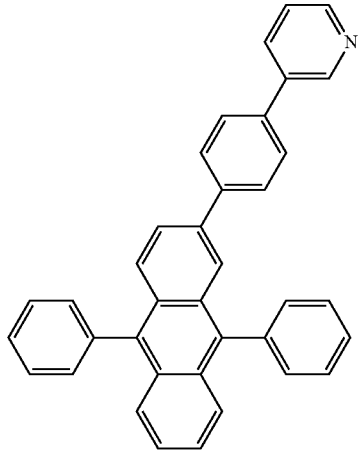

93
-continued
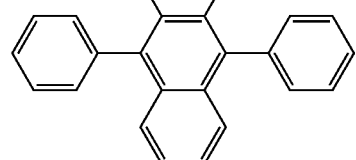
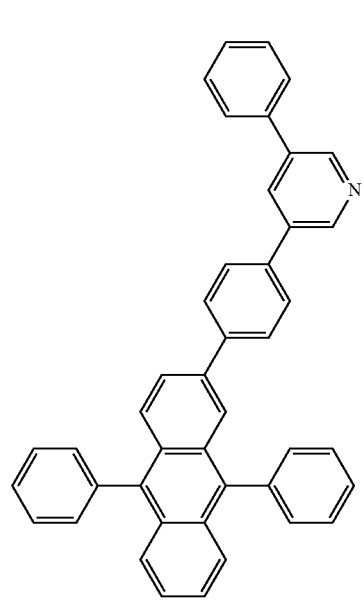
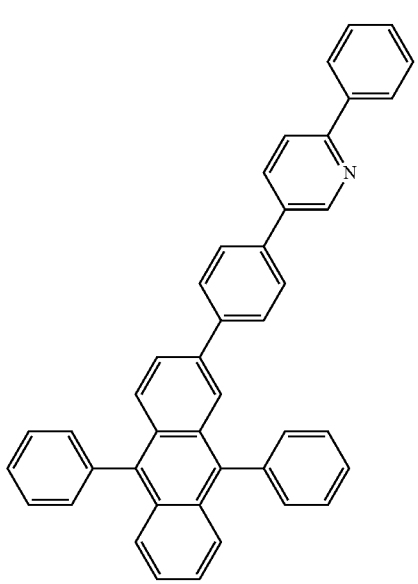
94
-continued
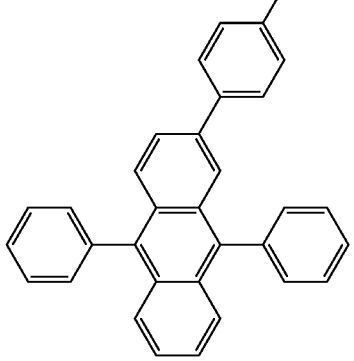
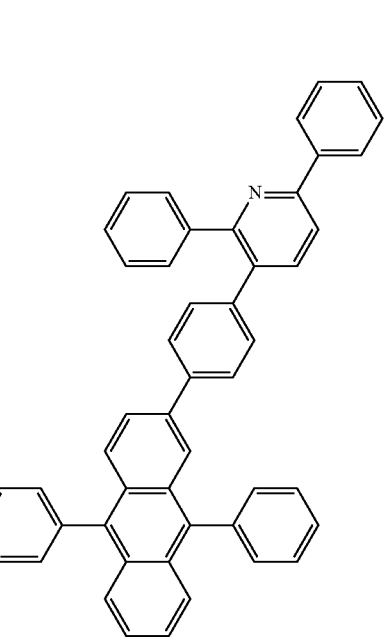
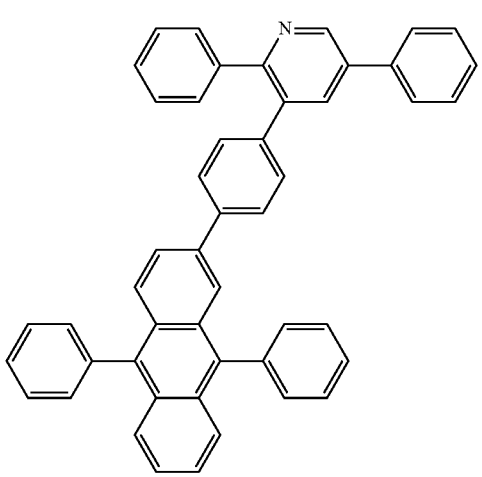

95
-continued
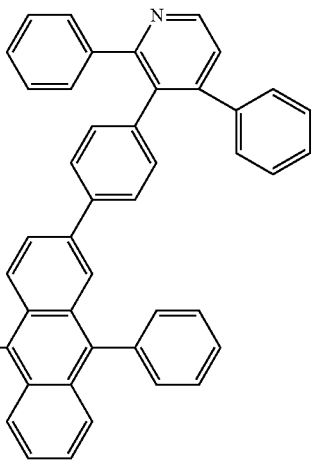
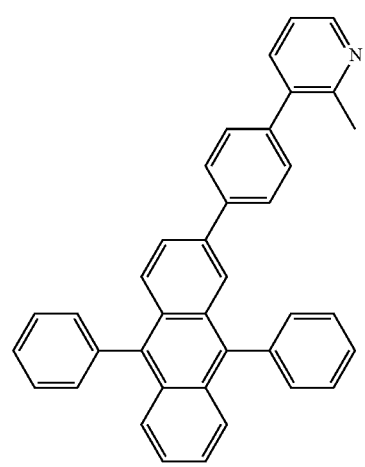
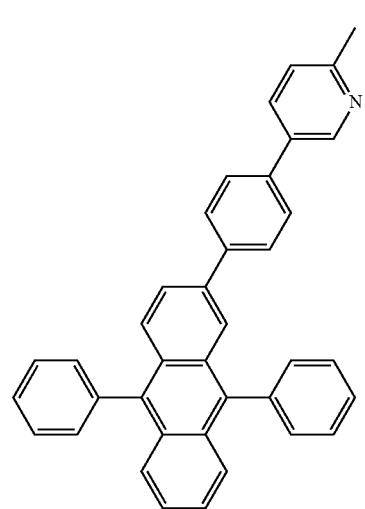
96
-continued
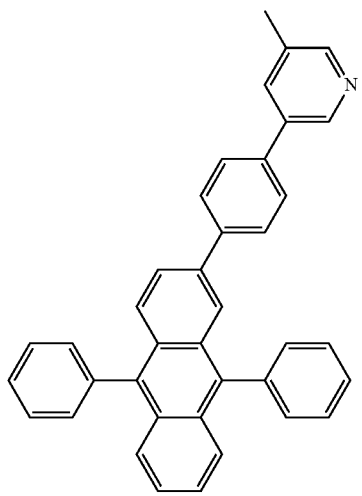
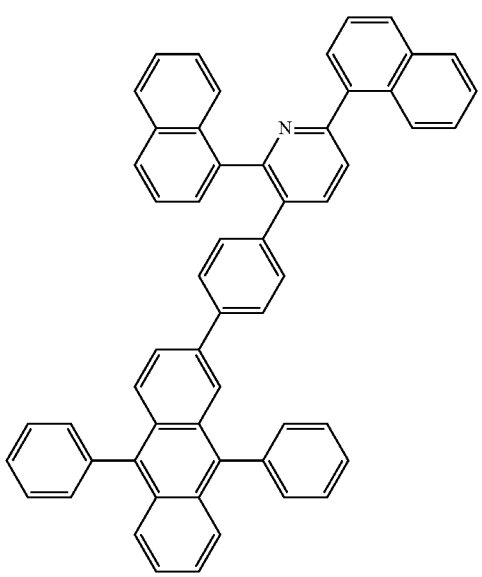

97
-continued
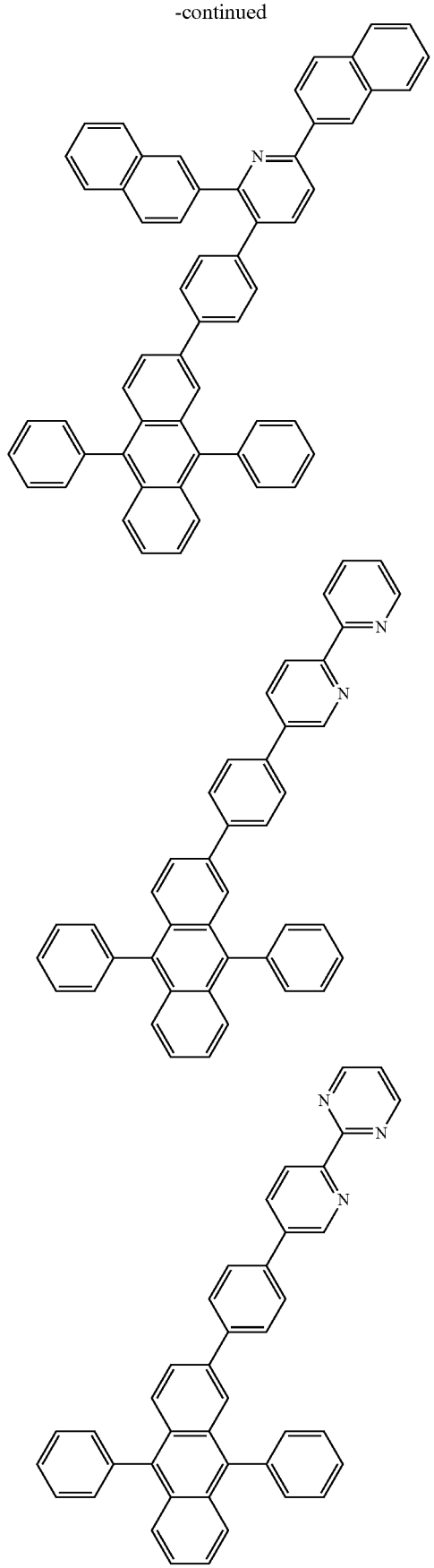
98
-continued
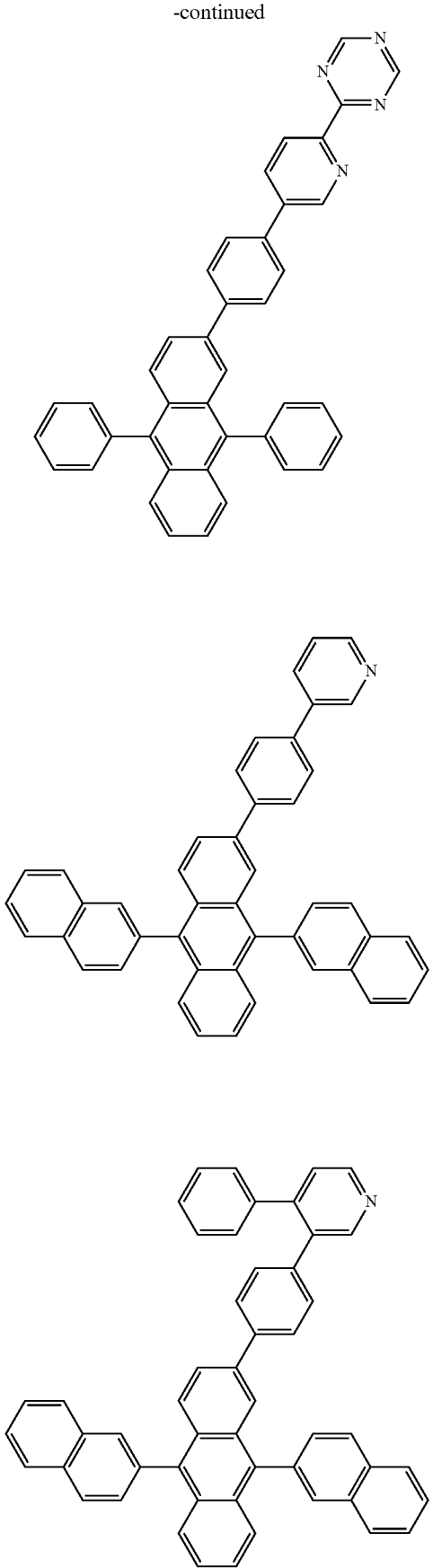

99
-continued
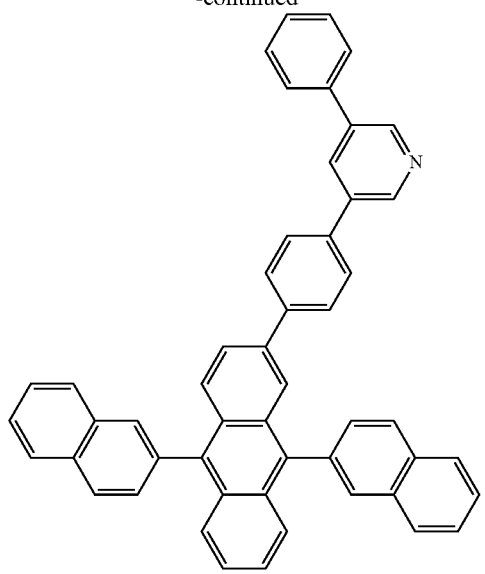
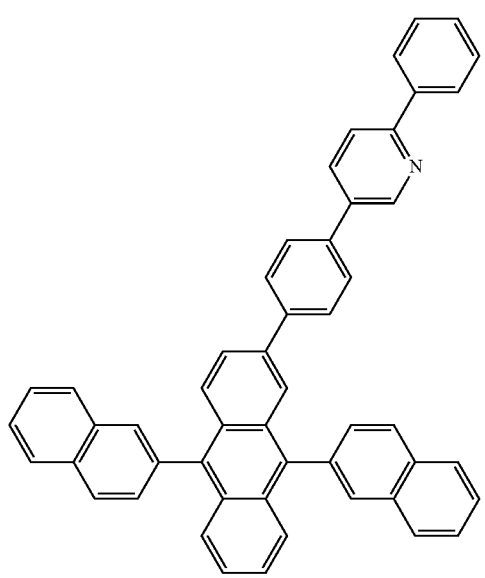
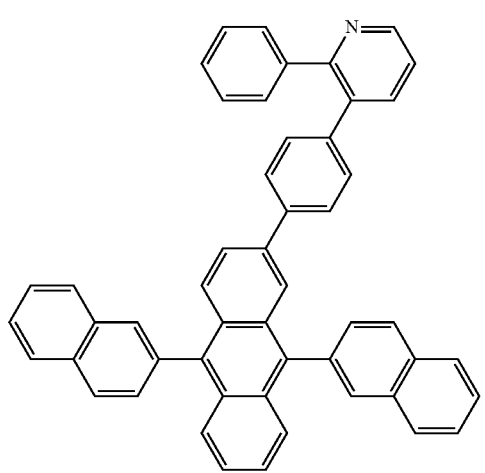
100
-continued
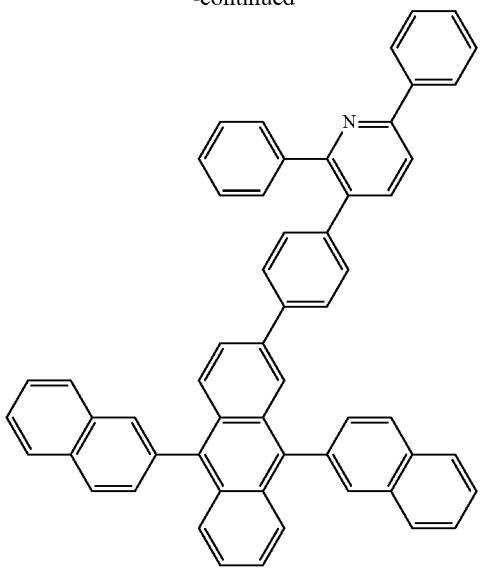
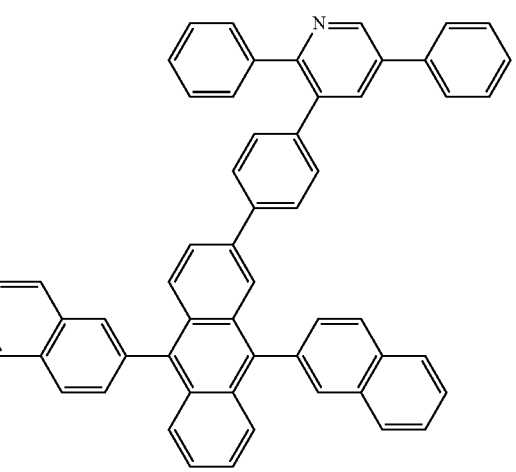
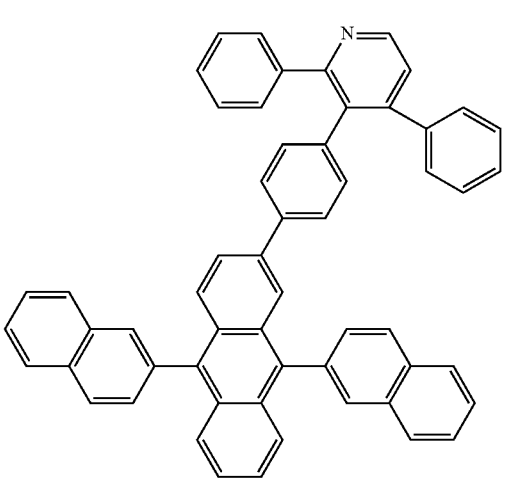

101
-continued
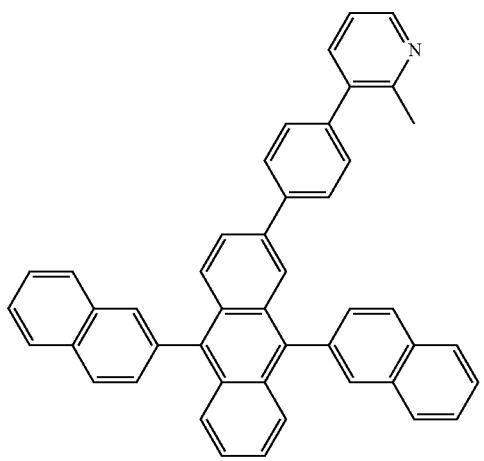
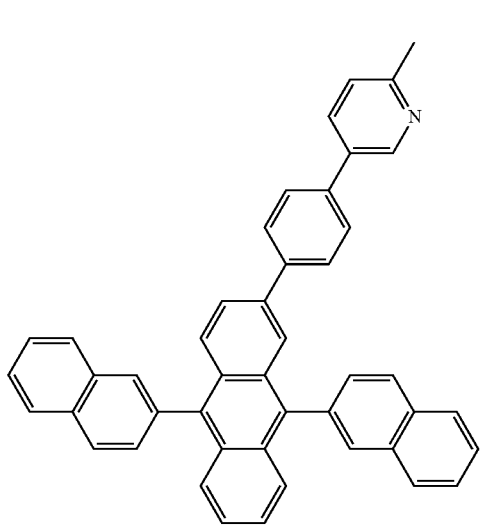
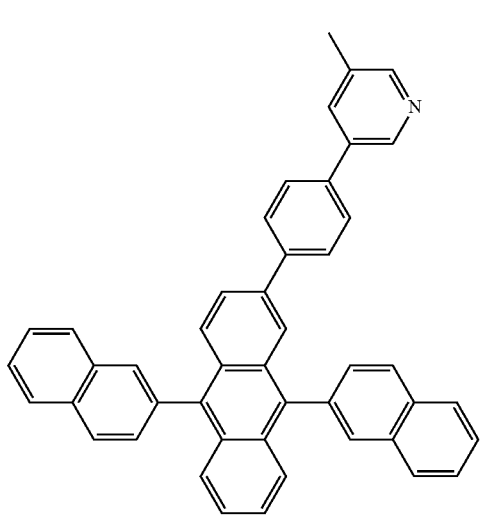
102
-continued
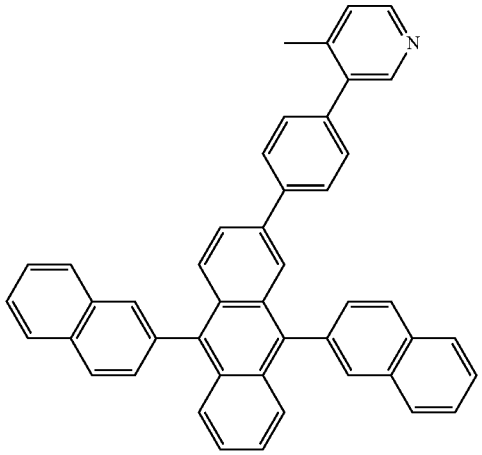
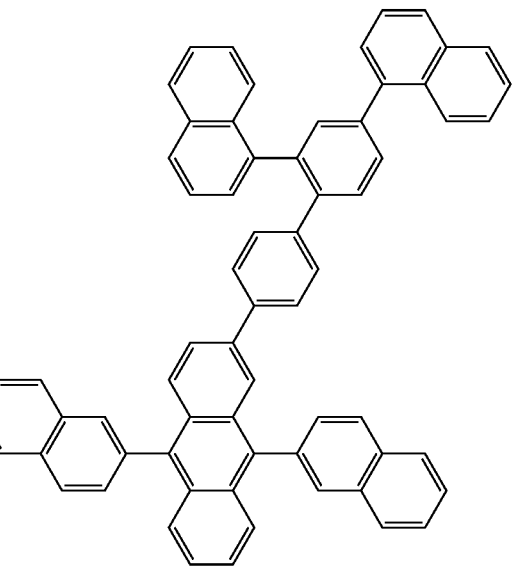
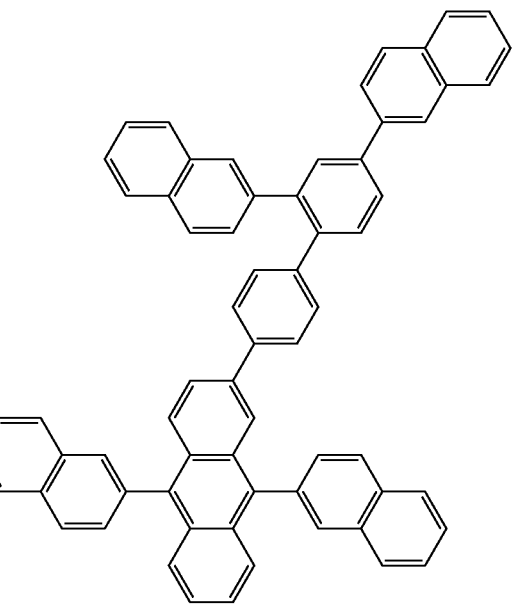

103
-continued
104
-continued
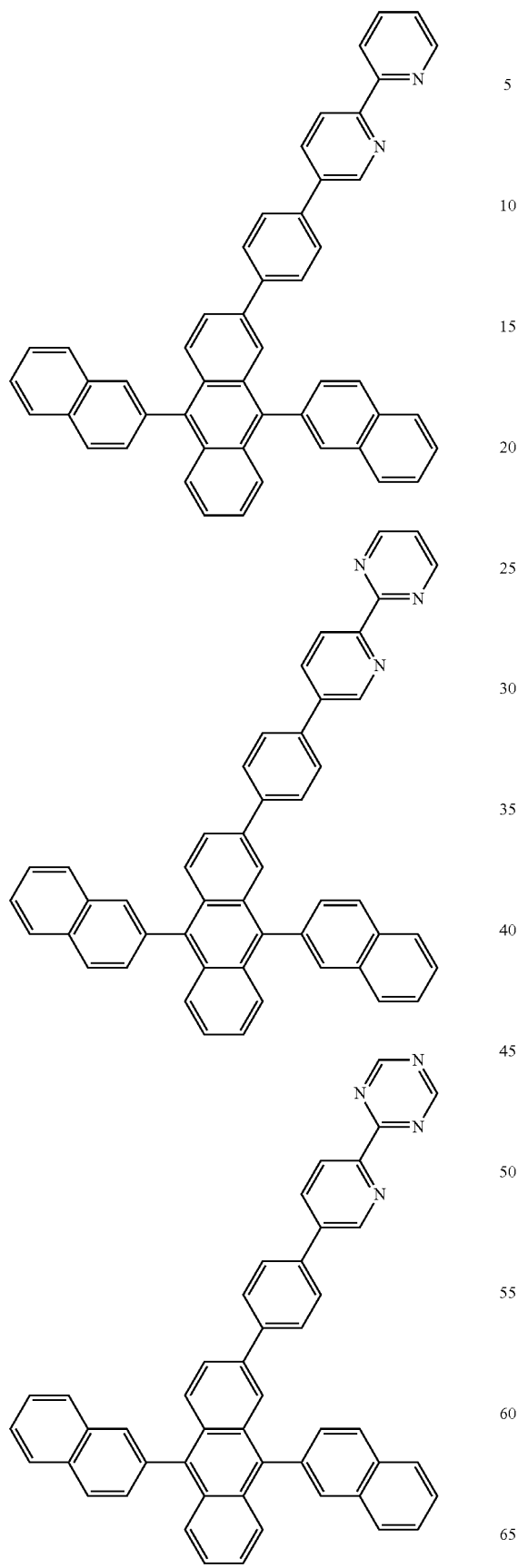
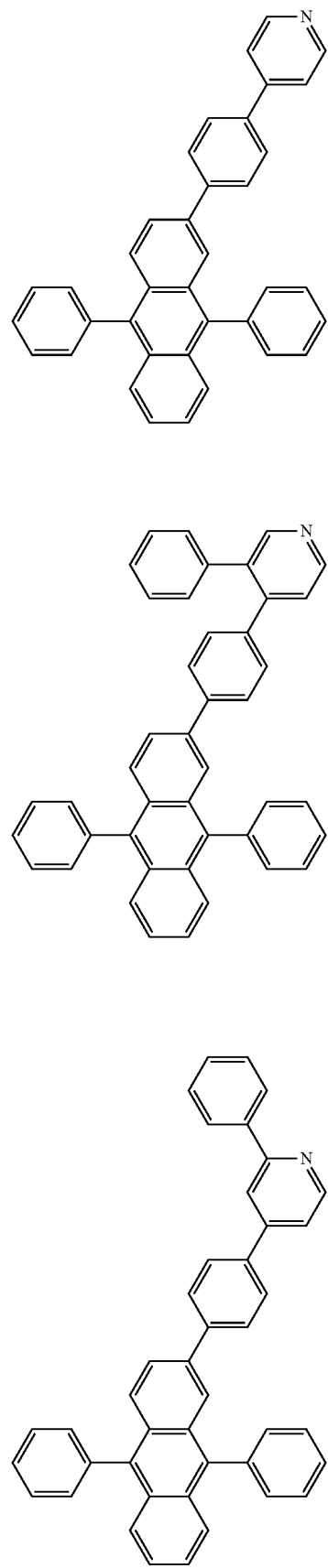

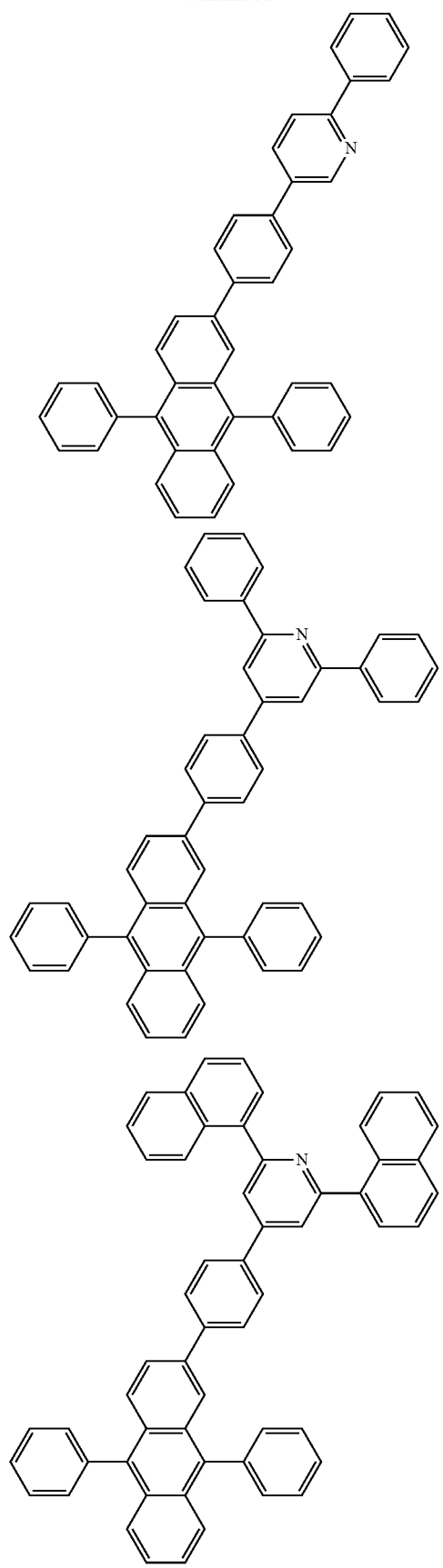
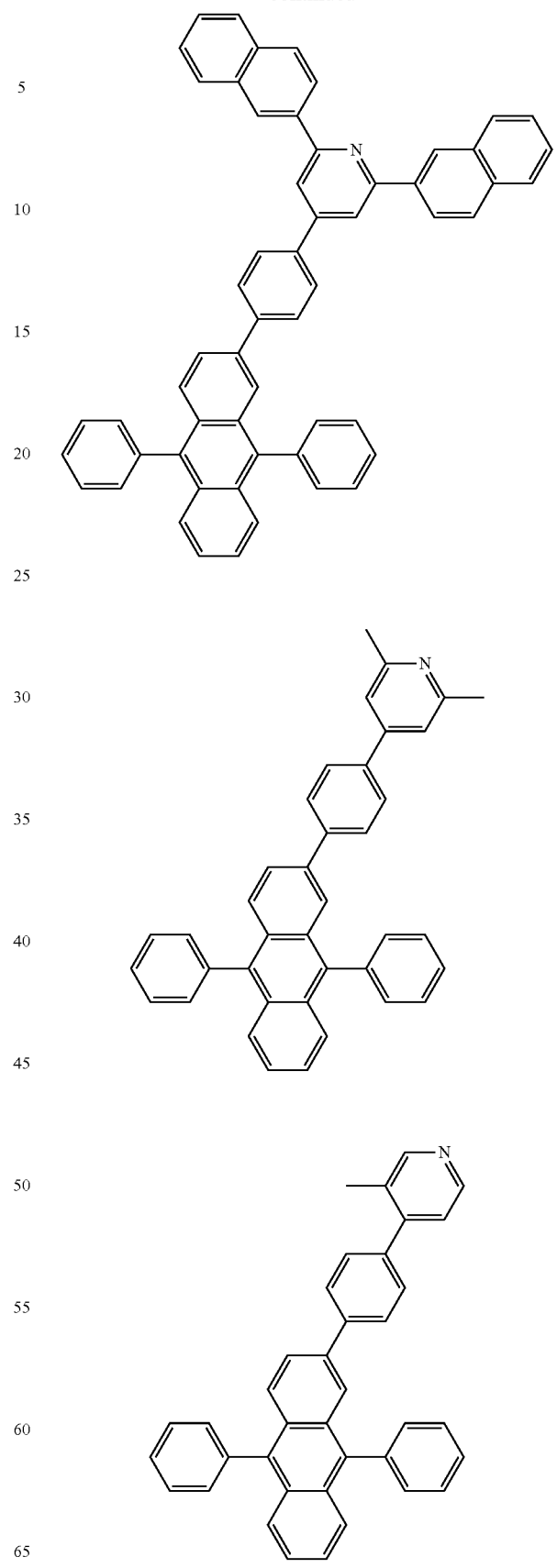

-continued
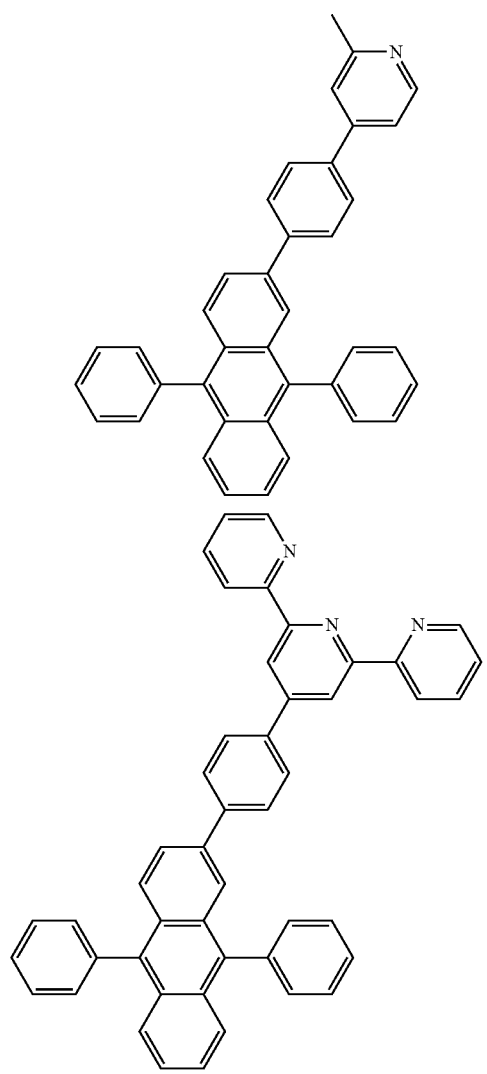
-continued
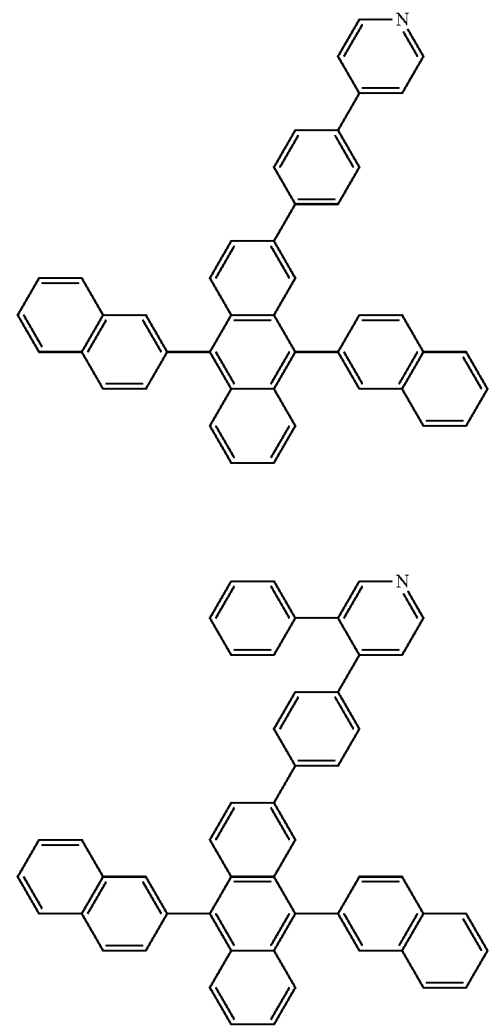
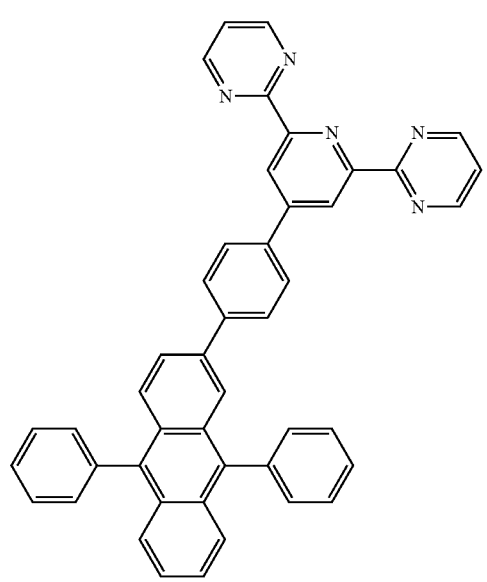
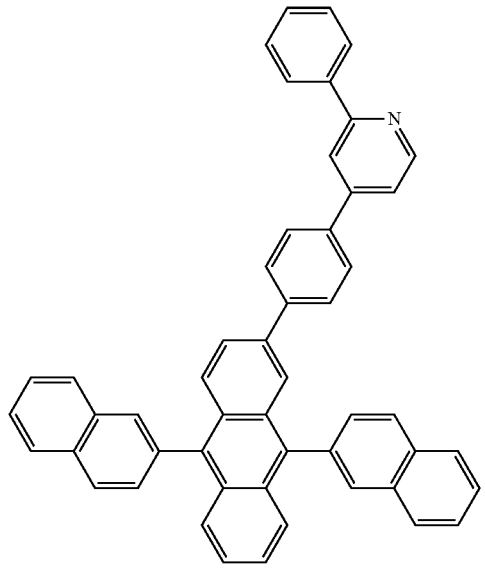

109
-continued
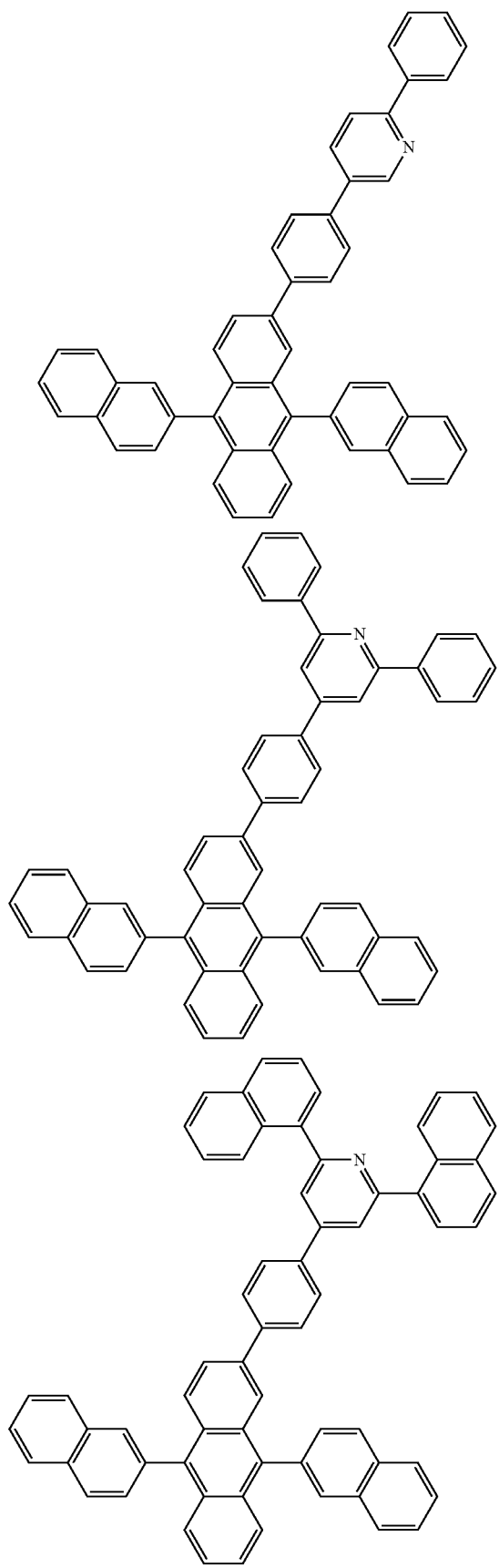
110
-continued
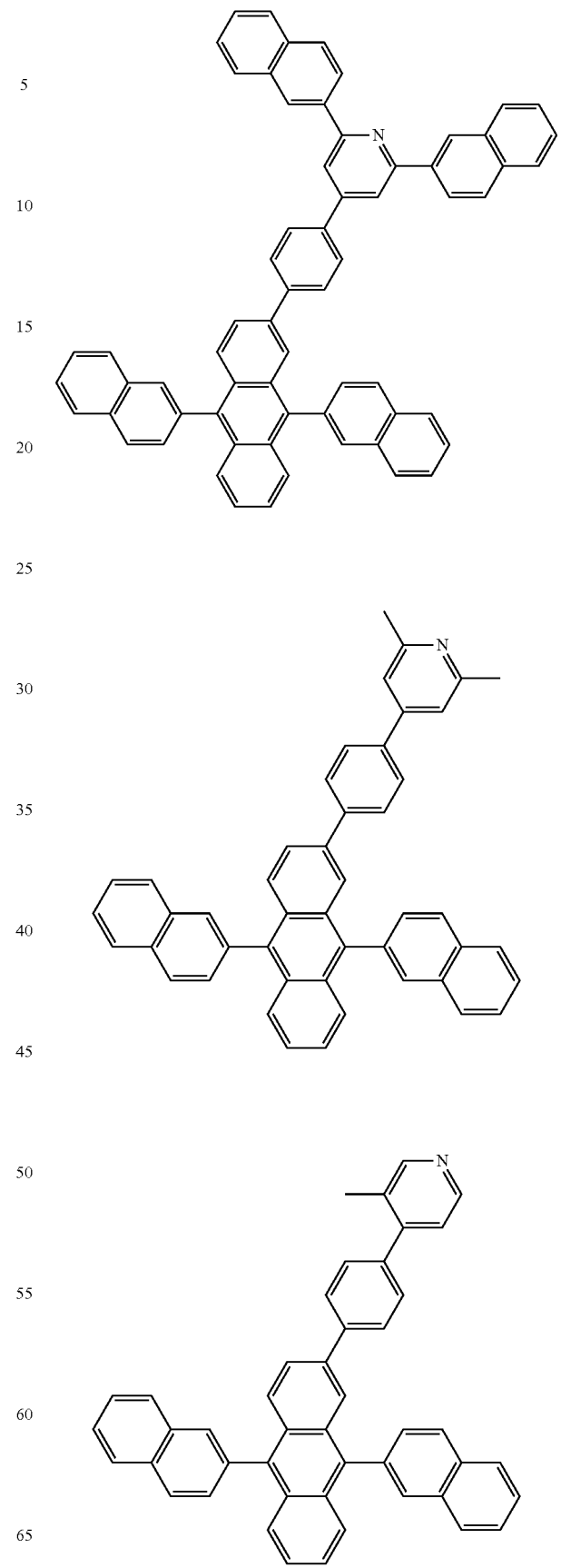

111
-continued
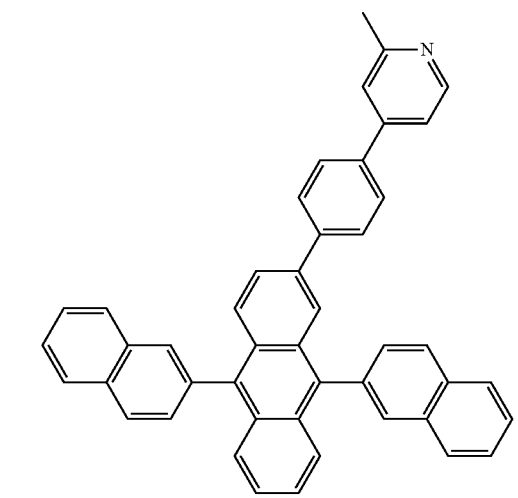
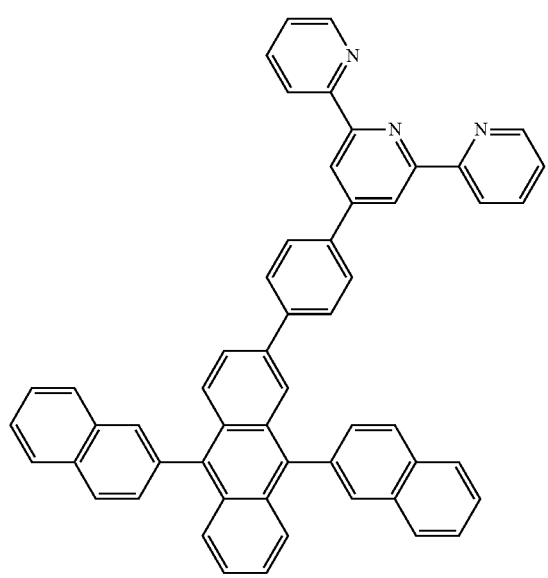
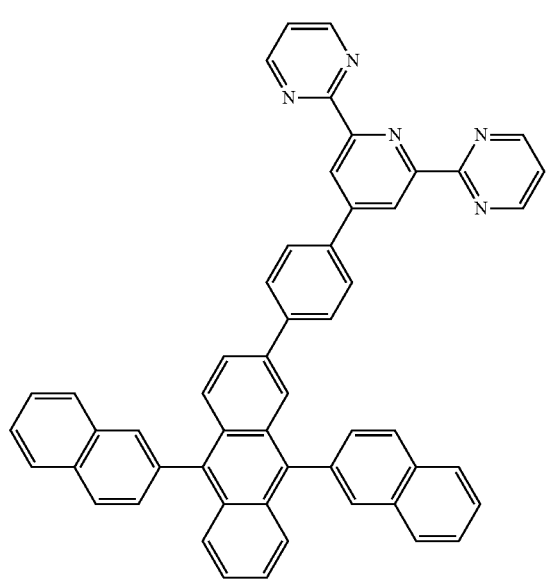
112
-continued
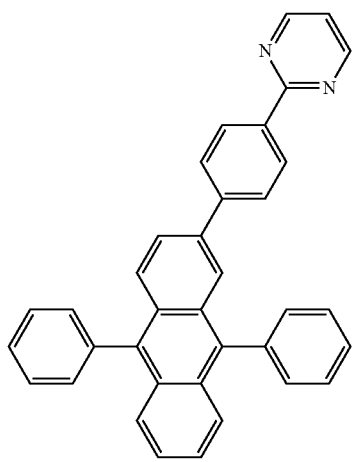
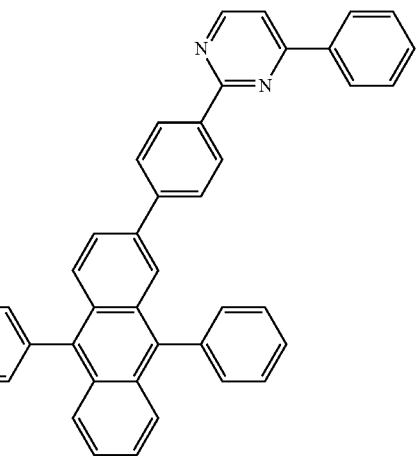
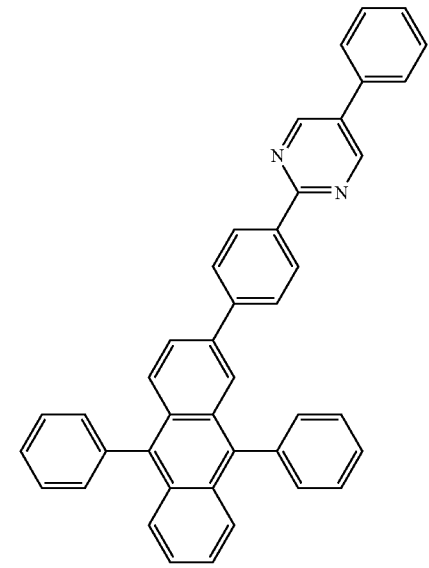

113
-continued
114
-continued
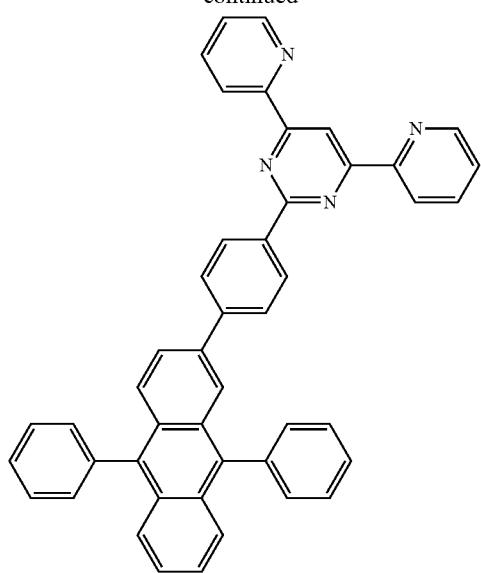
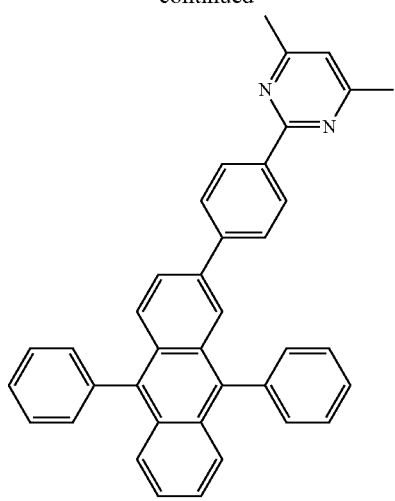
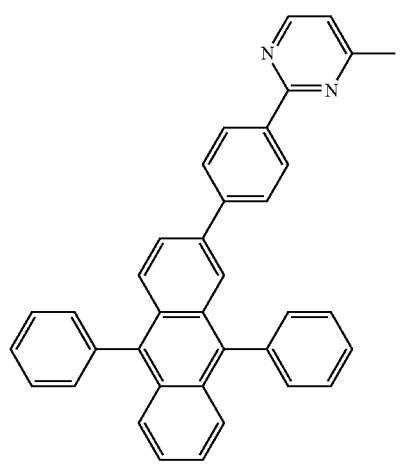
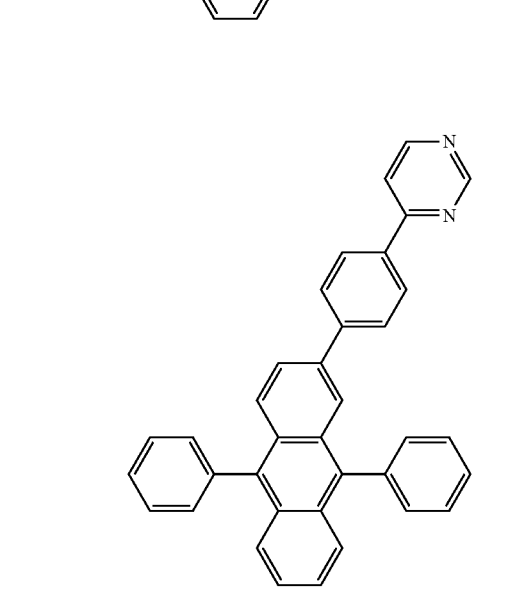

-continued
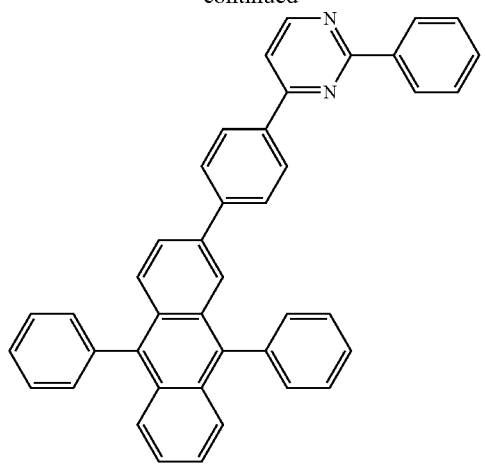
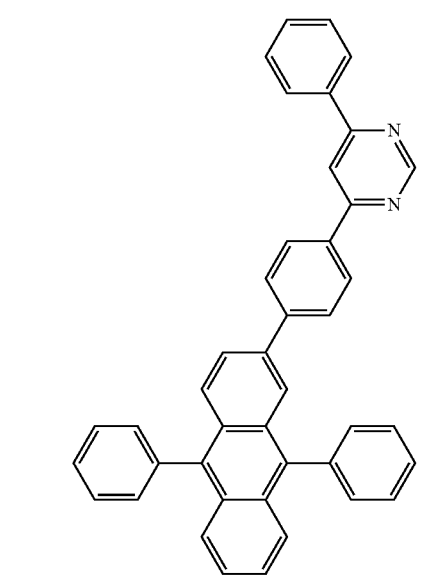
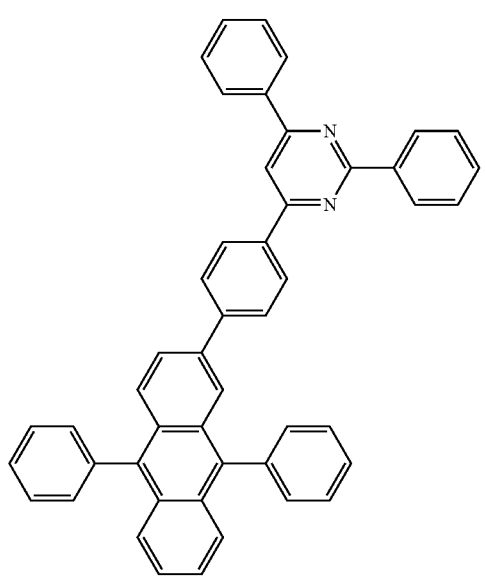
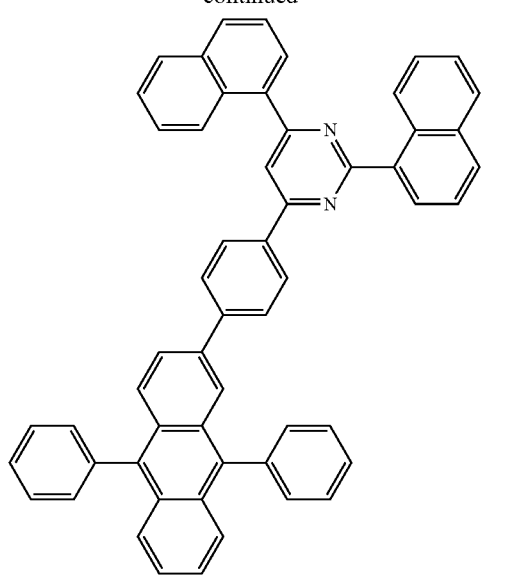
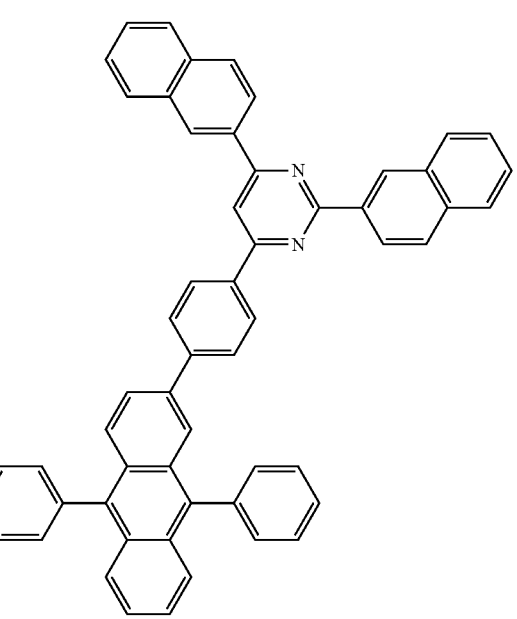
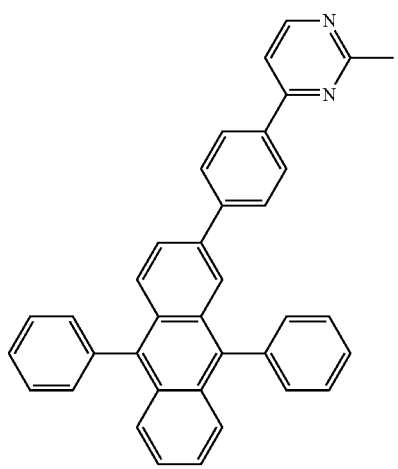

117
-continued
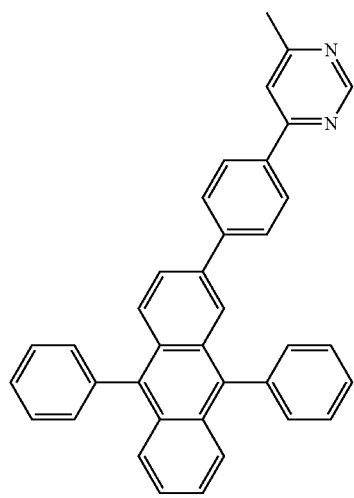
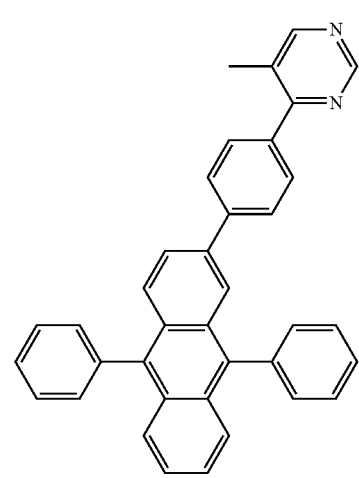
118
-continued
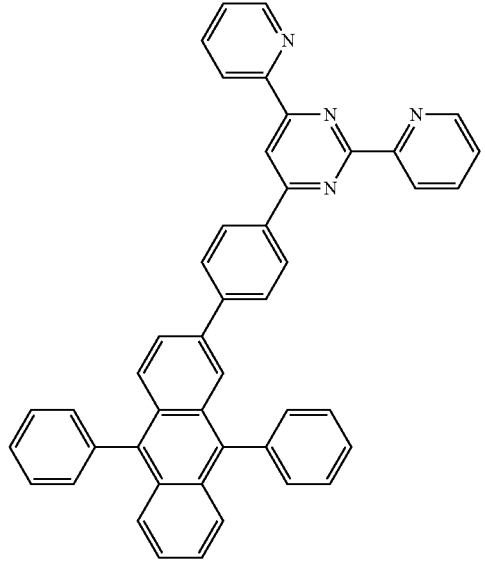
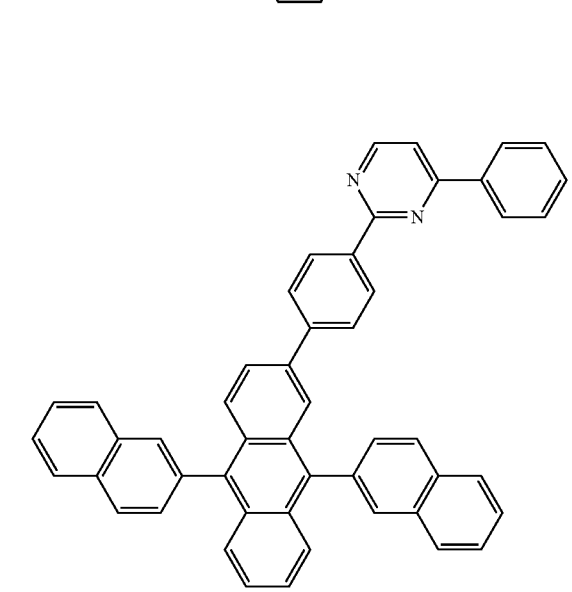

119
-continued
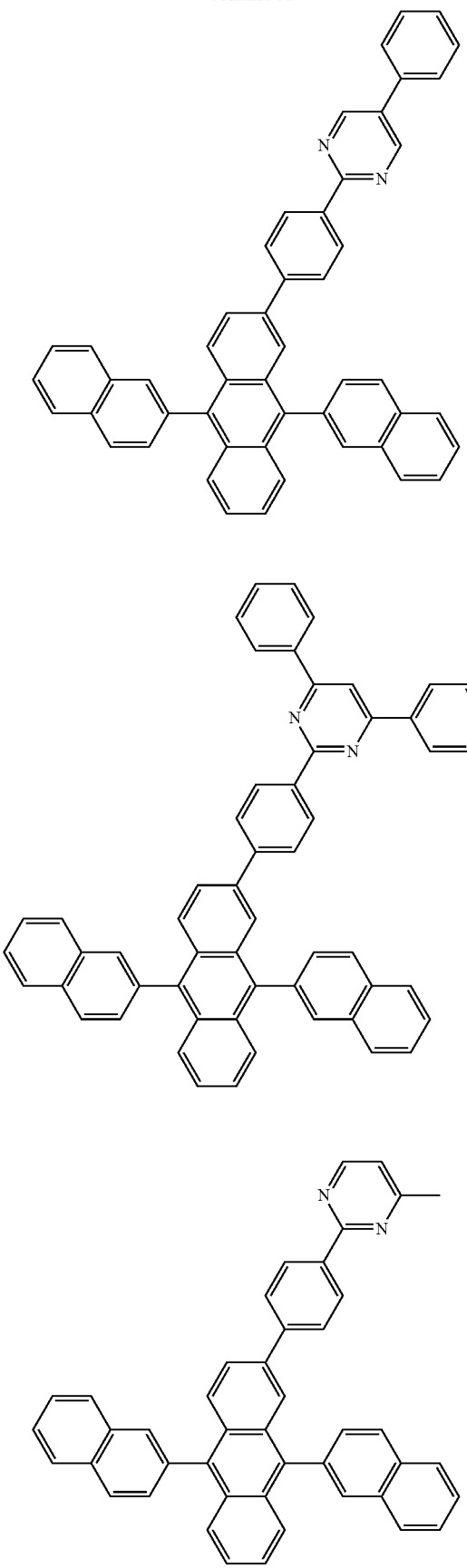
120
-continued
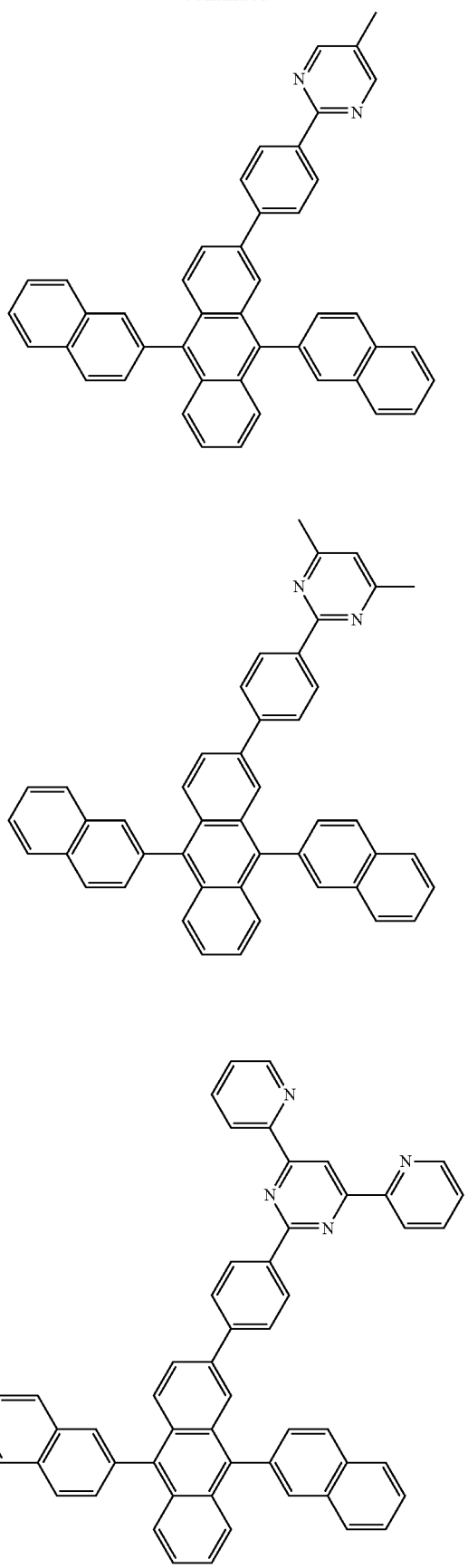

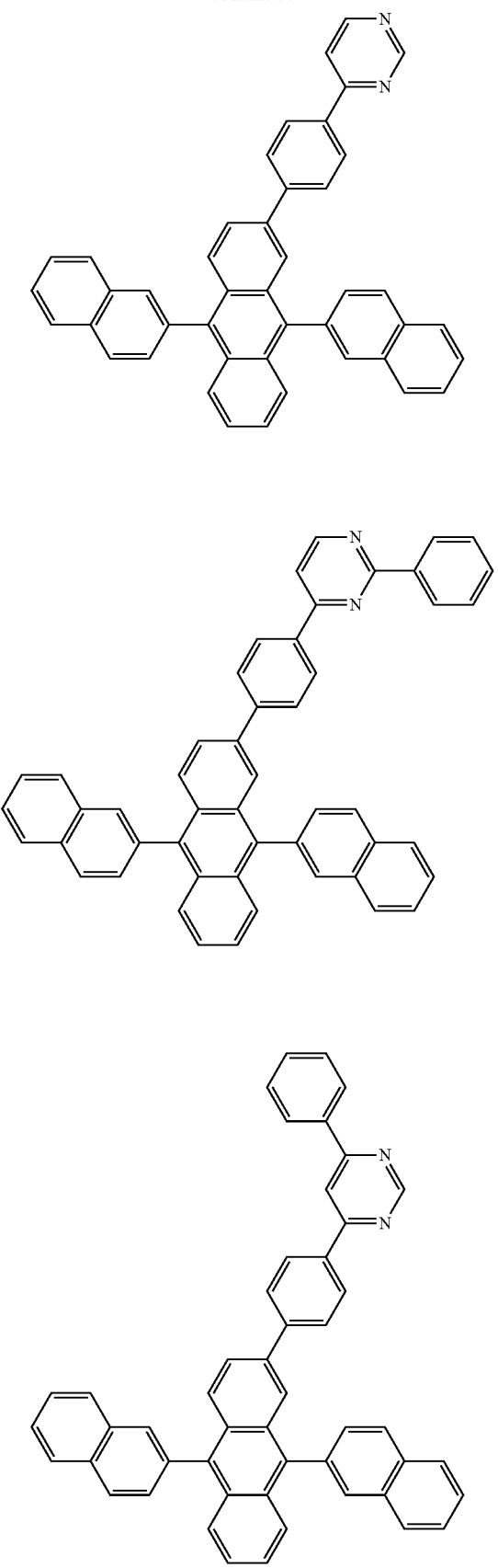

123
-continued
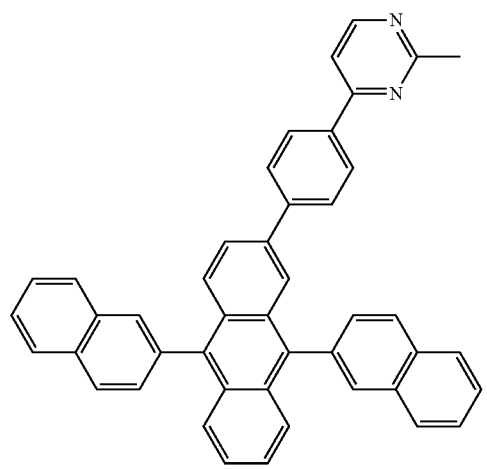
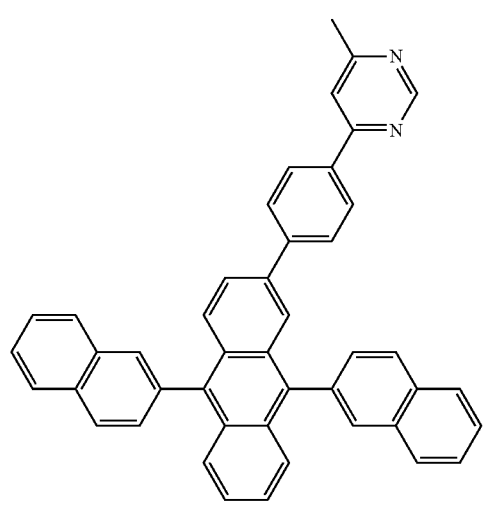
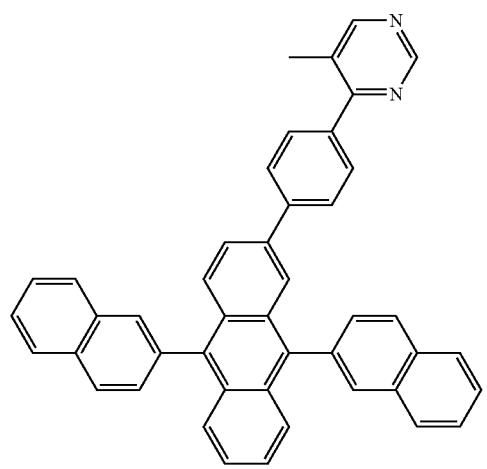
124
-continued
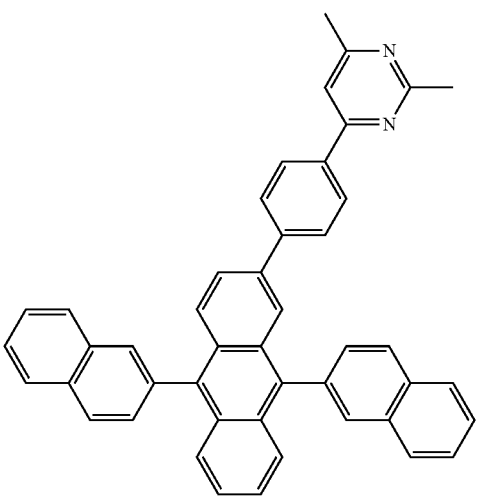
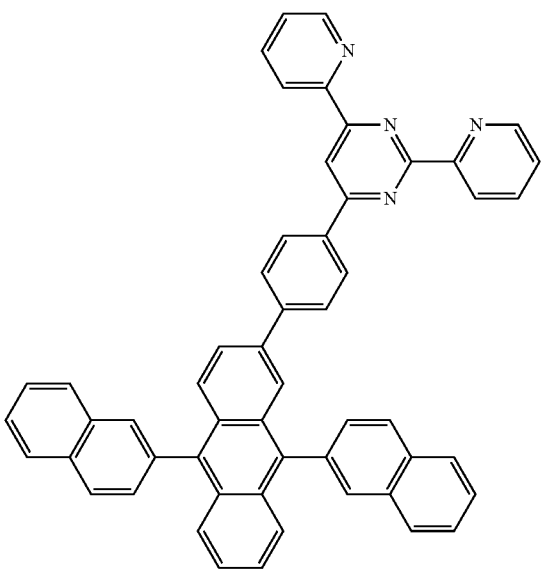
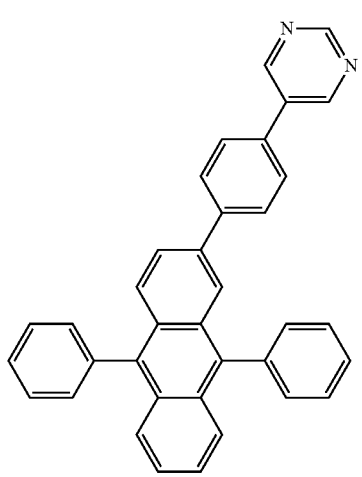

125
-continued
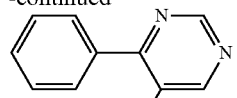
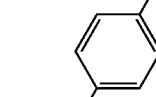
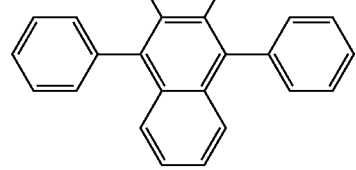
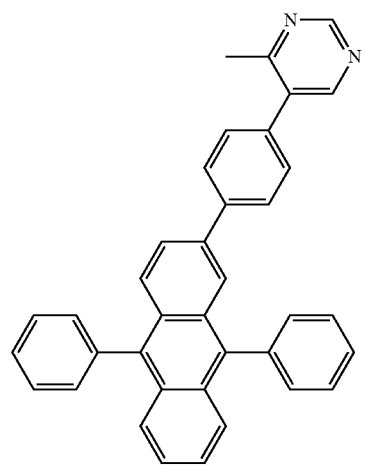
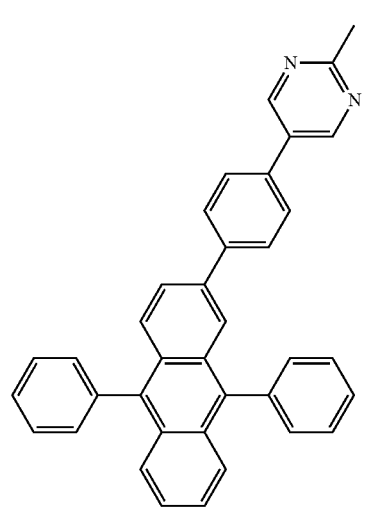
126
-continued
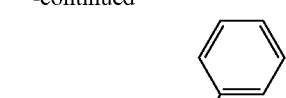
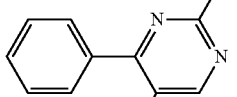
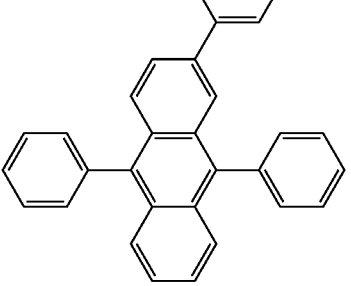
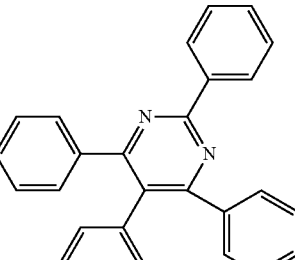
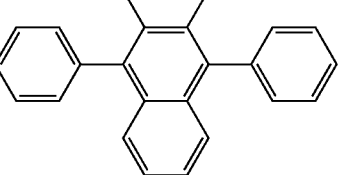

127
-continued
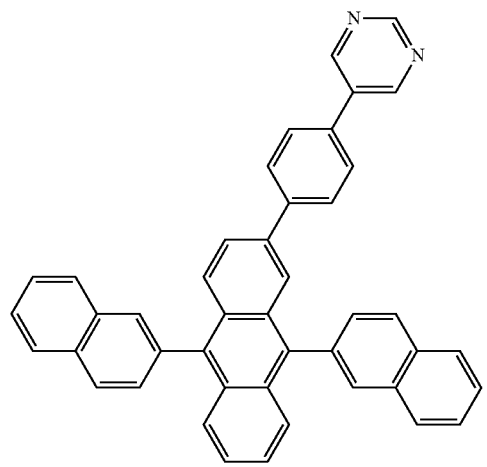
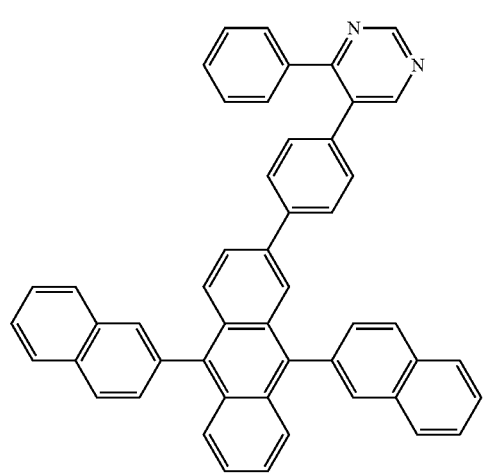
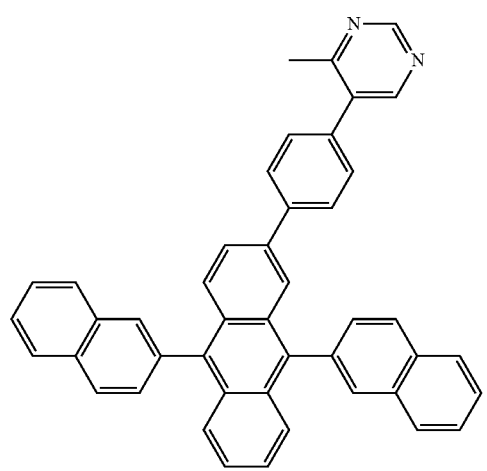
128
-continued
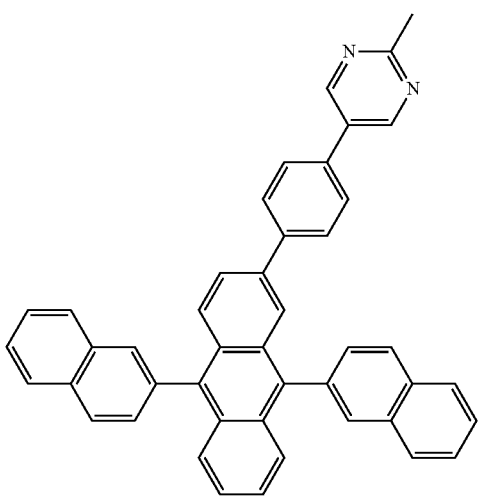
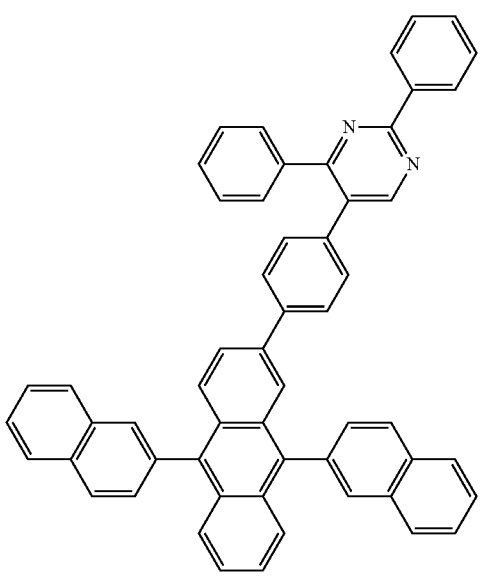
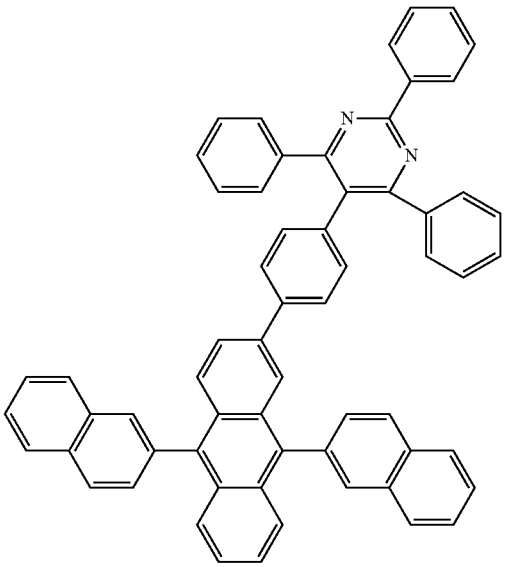

129
-continued
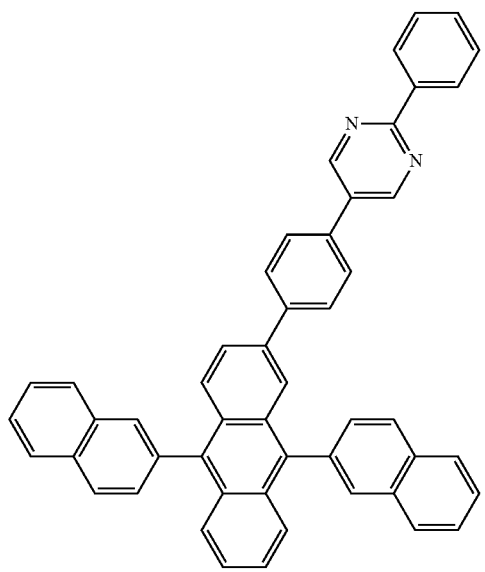
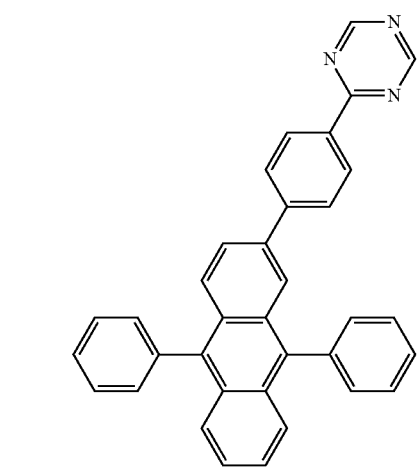
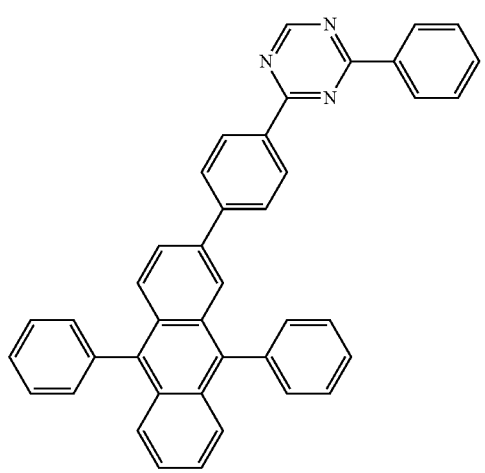
130
-continued
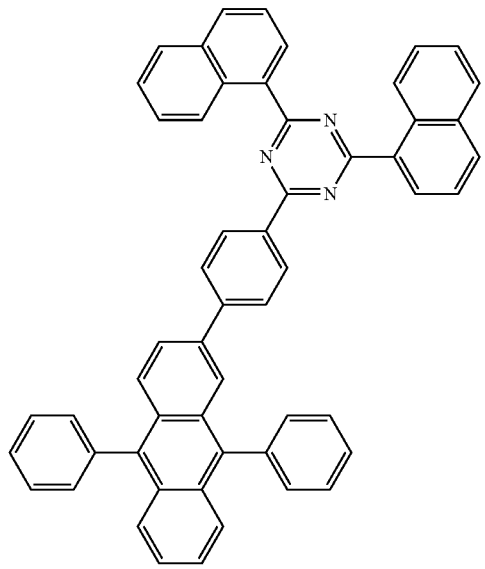
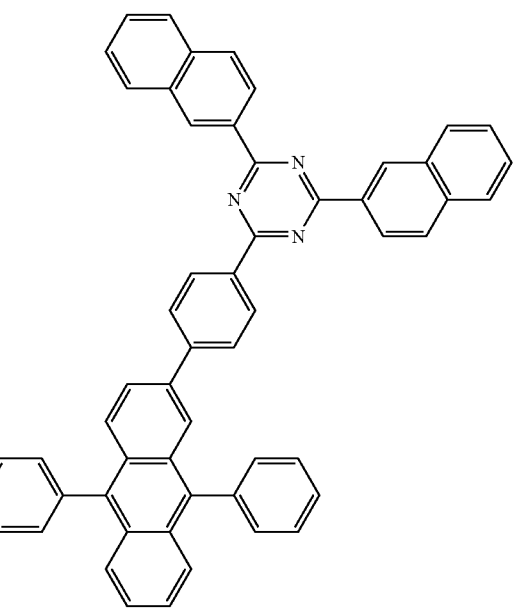
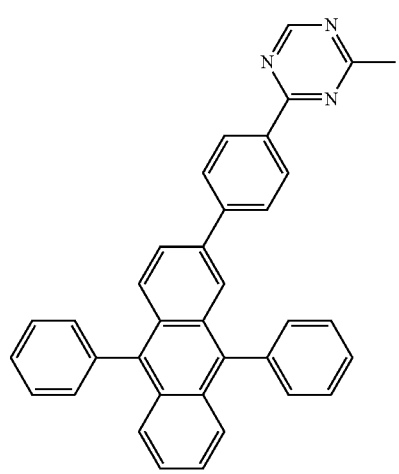

131
-continued
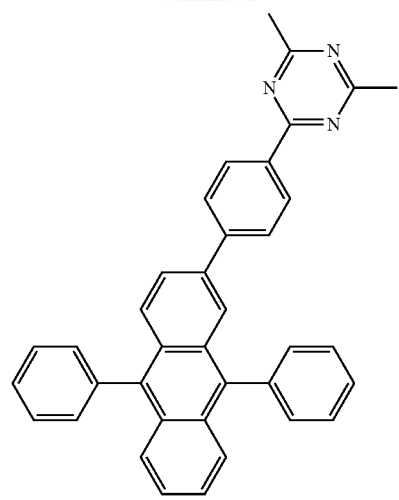
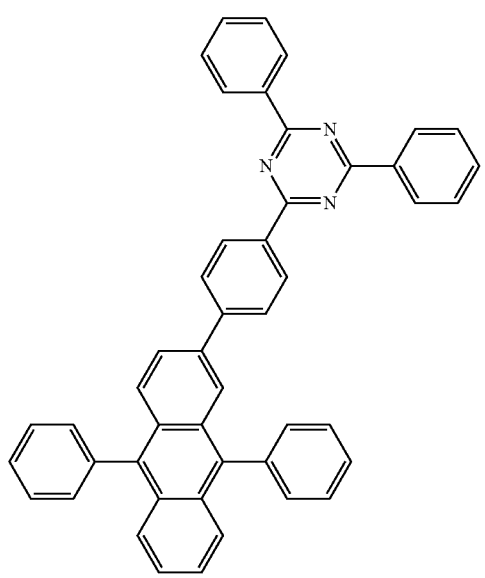
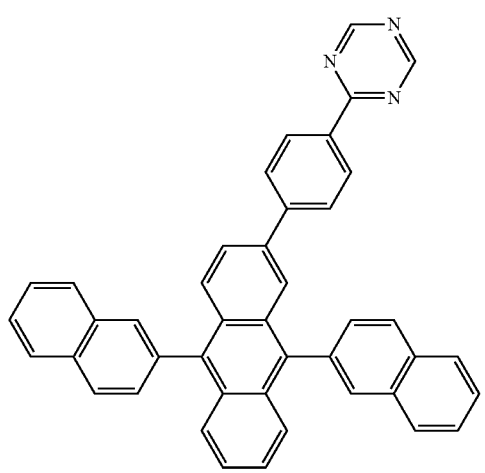
132
-continued
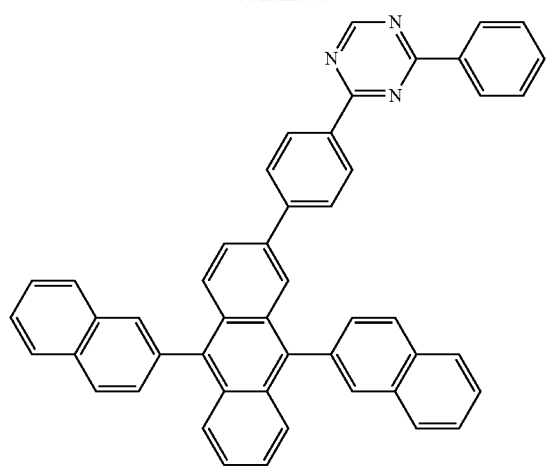
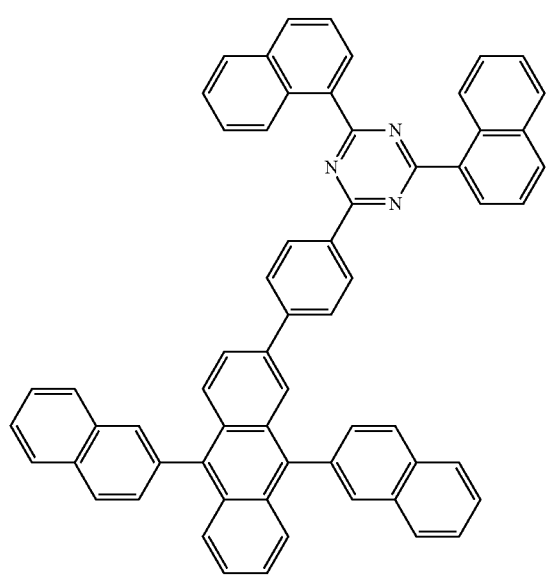
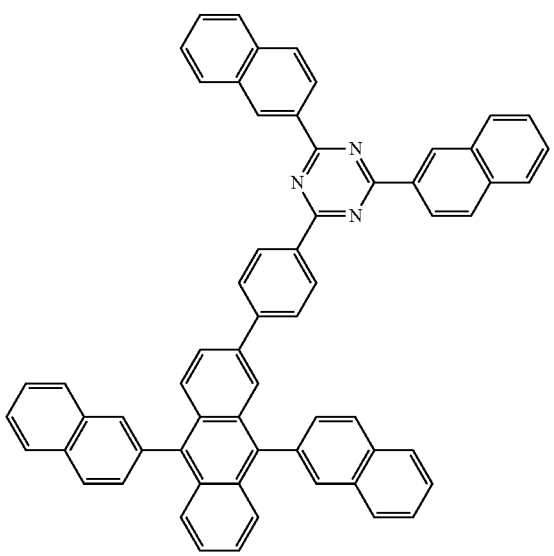

133
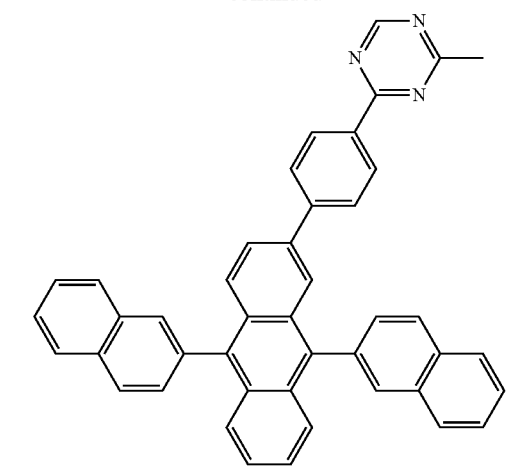
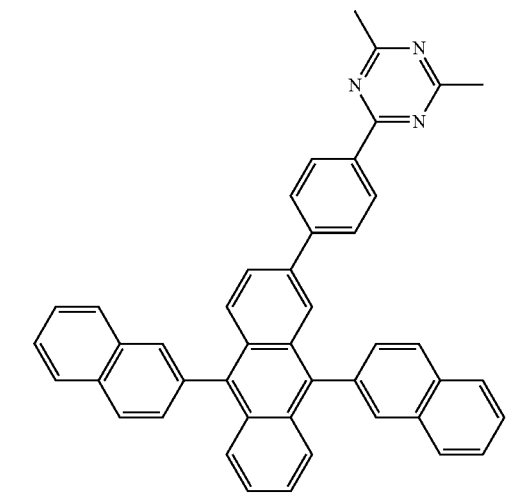
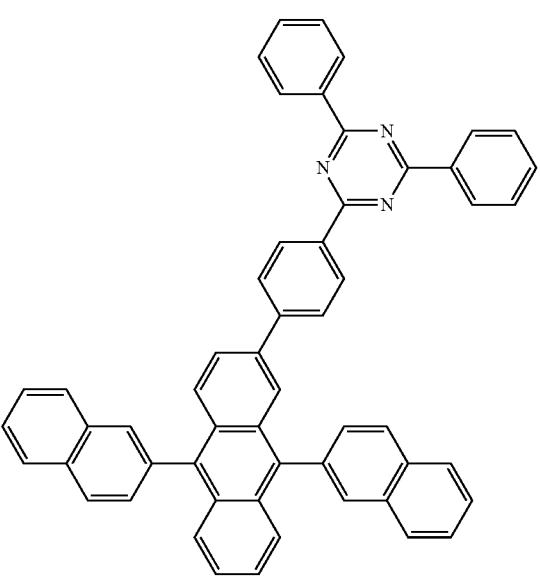
134
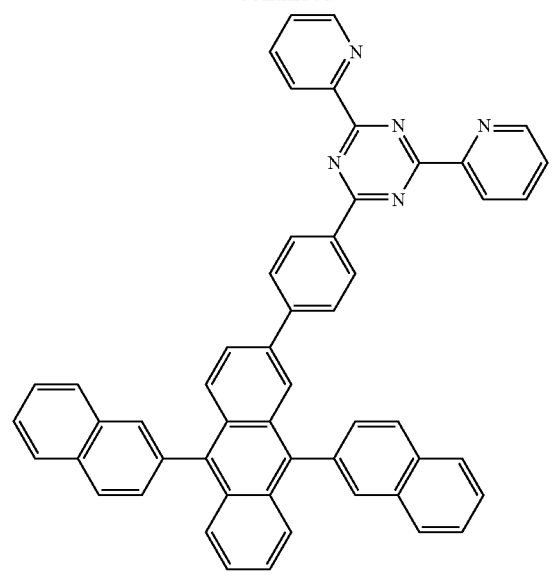
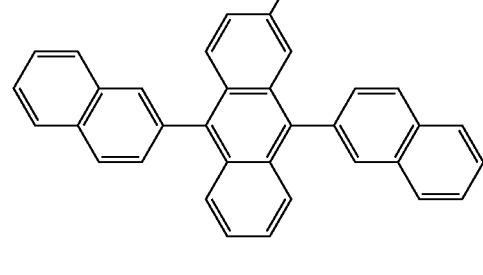
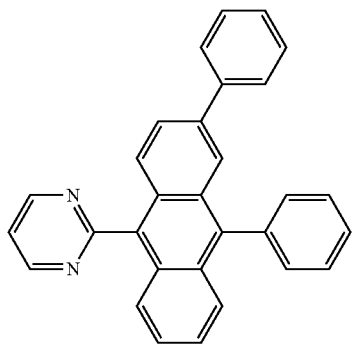
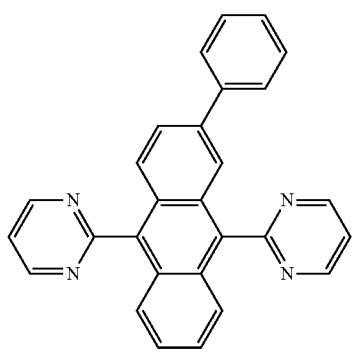
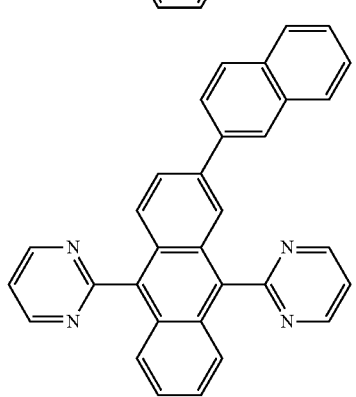

135
-continued
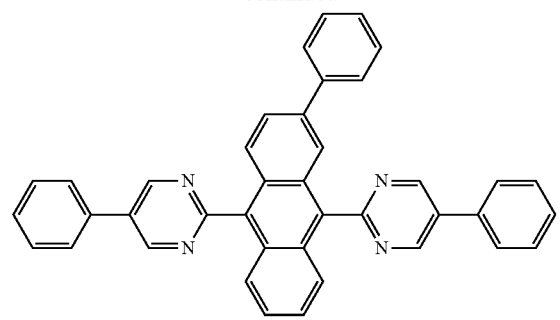
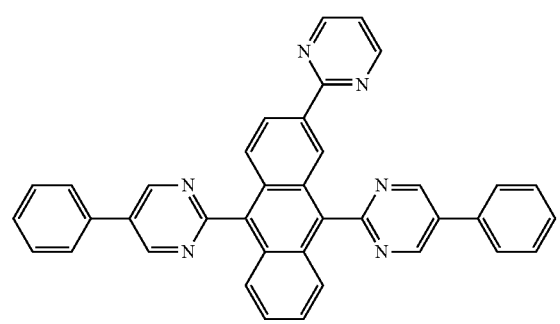
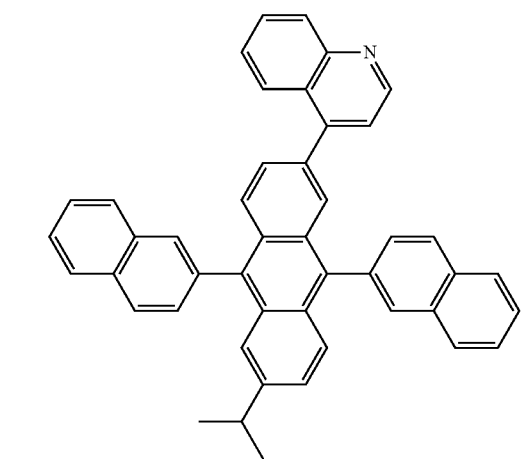
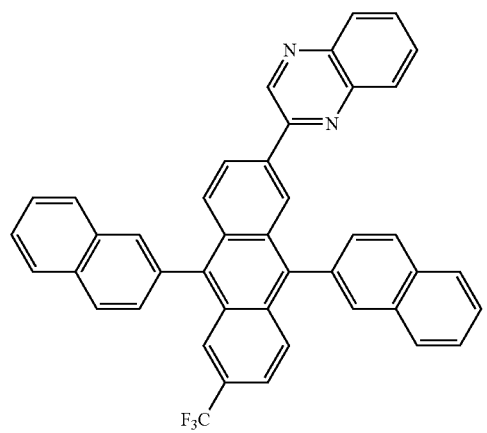
136
-continued
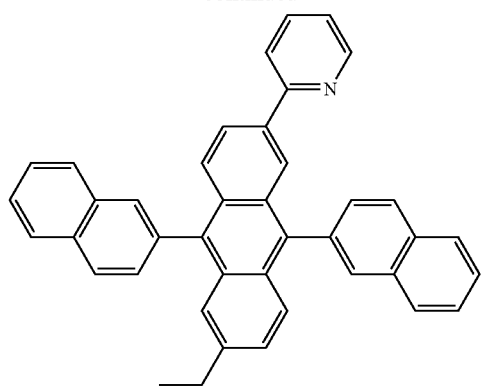
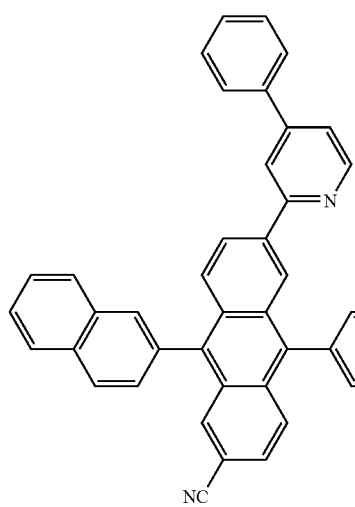
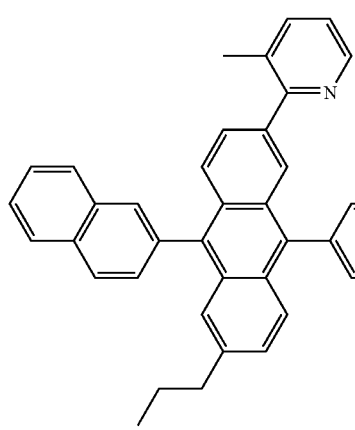
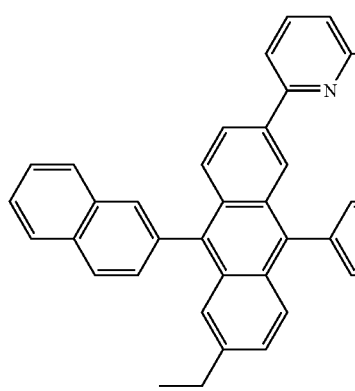

137
-continued
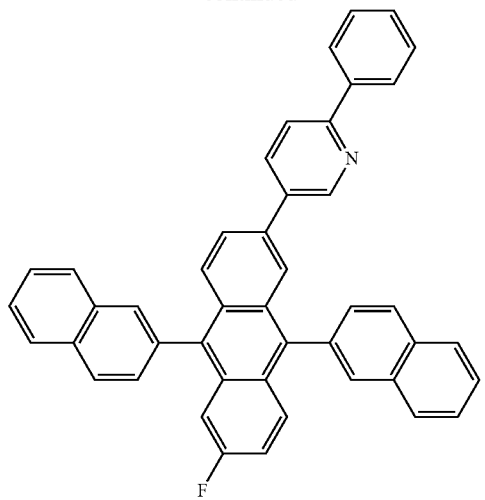
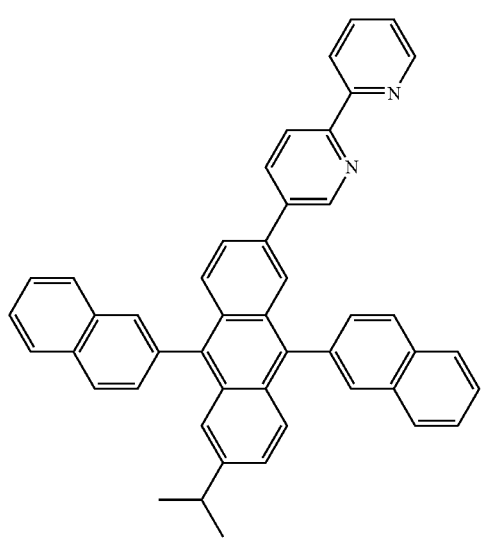
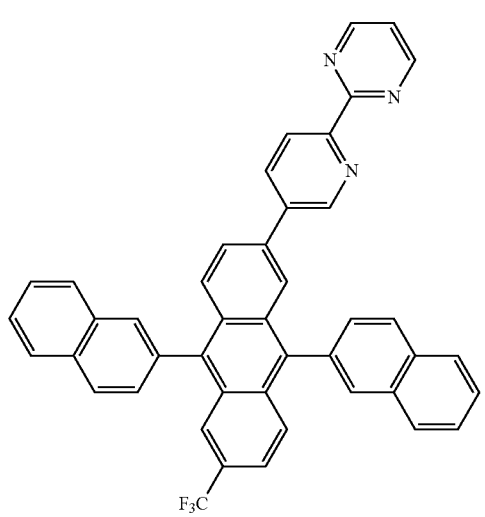
138
-continued
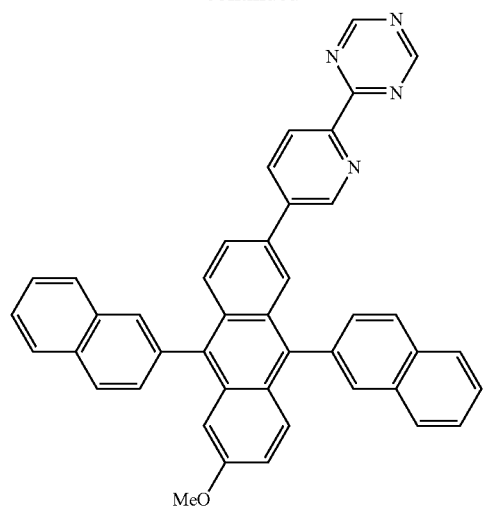
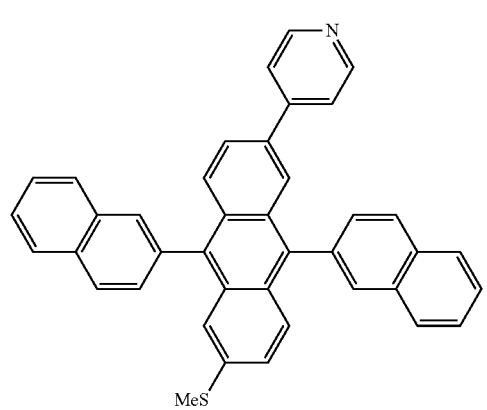
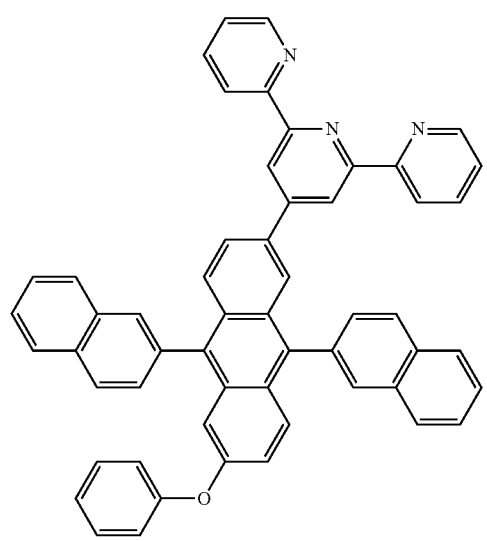

139
-continued
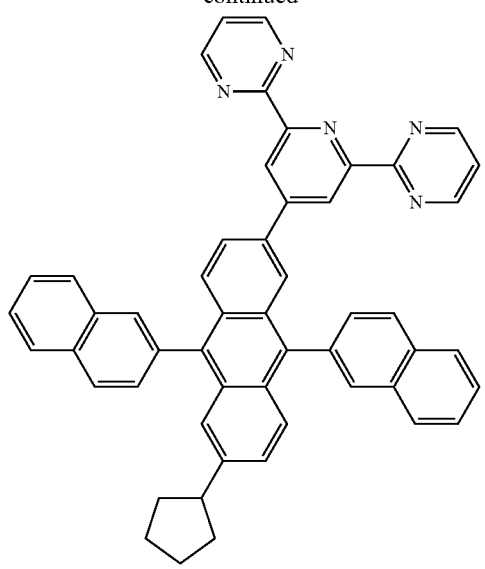
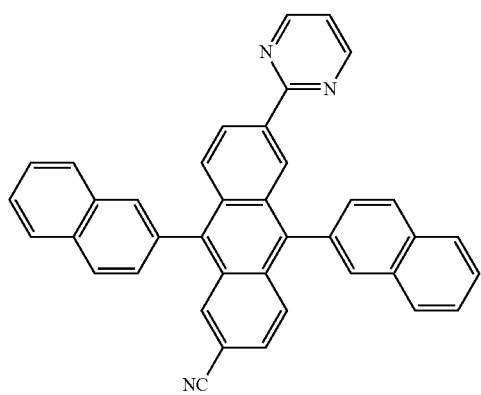
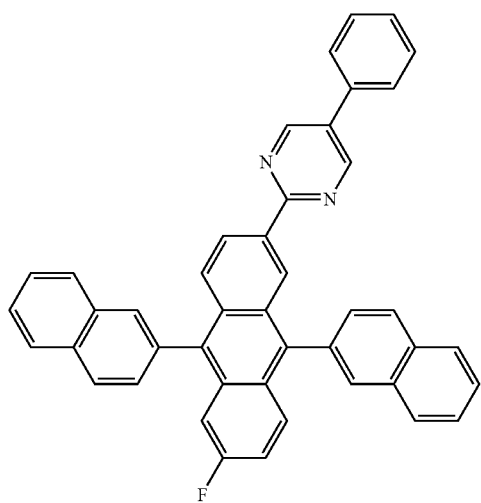
140
-continued
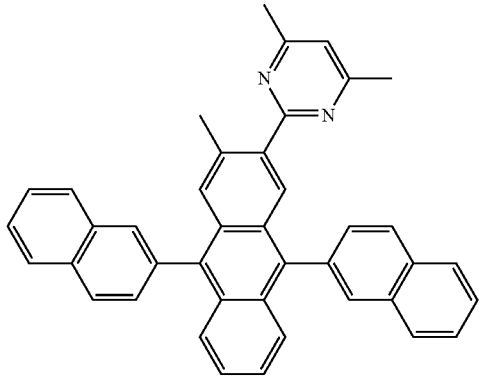
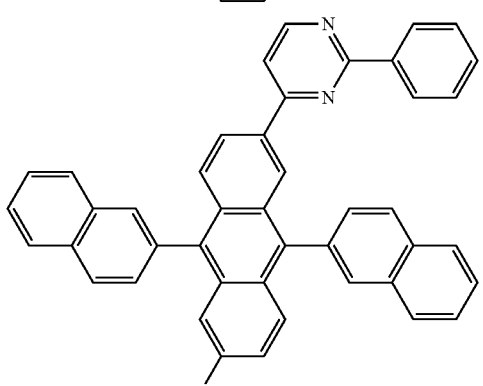
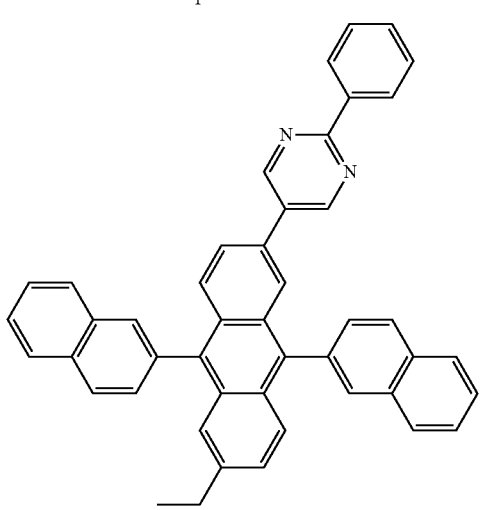
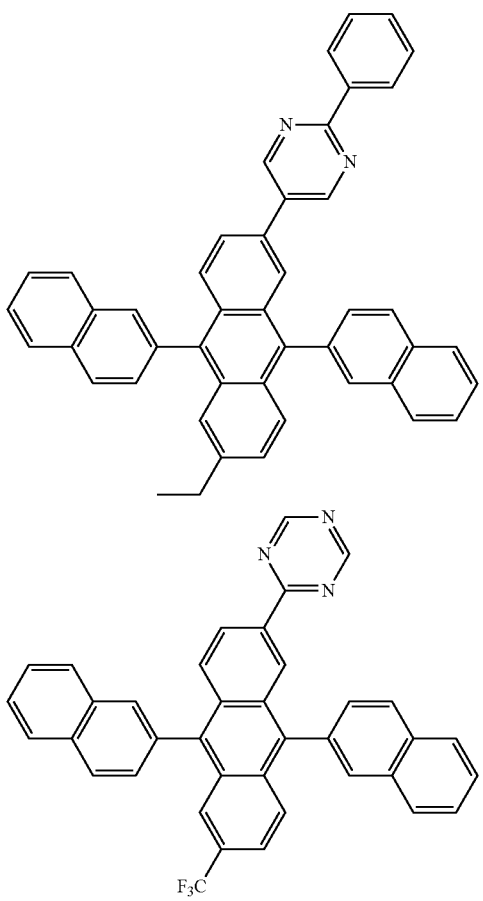

141
-continued
142
-continued
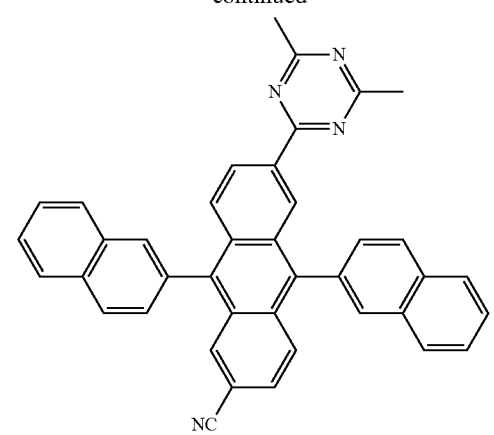
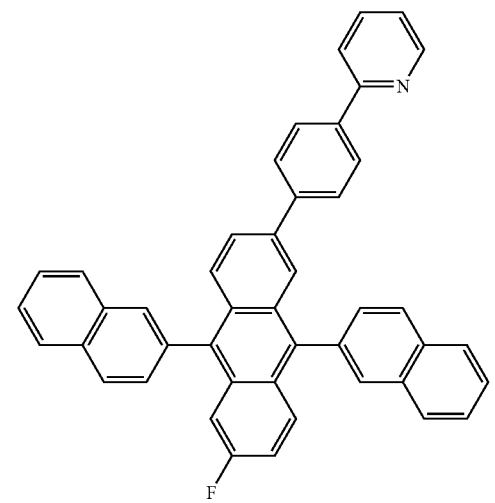
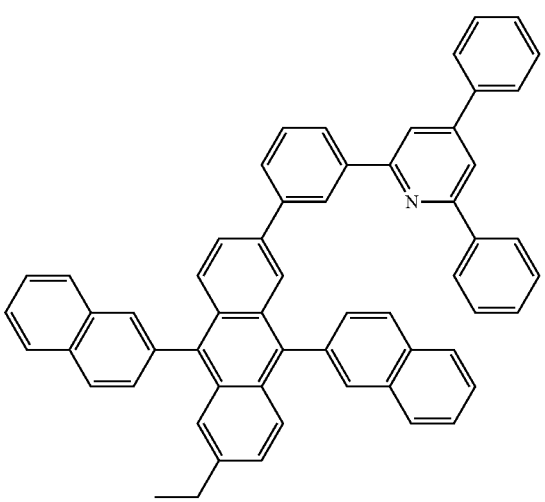
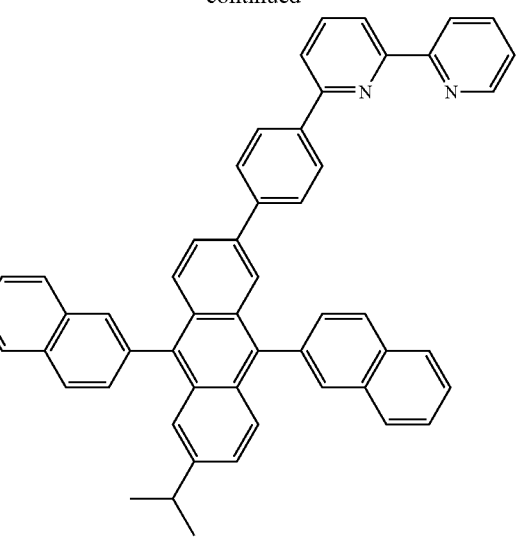
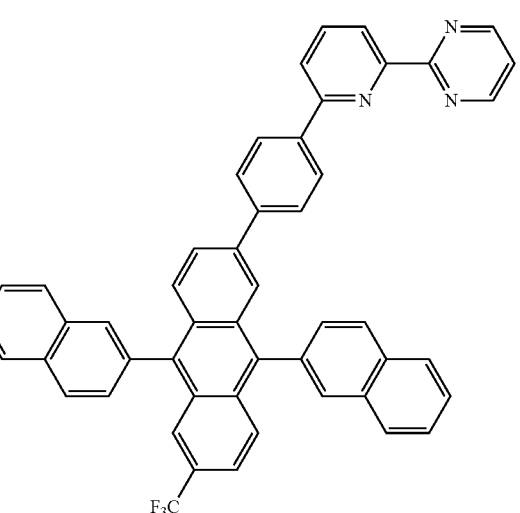
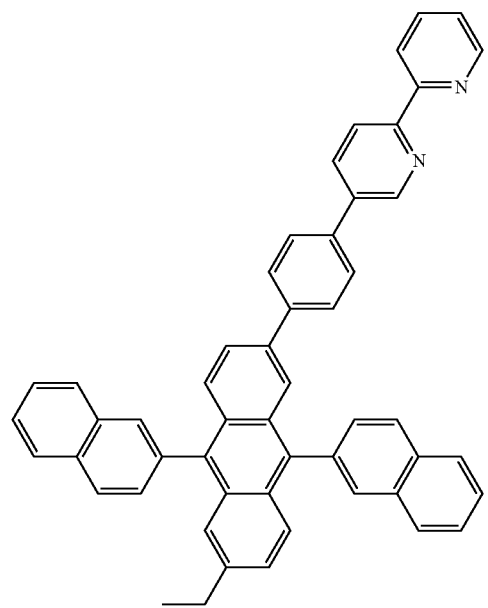

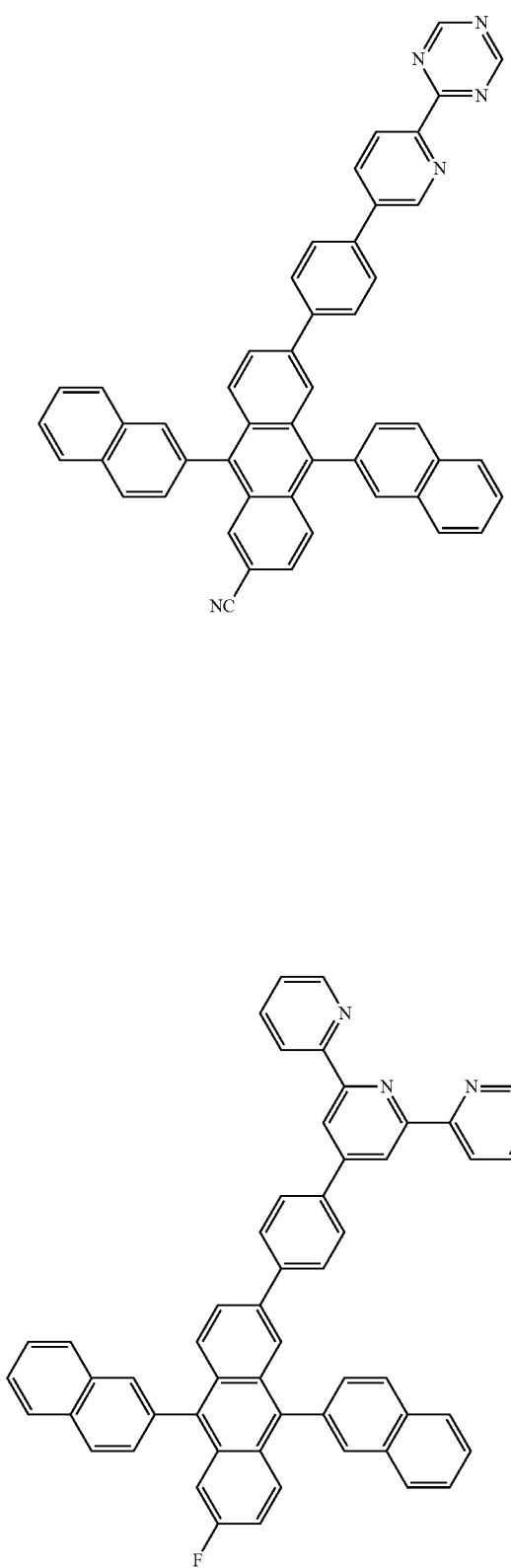
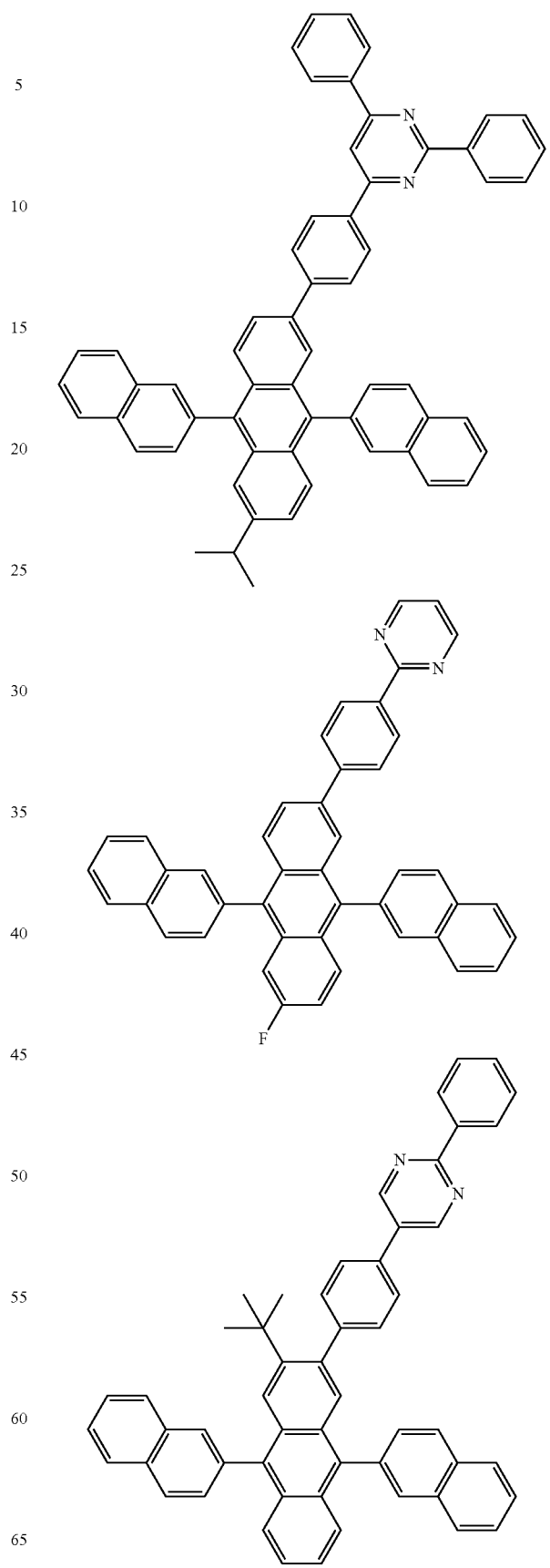

-continued
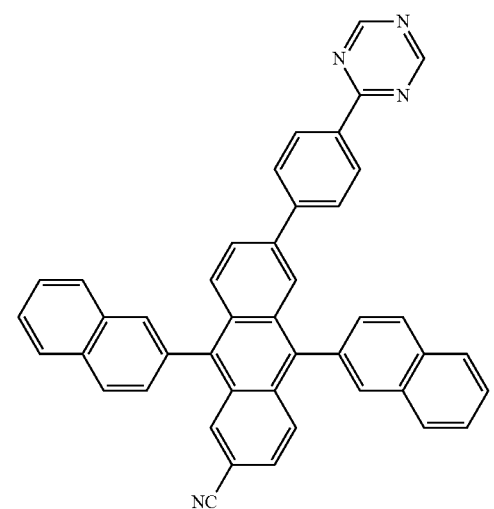
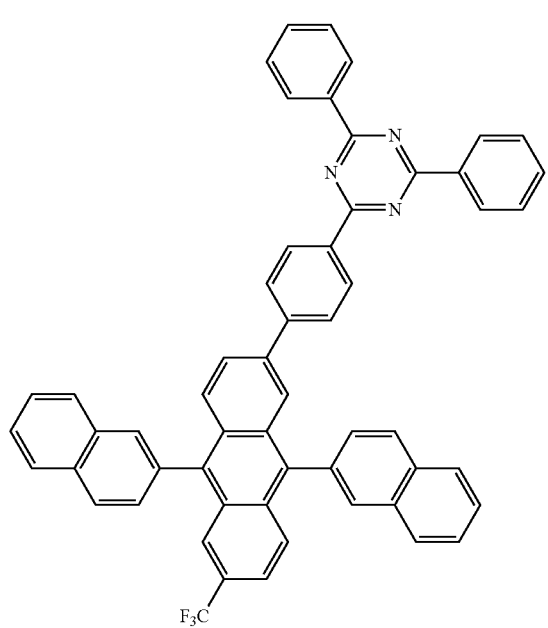
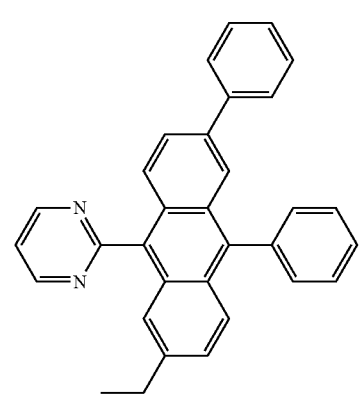
-continued
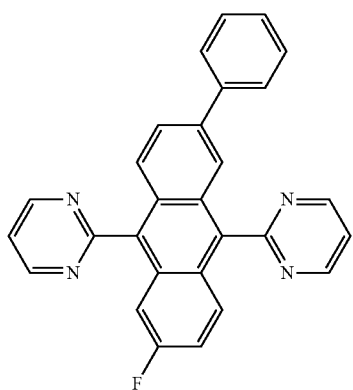
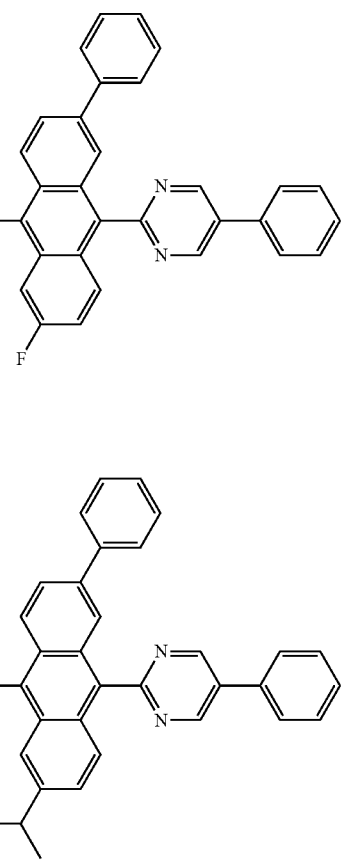
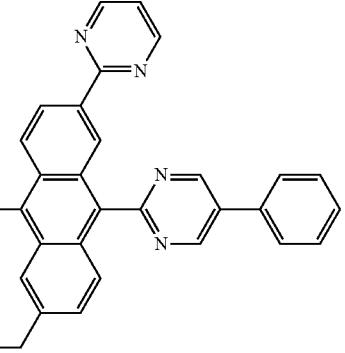

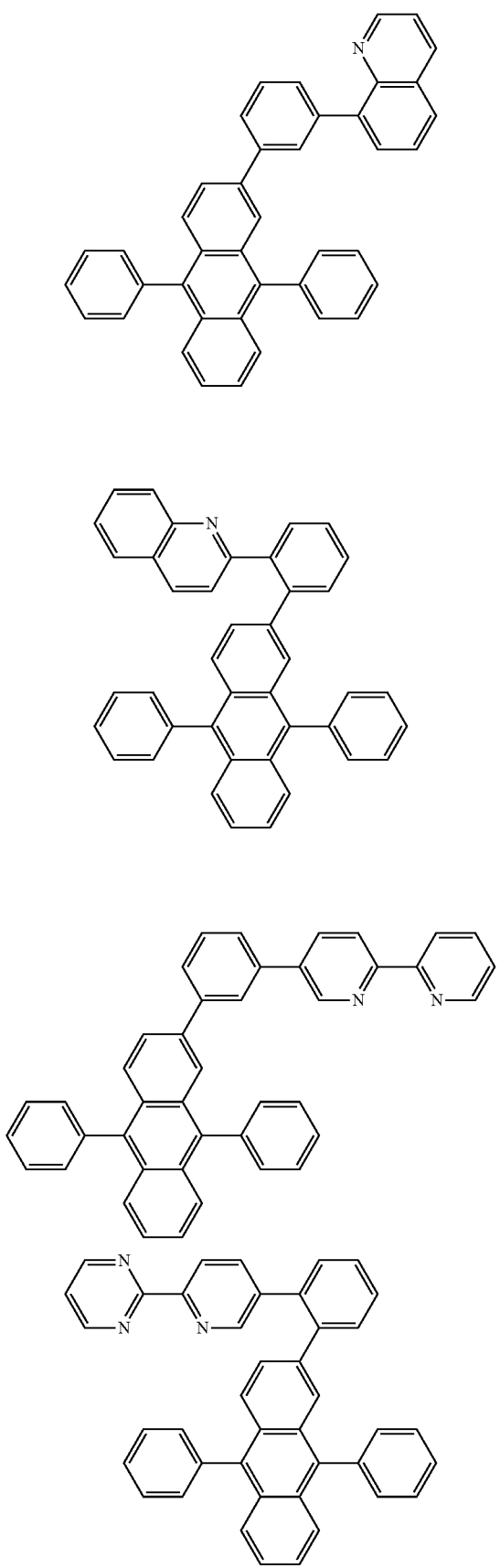
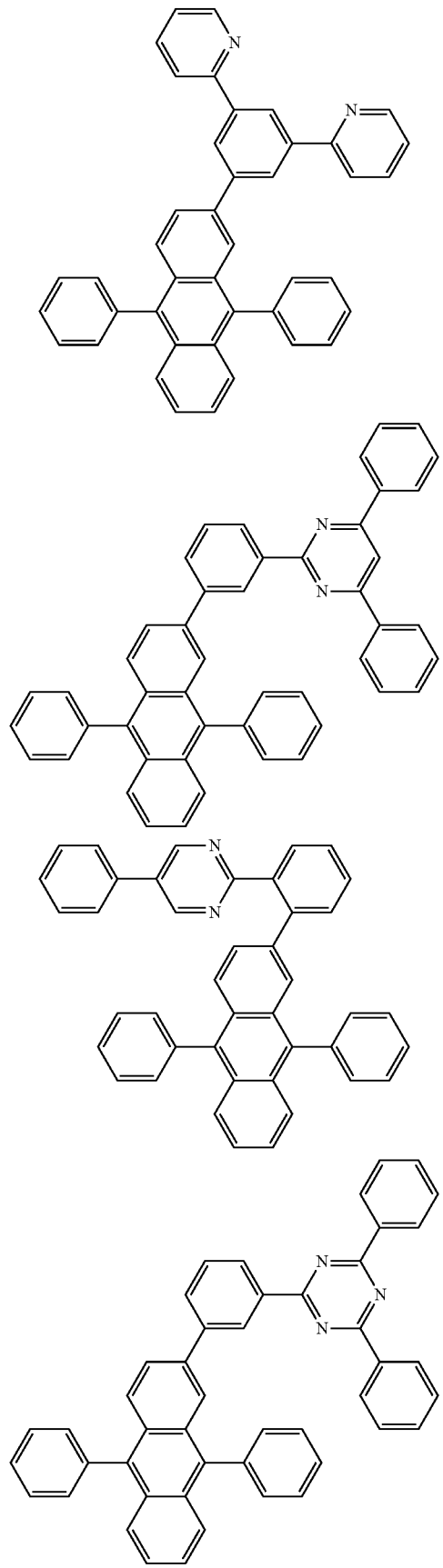

149
-continued
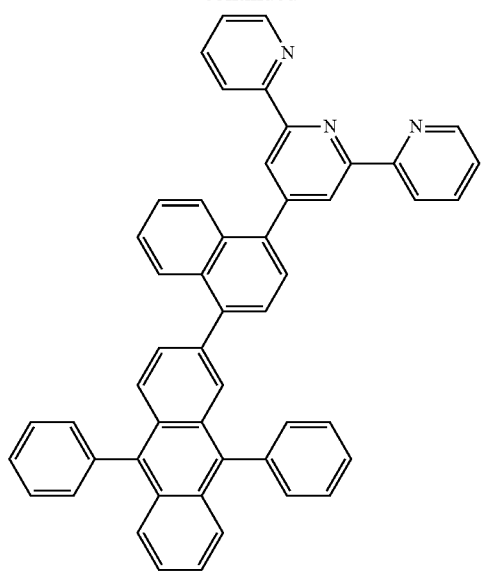
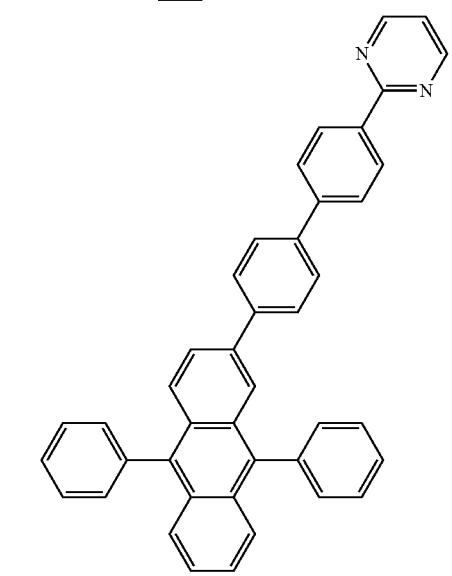
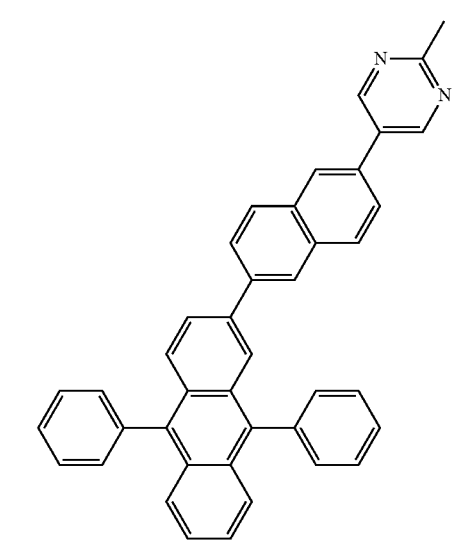
150
-continued
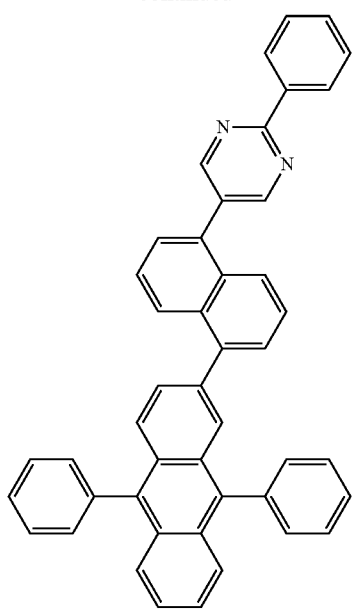
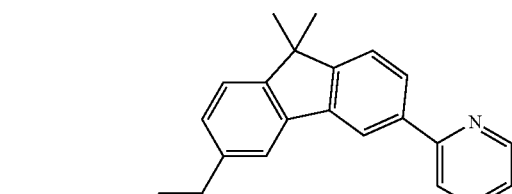
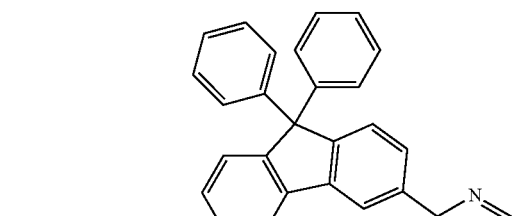

151
-continued
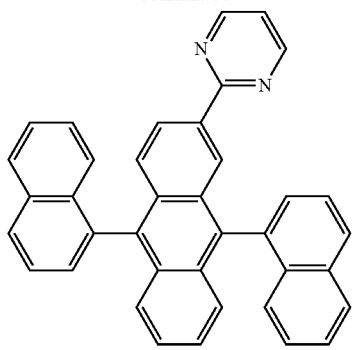
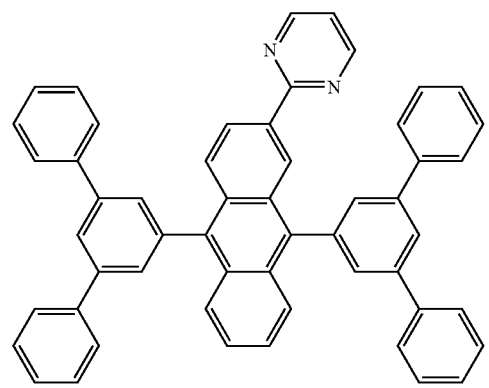
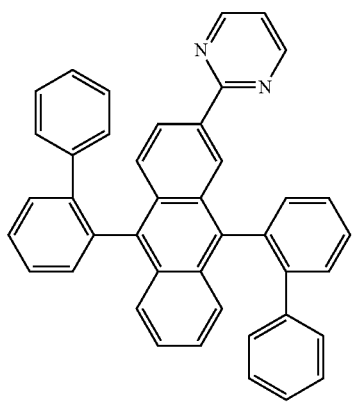
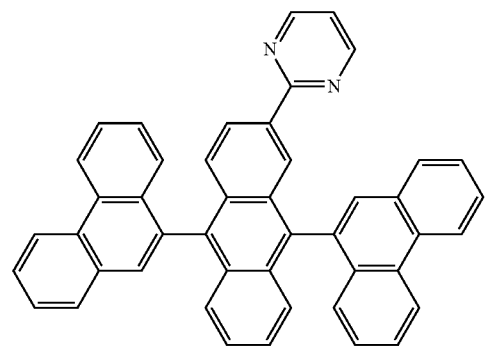
152
-continued
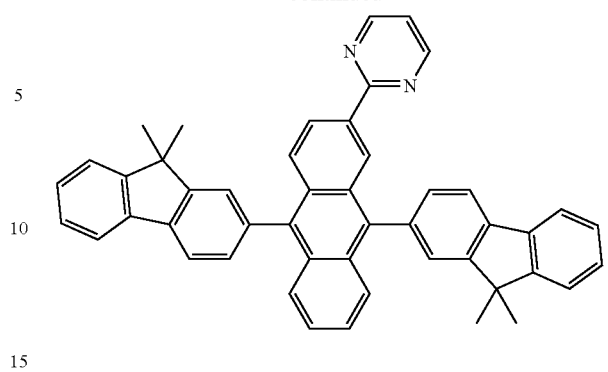
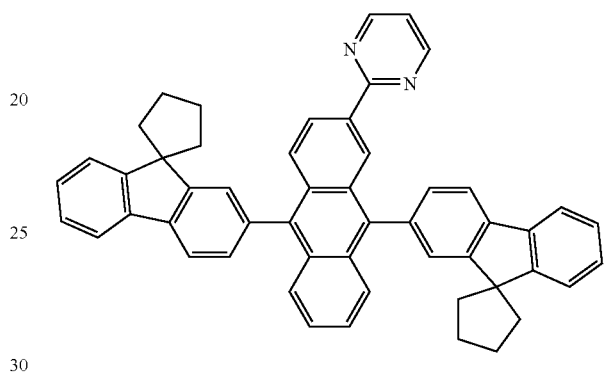
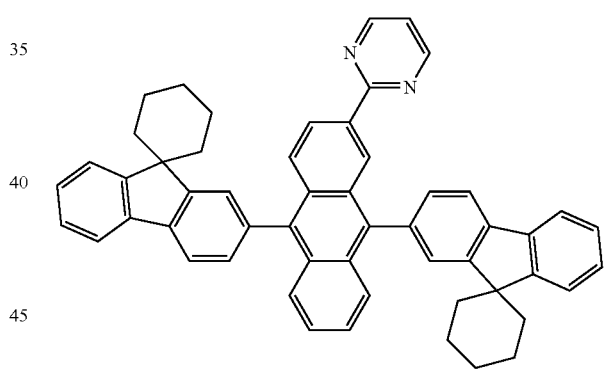
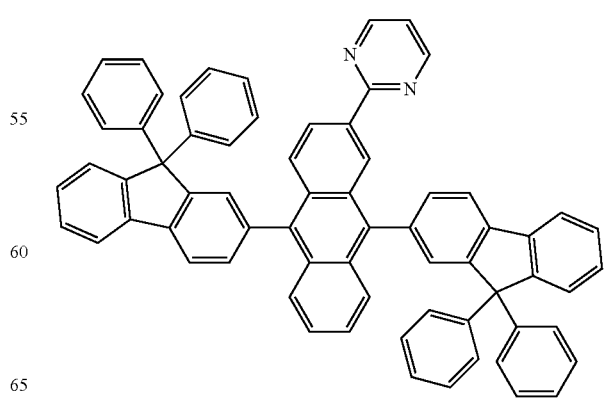

153
-continued
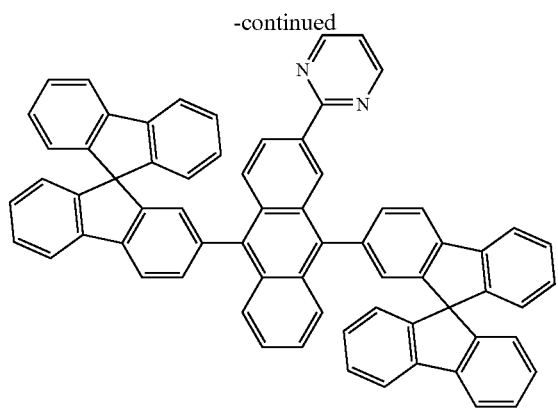
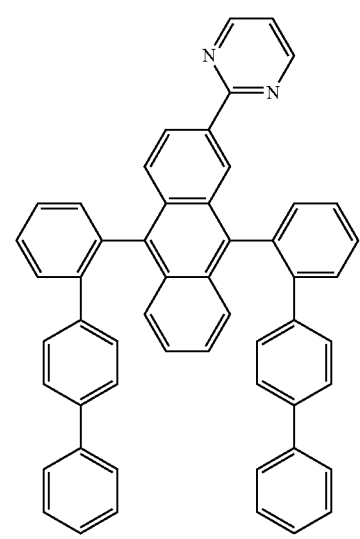
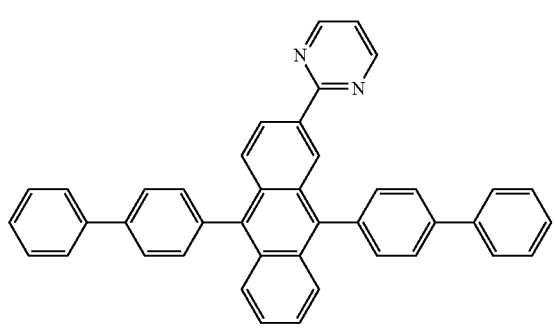
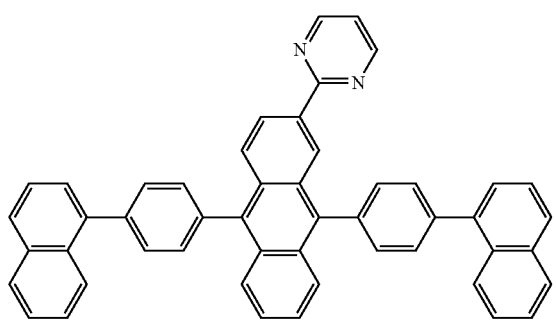
154
-continued
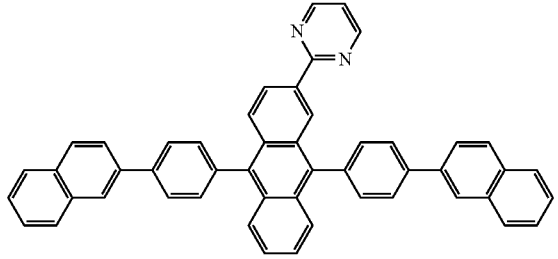
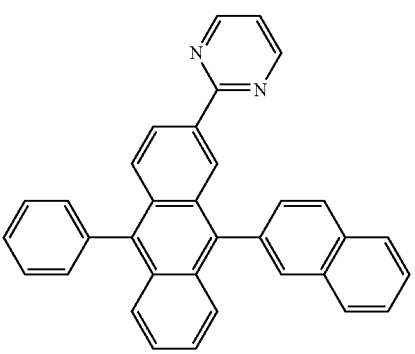
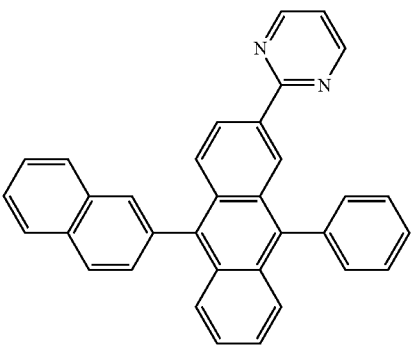
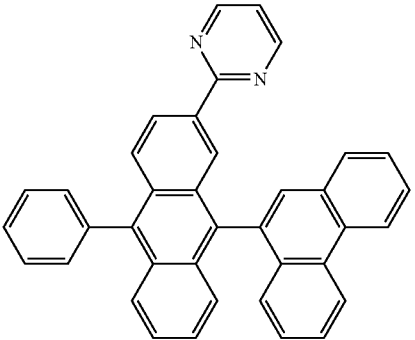
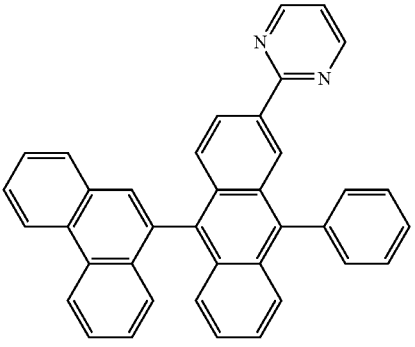

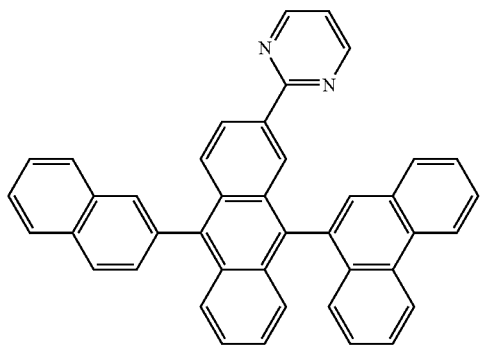
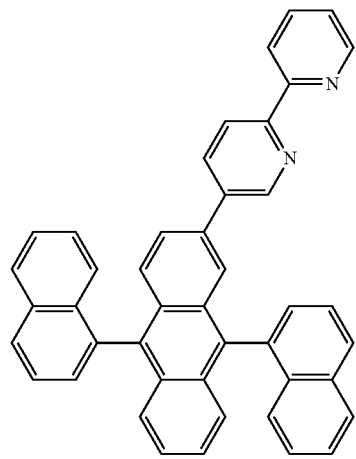
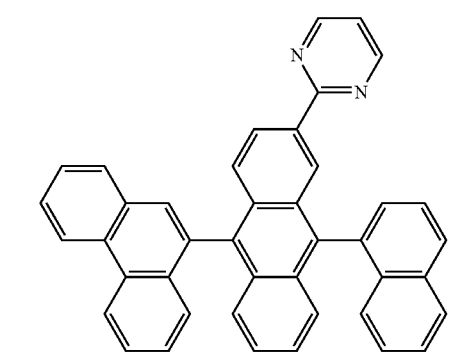
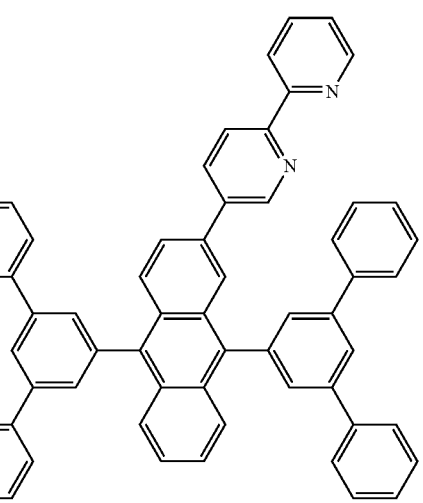
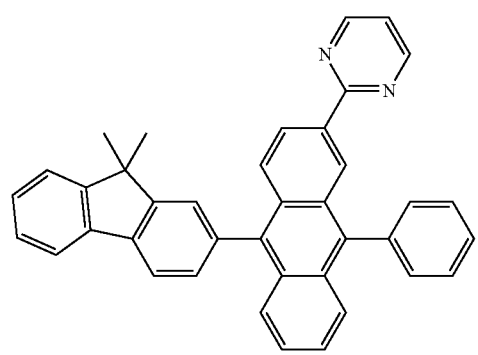
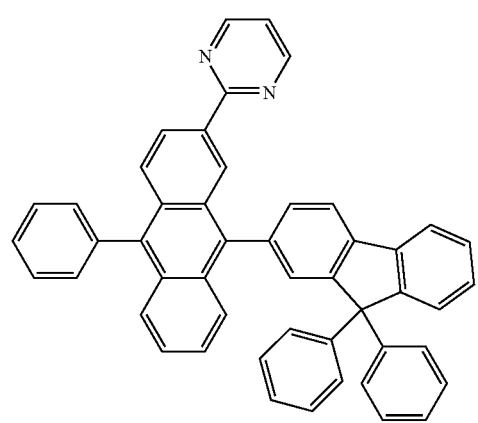
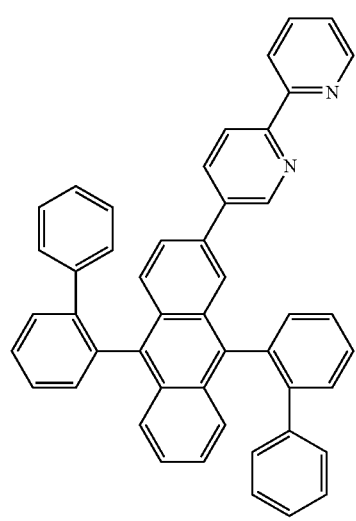

157
-continued
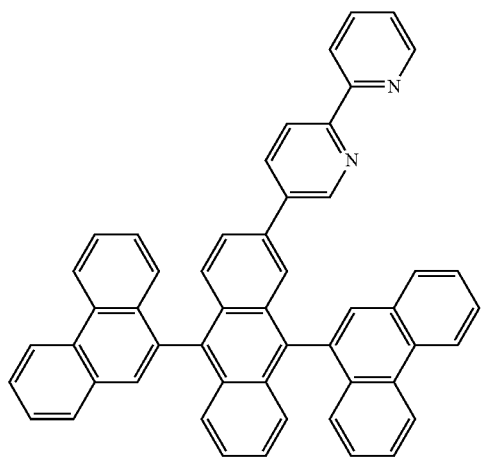
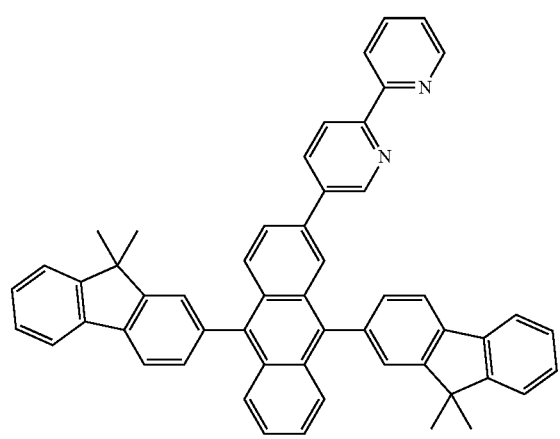
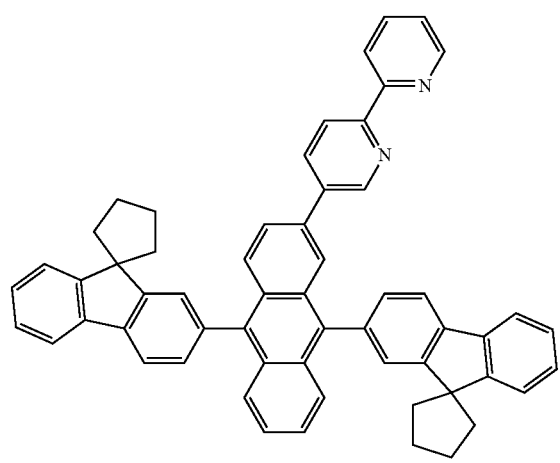
158
-continued
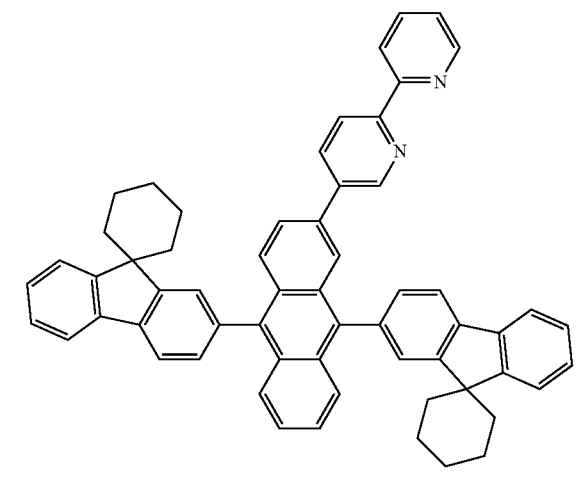
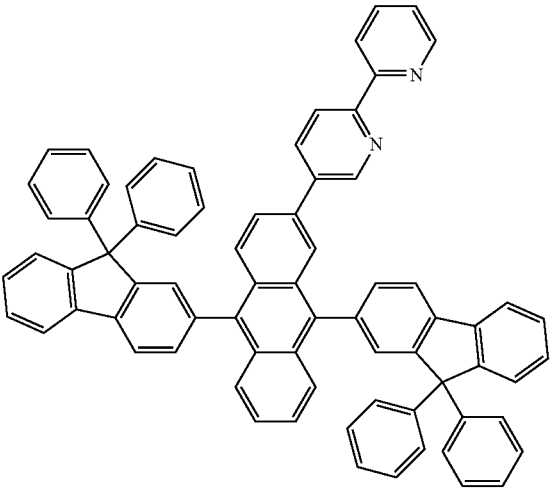
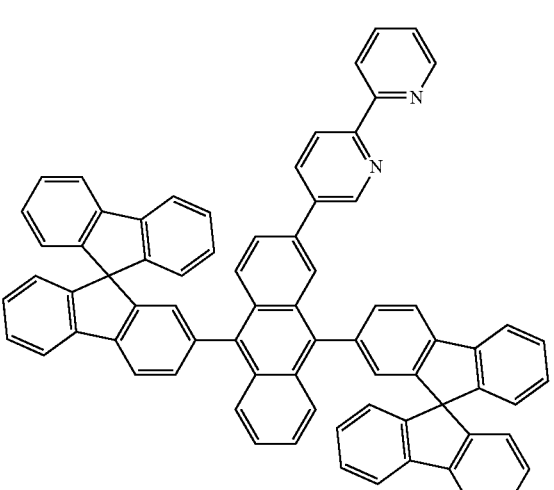

159
-continued
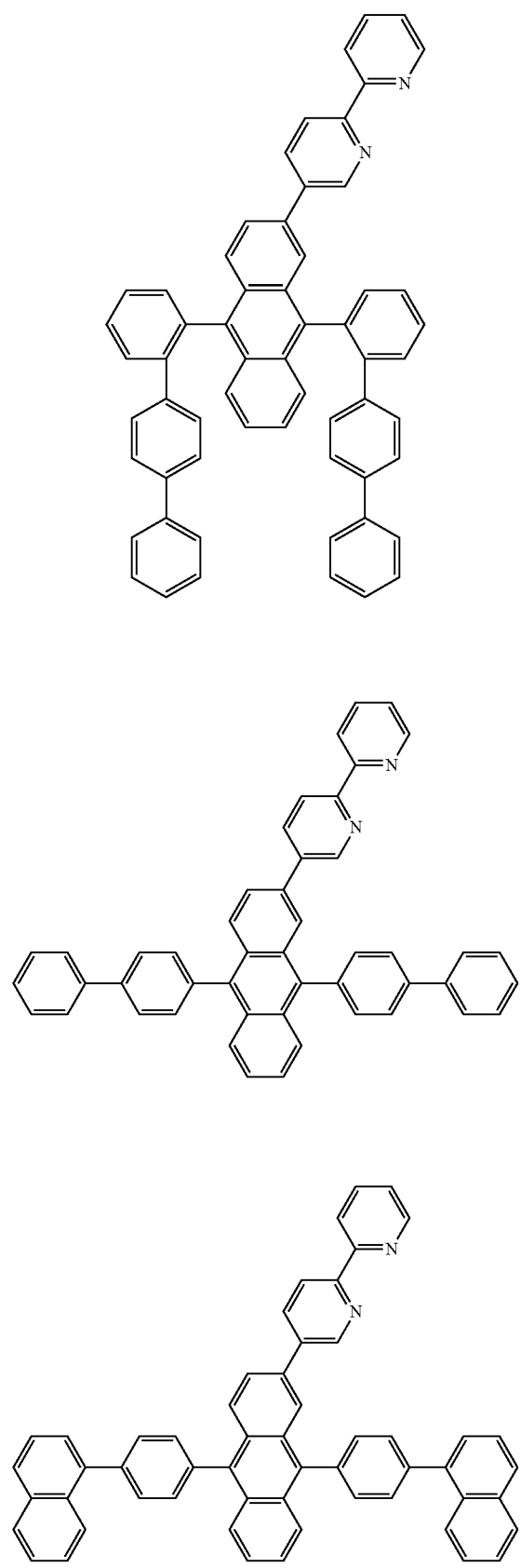
160
-continued
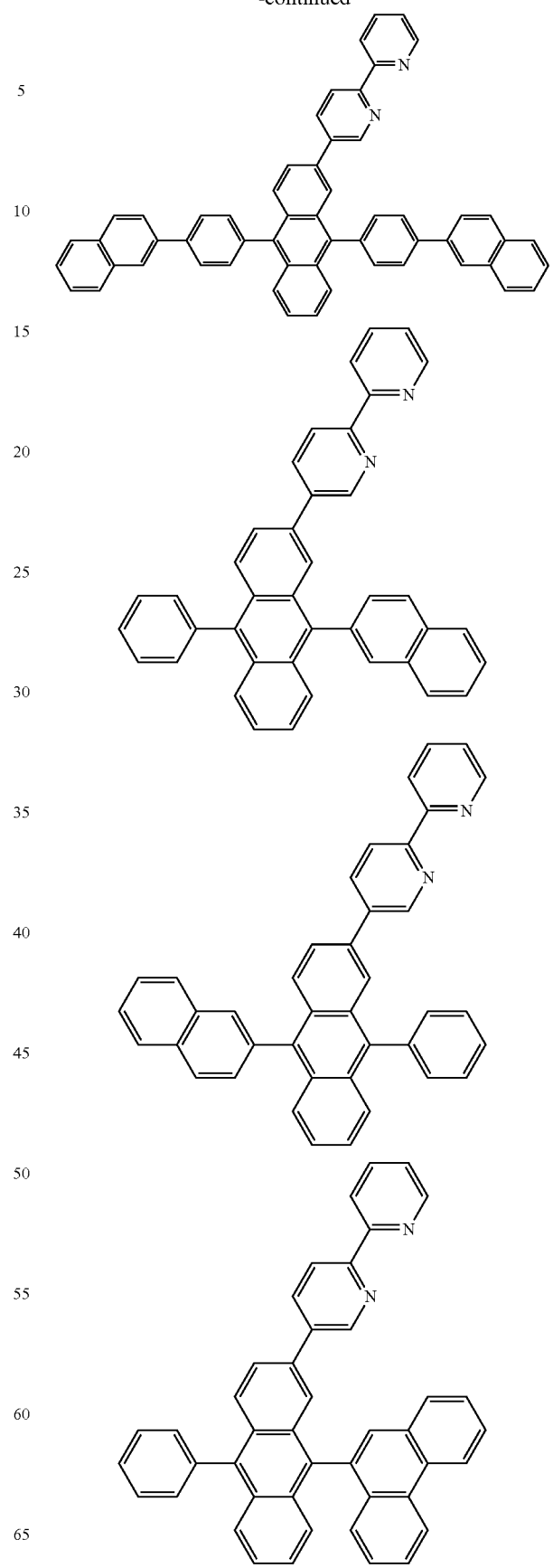

161
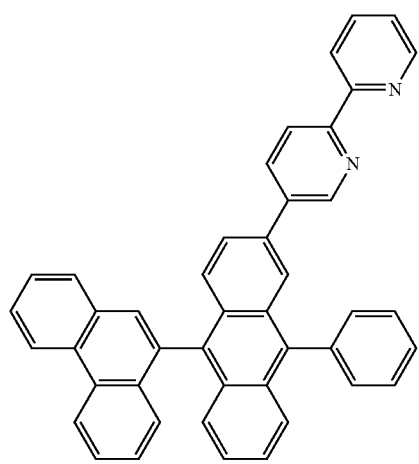
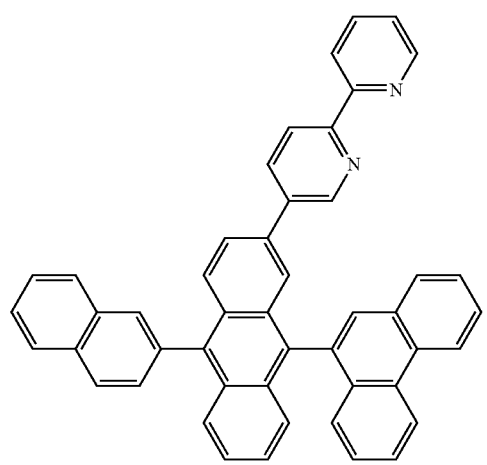
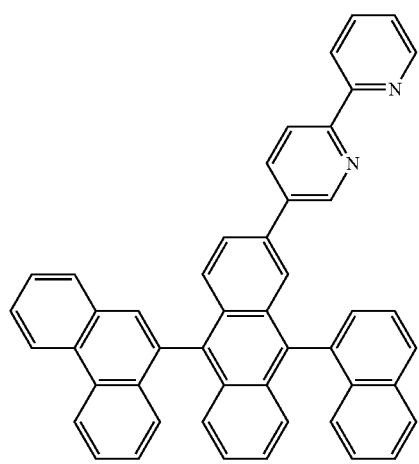
162
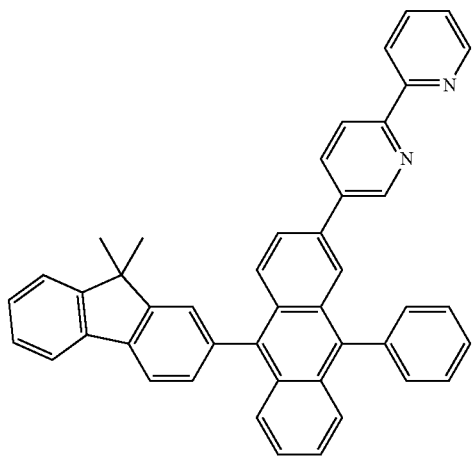
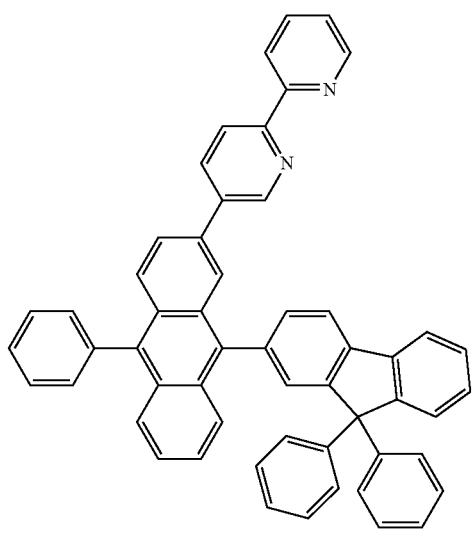
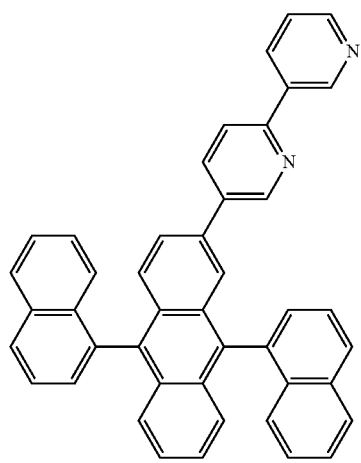

163
-continued
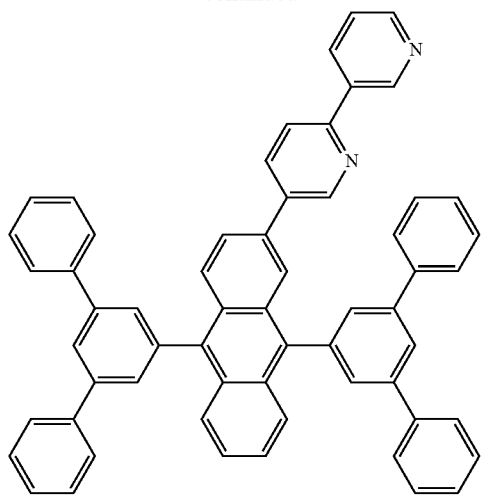
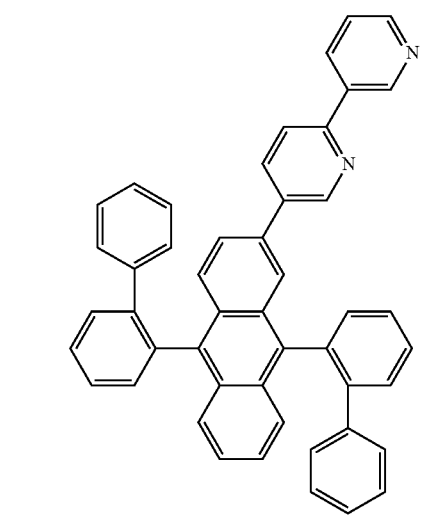
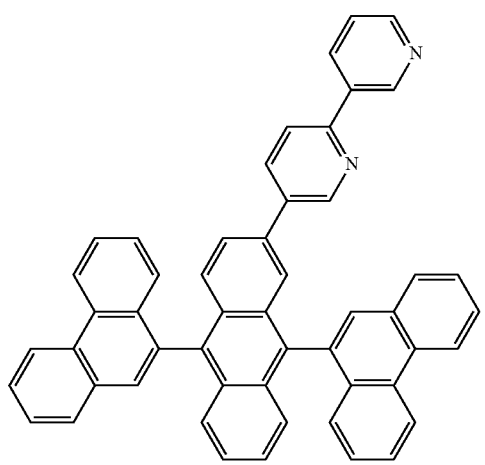
164
-continued
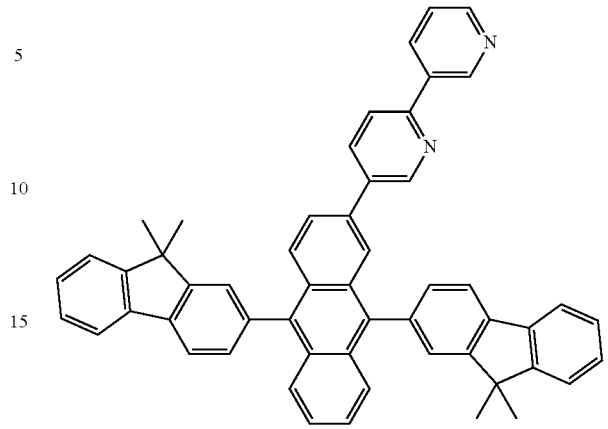
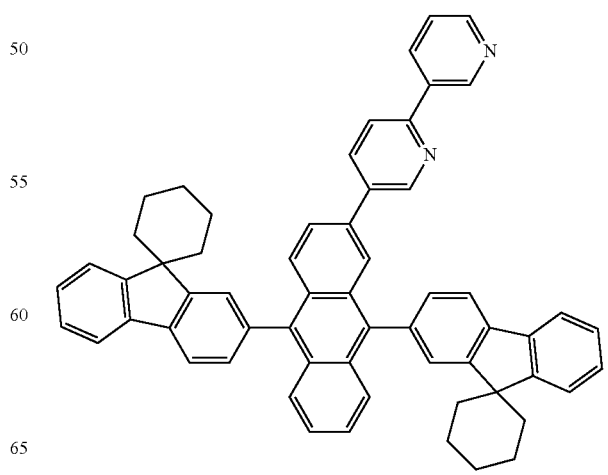

165
-continued
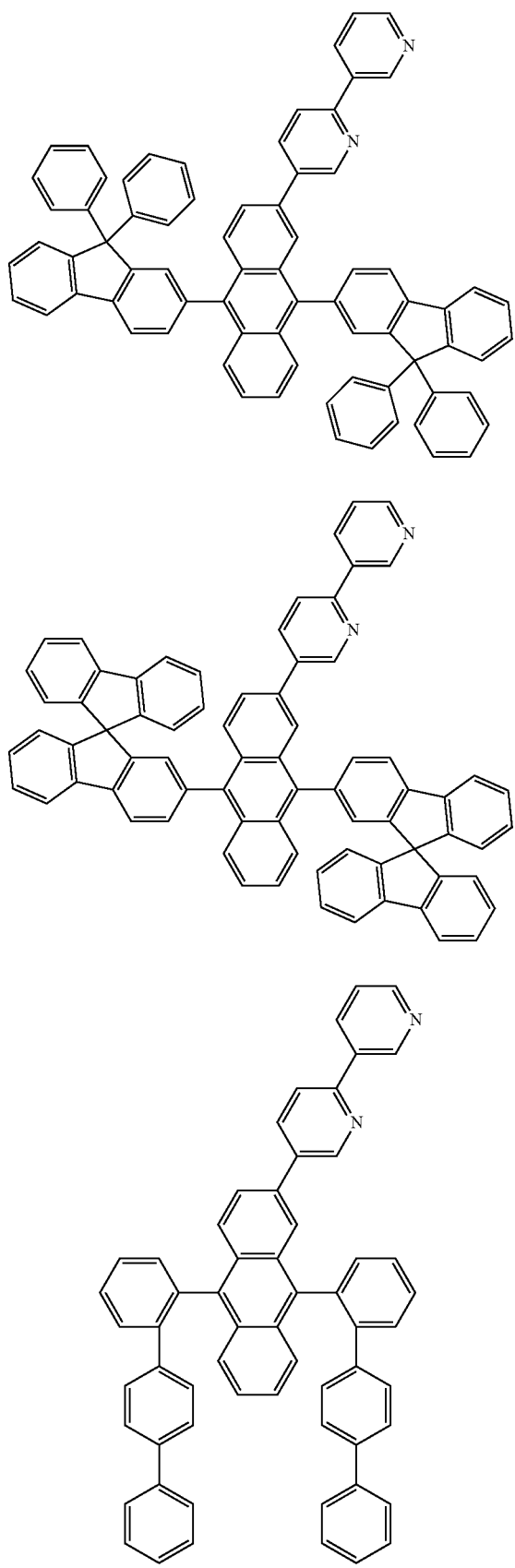
166
-continued
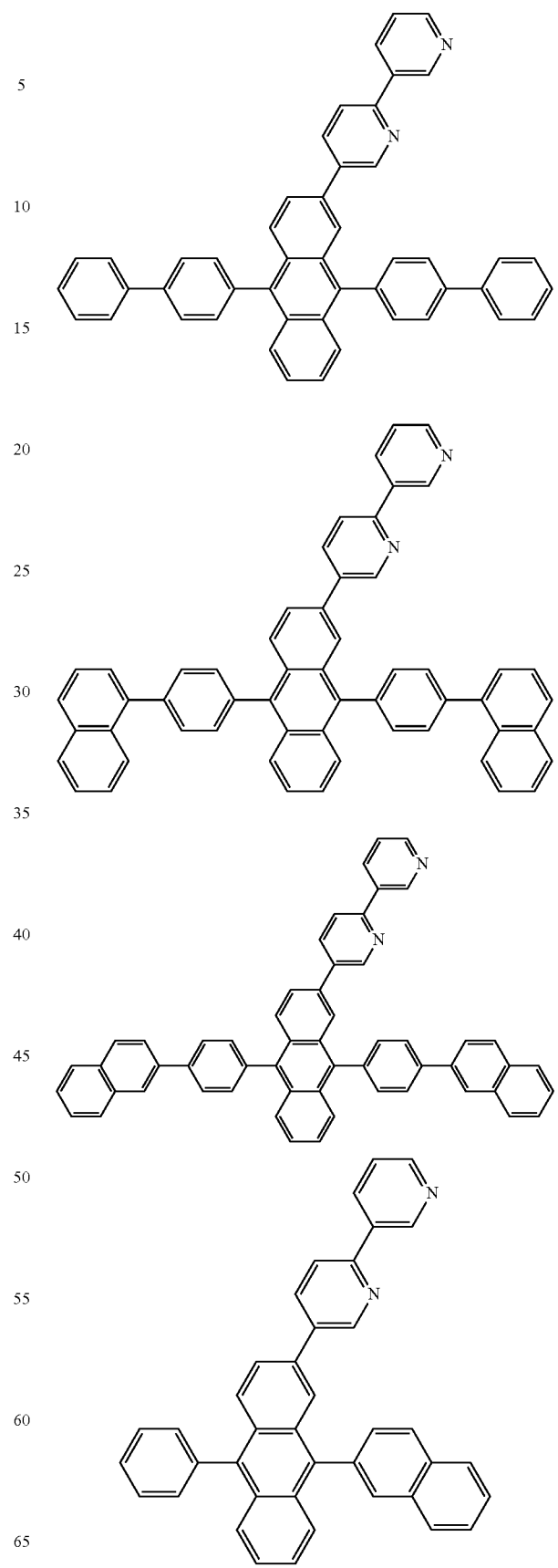

167
-continued
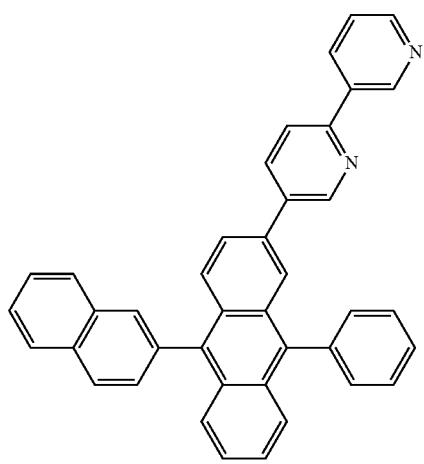
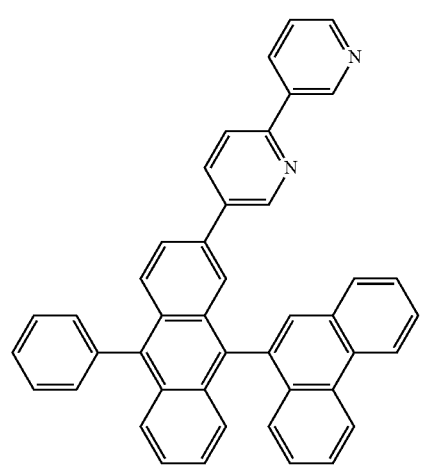
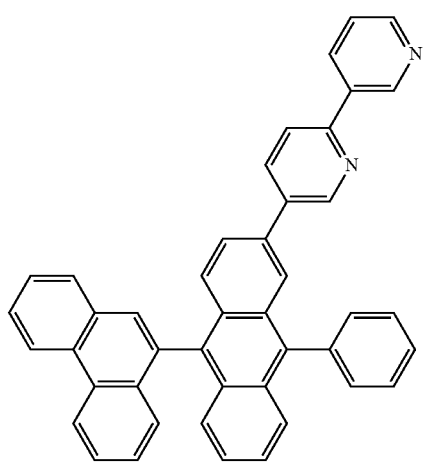
168
-continued
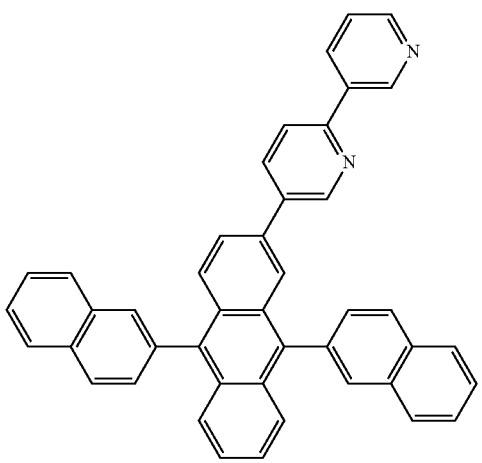
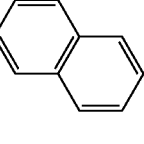
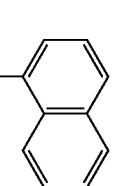
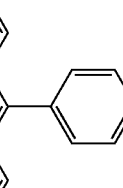

169
-continued
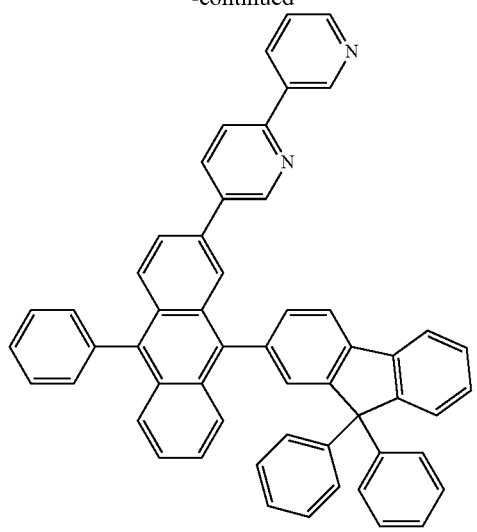
170
-continued
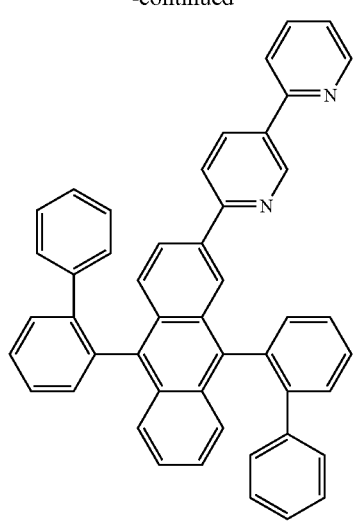
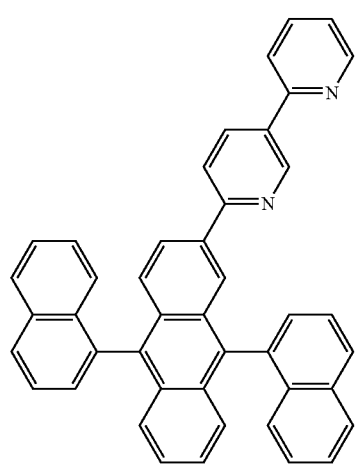
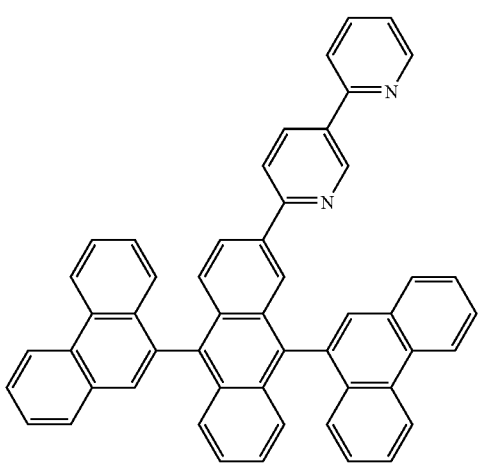
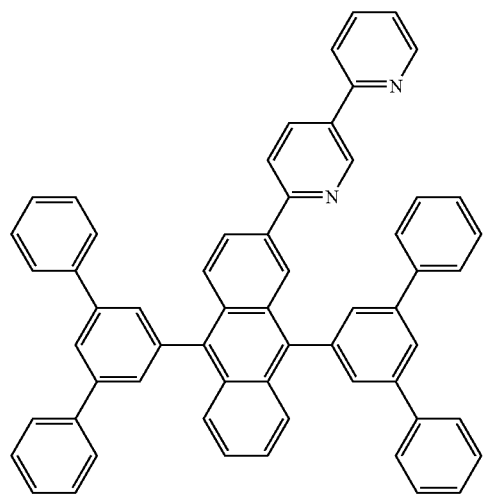
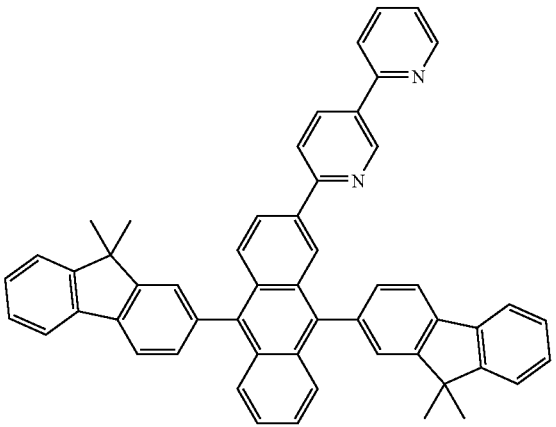

171
-continued
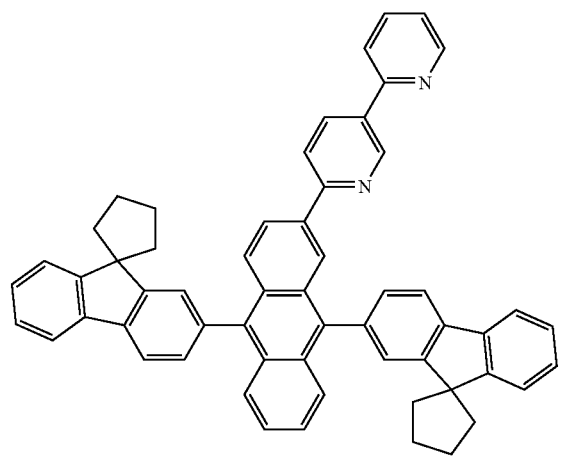
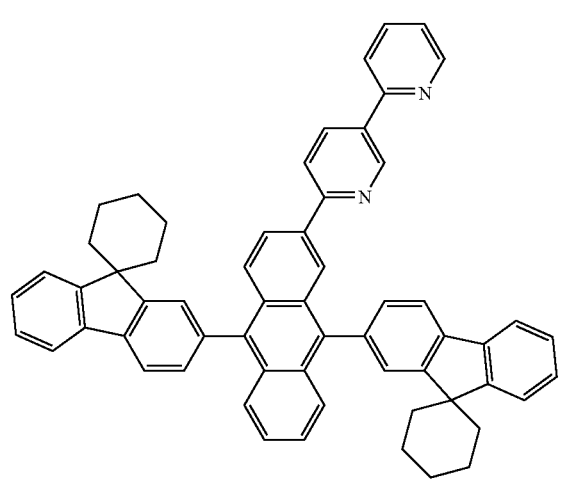
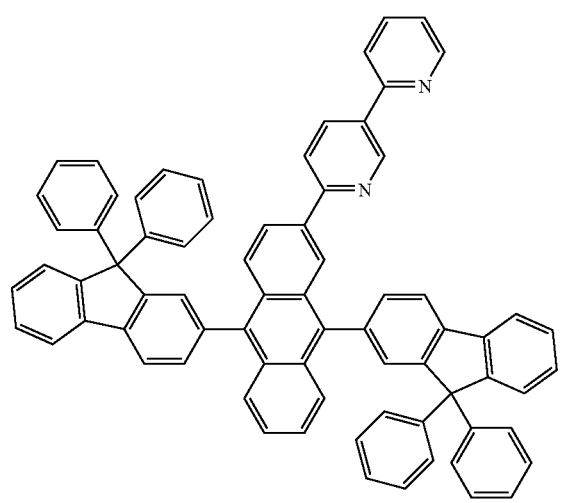
172
-continued
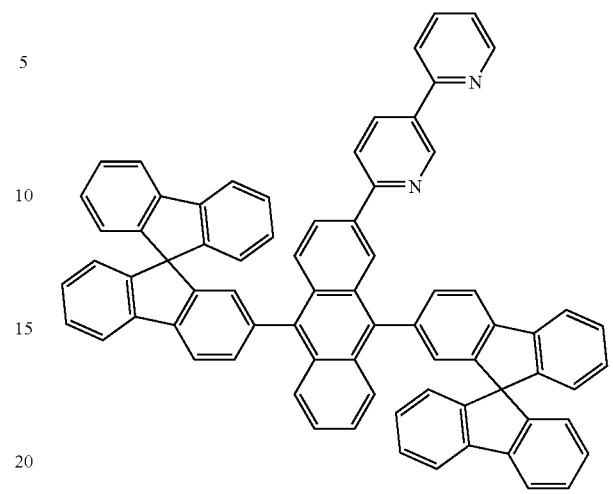
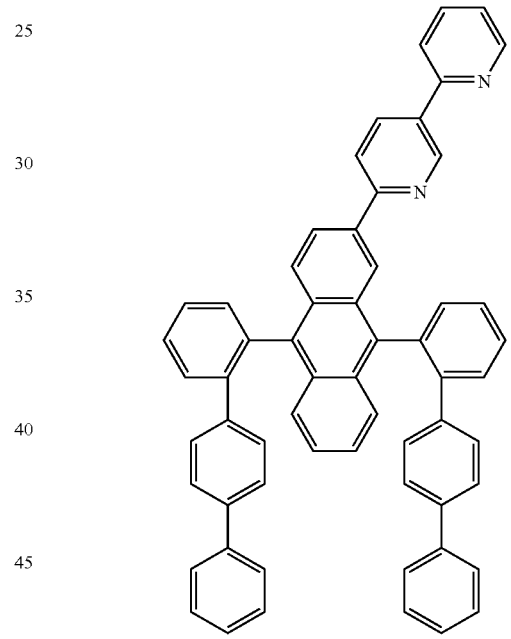
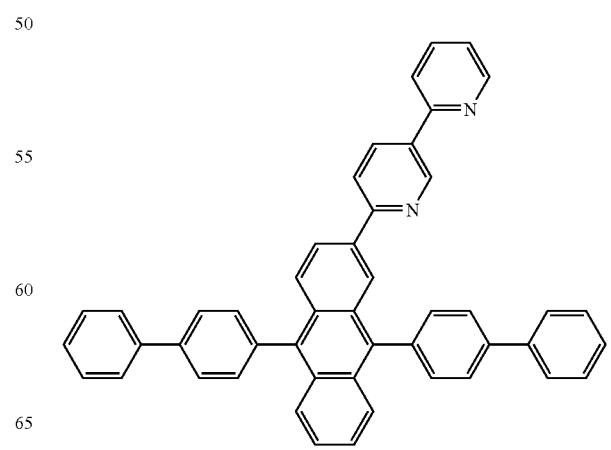

173
-continued
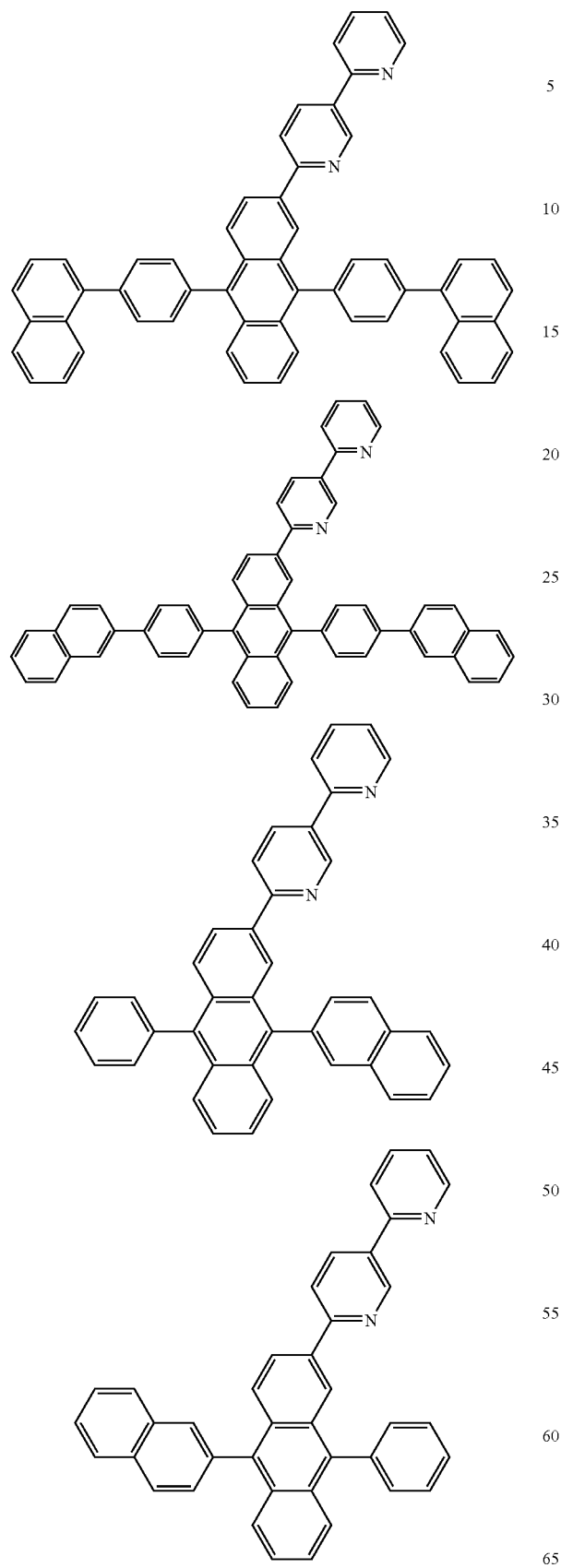
174
-continued
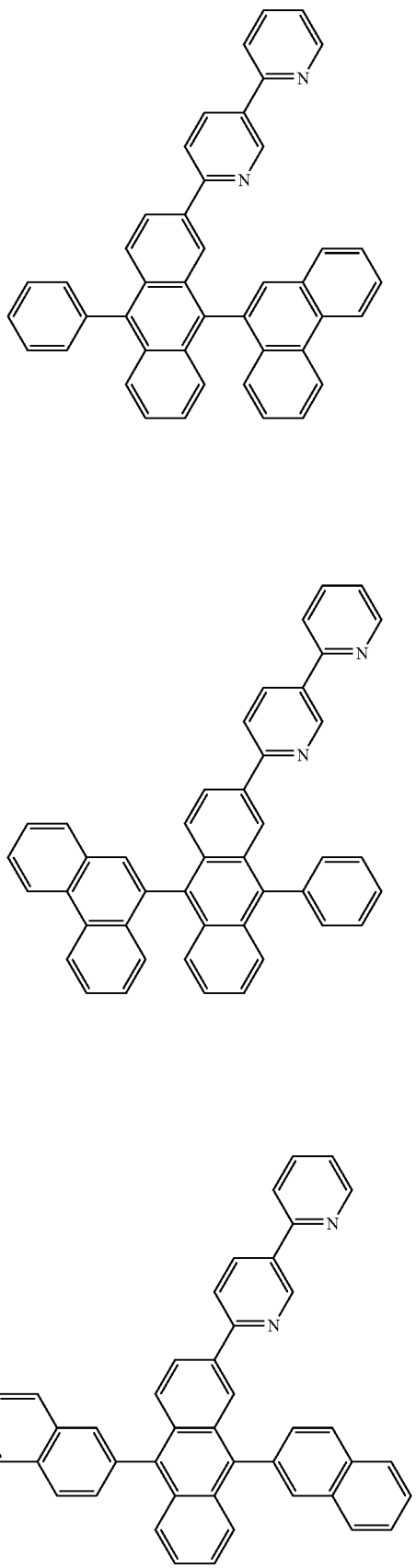

175
-continued
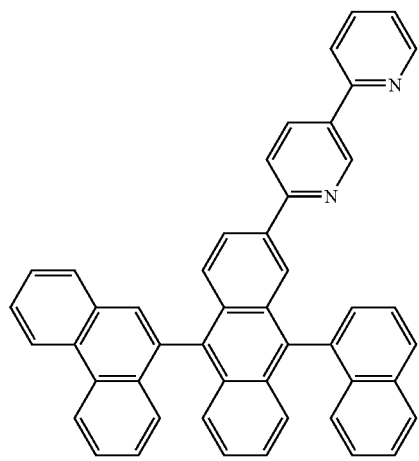
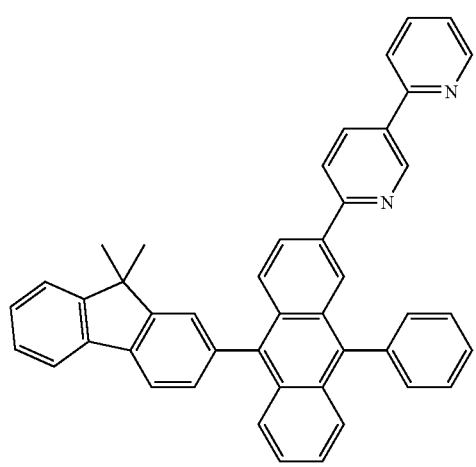
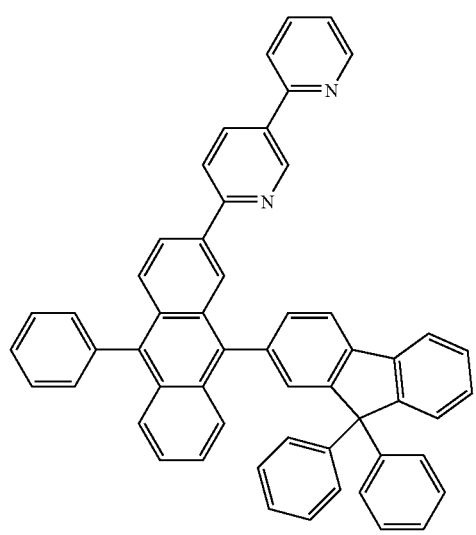
176
-continued
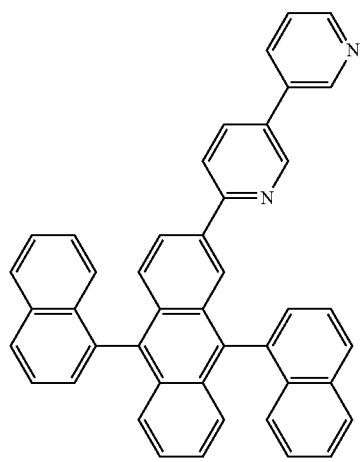
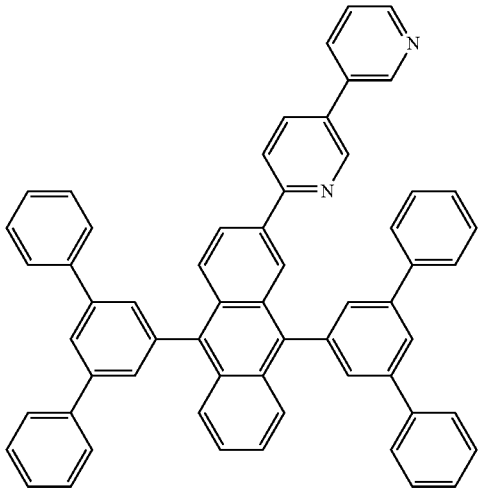
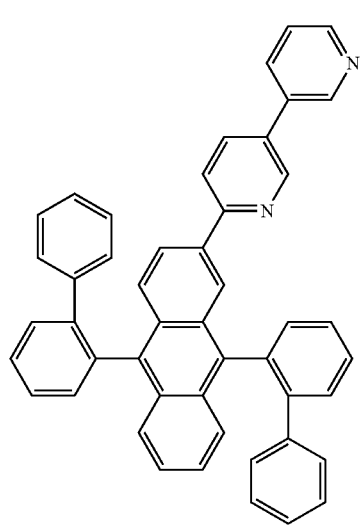

177
-continued
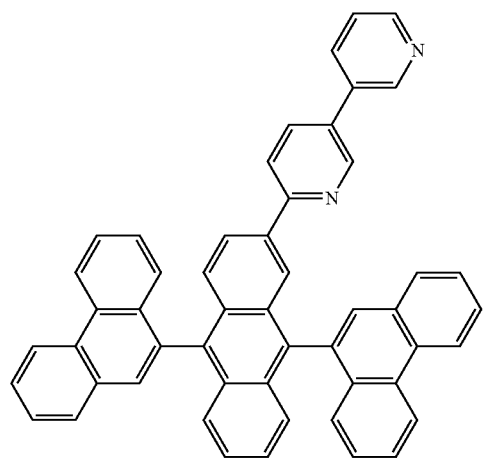
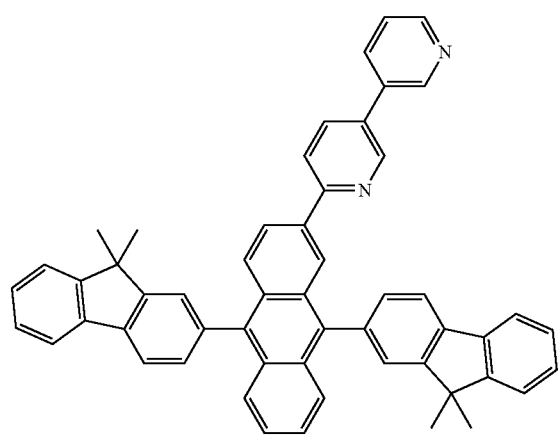
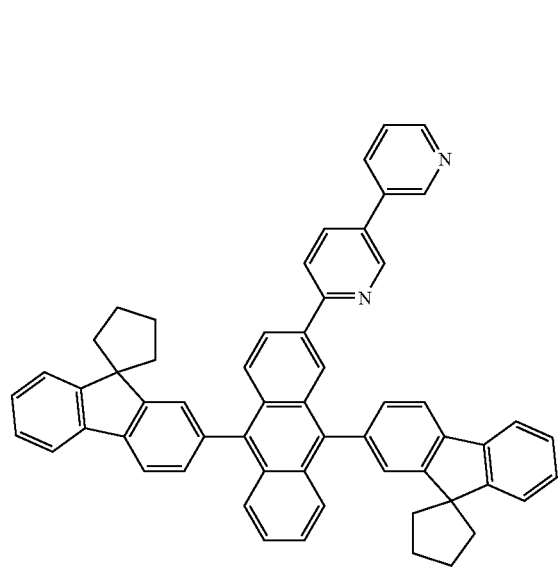
178
-continued
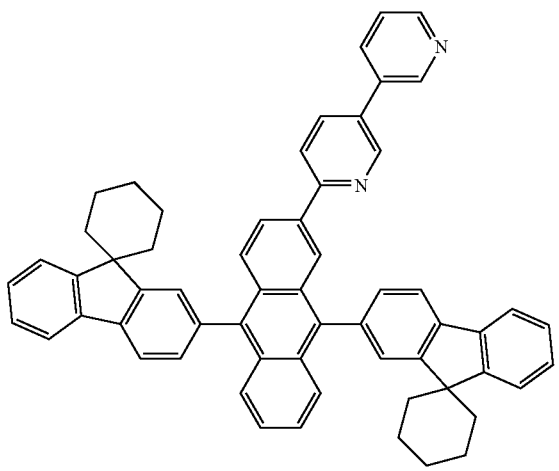
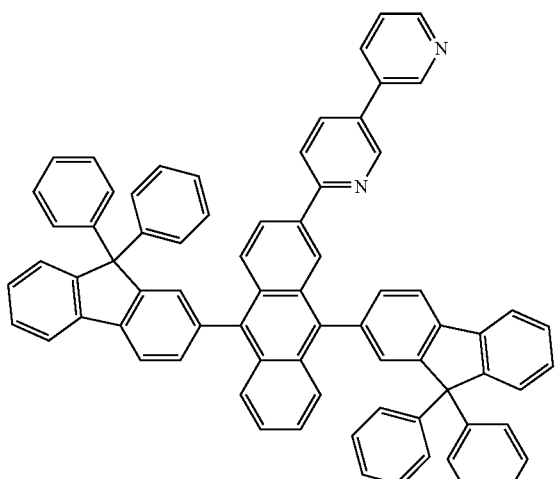
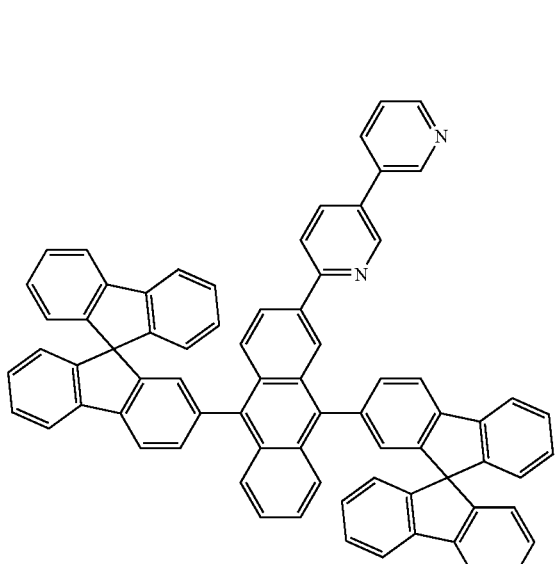

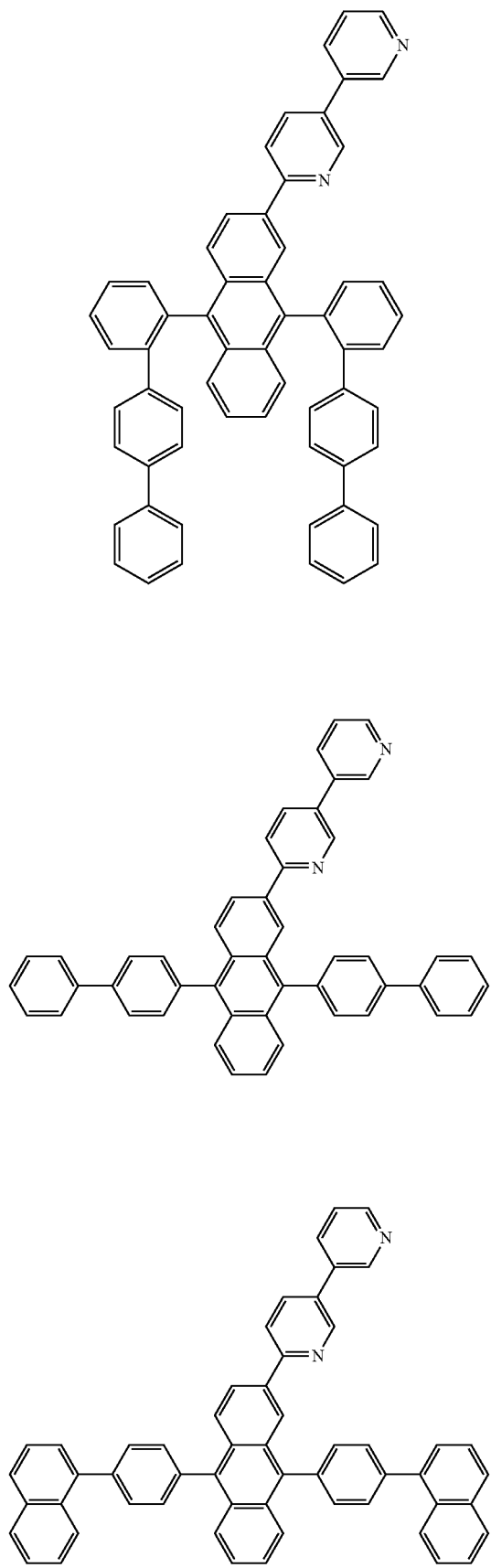
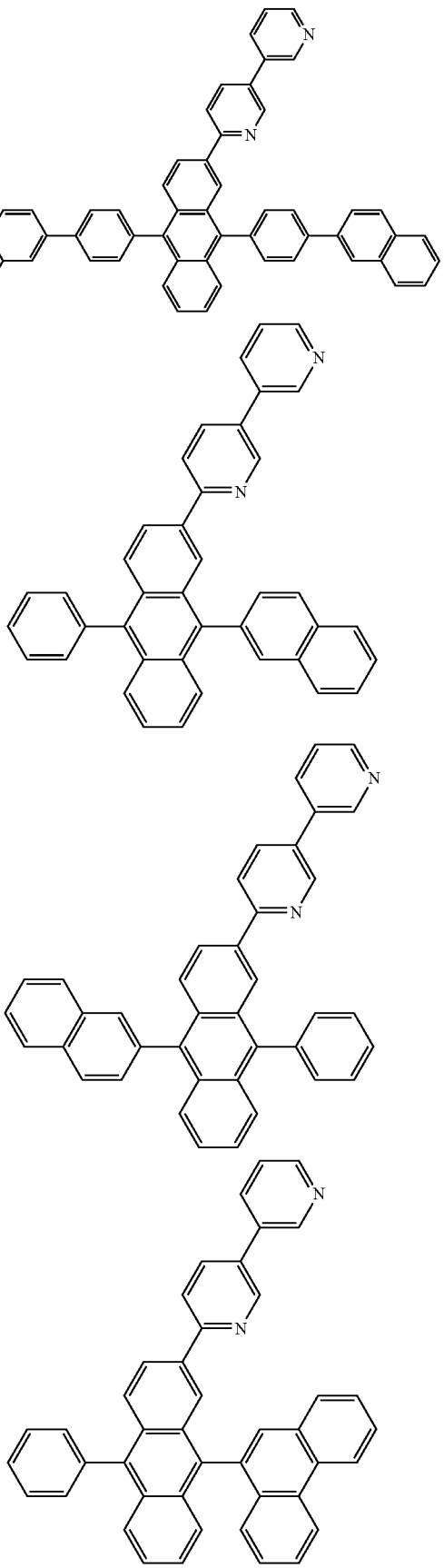

181
-continued
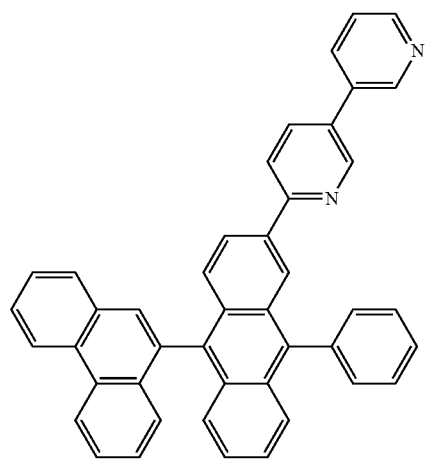
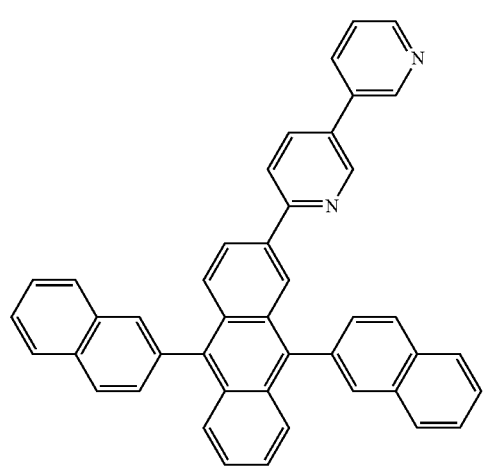
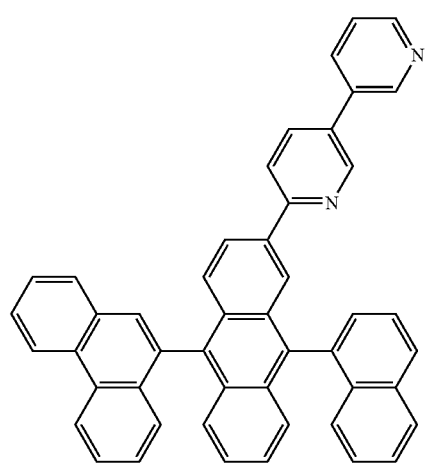
182
-continued
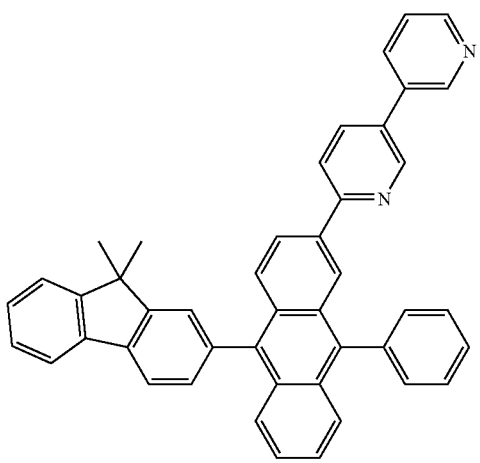
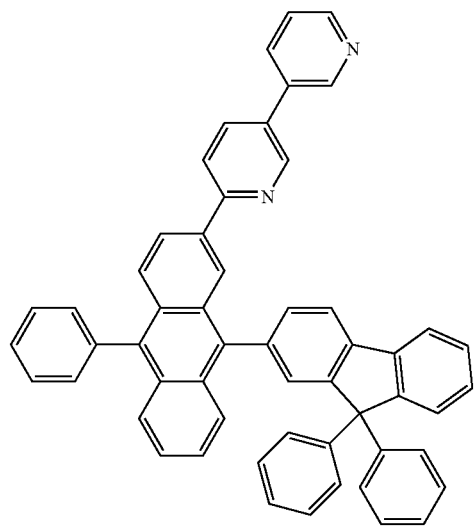
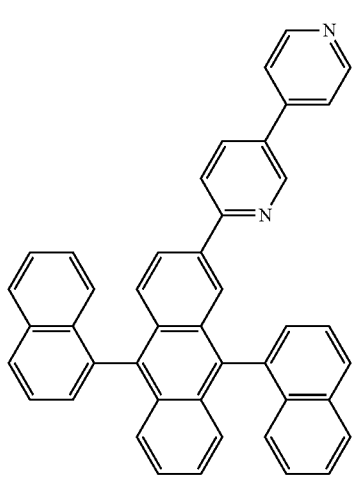

183
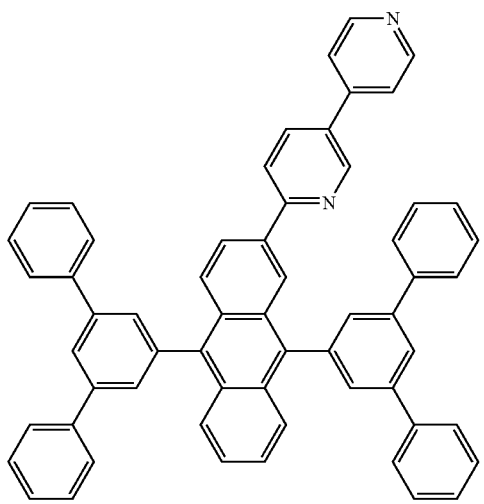
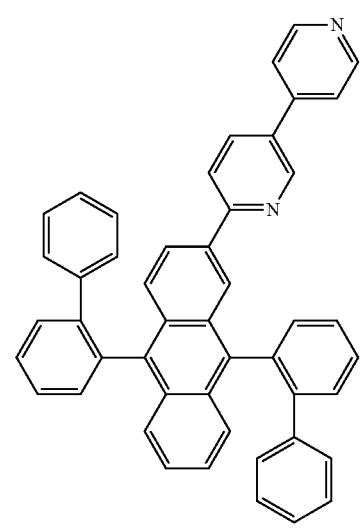
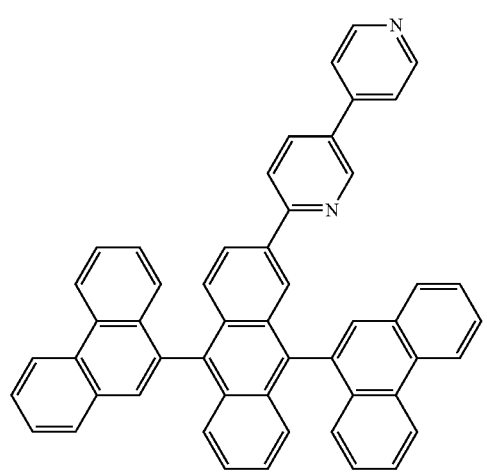
184
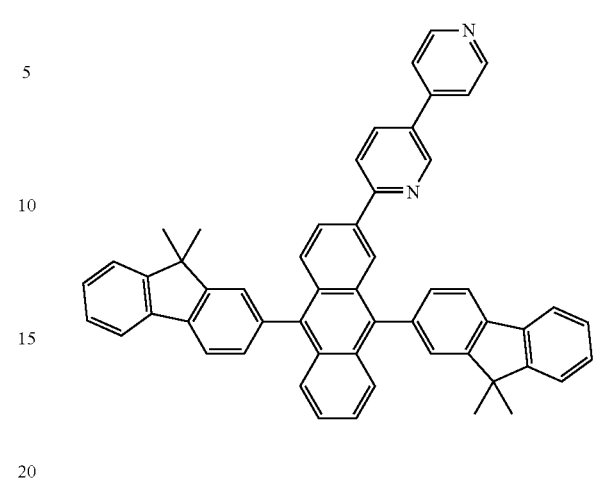
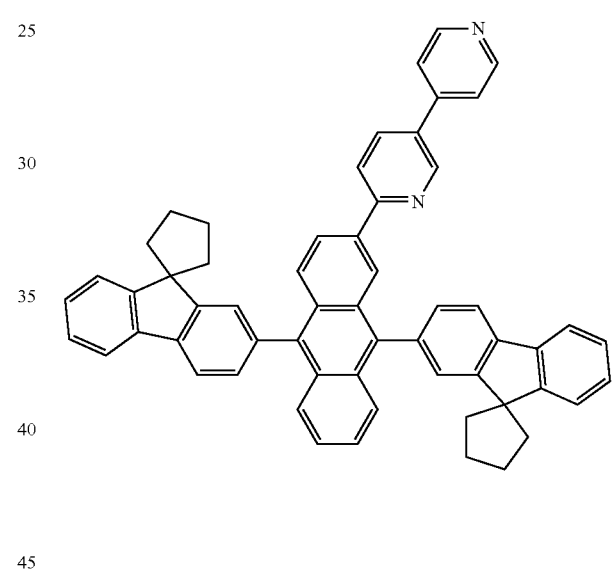
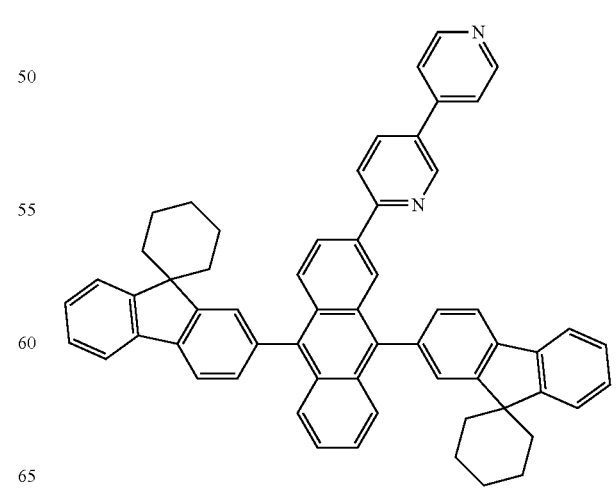

185
-continued
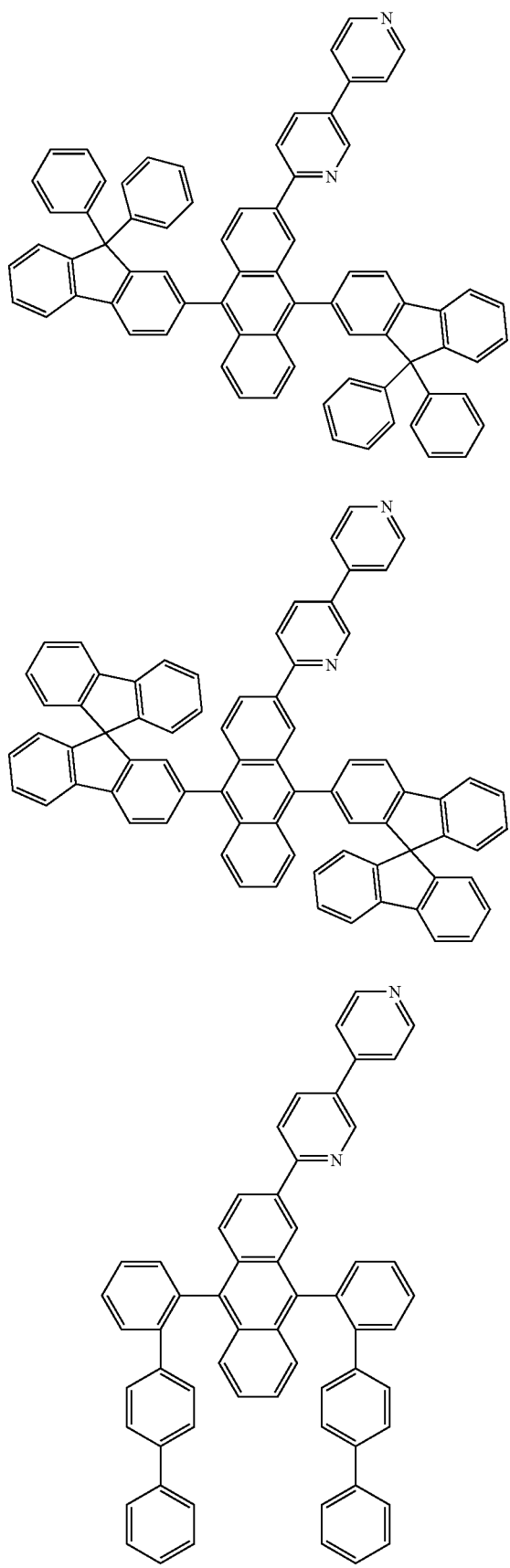
186
-continued
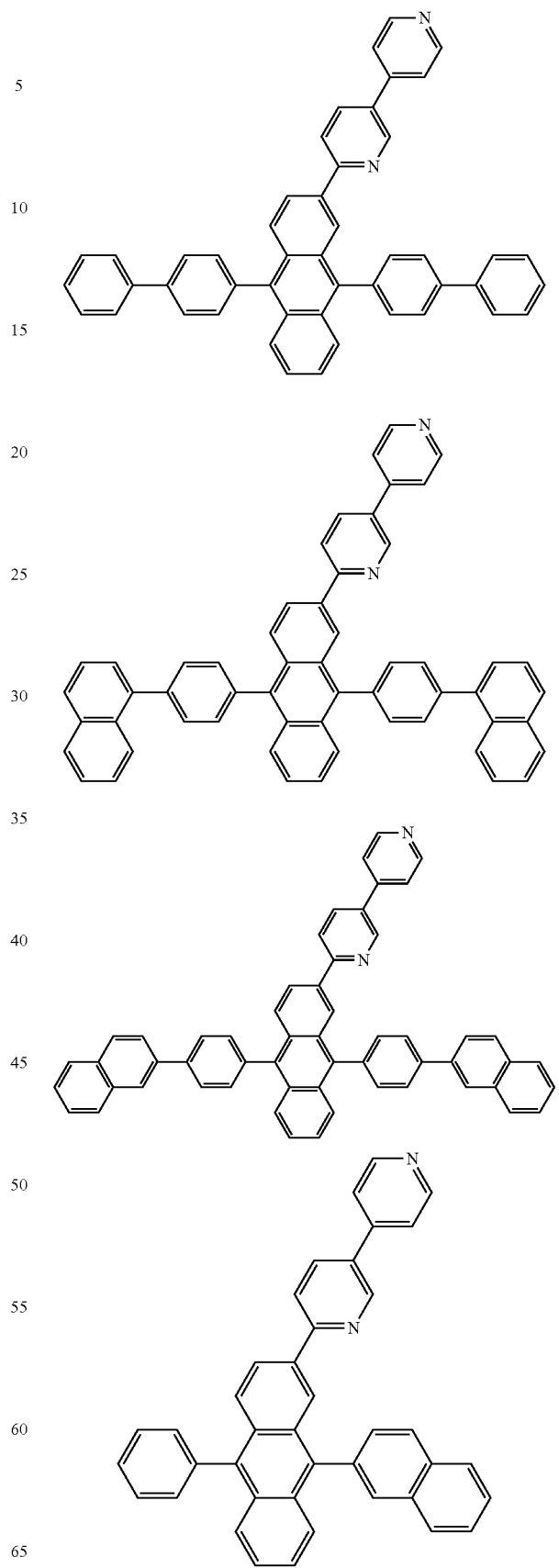

187
-continued
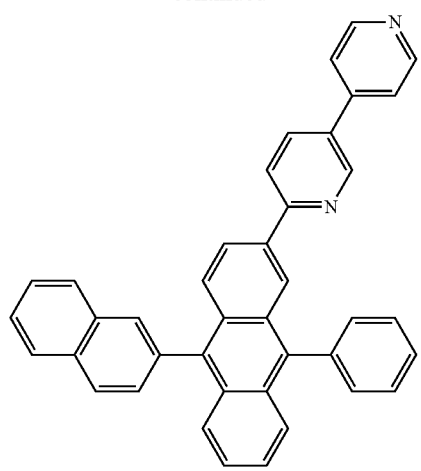
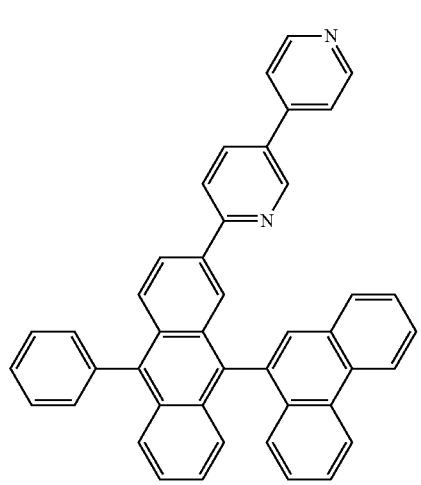
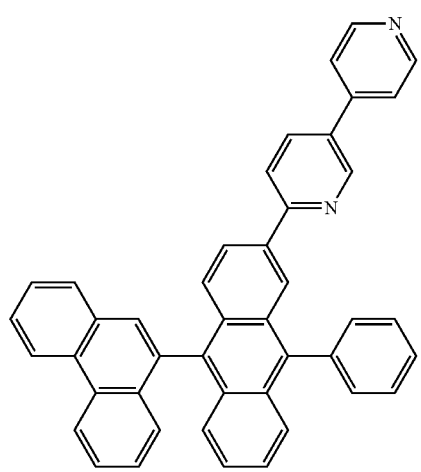
188
-continued
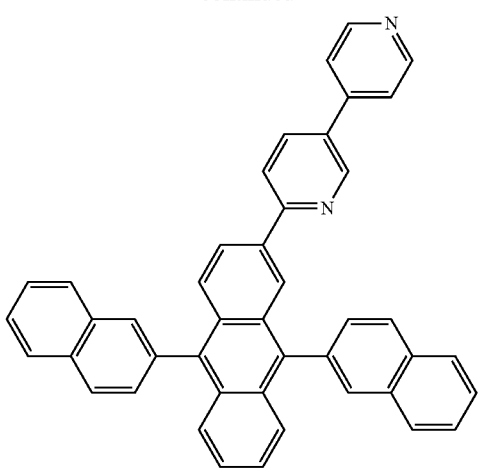
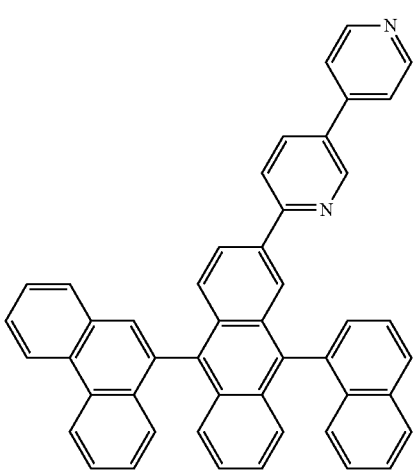
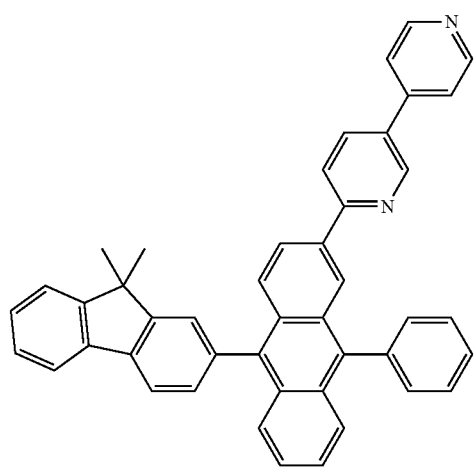

189
-continued
190
-continued
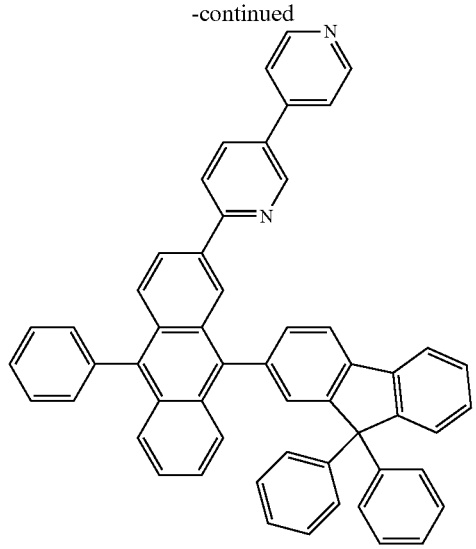
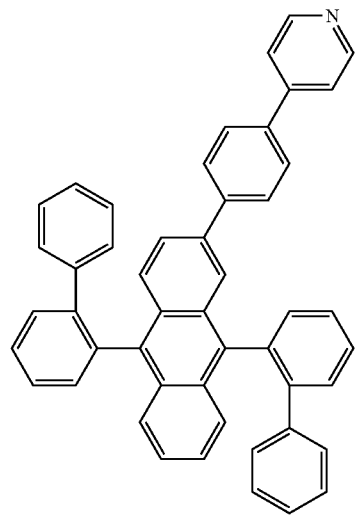
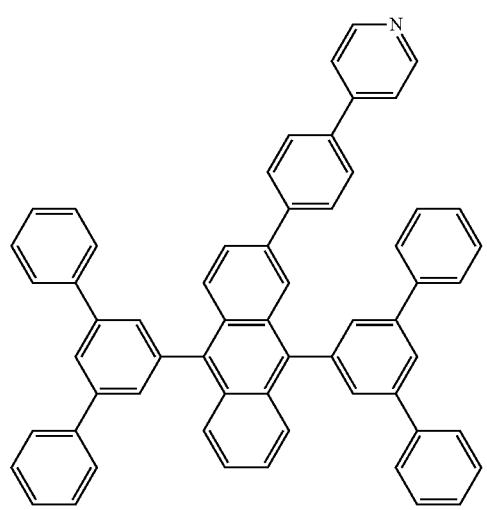
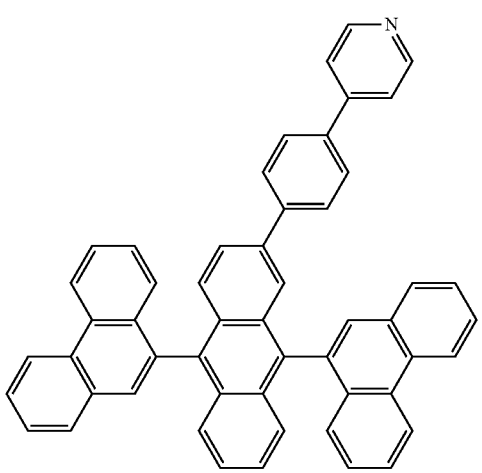

191
-continued
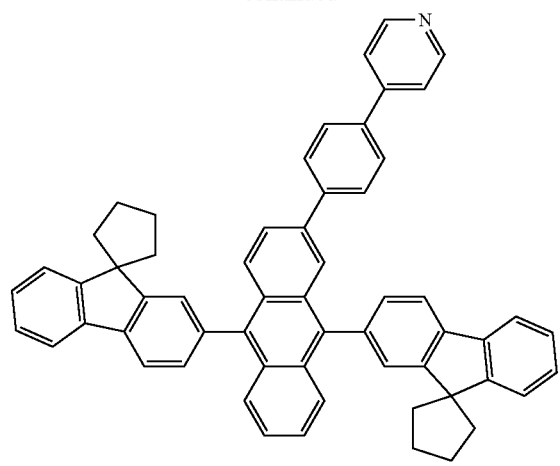
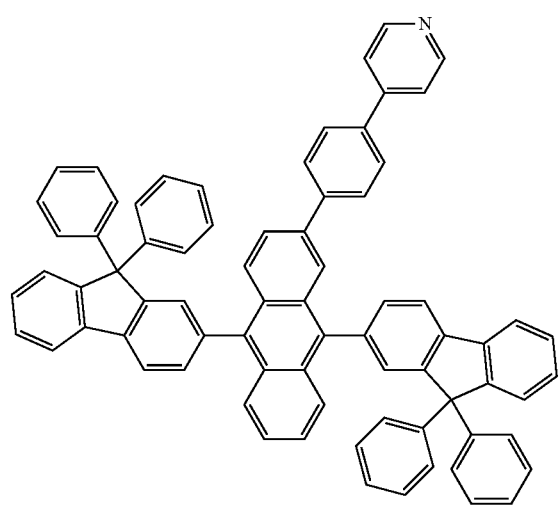
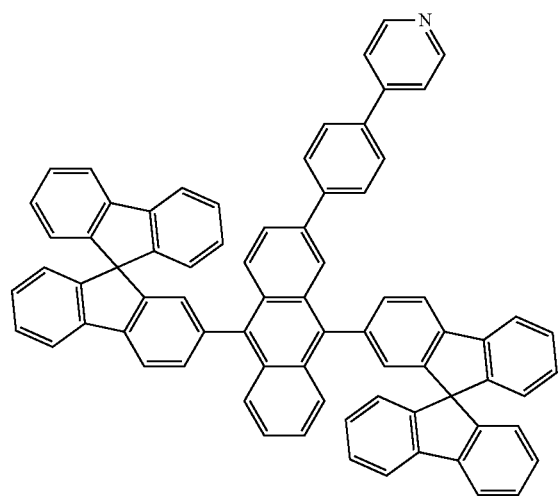
192
-continued
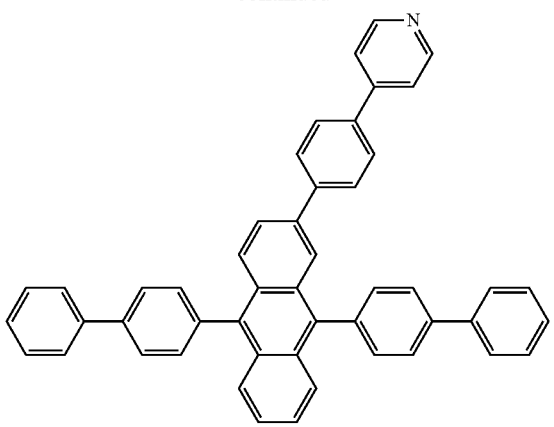
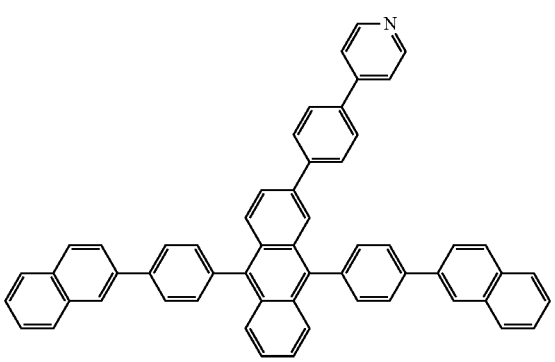
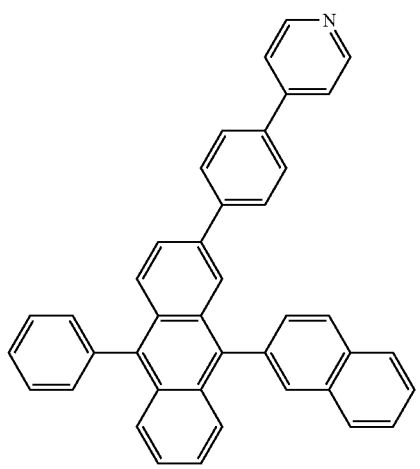
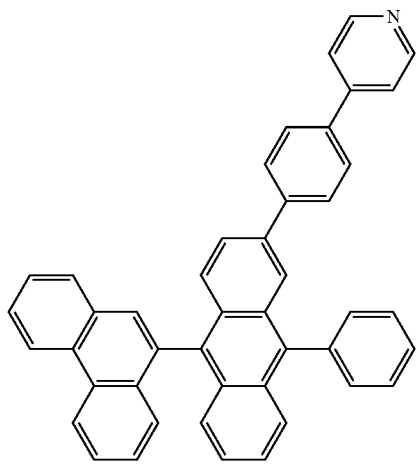

193
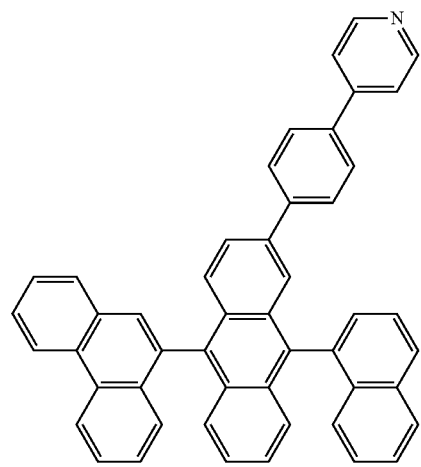
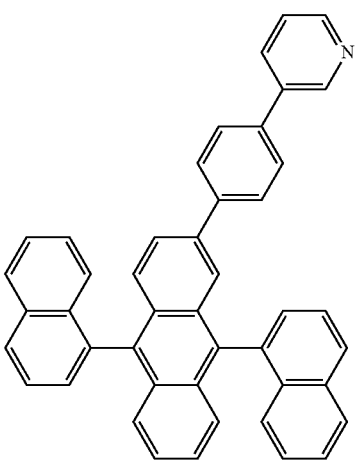
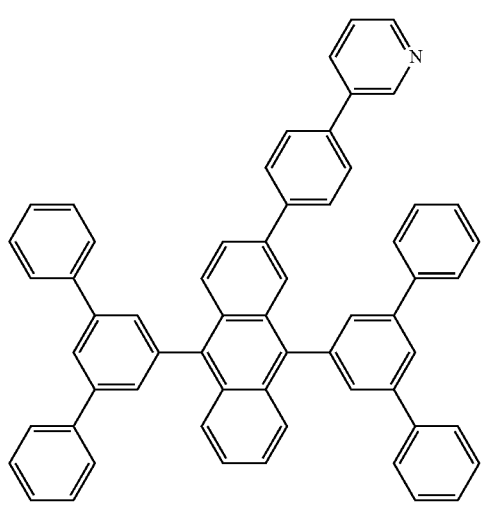
194
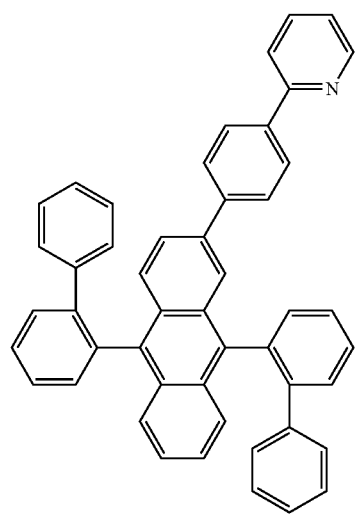
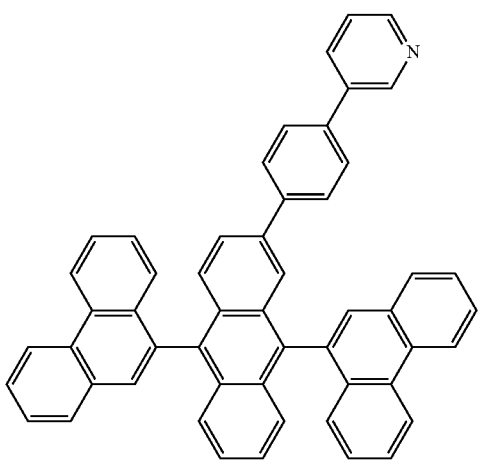
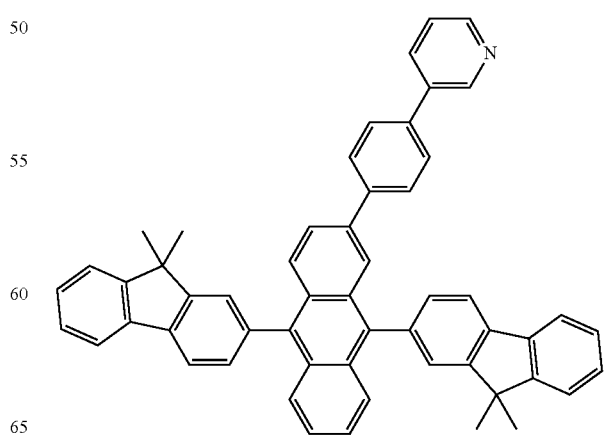

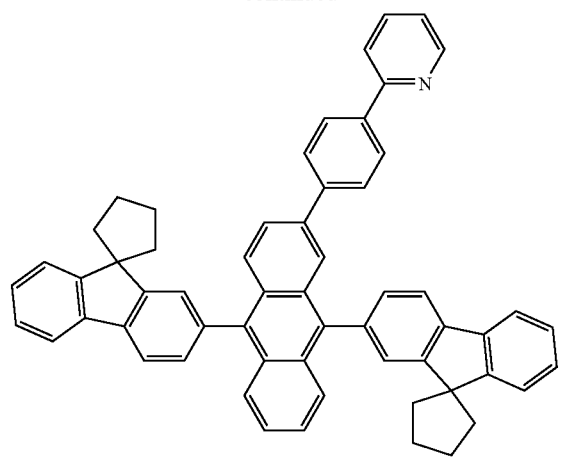
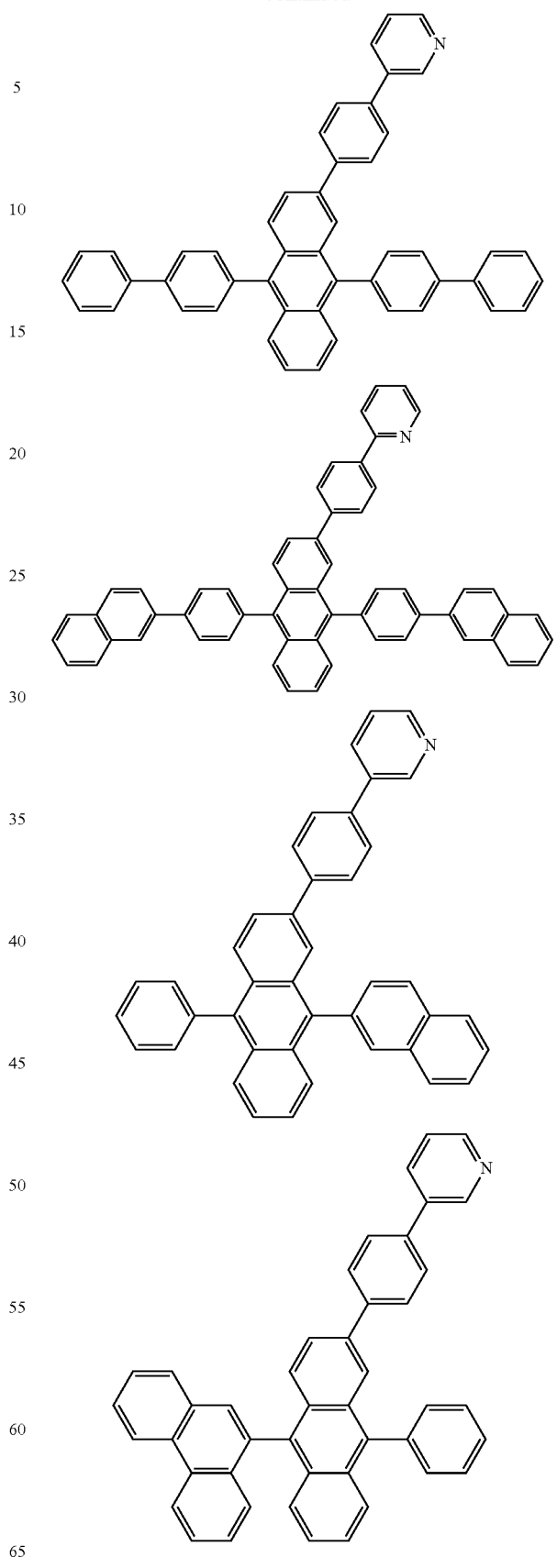

197
-continued
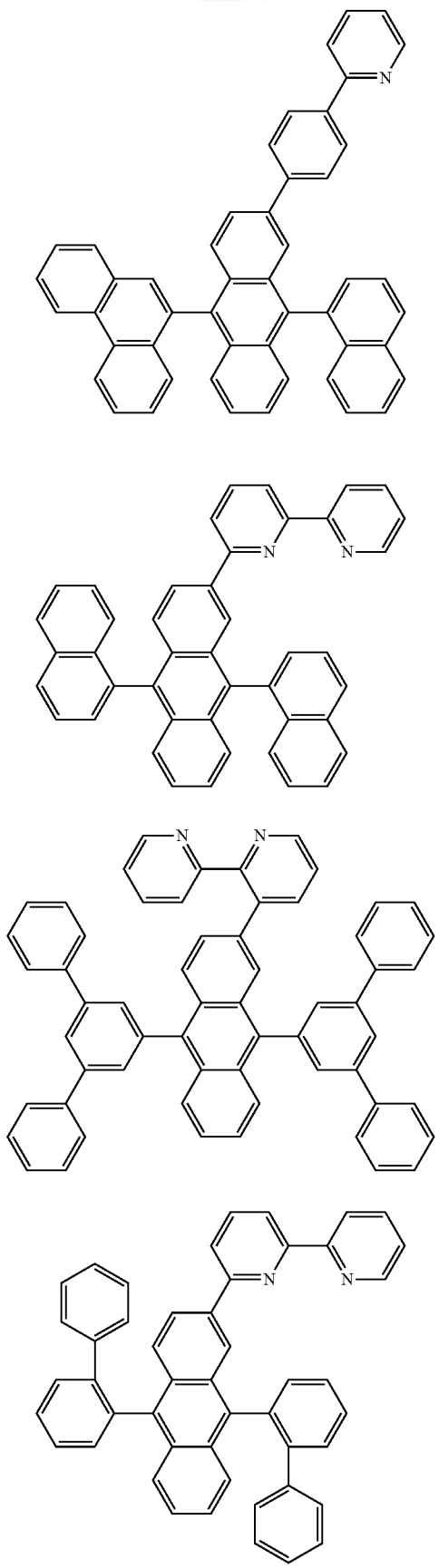
198
-continued
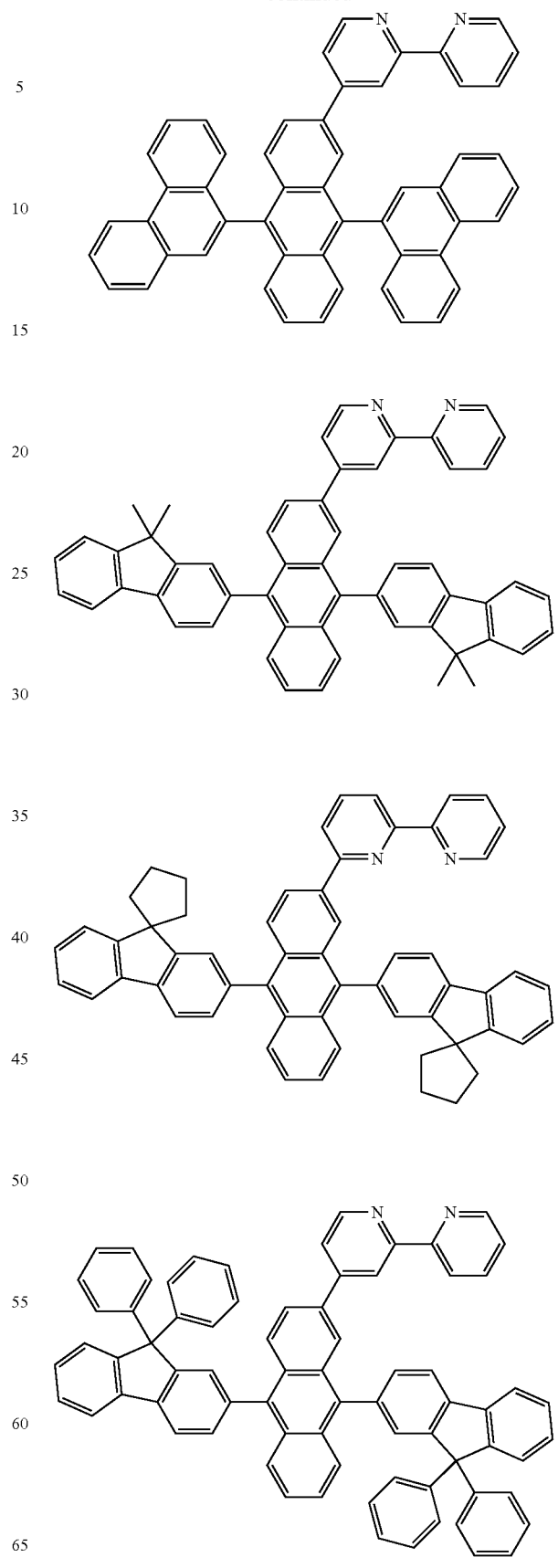

199
-continued
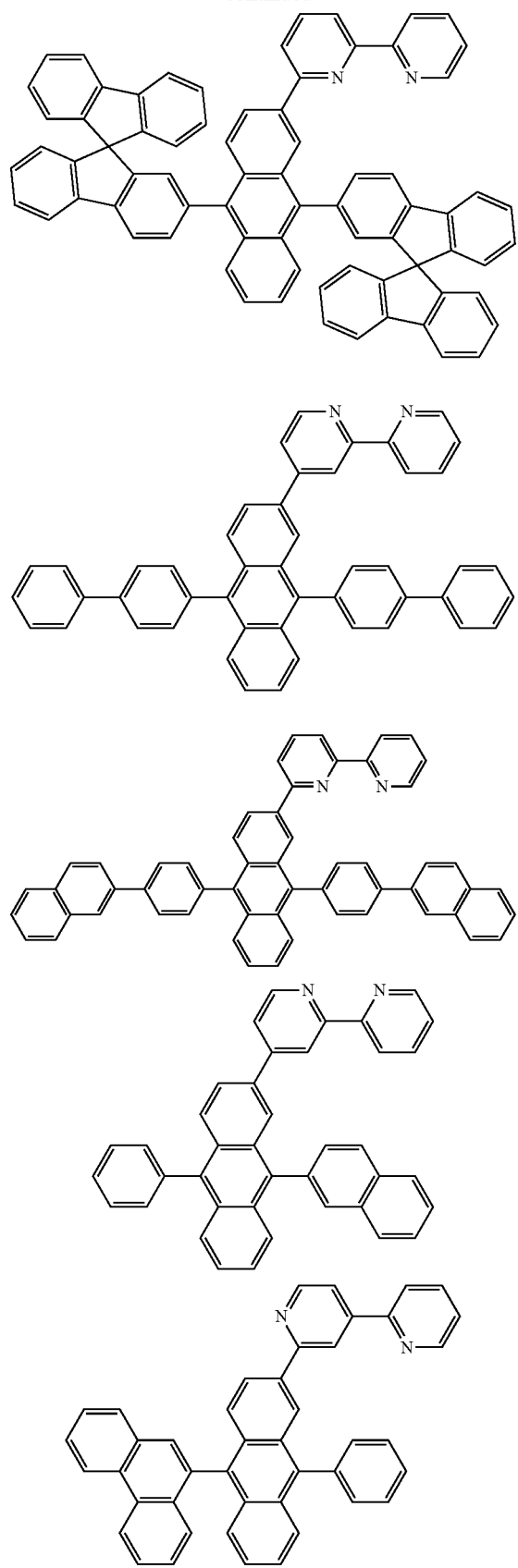
200
-continued
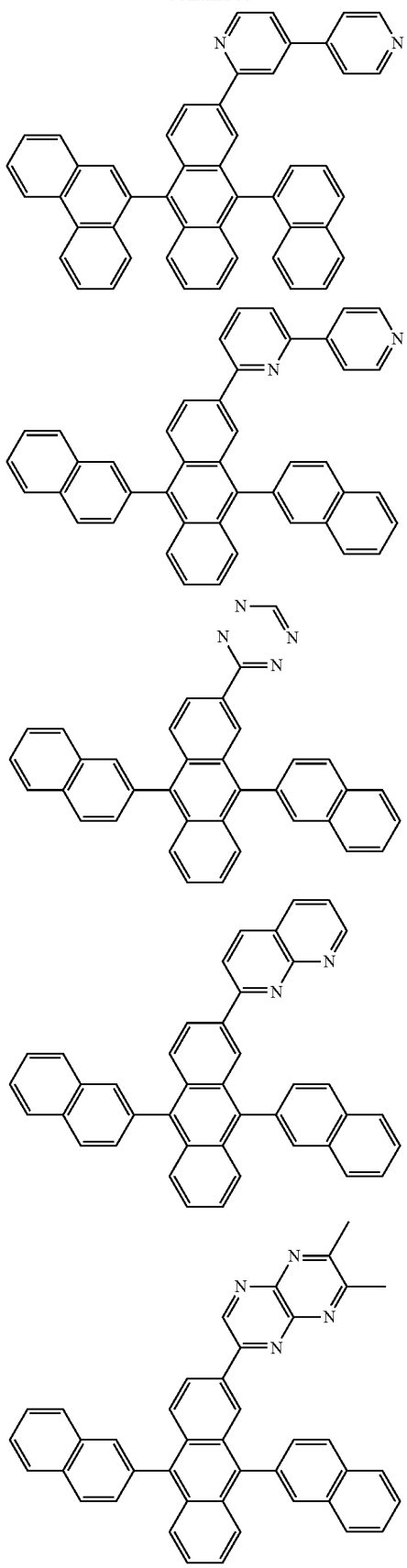

201
-continued
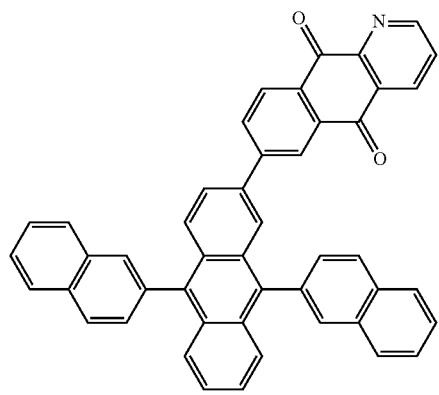
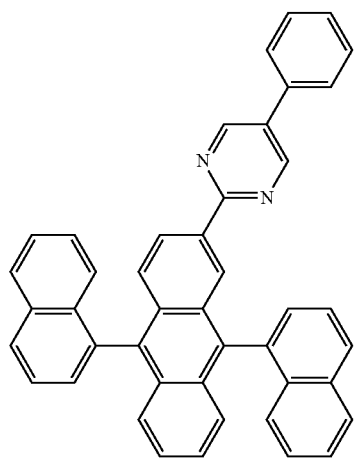
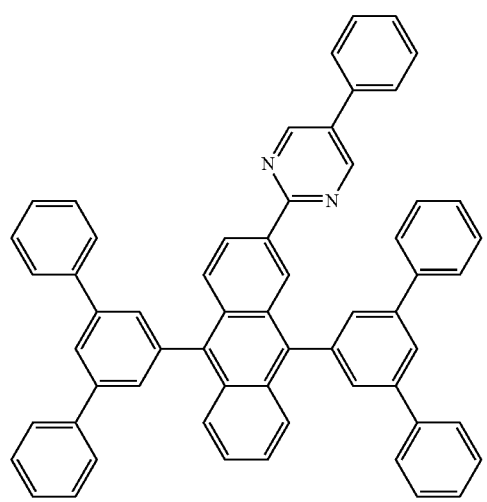
202
-continued
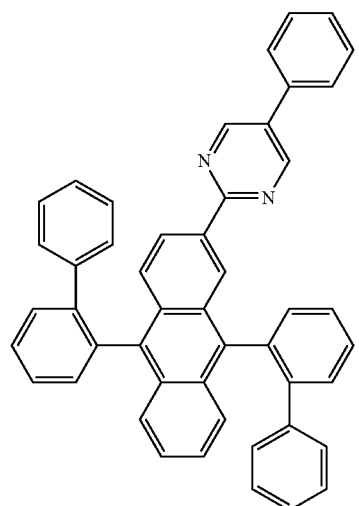
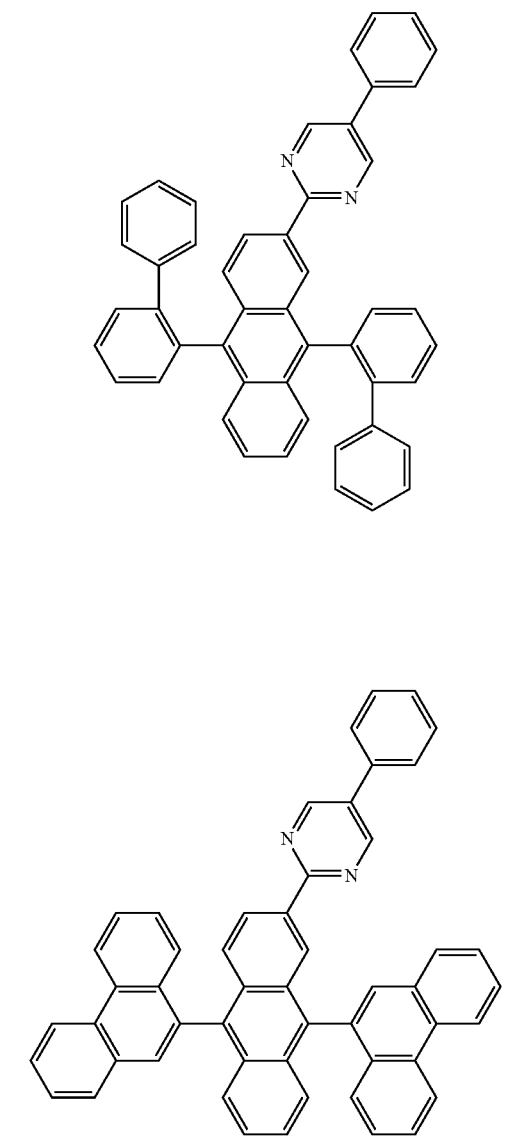
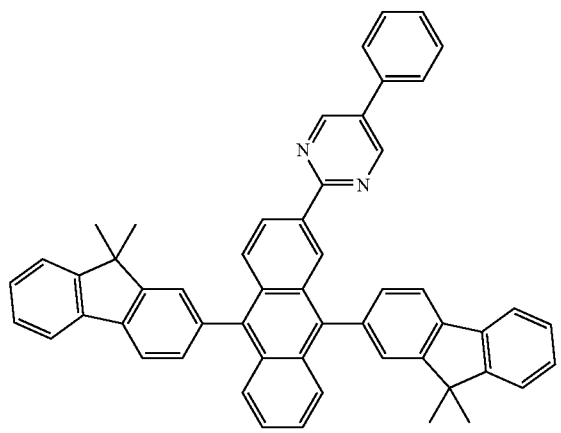

203
-continued
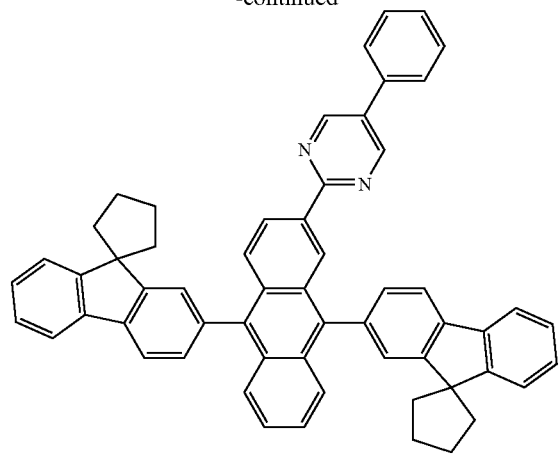
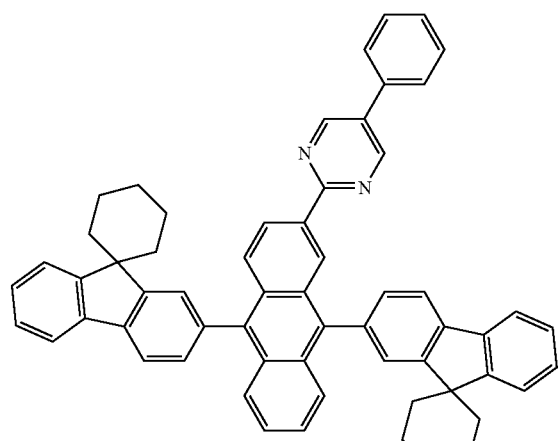
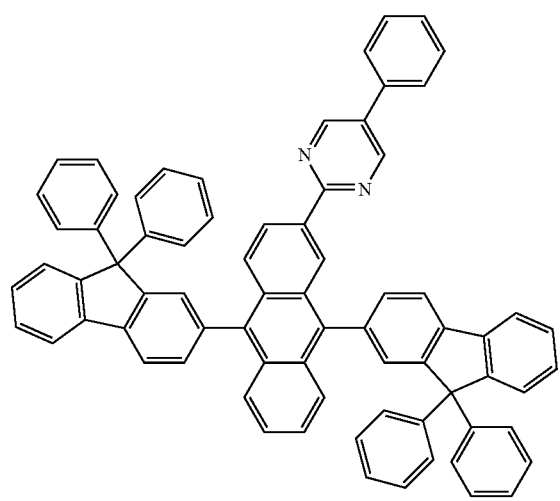
204
-continued
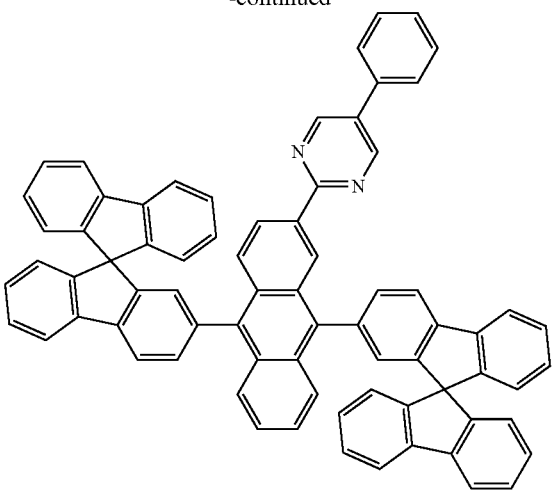
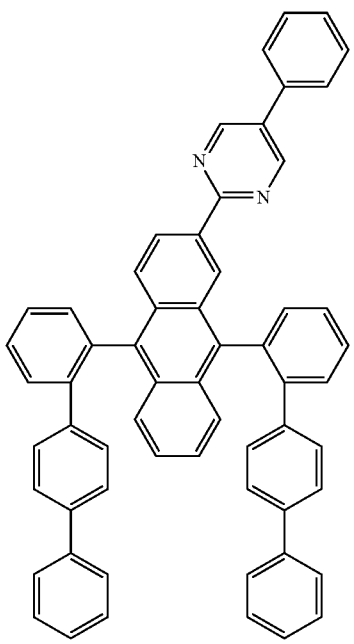
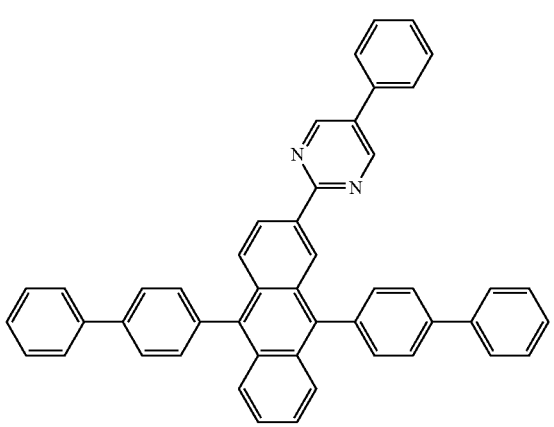

205
-continued
206
-continued
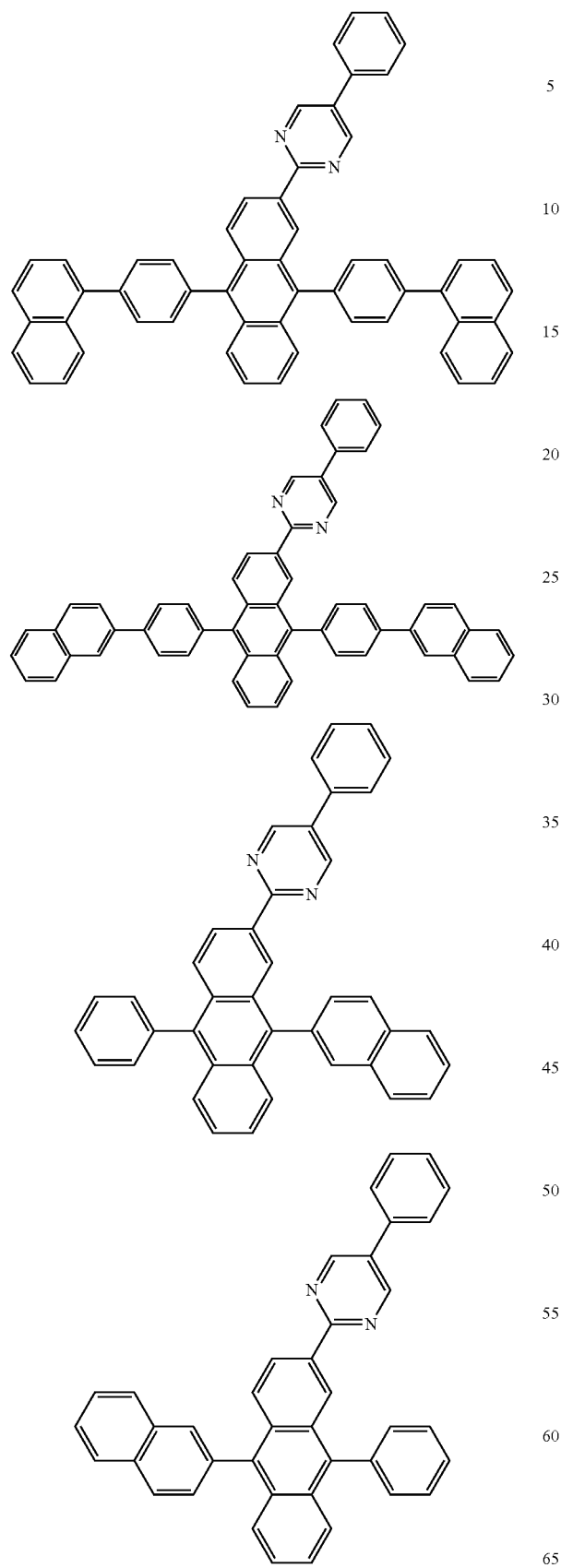
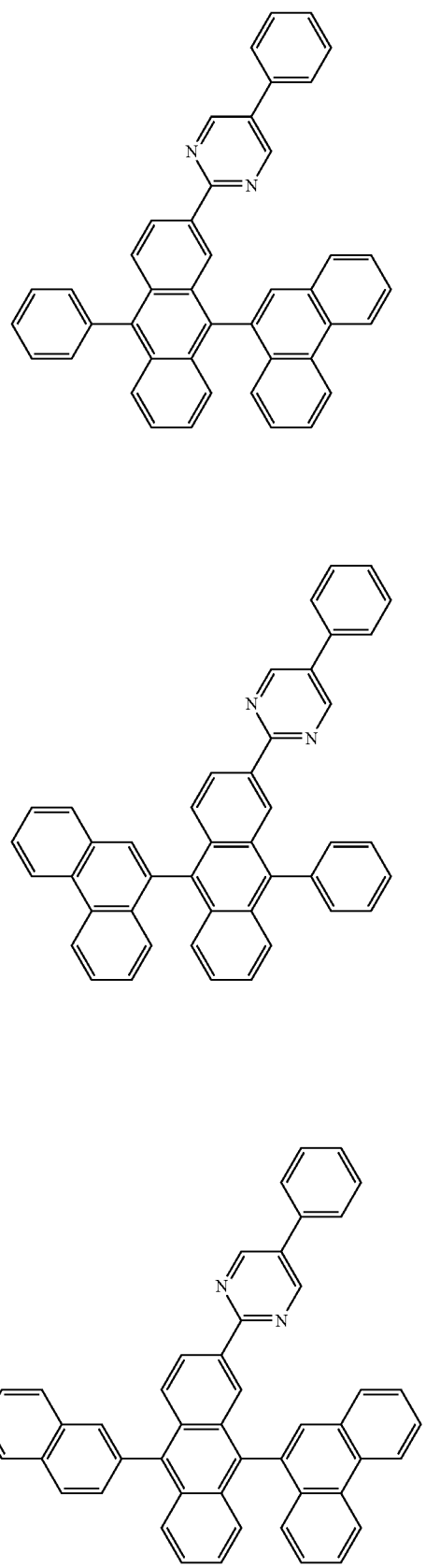

207
-continued
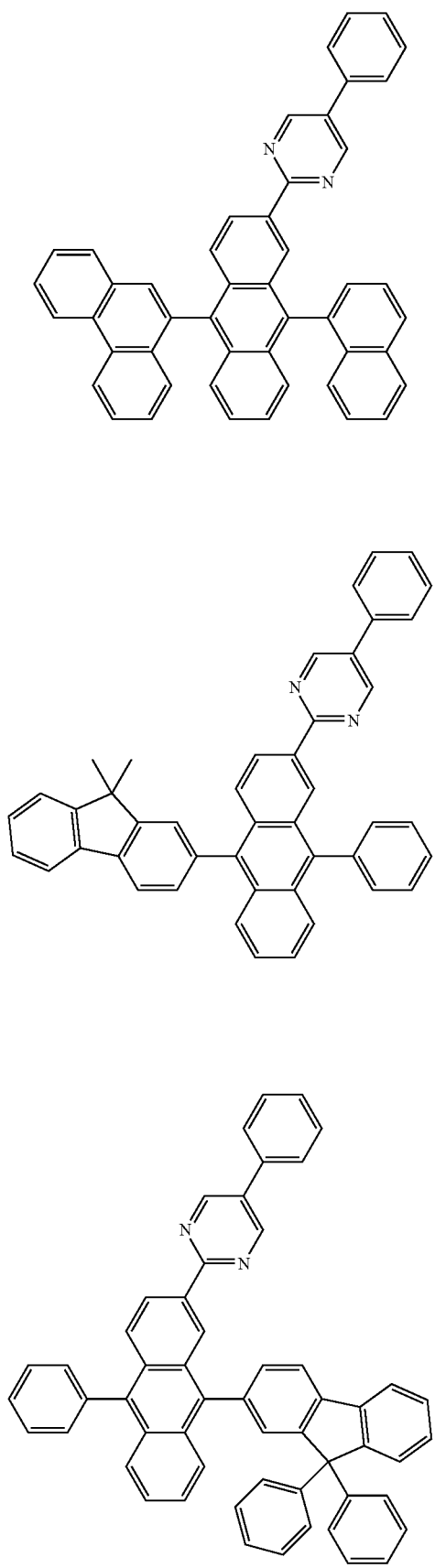
208
-continued
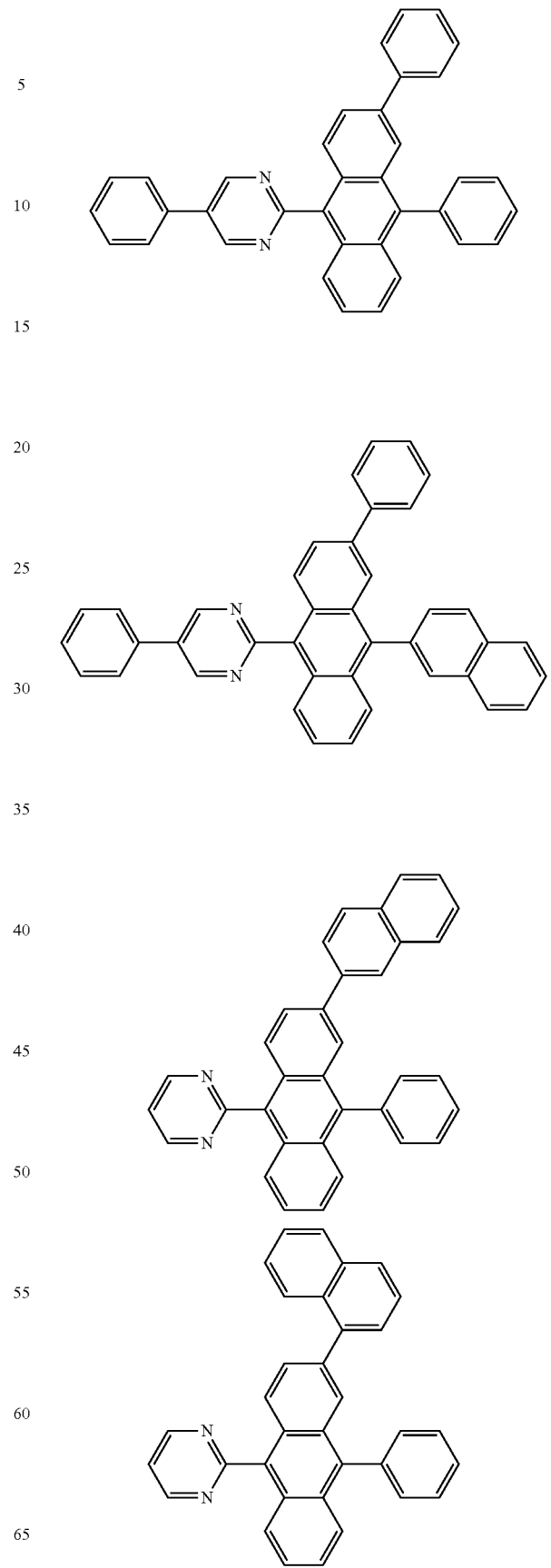

209
-continued
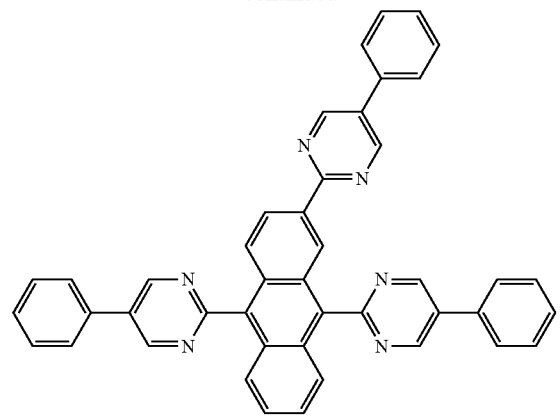
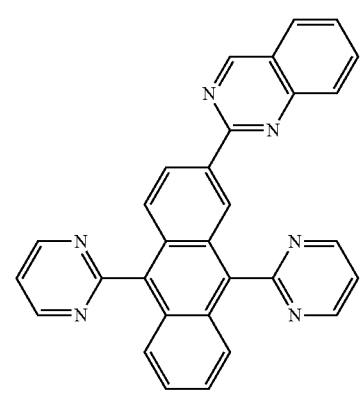
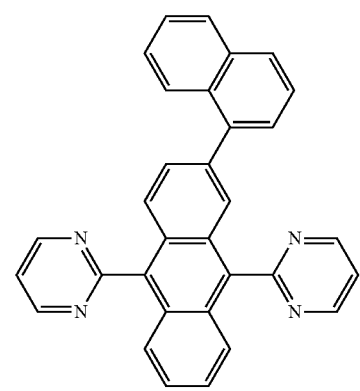
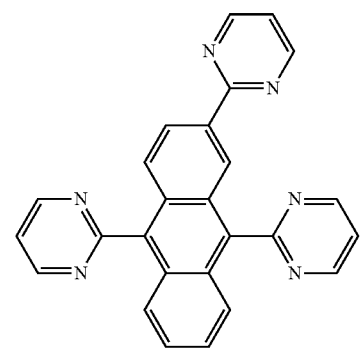
210
-continued
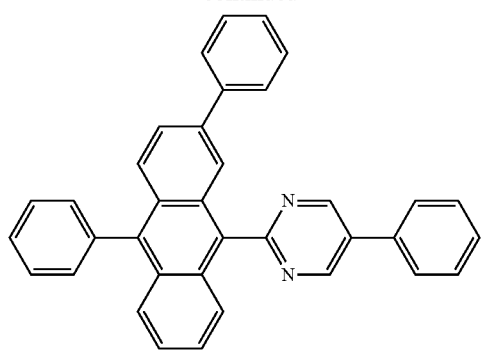
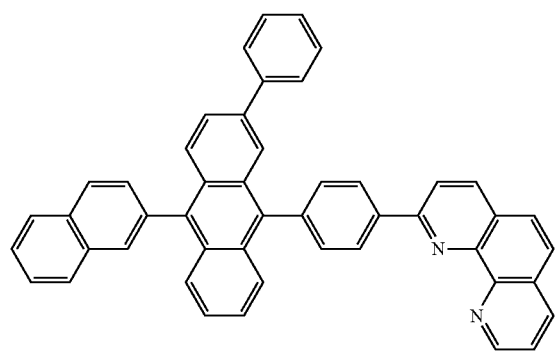
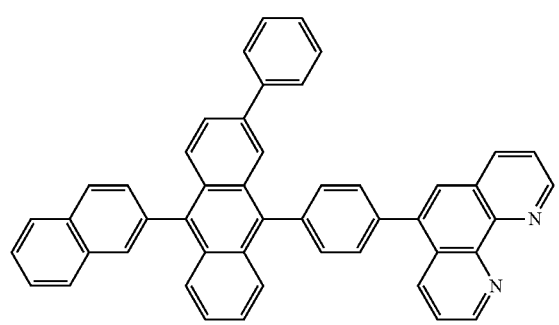
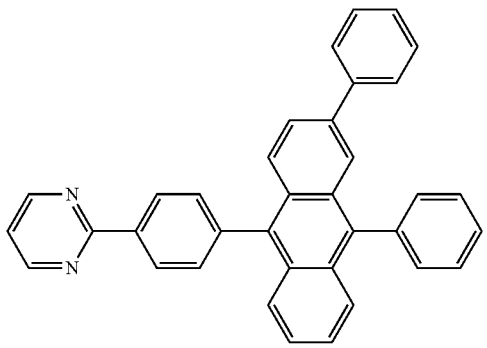

211
-continued

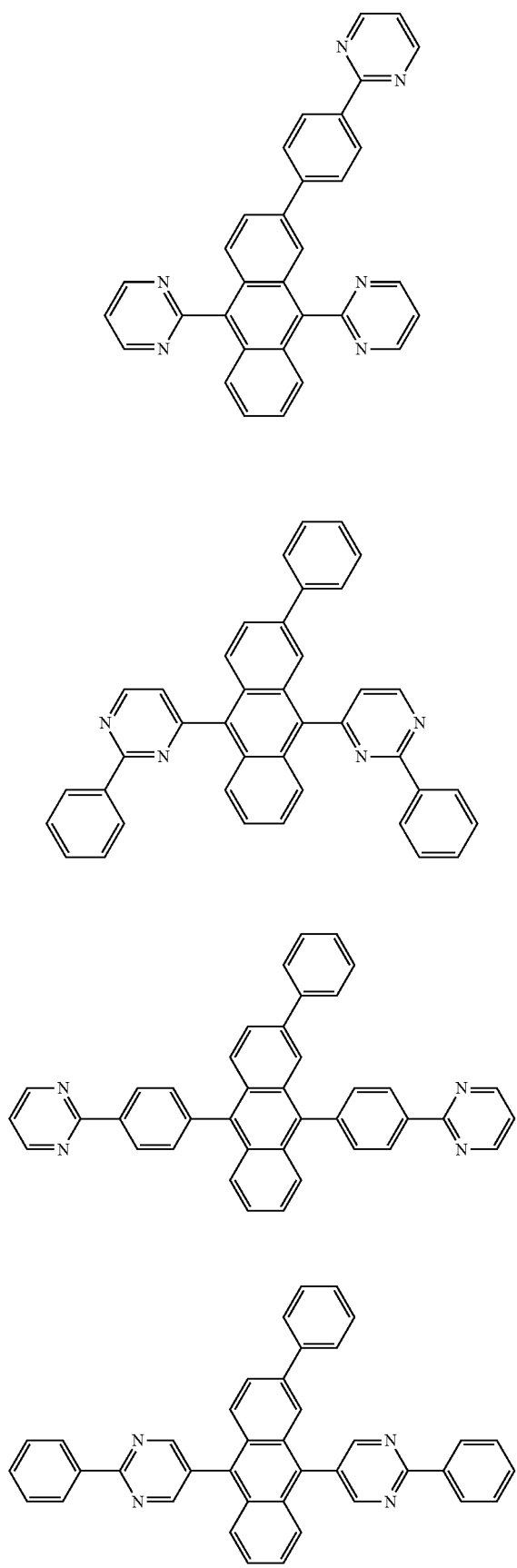

212
-continued

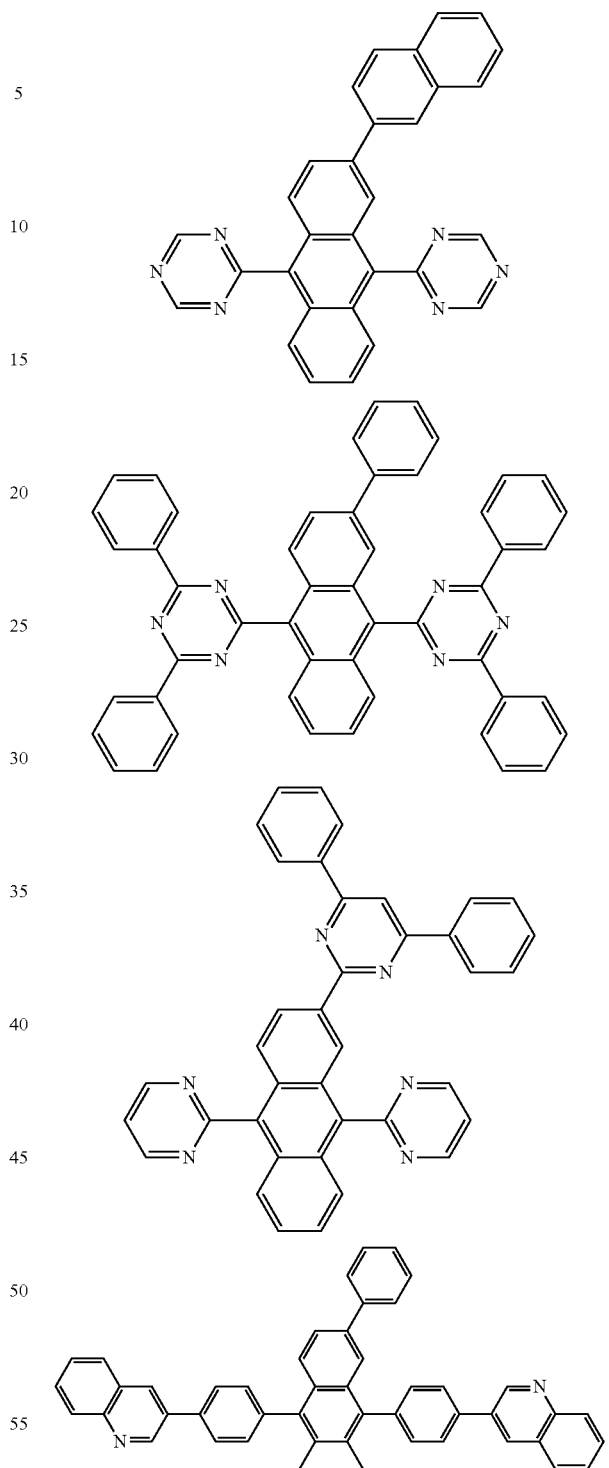

Organic-EL-Device Material

The anthracene derivative according to the above exemplary embodiment of the invention is usable as an organic-EL-device material. The organic-EL-device material according to the exemplary embodiment may singularly contain the anthracene derivative, or alternatively, may contain another compound in addition to the anthracene derivative. The organic-EL-device material containing the anthracene derivative is exemplarily usable in the electron transporting layer.

Organic EL Device

Arrangement(s) of Organic EL Device

Arrangement(s) of an organic EL device according to the exemplary embodiment of the invention will be described below.

The organic EL device according to the exemplary embodiment includes a pair of electrodes and an organic layer between the pair of electrodes. The organic layer includes at least two layers formed of an organic compound. The organic layer may include an inorganic compound.

In the organic EL device according to the exemplary embodiment, in the organic layer, at least one layer is an emitting layer and at least one layer is a hole transporting layer. Accordingly, the organic layer may be provided by a single emitting layer and a single hole transporting layer. The organic layer may further include a layer applied in an organic EL device such as a hole injecting layer, an electron injecting layer, an electron transporting layer, a hole blocking layer and an electron blocking layer.

Representative arrangement examples of the organic EL device are as follows:

(a) anode/ emitting layer/ cathode;
(b) anode/hole injecting-transporting layer/emitting layer/ cathode;
(c) anode/hole injecting-transporting layer/emitting layer/ electron injecting transporting layer/ cathode; and
(d) anode/hole injecting transporting layer/emitting layer/ blocking layer/electron injecting-transporting layer/cathode.

While the arrangement (c) is preferably used among the above arrangements, the arrangement of the invention is not limited to the above arrangements.

It should be noted that the aforementioned "emitting layer" is an organic layer having an emission function and, when a doping system is applied, including a host material and a dopant material. Herein, the host material has a function of mainly promoting recombination of electrons and holes and trapping excitons in the emitting layer while the dopant material has a function of making the excitons obtained in the recombination efficiently emit. In a phosphorescent device, the host material has a function of trapping the excitons, which are generated mainly in the dopant, within the emitting layer.

The "hole injecting/transporting layer" (or hole injecting-transporting layer) means a "hole transporting layer" or a "hole injecting layer" while the "electron injecting/transporting layer" (or electron injecting transporting layer) means an "electron transporting layer" or an "electron injecting layer and electron transporting layer." Herein, when the hole injecting layer and the hole transporting layer are provided, the hole injecting layer is preferably adjacent to the anode. When the electron injecting layer and the electron transporting layer are provided, the electron injecting layer is preferably adjacent to the cathode.

In the organic EL device according to the exemplary embodiment, the electron transporting layer means an organic layer having a higher electron mobility among organic layer(s) providing an electron transporting zone existing between the emitting layer and the cathode. When the electron transporting zone is provided by a single layer, the single layer is the electron transporting layer. Moreover, in the phosphorescent organic EL device, a blocking layer having an electron mobility that is not always high may be provided as shown in the arrangement (d) between the emitting layer and the electron transporting layer in order to prevent diffusion of exciton energy generated in the emitting layer. Thus, the organic layer adjacent to the emitting layer does not always correspond to the electron transporting layer.

FIG. 1 schematically shows an exemplary arrangement of the organic EL device according to the exemplary embodiment of the invention.

An organic EL device 1 includes a light-transmissive substrate 2, an anode 3, a cathode 4 and an organic layer 10 interposed between the anode 3 and the cathode 4.

The organic layer 10 includes an emitting layer 5 containing a host material and a dopant material. The organic layer 10 also includes a hole transporting layer 6 between the emitting layer 5 and the anode 3. The organic layer 10 further includes an electron transporting layer 7 between the emitting layer 5 and the cathode 4.

Electron Transporting Layer

The electron transporting layer used in the organic EL device according to the exemplary embodiment preferably contains the anthracene derivative represented by the formula (1). Since the anthracene derivative represented by the formula (1) is used in the electron transporting layer, the drive voltage of the organic EL device can be reduced.

Emitting Layer

The emitting layer of the organic EL device has a function for providing conditions for recombination of the electrons and the holes to emit light. The emitting layer is preferably a molecular deposit film. The molecular deposit film means a thin film formed by depositing a material compound in gas phase or a film formed by solidifying a material compound in a solution state or in liquid phase. The molecular deposit film is typically distinguished from a thin film formed by the LB (Langmuir Blodgett) method (i.e., molecular accumulation film) by differences in aggregation structures and higher order structures and functional differences arising therefrom.

Dopant Material

The dopant material is selected from a fluorescent material that emits fluorescence or a phosphorescent material that emits phosphorescence.

Host Material

Any host material applicable to the organic EL device is used as the host material and is exemplified by an amine derivative, azine derivative and fused polycyclic aromatic derivative.

Examples of the amine derivative include a monoamine compound, diamine compound, triamine compound, tetramine compound and amine compound substituted by a carbazole group.

Examples of the azine derivative include a monoazine derivative, diazine derivative and triazine derivative.

The fused polycyclic aromatic derivative is preferably a fused polycyclic aryl having no heterocyclic skeleton, examples of which are the fused polycyclic aryl such as naphthalene, anthracene, phenanthrene, chrysene, fluoranthene and triphenylene, or derivatives thereof.

Hole Injecting/Transporting Layer

The hole injecting/transporting layer helps injection of holes to the emitting layer and transports the holes to an emitting region. The hole injecting/transporting layer exhibits a large hole mobility and a small ionization energy.

A material for forming the hole injecting layer and the hole transporting layer is preferably a material for transporting the holes to the emitting layer at a lower electric field intensity. For instance, an aromatic amine compound is preferably used. A material for the hole injecting layer is preferably a porphyrin compound, an aromatic tertiary amine compound or a styryl amine compound, particularly preferably the aromatic tertiary amine compound such as hexacyanohexaazatriphenylene (HAT).

Electron Injecting/Transporting Layer

The electron injection/transport layer helps injection of the electron to the luminescent layer and has a high electron mobility. The electron injecting layer is provided for adjusting energy level, by which, for instance, sudden changes of the energy level can be reduced.

In the exemplary embodiment, an electron transporting layer is provided as the electron injecting/transporting layer and contains the compound represented by the formula (1). In addition, an electron injecting layer may be provided. Alternatively, another electron transporting layer may be provided. When an electron injecting layer is provided, the electron transporting layer and the electron injecting layer may be laminated in this sequence from the anode. The electron injecting layer preferably contains a nitrogen-containing cyclic derivative as a main component. The electron injecting layer may serve as the electron transporting layer. Noted that "as a main component" means that the nitrogen-containing cyclic derivative is contained in the electron injecting layer at a content of 50 mass % or more.

A preferable example of the compound used as the electron injecting/transporting layer is an aromatic heterocyclic compound having at least one heteroatom in a molecule. A nitrogen-containing cyclic derivative is particularly preferable. The nitrogen-containing cyclic derivative is preferably a heterocyclic compound having a nitrogen-containing six-membered or five-membered ring skeleton, or a fused aromatic cyclic compound having a nitrogen-containing six-membered or five-membered ring skeleton. The electron injecting/transporting layer may contain alkali metal and the like.

In the organic EL device in the exemplary embodiment, in addition to the above exemplary compound, any compound selected from compounds usable in the organic El device is usable as a compound for the organic compound layer other than the emitting layer.

Formation Method of Each Layer of Organic EL Device

A method of forming each of the layers in the organic EL device of this exemplary embodiment is not particularly limited. Conventionally-known methods such as vacuum deposition and spin coating may be employed for forming the layers. The organic layer containing the compound used in the organic EL device according to this exemplary embodiment can be formed by a conventional coating method such as vacuum deposition, molecular beam epitaxy (MBE method) and coating methods using a solution such as a dipping, spin coating, casting, bar coating, and roll coating.

Film Thickness of Each Layer of Organic EL Device

A film thickness of the emitting layer is preferably in a range of 5 nm to 50 nm, more preferably in a range of 7 nm to 50 nm and most preferably in a range of 10 nm to 50 nm. By forming the emitting layer at the film thickness of 5 nm or more, the emitting layer is easily formable and chromaticity is easily adjustable. By forming the emitting layer at the film thickness of 50 nm or less, increase in the drive voltage is suppressible.

A film thickness of the organic thin-film layer other than the emitting layer is not particularly limited, but is preferably in a typical range of several nm to 1 μm. When the film thickness is provided in the above range, defects such as pin holes caused by an excessively thinned film can be avoided while increase in the drive voltage caused by an excessively thickened film can be suppressed.

Electronic Equipment

The organic EL device according to the exemplary embodiment is suitably usable in electronic equipment such as: a display of an organic EL panel module, TV, a mobile phone or personal computer; and a luminescent device of an illumination or a vehicle light.

According to the above exemplary embodiment of the invention, an organic electroluminescence device capable of being driven at a low voltage, an anthracene derivative usable in the organic electroluminescence device, and an organic-electroluminescence-device material including the anthracene derivative can be provided. Moreover, electronic equipment including the organic electroluminescence device can be provided.

Modifications of Embodiment(s)

It should be noted that the invention is not limited to the above exemplary embodiment but may include any modification and improvement as long as such modification and improvement are compatible with the invention.

The emitting layer is not limited to a single layer, but may be provided as laminate by a plurality of emitting layers.

When the organic EL device includes a plurality of emitting layers, the emitting layers may be adjacent to each other, or the organic EL device may be provided as a so-called tandem type organic EL device in which a plurality of emitting units are laminated to each other through an intermediate layer.

In the invention, the emitting layer may also preferably contain an assistance material for assisting injection of charges.

When the emitting layer is formed of a host material that exhibits a wide energy gap, a difference in ionization potential (Ip) between the host material and the hole injecting/transporting layer etc. becomes so large that injection of the holes into the emitting layer becomes difficult, which may cause a rise in a driving voltage required for providing sufficient luminance.

In the above instance, introducing a hole-injectable or hole-transportable assistance substance for assisting injection of charges in the emitting layer can contribute to facilitation of the injection of the holes into the emitting layer and to reduction of the driving voltage.

As the assistance substance for assisting the injection of charges, for instance, a general hole injecting material, a general hole transporting material or the like can be used.

Specific examples of the assistance material for assisting the injection of charges are a triazole derivative, oxadiazole derivative, imidazoles derivative, polyarylalkane derivative, pyrazoline derivative, pyrazolone derivative, phenylenediamine derivative, arylamine derivative, amino-substituted chalcone derivative, oxazole derivative, fluorenone derivative, hydrazone derivative, stilbene derivative, silazane derivative, polysilane copolymer, aniline copolymer, and conductive polymer oligomer (particularly, a thiophene oligomer).

The hole injecting material is exemplified by the above. The hole injecting material is preferably a porphyrin compound, aromatic tertiary amine compound and styryl amine compound, particularly preferably aromatic tertiary amine compound.

In addition, 4,4'-bis(N-(1-naphthyl)-N-phenylamino)biphenyl (hereinafter, abbreviated as NPD) having two fused aromatic rings in a molecule, or 4,4',4''-tris(N-(3-methylphenyl)-N-phenylamino)triphenylamine (hereinafter, abbreviated as MTDATA) in which three triphenylamine units are bonded in a starburst form as disclosed and the like may also be used.

Moreover, a hexaazatriphenylene derivative and the like may be also preferably used as the hole injecting material.

Alternatively, inorganic compounds such as p-type Si and p-type SiC may also be used as the hole-injecting material.

EXAMPLES

Next, the invention will be described in further detail by exemplifying Example(s) and Comparative(s). However, the invention is not limited by the description of Example(s).

Synthesis Example 1

Synthesis of Compound 3

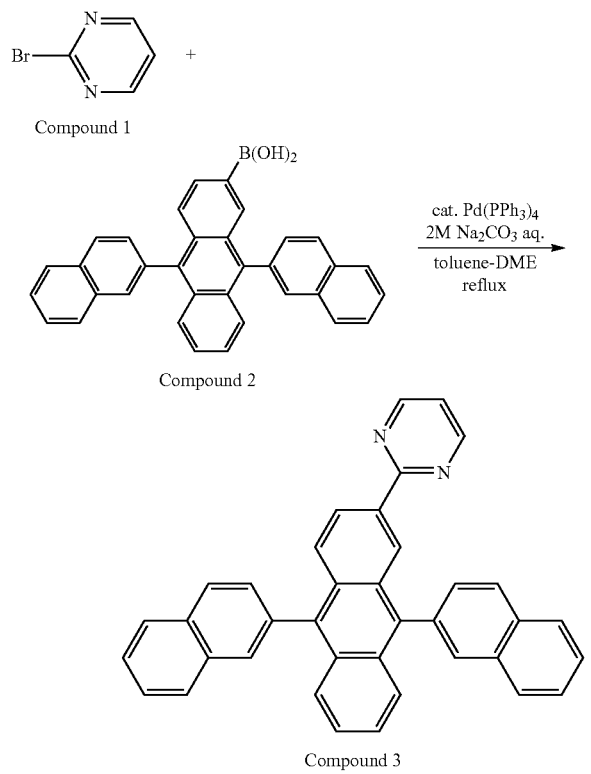

To a compound 1 (2.7 g, 17 mmol) and a compound 2 (8.0 g, 17 mmol), 1,2-dimethoxyethane (200 mL) and toluene (400 mL) were added, tetrakis(triphenylphosphine)palladium(0) (0.97 g, 0.84 mmol) and an aqueous solution of 2M sodium carbonate (67 mL) were further added, and heated to reflux for seven hours. After the reaction, a solvent was distilled away under reduced pressure, to which water was added to obtain a solid. The obtained solid was filtrated, washed with water and methanol, and dried under reduced pressure. After the obtained crude product was purified by silica-gel column chromatography (with toluene), the obtained solid was washed with methanol and dried under reduced pressure, so that a compound 3 (6.0 g, a yield of 70%) was obtained as a yellow solid. As a result of FD-MS (Field Desorption Mass Spectrometry) analysis, the solid was identified as the compound 3.

Synthesis Example 2

Synthesis of Compound 5

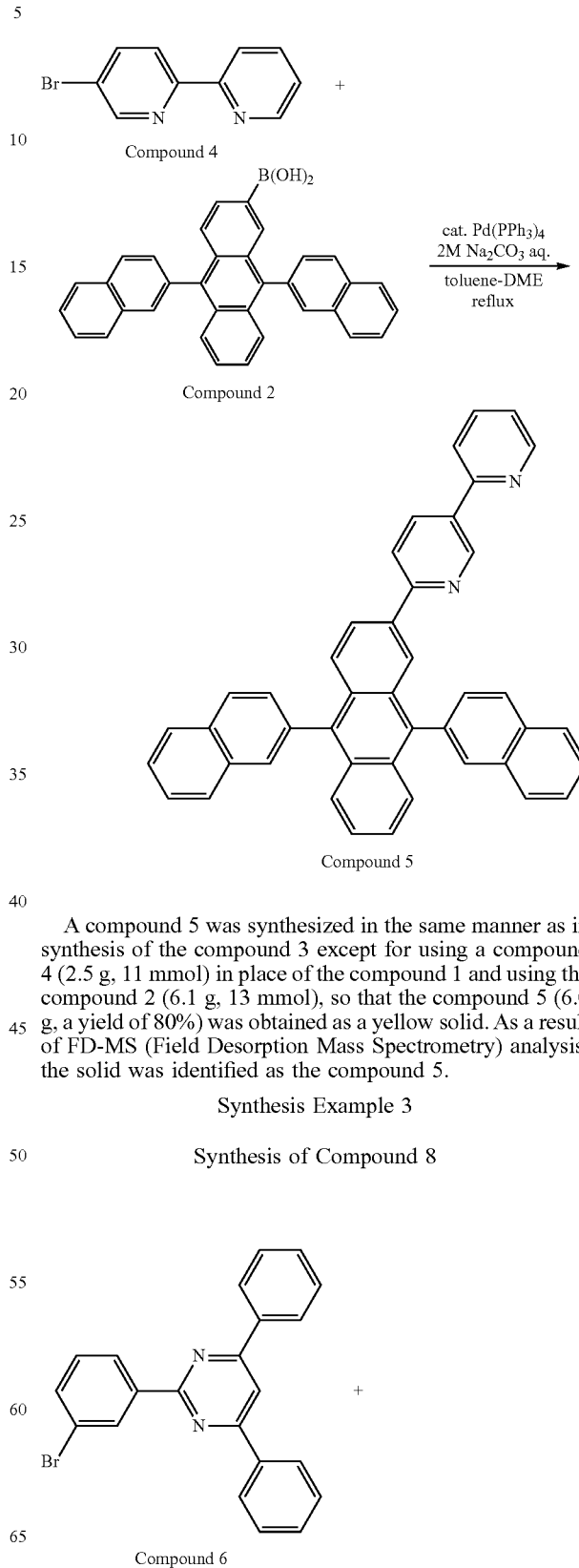

A compound 5 was synthesized in the same manner as in synthesis of the compound 3 except for using a compound 4 (2.5 g, 11 mmol) in place of the compound 1 and using the compound 2 (6.1 g, 13 mmol), so that the compound 5 (6.0 g, a yield of 80%) was obtained as a yellow solid. As a result of FD-MS (Field Desorption Mass Spectrometry) analysis, the solid was identified as the compound 5.

Synthesis Example 3

Synthesis of Compound 8

-continued

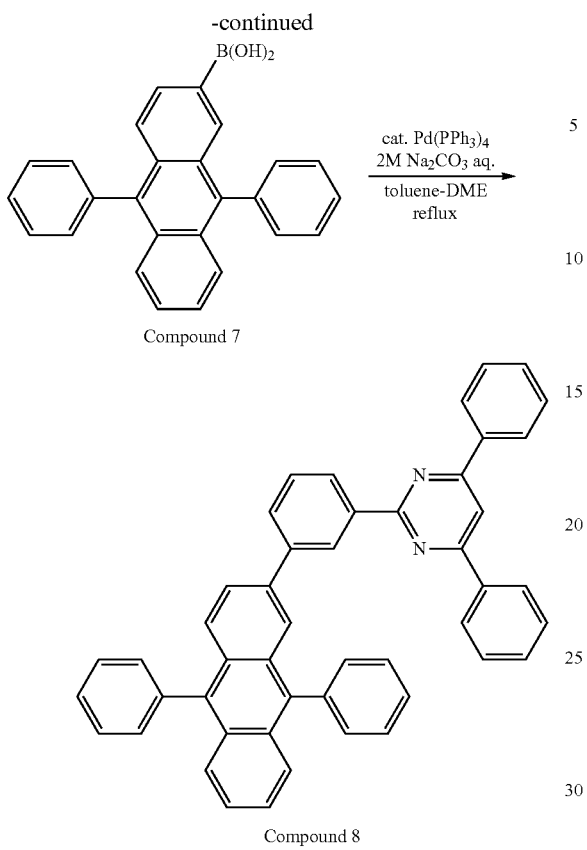

Compound 7

Compound 8

A compound 8 was synthesized in the same manner as in synthesis of the compound 3 except for using a compound 6 (5.0 g, 13 mmol) in place of the compound 1 and using a compound 7 (5.8 g, 15 mmol) in place of the compound 2, so that the compound 8 (5.9 g, a yield of 72%) was obtained as a white solid. As a result of FD-MS (Field Desorption Mass Spectrometry) analysis, the solid was identified as the compound 8.

Synthesis Example 4

Synthesis Example 11

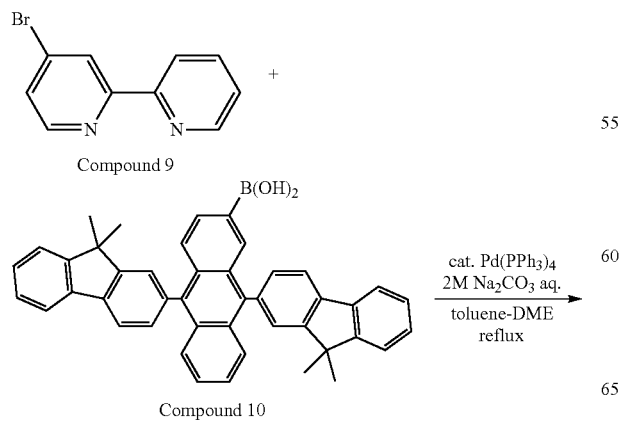

Compound 9

Compound 10

-continued

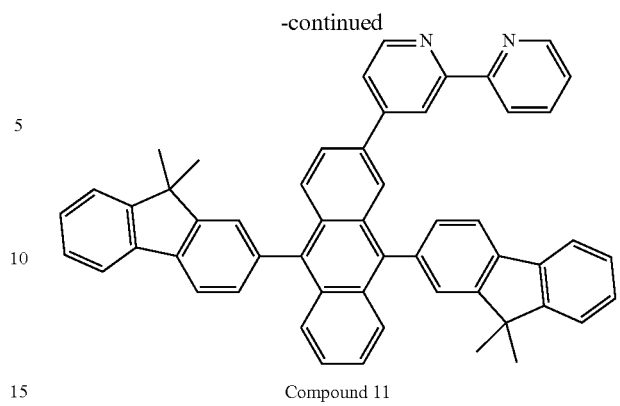

Compound 11

A compound 11 was synthesized in the same manner as in synthesis of the compound 3 except for using a compound 9 (3.0 g, 13 mmol) in place of the compound 1 and using a compound 10 (7.7 g, 13 mmol) in place of the compound 2, so that the compound 11 (6.1 g, a yield of 67%) was obtained as a yellow solid. As a result of FD-MS (Field Desorption Mass Spectrometry) analysis, the solid was identified as the compound 11.

Synthesis Example 5

Synthesis of Compound 13

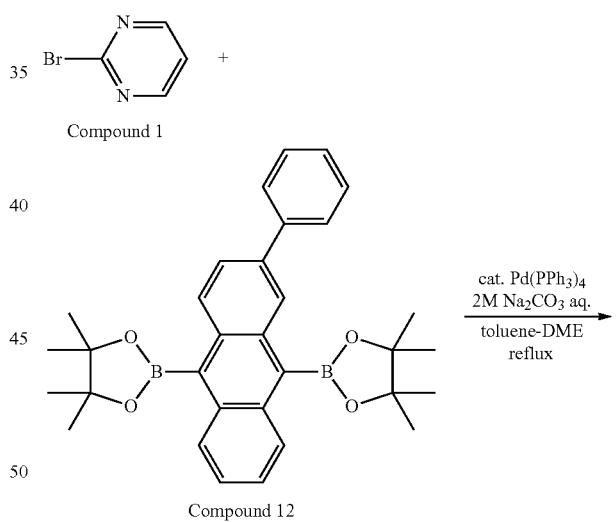

Compound 1

Compound 12

Compound 13

A compound 13 was synthesized in the same manner as in synthesis of the compound 3 except for using a compound 12 (8.0 g, 16 mmol) in place of the compound 2 and using 2molar equivalent of the compound 1 relative to the compound 2, so that the compound 13(4.8 g, a yield of 75%) was obtained as a light-yellow solid. As a result of FD-MS (Field Desorption Mass Spectrometry) analysis, the solid was identified as the compound 13.

Manufacturing Example of Device for Evaluation

Example 1

A glass substrate of 25 mm×75 mm×1.1 mm thick was ultrasonic-cleaned in isopropyl alcohol for five minutes.

The cleaned glass substrate was mounted on a substrate holder of a vacuum deposition apparatus. Initially, Al was deposited on the glass substrate to form an 80-nm thick anode. Next, the following compound ET1 was deposited to form a 20-nm thick ET1 film.

The following compound CH1 was deposited on the ET1 film to form a 145-nm thick organic layer.

The following compound ET2 was deposited on the organic layer to form a 5-nm thick ET2 film. LiF was deposited on the ET2 film to form a 1-nm thick LiF film. Al was deposited on the Liq film to form an 80-nm thick cathode.

Compounds used for manufacturing devices for evaluation will be shown below.

ET1

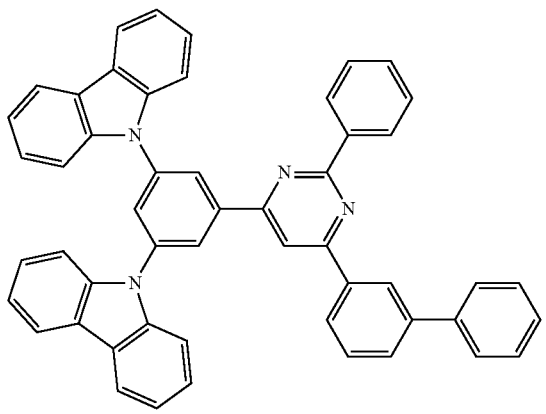

ET2

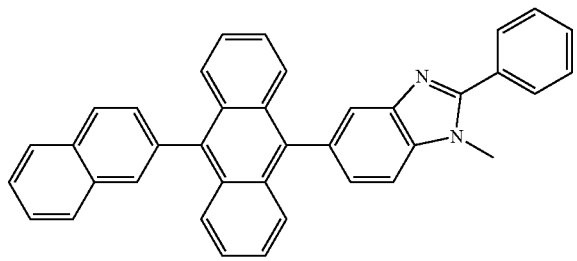

CH1

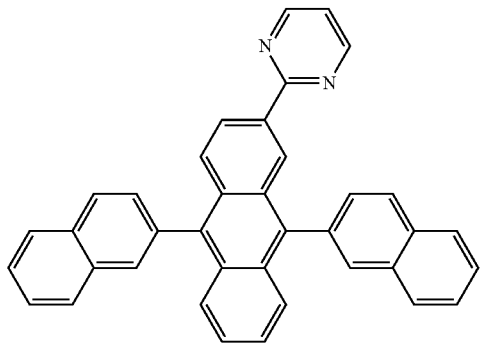

CH2

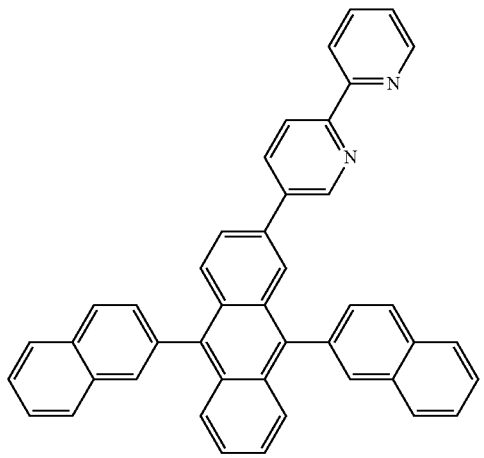

CH3

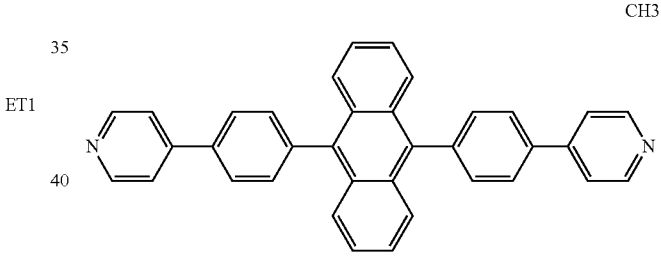

CH4

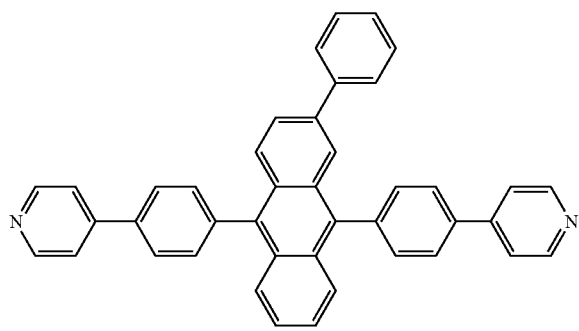

Example 2 and Comparatives 1 to 2

Devices for evaluation in Example 2 and Comparatives 1 to 2 were manufactured in the same manner as in Example 1 except for respectively using compounds described in Table 1 in place of the compound CH1 in Example 1.

Evaluation of Devices for Evaluation

A voltage was applied on the manufactured devices for evaluation such that a current density was 10 mA/cm$^2$, where a value (V) of the voltage was measured. The results were shown in Table 1 describing a ratio of each of values in Examples 1 to 2 and Comparative 2 relative to a value of Comparative 1.

TABLE 1

|  | Organic Layer | Voltage |
|---|---|---|
| Example 1 | CH1 | 0.28 |
| Example 2 | CH2 | 0.35 |
| Comparative 1 | CH3 | 1 |
| Comparative 2 | CH4 | 0.50 |

As understood from Table 1, the measured voltage of the device using the compound CH1 or CH2 (in Example 1 or 2) was lower than the voltage of the device using the compound CH3 (in Comparative 1). This is considered to be attributed to a difference in molecular arrangements between the compound CH1 or CH2 having substituents only in positions 2, 9 and 10 of the anthracene skeleton and the compound CH3 having substituents only in positions 9 and 10 of the anthracene skeleton.

As understood from Table 1, the measured voltage of the device using the compound CH1 or CH2 (in Example 1 or 2) was lower than the voltage of the device using the compound CH4 (in Comparative 2). This is because the compound CH1 or CH2 including no pyridine ring as a substituent bonding to the position 9 or 10 of the anthracene skeleton is speculated to require a lower voltage than the compound CH4 including a pyridine ring as the substituent bonding to the position 9 or 10 of the anthracene skeleton.

What is claimed is:

1. An anthracene derivative of formula (3):

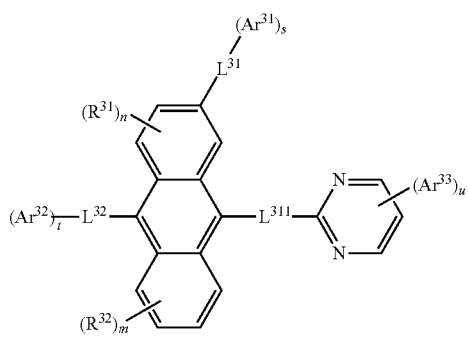

(3)

wherein:
s, t, and u are each independently an integer of 1 to 5;
n is 3;
m is 4;
$Ar^{31}$, $Ar^{32}$ or $Ar^{33}$ does not comprise a monovalent cyclic structure derived from a formula (X-100) or (X-101) below;
$L^{31}$, $L^{32}$ or $L^{311}$ does not comprise an (s+1)-valent group, (t+1)-valent group or (u+1)-valent group derived from the formula (X-100) or (X-101);
$R^{31}$ and $R^{32}$ are selected from the group consisting of a hydrogen atom, halogen atom, cyano group, nitro group, hydroxyl group, carboxyl group, sulfonyl group, mercapto group, substituted or unsubstituted boryl group, substituted or unsubstituted phosphino group, substituted or unsubstituted acyl group, substituted or unsubstituted amino group, substituted or unsubstituted silyl group, substituted or unsubstituted alkyl group having 1 to 30 carbon atoms, substituted or unsubstituted alkenyl group having 2 to 30 carbon atoms, substituted or unsubstituted alkynyl group having 2 to 30 carbon atoms, substituted or unsubstituted aralkyl group having 6 to 30 carbon atoms, substituted or unsubstituted alkoxy group having 1 to 30 carbon atoms, substituted or unsubstituted aryloxy group having 6 to 40 ring carbon atoms, substituted or unsubstituted heteroaryloxy group having 5 to 40 ring carbon atoms, substituted or unsubstituted alkylthio group having 1 to 30 carbon atoms, substituted or unsubstituted arylthio group having 6 to 40 ring carbon atoms, substituted or unsubstituted heteroarylthio group having 5 to 40 ring carbon atoms, substituted or unsubstituted alkoxycarbonyl group having 2 to 30 carbon atoms, substituted or unsubstituted aryloxycarbonyl group having 6 to 40 ring carbon atoms, and substituted or unsubstituted heteroaryloxycarbonyl group having 5 to 40 ring carbon atoms, with the proviso that $R^{32}$ is neither a methyl group nor a tertiary butyl group; that $R^{31}$ and $R^{32}$ are respectively bonded to any carbon atoms of the anthracene ring; that a plurality of $R^{31}$ are mutually the same or different; and that a plurality of $R^{32}$ are mutually the same or different;

$Ar^{31}$ and $Ar^{32}$ represent a substituted or unsubstituted aromatic hydrocarbon group having 6 to 40 ring carbon atoms or a substituted or unsubstituted heterocyclic group having 5 to 40 ring atoms; a plurality of $Ar^{31}$ are mutually the same or different when s is 2 or more; a plurality of $Ar^{32}$ are mutually the same or different when t is 2 or more; a plurality of $Ar^{33}$ are mutually the same or different when u is 2 or more, with the proviso that, when $Ar^{33}$ has a substituent, the substituent is not a trimethylsilyl group;

$L^{311}$ represents a separate linking group, the separate linking group being a substituted or unsubstituted polyvalent aromatic hydrocarbon group having 6 to 40 ring carbon atoms, a substituted or unsubstituted polyvalent heterocyclic group having 5 to 40 ring atoms, or a polyvalent multiple linking group provided by bonding two to three groups selected from the aromatic hydrocarbon group and the heterocyclic group, wherein the aromatic hydrocarbon group and the heterocyclic group forming the multiple linking group are mutually the same or different and are optionally bonded to each other forming a ring;

$L^{31}$ and $L^{32}$ each independently represent a single bond or a linking group, the linking group being a substituted or unsubstituted polyvalent aromatic hydrocarbon group having 6 to 40 ring carbon atoms, a substituted or unsubstituted polyvalent heterocyclic group having 5 to 40 ring atoms, or a polyvalent multiple linking group provided by bonding two to three groups selected from the aromatic hydrocarbon group and the heterocyclic group, wherein the aromatic hydrocarbon group and the heterocyclic group forming the multiple linking group are mutually the same or different and are optionally bonded to each other to form a ring; $L^{31}$, $L^{32}$ and $L^{311}$ are each independently bonded to the anthracene ring, $R^{31}$ or $R^{32}$ to form a ring, or are not bonded thereto; $Ar^{31}$ and $L^{31}$, $Ar^{32}$ and $L^{32}$ each form a ring, or do not form a ring;

when (Ar³¹)s-L³¹- comprises a group derived from the skeleton represented by the following formula (10), (Ar³¹)s-L³¹- does not comprise a group selected from groups represented by the following formulae (X-111), (X-112) and (X-114) to (X-117);

when (Ar³¹)s-L³¹- comprises a group derived from the skeleton represented by the following formula (10), (Ar³¹)s-L³¹- is not a group represented by the following formula (X-113);

when (Ar³²)t-L³²- comprises a group derived from the skeleton represented by the following formula (10), (Ar³²)t-L³²- does not comprise a monovalent group derived from the following formula (X-141) or (X-144), a (t+1)-valent group derived from the formula (X-141) or (X-144), and (u+1)-valent group derived from the formula (X-141) or (X-144);

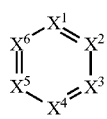
(10)

wherein:

$X^1$ to $X^6$ each independently represent a nitrogen atom or $CR^{10}$, with the proviso that one to four of $X^1$ to $X^6$ are a nitrogen atom; that adjacent ones of $CR^{10}$ are bonded to each other to form a ring, or are not bonded thereto; and that, when adjacent ones of $CR^{10}$ are bonded to each other to form a ring, a five-membered ring is not formed; and $R^{10}$ is selected from the group consisting of a hydrogen atom, halogen atom, cyano group, nitro group, hydroxyl group, carboxyl group, sulfonyl group, mercapto group, substituted or unsubstituted boryl group, substituted or unsubstituted phosphino group, substituted or unsubstituted acyl group, substituted or unsubstituted amino group, substituted or unsubstituted silyl group, substituted or unsubstituted alkyl group having 1 to 30 carbon atoms, substituted or unsubstituted alkenyl group having 2 to 30 carbon atoms, substituted or unsubstituted alkynyl group having 2 to 30 carbon atoms, substituted or unsubstituted aralkyl group having 6 to 30 carbon atoms, substituted or unsubstituted alkoxy group having 1 to 30 carbon atoms, substituted or unsubstituted aryloxy group having 6 to 40 ring carbon atoms, substituted or unsubstituted heteroaryloxy group having 5 to 40 ring carbon atoms, substituted or unsubstituted alkylthio group having 1 to 30 carbon atoms, substituted or unsubstituted arylthio group having 6 to 40 ring carbon atoms, substituted or unsubstituted heteroarylthio group having 5 to 40 ring carbon atoms, substituted or unsubstituted alkoxycarbonyl group having 2 to 30 carbon atoms, substituted or unsubstituted aryloxycarbonyl group having 6 to 40 ring carbon atoms, substituted or unsubstituted heteroaryloxycarbonyl group having 5 to 40 ring carbon atoms, substituted or unsubstituted aromatic hydrocarbon group having 6 to 40 ring carbon atoms, and substituted or unsubstituted heterocyclic group having 5 to 40 ring atoms;

$Ar^{33}$ is the same as $R^{10}$;

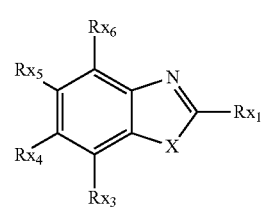
(X-100)

wherein:

X represents one of an oxygen atom, a sulfur atom and $NR^{x2}$; and $R^{x1}$ to $R^{x6}$ represent the same as $R^{31}$ or are selected from a substituted or unsubstituted aromatic hydrocarbon group having 6 to 40 ring carbon atoms, or substituted or unsubstituted heterocyclic group having 5 to 40 ring atoms, and (X-101)

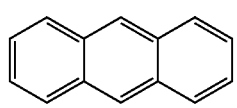
(X-111)

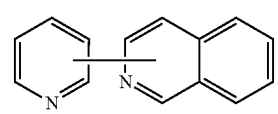
(X-112)

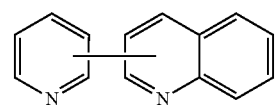
(X-113)

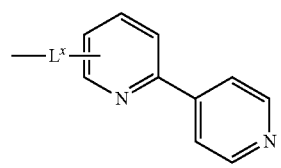
(X-114)

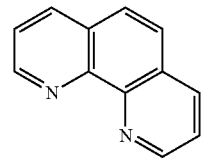
(X-115)

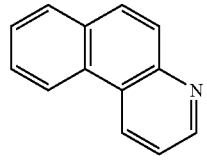
(X-116)

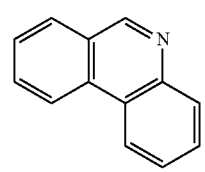

-continued

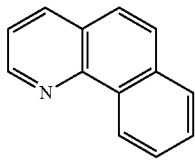
(X-117)

wherein in the formula (X-113), $L^x$ is a substituted or unsubstituted aromatic hydrocarbon group having 6 to 40 ring carbon atoms

(X-141)

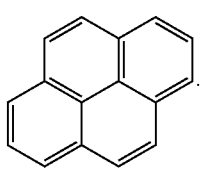
(X-144)

2. The anthracene derivative according to claim 1, wherein when $R^{10}$ is a substituted or unsubstituted aromatic hydrocarbon group in the formula (10), the substituted or unsubstituted aromatic hydrocarbon group is an aromatic hydrocarbon group having 6 to 20 ring carbon atoms.

3. The anthracene derivative according to claim 1, wherein, in formula (3), $(Ar^{31})s\text{-}L^{31}\text{-}$ is represented by a formula (201A) or (202A):

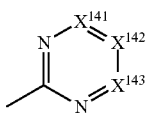
(201A)

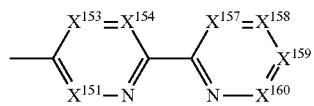
(202A)

wherein:
$X^{141}$ to $X^{143}$, $X^{151}$, $X^{153}$, $X^{154}$, and $X^{157}$ to $X^{160}$ are each independently $CR^{111}$, where $R^{111}$ represents the same as $R^{10}$ of the formula (10).

4. The anthracene derivative according to claim 1, wherein, in formula (3), s, t, and u are each independently 1 or 2.

5. The anthracene derivative according to claim 1, wherein, in formula (3), $(Ar^{31})s\text{-}L^{31}$ - comprises a group derived from a skeleton represented by a formula (10-A) or (10-B):

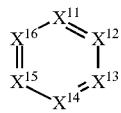
(10-A)

-continued

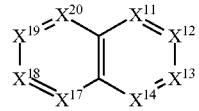
(10-B)

wherein:
$X^{11}$ to $X^{20}$ each independently represent a nitrogen atom, $CR^{100}$ or a carbon atom bonded to an adjacent group, with the proviso that one to four of $X^{11}$ to $X^{16}$ are a nitrogen atom in the formula (10-A); that one to four of $X^{11}$ to $X^{14}$ and $X^{17}$ to $X^{20}$ are a nitrogen atom in the formula (10-B); that $R^{100}$ represents the same as $R^{10}$ of the formula (10); and that adjacent ones of $CR^{100}$ are not mutually bonded to form a ring.

6. The anthracene derivative according to claim 1, wherein, in formula (3), $(Ar^{31})s\text{-}L^{31}$ - comprises a group derived from a skeleton represented by a formula (10-A1):

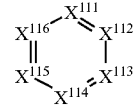
(10-A1)

wherein:
$X^{111}$ to $X^{116}$ each are a nitrogen atom, $CR^{101}$, or a carbon atom to be bonded to an adjacent group, with the proviso that one to three of $X^{111}$ to $X^{116}$ are a nitrogen atom; that $R^{101}$ represents the same as $R^{10}$ of the formula (10); and that adjacent ones of $CR^{101}$ are not mutually bonded to form a ring.

7. The anthracene derivative according to claim 1, wherein, in formula (3), $(Ar^{31})s\text{-}L^{31}$ - comprises a group derived from a skeleton represented by any one of formulae (10-A11) to (10-A13):

(10-A11)

(10-A12)

(10-A13)

8. The anthracene derivative according to claim 1, wherein, in formula (3), $(Ar^{31})s\text{-}L^{31}$ - is represented by any one selected from the group consisting of formulae (21) to (25):

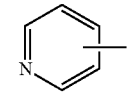
(21)

(22)

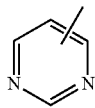

(23)

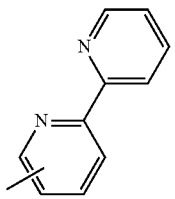

(24)

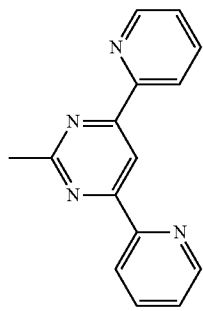

(25)

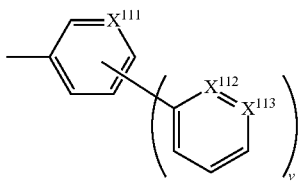

wherein:

in each of the formulae (21) to (23), any one of carbon atoms forming a six-membered ring is directly bonded to a position 2 of the anthracene ring of the formula (3);

an atomic bond in the formula (24) is bonded to the position 2 of the anthracene ring of the formula (3);

in the formula (25), $X^{111}$ to $X^{113}$ represent a nitrogen atom or $CR^{211}$, with the proviso that at least one of $X^{111}$ to $X^{113}$ is a nitrogen atom;

$R^{211}$ represents the same as $R^{10}$ of the formula (10);

v is 1 or 2; and in the formula (25), a six-membered ring having $X^{112}$ and $X^{113}$ is directly bonded to any one of carbon atoms of a six-membered ring having $X^{111}$, wherein the six-membered ring having $X^{111}$ is directly bonded to the position 2 of the anthracene ring of the formula (3).

9. The anthracene derivative according to claim 1, wherein, in the formula (3), $(Ar^{32})_r$-$L^{32}$- is a substituted or unsubstituted aromatic hydrocarbon group having 6 to 33 ring carbon atoms or a substituted or unsubstituted heterocyclic group having 5 to 33 ring atoms, wherein when the $(Ar^{32})_r$-$L^{32}$- is the heterocyclic group, the heterocyclic group does not comprise a group derived from a skeleton represented by a formula (X-40):

(X-40)

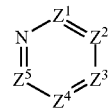

wherein:

$Z^1$ to $Z^5$ represent $CR^{140}$, where $R^{140}$ represents the same as $R^{10}$ of the formula (10), with the proviso that $R^{140}$ is not mutually bonded to form a ring; and one of $Z^1$ to $Z^5$ is a carbon atom bonded to the anthracene ring.

10. The anthracene derivative according to claim 1, wherein $(Ar^{32})_r$-$L^{32}$- has the same structure as

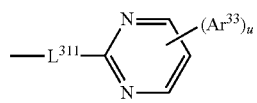

in the formula (3).

11. The anthracene derivative according to claim 1, wherein, in formula (3), $L^{31}$, $L^{32}$ and $L^{311}$ are each independently represented by any one of formulae (L11) to (L14) below, (L11)

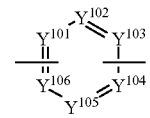

(L12)

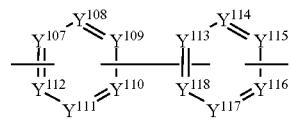

(L13)

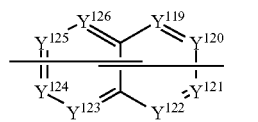

(L14)

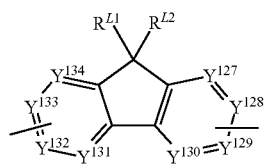

wherein:

$Y^{101}$ to $Y^{134}$ are $CR^{150}$, wherein $R^{150}$ represents the same as $R^{31}$ of the formula (3), with the proviso that two of $Y^{101}$ to $Y^{106}$, one of $Y^{107}$ to $Y^{112}$, one of $Y^{113}$ to $Y^{118}$, two of $Y^{119}$ to $Y^{126}$, one of $Y^{127}$ to $Y^{130}$, and one of $Y^{131}$ to $Y^{134}$ each are a carbon atom bonded to an adjacent group; and $R^{L1}$ and $R^{L2}$ represent the same as $R^{31}$ of the formula (3).

12. The anthracene derivative according to claim 1, wherein, in formula (3), $L^{31}$, $L^{32}$ and $L^{311}$ are each independently represented by any one of formulae (L-1) to (L-9):

(L-1)
(L-2)
(L-3)
(L-4)
(L-5)
(L-6)
(L-7)

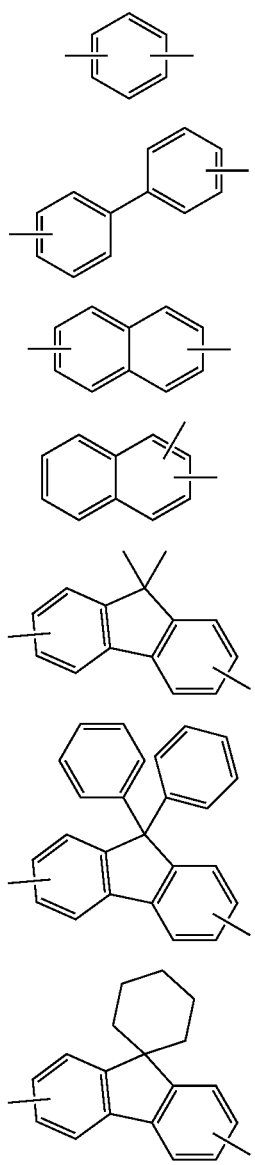

-continued (L-8)
(L-9)

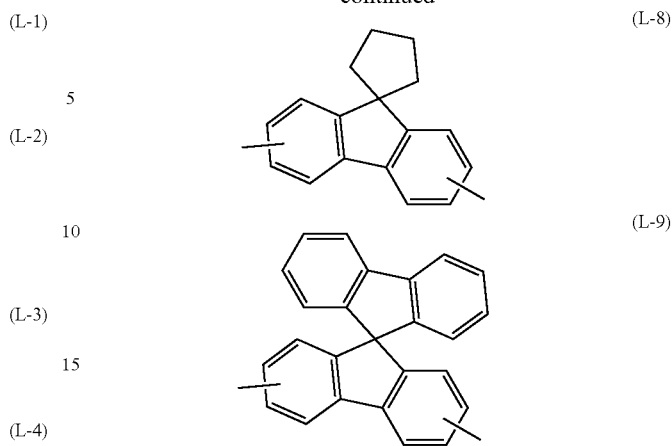

wherein:

one of atomic bonds is for bonding a carbon atom of a benzene ring in the formulae (L-1) to (L-9) to the anthracene ring of the formula (3) while the other of the atomic bonds is for bonding a carbon atom of the benzene ring or another benzene ring in the formulae (L-1) to (L-9) to any one of $Ar^{31}$, $Ar^{32}$, and the pyrimidine ring in the formula (3).

13. An organic-EL-device material comprising the anthracene derivative according to claim 1.

14. An organic electroluminescence device comprising:

an anode;

a cathode opposed to the anode; and one or more layers of an organic layer interposed between the anode and the cathode, wherein the organic layer comprises the anthracene derivative according to claim 1.

15. The organic electroluminescence device according to claim 14, wherein the organic layer comprises an electron transporting layer, and the electron transporting layer comprises the anthracene derivative.

16. Electronic equipment comprising the organic electroluminescence device according to claim 14.

* * * * *